United States Patent
Chakihara et al.

(10) Patent No.: US 8,896,053 B2
(45) Date of Patent: Nov. 25, 2014

(54) SEMICONDUCTOR DEVICE AND METHOD OF MANUFACTURING THE SAME

(71) Applicant: Renesas Electronics Corporation, Kawasaki (JP)

(72) Inventors: Hiraku Chakihara, Kanagawa (JP); Yasushi Ishii, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/740,045

(22) Filed: Jan. 11, 2013

(65) Prior Publication Data

US 2013/0126960 A1     May 23, 2013

Related U.S. Application Data

(62) Division of application No. 12/913,759, filed on Oct. 27, 2010, now Pat. No. 8,373,216.

(30) Foreign Application Priority Data

| Oct. 28, 2009 | (JP) | 2009-248002 |
| Mar. 25, 2010 | (JP) | 2010-69271 |
| Sep. 10, 2010 | (JP) | 2010-203164 |

(51) Int. Cl.
*H01L 29/792* (2006.01)
*H01L 29/78* (2006.01)
(Continued)

(52) U.S. Cl.
CPC .......... *H01L 29/792* (2013.01); *H01L 29/7835* (2013.01); *H01L 21/823462* (2013.01); *H01L 29/66825* (2013.01); *H01L 29/7881* (2013.01); *H01L 21/823443* (2013.01); *H01L 27/0922* (2013.01); *H01L 29/66833* (2013.01); *H01L 21/823835* (2013.01); *H01L 27/11519* (2013.01); *H01L 21/28273* (2013.01); *H01L 27/11575* (2013.01); *H01L 28/40* (2013.01); *H01L 29/6653* (2013.01); *H01L 29/42344* (2013.01); *H01L 27/11548* (2013.01); *H01L 27/11546* (2013.01); *H01L 29/42328* (2013.01); *H01L 29/66659* (2013.01); *H01L 21/28282* (2013.01); *H01L 27/11565* (2013.01)
USPC .......................... 257/324; 257/314; 257/316

(58) Field of Classification Search
USPC ......................................... 257/324, 314, 316
See application file for complete search history.

(56) References Cited

U.S. PATENT DOCUMENTS

| 7,045,848 B2 | 5/2006 | Shukuri |
| 7,245,531 B2 | 7/2007 | Okazaki et al. |

(Continued)

FOREIGN PATENT DOCUMENTS

| JP | 2003-309193 A | 10/2003 |
| JP | 2005-347679 A | 12/2005 |

(Continued)

OTHER PUBLICATIONS

Office Action issued Apr. 8, 2014 in Japanese Patent Application No. 2010-203164 with English language translation.

*Primary Examiner* — Long Pham
(74) *Attorney, Agent, or Firm* — Miles & Stockbridge P.C.

(57) ABSTRACT

Technique of improving a manufacturing yield of a semiconductor device including a non-volatile memory cell in a split-gate structure is provided. A select gate electrode of a CG shunt portion is formed so that a second height d2 from the main surface of the semiconductor substrate of the select gate electrode of the CG shunt portion positioned in the feeding region is lower than a first height d1 of the select gate electrode from the main surface of the semiconductor substrate in a memory cell forming region.

7 Claims, 97 Drawing Sheets

(51) Int. Cl.
  *H01L 21/8234* (2006.01)
  *H01L 29/66* (2006.01)
  *H01L 29/788* (2006.01)
  *H01L 27/092* (2006.01)
  *H01L 21/28* (2006.01)
  *H01L 49/02* (2006.01)
  *H01L 29/423* (2006.01)
  *H01L 21/8238* (2006.01)
  *H01L 27/115* (2006.01)

(56) References Cited

U.S. PATENT DOCUMENTS

| | | |
|---|---|---|
| 7,502,257 B2 | 3/2009 | Okazaki et al. |
| 7,544,988 B2 | 6/2009 | Shukuri |
| 7,636,253 B2 | 12/2009 | Okazaki et al. |
| 7,682,990 B2 | 3/2010 | Hamamura et al. |
| 2006/0035435 A1 | 2/2006 | Yasui et al. |
| 2007/0164342 A1 | 7/2007 | Okazaki et al. |
| 2007/0228498 A1* | 10/2007 | Toba et al. .......... 257/411 |
| 2009/0233431 A1 | 9/2009 | Shukuri |
| 2010/0038700 A1 | 2/2010 | Okazaki et al. |
| 2010/0059810 A1 | 3/2010 | Homma et al. |

FOREIGN PATENT DOCUMENTS

| | | |
|---|---|---|
| JP | 2006-49737 A | 2/2006 |
| JP | 2006-54292 A | 2/2006 |
| JP | 2007-189063 A | 7/2007 |

* cited by examiner

FIG. 46

| APPLIED VOLTAGE OPERATION | Vd | Vsg | Vmg | Vs | Vb |
|---|---|---|---|---|---|
| PROGRAM | 1 V | Vdd | 12 V | 6 V | 0 |
| ERASE | 0 | 0 | −6 V | 6 V | 0 |
| READ | Vdd | Vdd | Vdd | 0 | 0 |

Vdd = 1.5 V

A1　　　　　　　　PW1　61　　　　　　　　A1

C1　　　　　　　　62　61　　　　　　　　C1

SEMICONDUCTOR DEVICE AND METHOD OF MANUFACTURING THE SAME

CROSS-REFERENCE TO RELATED APPLICATION

The present application claims priorities from Japanese Patent Application No. 2009-248002 filed on Oct. 28, 2009, Japanese Patent Application No. 2010-69271 filed on Mar. 25, 2010, and Japanese Patent Application No. 2010-203164 filed on Sep. 10, 2010, the contents of which are hereby incorporated by reference into this application.

TECHNICAL FIELD OF THE INVENTION

The present invention relates to a semiconductor device and a method of manufacturing the same. More particularly, the present invention relates to technique effectively applied to a semiconductor device including a non-volatile memory and a method of manufacturing the semiconductor device.

BACKGROUND OF THE INVENTION

EEPROM (electrically erasable and programmable read only memory) is widely used as one of electrically erasable and programmable non-volatile semiconductor memory devices. These memory devices (memories), typified by flash memory which is currently widely used, have a conductive floating gate surrounded by an oxide film or a trap insulating film under a gate electrode of a MISFET, and a charge storage state in the floating gate or trap insulating film is taken as memory information of the memories and the charge storage state is read as a threshold voltage of the transistor. The trap insulating film means an insulating film capable of storing (accumulating) charges, and a silicon nitride film is an example. A threshold voltage of a MISFET is shifted by injection/release of charges to/from such a charge storage region to operate the MISFET as a memory element. As the flash memory, there is a split-gate-type cell using MONOS (metal-oxide-nitride-oxide semiconductor). By using a silicon nitride film as a charge storage region, this MONOS flash memory has better reliability of data retention than a conductive floating gate film as the silicon nitride film discretely stores charges, and oxide films over and under the silicon nitride film can be thinned as the silicon nitride film has good reliability, and thus there are advantages such that a voltage lowering in reading and programming operations can be attained, etc.

For example, Japanese Patent Application Laid-Open Publication No. 2003-309193 (Patent Document 1) discloses a non-volatile memory cell transistor including a first gate electrode (control gate electrode) and a second gate electrode (memory gate electrode) disposed via an insulating film and a charge storage film, wherein the structure is processed so that a height of the first gate electrode from a surface of a substrate is lower than a height of the second gate electrode film from the substrate surface or a height of a gate electrode of a transistor formed in a peripheral circuit from the surface of the substrate.

Japanese Patent Application Laid-Open Publication No. 2006-054292 (Patent Document 2) discloses a method of arranging isolated subsidiary patterns being adjacent to a select gate electrode in a memory cell that has a split-gate structure and forming contacts to wiring portions formed in a self-aligned manner by filling polysilicon of a sidewall gate to a gap between the subsidiary patterns.

Japanese Patent Application Laid-Open Publication No. 2006-049737 (Patent Document 3) discloses a memory cell in which a memory gate line is formed on a sidewall of a select gate line via an insulating film, a contact portion extended in an X direction is provided from above a second portion of the select gate line to a device isolation region, and the memory cell is connected to wirings via plugs buried in contact holes formed on contact portions.

Japanese Patent Application Laid-Open Publication No. 2005-347679 (Patent Document 4) discloses a MONOS (metal oxide nitride oxide semiconductor) type non-volatile memory cell in which a cap insulating film to be a mask during a processing of a select gate electrode is formed on the select gate electrode, and a memory gate electrode is formed on a sidewall of a stacked film formed of the select gate electrode and the cap insulating film.

SUMMARY OF THE INVENTION

Miniaturization of semiconductor devices including non-volatile memories has been increasingly advanced. Also, technology for improving a manufacturing yield of the semiconductor devices including non-volatile memories has been desired. Moreover, technology for ensuring reliability after improving performance of miniaturized non-volatile memories is desired.

A preferred aim of the present invention is to provide technology capable of improving a manufacturing yield of a semiconductor device including a non-volatile memory.

Another preferred aim of the present invention is to provide technology capable of improving reliability of the semiconductor device.

Another preferred aim of the present invention is to provide technology capable of advancing miniaturization of the semiconductor device.

Another preferred aim of the present invention is to provide technology capable of improving performance of the semiconductor device.

Another preferred aim of the present invention is to provide technology capable of improving a manufacturing yield of the semiconductor device and also improving reliability of the semiconductor device.

Another preferred aim of the present invention is to provide technology capable of improving a manufacturing yield of the semiconductor device and also advancing miniaturization of the semiconductor device.

Another preferred aim of the present invention is to provide technology capable of improving a manufacturing yield of the semiconductor device and also improving performance of the semiconductor device.

Another preferred aim of the present invention is to provide technology capable of improving reliability of the semiconductor device and also advancing miniaturization of the semiconductor device.

Another preferred aim of the present invention is to provide technology capable of improving reliability of the semiconductor device and also improving performance of the semiconductor device.

Another preferred aim of the present invention is to provide technology capable of advancing miniaturization of the semiconductor device and also improving performance of the semiconductor device.

Another preferred aim of the present invention is to provide technology capable of improving a manufacturing yield of the semiconductor device and also improving reliability of the semiconductor device, and advancing miniaturization of the semiconductor device.

Another preferred aim of the present invention is to provide technology capable of improving a manufacturing yield of the semiconductor device and also improving reliability of the semiconductor device, and improving performance of the semiconductor device.

Another preferred aim of the present invention is to provide technology capable of improving a manufacturing yield of the semiconductor device and also advancing miniaturization of the semiconductor device, and improving performance of the semiconductor device.

Another preferred aim of the present invention is to provide technology capable of improving reliability of the semiconductor device and also advancing miniaturization of the semiconductor device, and improving performance of the semiconductor device.

Another preferred aim of the present invention is to provide technology capable of improving a manufacturing yield of the semiconductor device and also advancing miniaturization of the semiconductor device, and improving performance of the semiconductor device.

The above and other preferred aims and novel characteristics of the present invention will be apparent from the description of the present specification and the accompanying drawings.

The typical ones of the inventions disclosed in the present application will be briefly described as follows.

A semiconductor device according to a typical embodiment is a semiconductor device including: a memory cell forming region in which a plurality of memory cells are formed in an array; and a feeding region, in a semiconductor substrate. The memory cell formed in the memory cell forming region includes: a first gate insulating film formed on the semiconductor substrate; a select gate electrode formed on the first gate insulating film and having a first height from a main surface of the semiconductor substrate; a memory gate electrode formed in a side-wall shape on one of side surfaces of the select gate electrode; and a second gate insulating film formed between the select gate electrode and the memory gate electrode, and formed between the memory gate electrode and the semiconductor substrate. In addition, in the feeding region, the select gate electrode having a second height that is lower than the first height is provided, a pad electrode formed of a conductive film in a same layer as the memory gate electrode runs over a partial region of the select gate electrode having the second height formed in the feeding region, and the pad electrode is connected to the memory gate electrode formed in the memory cell forming region.

A method of manufacturing a semiconductor device according to a typical embodiment is a method of manufacturing a semiconductor device including a memory cell. A process of forming the memory cell includes the steps of: forming a first gate insulating film on a semiconductor substrate; forming a first conductive film on the first gate insulating film; forming a select gate electrode having a first height from a main surface of the semiconductor substrate by processing the first conductive film; thinning the select gate electrode in a feeding region to make a second height of the select gate electrode in the feeding region from the main surface of the semiconductor substrate lower than the first height; then, forming a second gate insulating film on the semiconductor substrate; forming a second conductive film on the second gate insulating film; forming a memory gate electrode in a sidewall shape on a side surface of the select gate electrode by performing an anisotropic etching on the second conductive film using a photoresist pattern as a mask, and at the same time, forming a pad electrode running over the select gate electrode having the second height in the feeding region; removing the memory gate electrode formed on one sidewall in a memory cell forming region to leave the memory gate electrode formed on the other sidewall; then, forming a source region and a drain region to the semiconductor substrate in a region in which the memory cell is formed; and then, forming a silicide layer to an upper surface of the memory gate electrode, an upper surface of the select gate electrode, an upper surface of the pad electrode, and upper surfaces of the source region and the drain region in the region in which the memory cell is formed.

In addition, in the semiconductor device of another typical embodiment, a contact portion of the memory gate electrode does not have a portion positioned above a select gate electrode.

Moreover, in the method of manufacturing semiconductor device according to another typical embodiment, a contact portion of the memory gate electrode is once formed to have a portion running over the select gate electrode, and then the contact portion is subjected to an isotropic etching so that the contact portion does not have a portion running over the select gate electrode.

The effects obtained by typical aspects of the present invention will be briefly described below.

According to the typical embodiments, a manufacturing yield can be improved in a semiconductor device including a non-volatile memory cell.

Another effect of the present invention is improving reliability of the semiconductor device.

Another effect of the present invention is advancing miniaturization of the semiconductor device.

Another effect of the present invention is improving performance of the semiconductor device.

Another effect of the present invention is improving a manufacturing yield and also improving reliability of the semiconductor device.

Another effect of the present invention is improving a manufacturing yield and also advancing miniaturization of the semiconductor device.

Another effect of the present invention is improving a manufacturing yield and also improving performance of the semiconductor device.

Another effect of the present invention is improving reliability of the semiconductor device and also advancing miniaturization of the semiconductor device.

Another effect of the present invention is improving reliability of the semiconductor device and also improving performance of the semiconductor device.

Another effect of the present invention is advancing miniaturization of the semiconductor device and also improving performance of the semiconductor device.

Another effect of the present invention is improving a manufacturing yield, also improving reliability of the semiconductor device, and also advancing miniaturization of the semiconductor device.

Another effect of the present invention is improving a manufacturing yield, also improving reliability of the semiconductor device, and also improving performance of the semiconductor device.

Another effect of the present invention is improving a manufacturing yield, also advancing miniaturization of the semiconductor device, and also improving performance of the semiconductor device.

Another effect of the present invention is improving reliability of the semiconductor device, also advancing miniaturization of the semiconductor device, and also improving performance of the semiconductor device.

Another effect of the present invention are improving a manufacturing yield, improving reliability of the semiconductor device, advancing miniaturization of the semiconductor device, and also improving performance of the semiconductor device.

BRIEF DESCRIPTIONS OF THE DRAWINGS

FIG. 46 is a table illustrating an example of conditions of applying voltage to each part of a select memory cell upon "program," "erase," and "read";

Figure 127A:
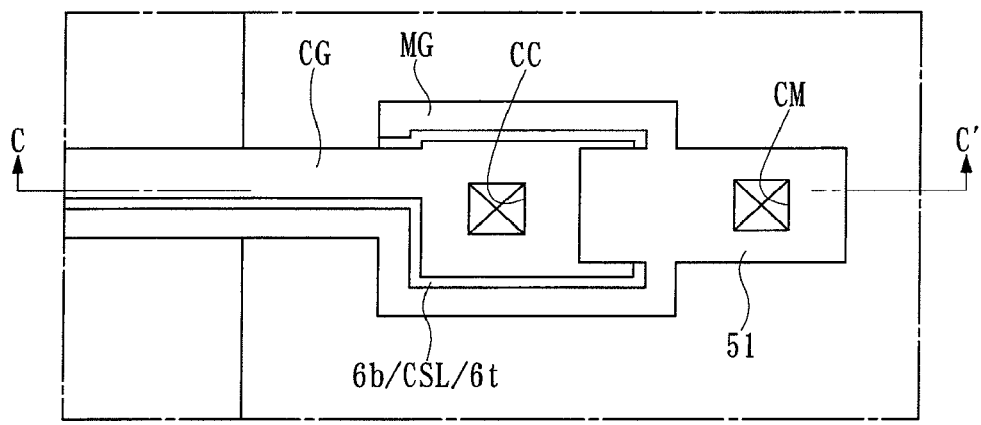
FIG. 127A is a plan view of a feeding region of a non-volatile memory cell which has been studied by the inventors of the present invention.
Figure 127B:
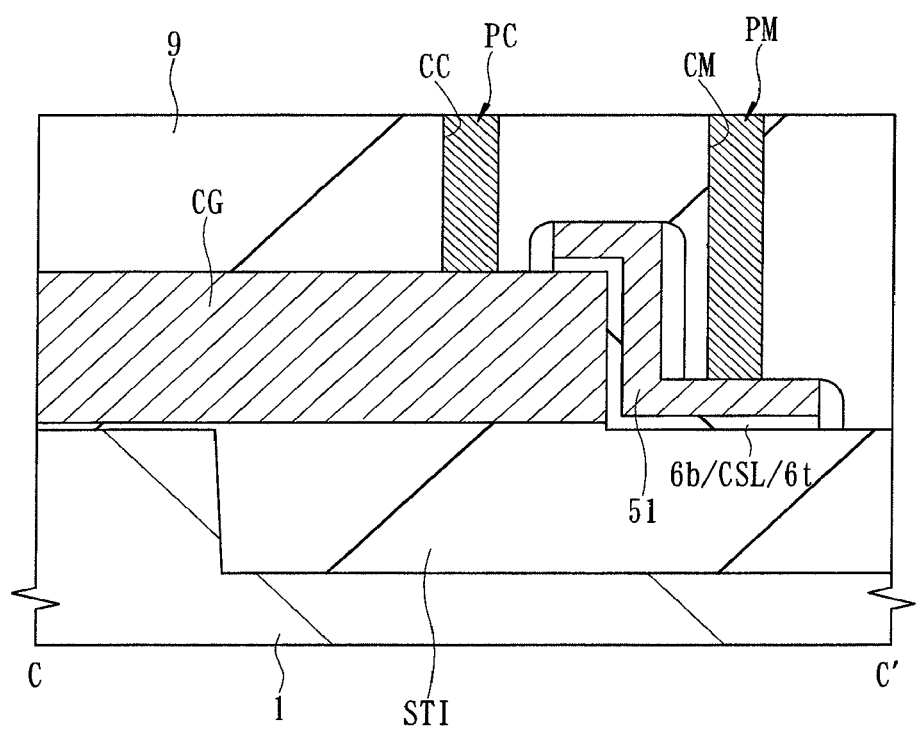
Figure 128:
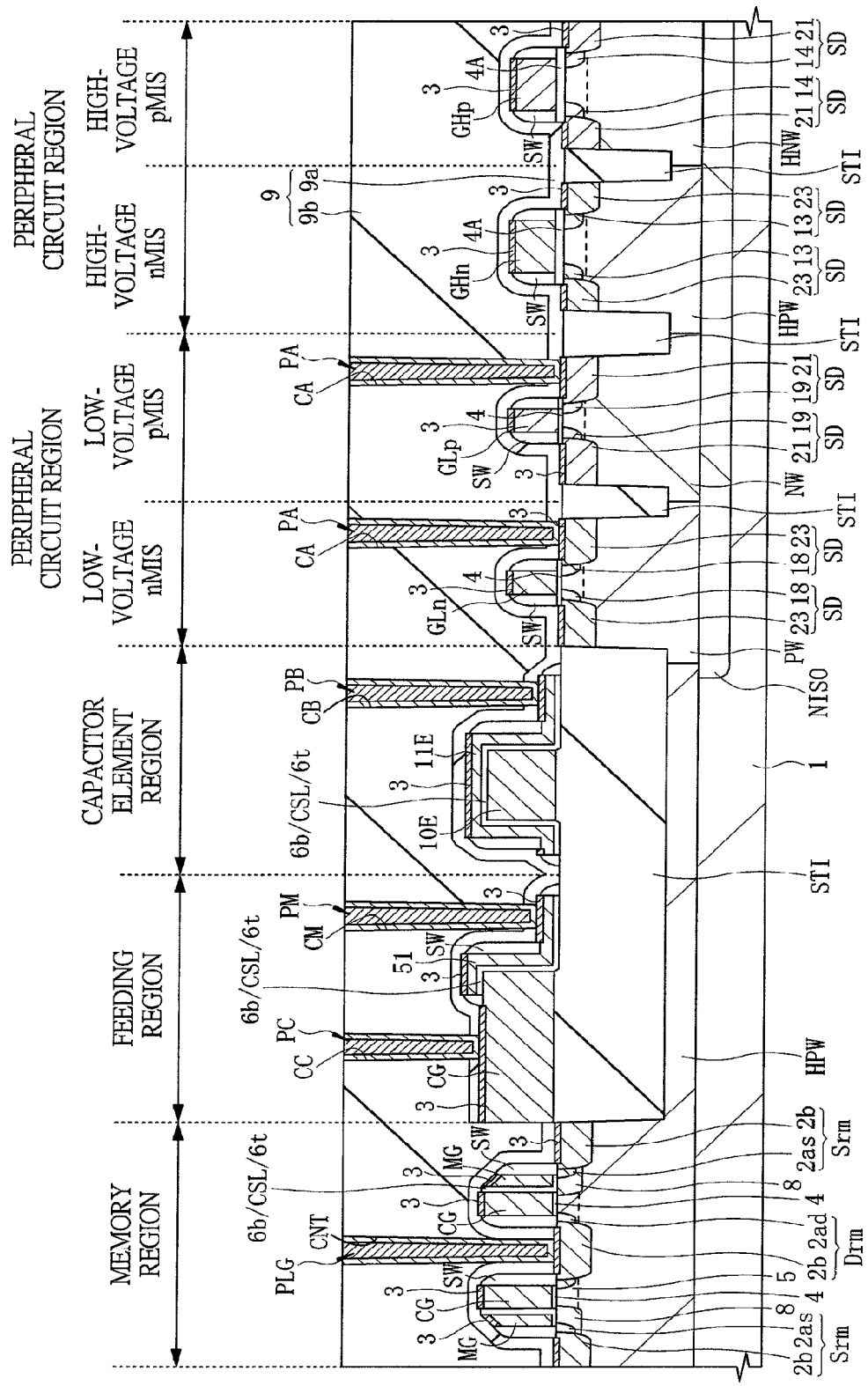

FIG. 127B is a cross-sectional view (cross-sectional view of a main part taken along the line C-C' of FIG. 127A) of the feeding region of the non-volatile memory cell which has been studied by the inventors of the present invention; and FIG. 128 is a cross-sectional view of a main part of a semiconductor device including a non-volatile semiconductor device which the inventors of the present invention.

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate or similar shapes and the like are included therein unless otherwise stated or except the case where it is conceivable that they are apparently excluded in principle. The same goes for the numerical value and the range mentioned above.

Also, in some drawings referenced in the embodiments, hatching is used even in a plan view to facilitate viewing of the drawings.

In the following embodiments, a metal insulator semiconductor field effect transistor (MISFET) representing a field effect transistor is abbreviated as "MIS", a p-channel type MISFET is abbreviated as "pMIS", and an n-channel type MISFET is abbreviated as "nMIS". It is needless to say that MONOS type memory cell also is a subordinate concept of the MIS. In the following embodiments, "silicon nitride" not only includes $Si_3N_4$ but also includes insulating films of nitride of silicon having similar compositions. In the following embodiments, the term "wafer" mainly indicates a silicon (Si) single-crystal wafer and it indicates not only the same but also a silicon-on-insulator (SOI) wafer, an insulating film substrate for forming an integrated circuit thereon, or the like.

The shape of the wafer includes not only a circular shape or a substantially circular shape but also a square shape, a rectangular shape, and the like.

Moreover, components having the same function are denoted by the same reference symbols throughout the drawings for describing the embodiment, and the repetitive description thereof will be omitted. Hereinafter, embodiments of the present invention will be described in detail with reference to the accompanying drawings.

First Embodiment

First, a non-volatile memory which has been studied by the inventors of the present invention will be described.

As a non-volatile memory which is electrically programmable/erasable, EEPROM (electrically erasable programmable read only memory) using polycrystalline silicon for its floating gate has been used. However, in the EEPROM having this structure, when there is a failure in only a part of its insulating film which surrounds the floating gate, all charges stored in a storage node may come out since a charge storage layer of the EEPROM is a conductor. Particularly, if the degree of integration is improved as miniaturization is advanced in the future, this problem would be more apparent.

Accordingly, in recent years, a MONOS type non-volatile memory cell using an insulating film having trap levels such as a nitride film as a charge storage layer has been attracting attention. In this case, charges which contribute to data storage are stored in discrete traps in a nitride film which is an insulator, and even when an abnormal leakage occurs as a failure occurs in a part somewhere in an insulating film surrounding a storage node, the whole of charges in the charge storage layer will not come out, and thus the reliability of data retention can be improved.

As the MONOS type non-volatile memory cell, a memory cell of a single transistor structure has been proposed. Since the memory cell of this structure is prone to be affected by disturb as compared with memory cells of the EEPROM, a memory cell of a split-gate structure having a two-transistor configuration, in which a select gate is provided, has been proposed.

However, in the MONOS type non-volatile memory cell of the split-gate structure has various technical problems described below. Note that the technical problems described below are not disclosed in background art such as Patent Documents 1 to 6 mentioned above, and the inventors of the present invention are the first ones who found out the technical problems.

An example of the MONOS type non-volatile memory cells of the split-gate structure is a memory cell in which a memory gate electrode in a sidewall shape is provided by self alignment. In this case, since an alignment margin in photolithography is not necessary and a gate length of the memory gate electrode formed in self alignment can be smaller than or equal to the minimum feature size of photolithography, more miniaturized memory cells can be achieved than the memory cells in which memory gate electrodes are formed using photoresist patterns.

When the memory gate electrode in a sidewall shape is used, electric application to the outside of the memory gate electrode is made by, as illustrated in FIGS. 127A and 127B, using a pad electrode 51 formed of a conductive film in the same layer as a memory gate electrode MG. That is, at the same time of forming the memory gate MG in a sidewall shape by self alignment on a sidewall of a select gate electrode CG, the pad electrode 51 is formed in a feeding region of the memory gate electrode MG by using a photoresist pattern.

The pad electrode 51 has a shape running over a part of the region of the select gate electrode CG in consideration of an alignment margin or a size variation margin of the memory gate electrode MG and the pad electrode 51.

After forming a memory cell, a MISFET (metal insulator semiconductor field effect transistor) in a peripheral circuit region, and a capacitor element, an interlayer insulating film 9 is formed on a main surface of a semiconductor substrate 1, and a thickness of the interlayer insulating film 9 is determined by an element having the largest height from the main surface of the semiconductor substrate 1. Generally, the select gate electrode CG or the gate electrode of the MISFET is the tallest on the main surface of the semiconductor substrate 1. Meanwhile, when the pad electrode 51 is formed by running over a partial region of the select gate electrode CG, the pad electrode 51 in the feeding region is the tallest from the main surface of the semiconductor substrate 1 as illustrated in FIG. 128.

Therefore, it is necessary to more thickly form the interlayer insulating film 9 in accordance with the height of the pad electrode 51, and along with that, a contact hole to be formed later is necessary to be deep. Particularly, when forming a contact hole reaching the main surface of the semiconductor substrate 1 (cf. FIG. 128), a diameter of an opening near the bottom of the contact hole is small, and thus a connection portion of a plug has a high resistance or no conduction when the plug is formed in a later step. In addition, when the interlayer insulating film 9 is thick, due to a lack of height of a photoresist pattern formed in an etching of the contact hole, a problem of a shape failure of the contact hole is expected to occur at an upper portion of the device, and this shape abnormality may cause a short-circuit failure among gate electrodes of adjacent MISFETs. Due to such a failure, manufacture yield of the semiconductor device is lowered.

Hereinafter, a first embodiment of the present invention will be described in detail with reference to FIG. 1.

Figure 2:
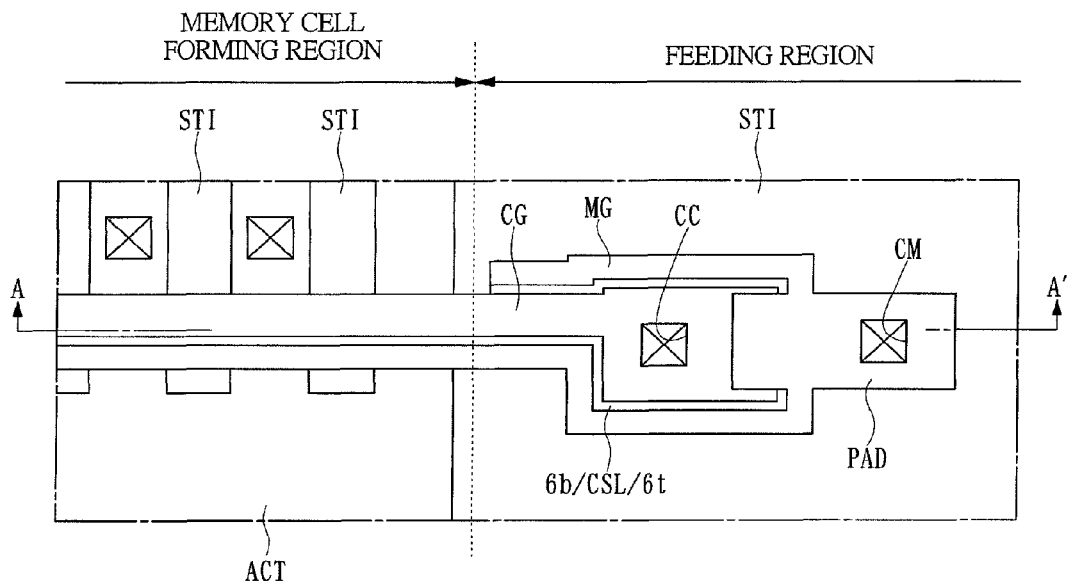
FIG. 2 is a plan view of a main part of a feeding region of a non-volatile memory cell according to the first embodiment of the present invention.
Figure 3:
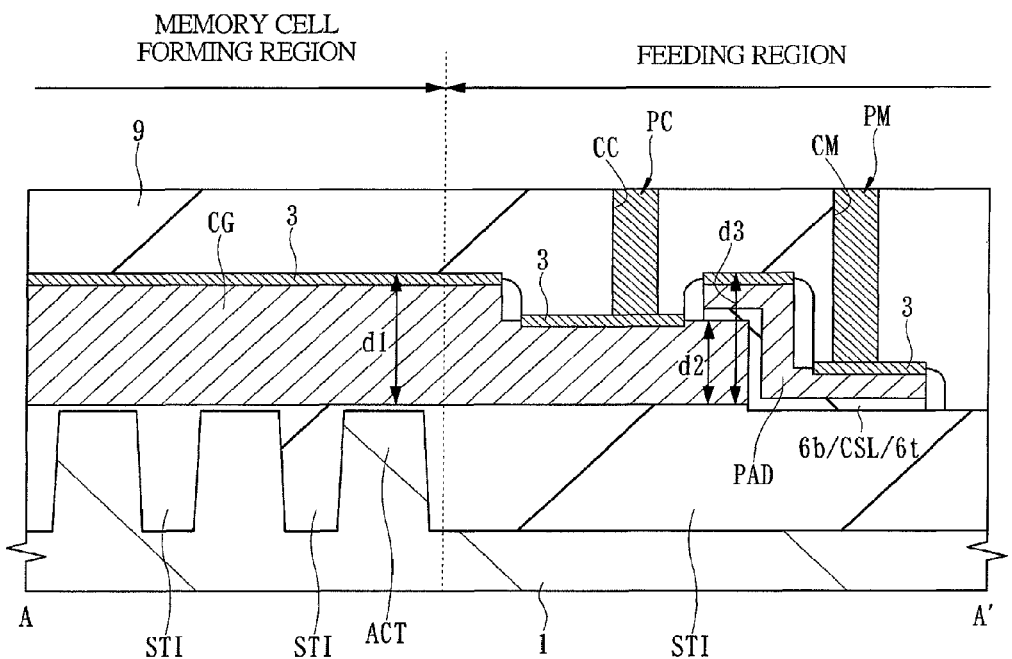
FIG. 3 is a cross-sectional view of a main part taken along the line A-A' of FIG. 2 (a cross-sectional view of a main part of a shunt portion of the memory gate electrode and a select gate electrode)

An example of a structure of a non-volatile memory cell according to the first embodiment of the present invention will be described with reference to FIG. 1, and an example of a structure in a feeding region of a memory gate electrode and a select gate electrode which form the non-volatile memory cell will be described with reference to FIGS. 2 and 3. FIG. 1 is a cross-sectional view of a main part of a channel of a non-volatile memory cell taken along a direction crossing a memory gate electrode, FIG. 2 is a plan view of a main part of the memory gate electrode and a select gate electrode in a feeding region, and FIG. 3 is a cross-sectional view of a main part taken along the line A-A' in FIG. 2. Here, a MONOS type non-volatile memory cell having a split-gate structure using a memory gate electrode in a sidewall shape is exemplified.

First, a structure of the non-volatile memory cell formed in a region (memory cell forming region, memory region) in which a plurality of memory cells are formed will be described with reference to FIG. 1.

Figure 1:
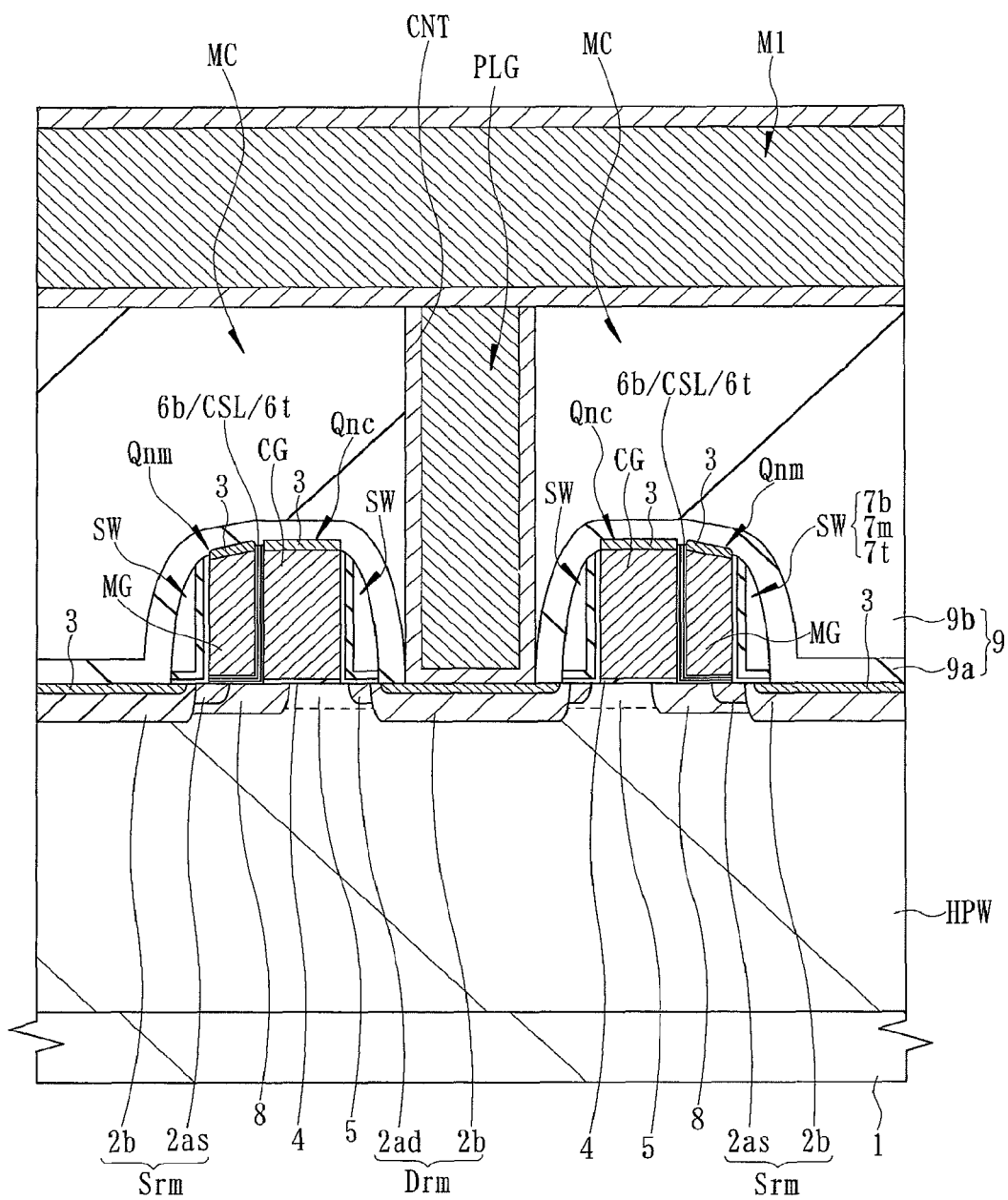
FIG. 1 is a cross-sectional view of a main part of a non-volatile memory cell according to a first embodiment of the present invention, cutting a channel along a direction crossing a memory gate electrode.

As illustrated in FIG. 1, a semiconductor substrate 1 is formed of, for example, p-type single crystal silicon, and a select nMIS (Qnc) and a memory nMIS (Qnm) of a memory cell MC are arranged in an active region of a main surface (device forming surface) of the semiconductor substrate 1. A drain region Drm of the memory cell MC includes an $n^-$-type semiconductor region $2ad$ having a comparatively low impurity concentration and an $n^+$-type semiconductor region $2b$ having a comparatively high impurity concentration higher than that of the $n^-$-type semiconductor region $2ad$ (LDD (lightly doped drain) structure). In addition, a source region Srm of the memory cell MC includes an $n^-$-type semiconductor region $2as$ having a comparatively low impurity concentration and an n+-type semiconductor region 2b having a comparatively high impurity concentration higher than that of the n−-type semiconductor region 2as (LDD structure). The n−-type semiconductor regions 2ad and 2as are arranged on a channel region side of the memory cell MC, and the n+-type semiconductor regions 2b are arranged at positions away from the channel region side of the memory cell MC by the n−-type semiconductor regions 2ad and 2as.

On the main surface of the semiconductor substrate between the drain region Drm and the source region Srm, a select gate electrode CG of the select nMIS (Qnc) and a memory gate electrode MG of the memory nMIS (Qnm) extend and be adjacent to each other, and the plurality of memory cells MC are adjacent to each other via device isolation portions STI (shallow trench isolation) formed to the semiconductor substrate 1 in the extending direction of the select gate electrode CG and the memory gate electrode MG (see FIGS. 2 and 3). The memory gate electrode MG is formed in a sidewall shape to one of sidewalls of the select gate electrode CG. The select gate electrode CG is formed of a first conductive film of, for example, n-type low-resistance polycrystalline silicon, and a gate length of the select gate electrode CG is, for example, about 80 to 120 nm. The memory gate electrode MG is formed of a second conductive film of, for example, n-type low-resistance polycrystalline silicon, and a gate length of the memory gate electrode MG is, for example, about 50 to 100 nm. In addition, a height of the select gate electrode CG from the main surface of the semiconductor substrate 1 is, for example, 150 to 250 nm.

Further, a silicide layer 3 such as nickel silicide (NiSi), cobalt silicide (CoSi$_2$), or the like is formed to upper surfaces of the select gate electrode CG and the memory gate electrode MG. A thickness of the silicide layer 3 is, for example, about 20 nm. In the non-volatile memory cells of split-gate structure, it is necessary to supply potential to both the select gate electrode CG and the memory gate electrode MG, and an operation speed of the memory cell largely depends on resistance values of the select gate electrode CG and the memory gate electrode MG. Thus, it is preferable to reduce the resistances of the select gate electrode CG and the memory gate electrode MG by forming the silicide layers 3. The silicide layer 3 described above is also formed to an upper surface of the n+-type semiconductor region 2b forming the source region Srm or the drain region Drm.

Between the select gate electrode CG and the main surface of the semiconductor substrate 1 (p-well HPW), a gate insulating film (first gate insulating film) 4 is provided. The gate insulating film 4 is formed of a first insulating film of, for example, a silicon oxide film or a high-dielectric-constant (high-k) film such as hafnium oxide (HfSiON), and a thickness of the gate insulating film 4 is, for example, about 1 to 5 nm.

To a main surface of the semiconductor substrate 1 (p-well HPW) under the gate insulating film 4, for example, boron is introduced so that a p-type semiconductor region 5 is formed. The p-type semiconductor region 5 is a semiconductor region for forming a channel of the select nMIS (Qnc), and a threshold voltage of the select nMIS (Qnc) is set to a predetermined value by the p-type semiconductor region 5.

The memory gate MG is provided to a side surface of the select gate electrode CG via a gate insulating film (second gate insulating film). The gate insulating film (second insulating film) which insulates the select gate electrode CG and the memory gate electrode MG is formed of a stacked film of an insulating film (fourth insulating film) 6b, a charge storage layer CSL, and an insulating film (fifth insulating film) 6t (hereinafter, mentioned as the insulating films 6b and 6t and the charge storage layer CSL). In addition, the memory gate electrode MG is arranged in a second region of the semiconductor substrate 1 via the insulating films 6b and 6t and the charge storage layer CSL. Note that, in FIG. 1, denotation of the insulating films 6b and 6t and the charge storage layer CSL is expressed as 6b/CSL/6t.

The charge storage layer CSL is formed of an insulating film having trap levels, for example, a silicon nitride film, and a thickness of the charge storage layer CSL is, for example, about 5 to 20 nm. The insulating film having trap levels is not limited to a silicon nitride film, and a high-dielectric-constant film having a higher dielectric constant than silicon nitride film such as an aluminum oxide film (alumina), a hafnium oxide film, a tantalum oxide film, or the like may be used. When using an insulating film having trap levels as the charge storage layer CSL, charges are trapped in the trap levels formed in the insulating film, thereby storing charges in the insulating film. The insulating films 6b and 6t are formed of, for example, silicon oxide, and a thickness of the insulating film 6b is, for example, about 1 to 10 nm, and a thickness of the insulating film 6t is, for example, 4 to 15 nm. The insulating films 6b and 6t can be formed of silicon oxide containing nitride.

A sidewall SW is formed to one side surface of the select gate electrode CG (a side surface opposite to the memory gate electrode MG, a side surface on the drain region Drm side) and to one side surface of the memory gate electrode MG (a side surface opposite to the select gate electrode CG, a side surface on the source region Srm side). The sidewall SW is formed of, as an insulating film, a stacked film of a silicon oxide film 7b, a silicon nitride film 7m, and a silicon oxide film 7t. A thickness of the silicon oxide film 7b is, for example, about 20 nm, that of the silicon nitride film 7m is, for example, about 25 nm, and that of the silicon oxide film 7t is, for example, about 50 nm.

An n-type semiconductor region 8 is formed by introducing, for example, arsenic or phosphorus into the semiconductor substrate 1 (p-well HPW) under the insulating film 6b and between the p-type semiconductor region 5 and the source region Srm. The n-type semiconductor region 8 is a semiconductor region for forming a channel of the memory nMIS (Qnm), and a threshold voltage of the memory nMIS (Qnm) is set to a predetermined value by the n-type semiconductor region 8.

The memory cell MC is covered by the interlayer insulating film 9, and a contact hole (third contact hole) CNT reaching the drain region Drm is formed to the interlayer insulating film 9. The interlayer insulating film 9 is formed of a third insulating film, and is formed of, as an insulating film, a stacked film of a silicon nitride film 9a and a silicon oxide film 9b. A first layer wiring M1 extending in a direction crossing the memory gate electrode MG (or the select gate electrode CG) is connected to the drain region Drm via a plug (third plug) PLG buried inside the contact hole CNT. The plug PLG is formed of a third conductive film, for example, a stacked film of: a comparatively thin barrier film formed of a stacked film of titanium and titanium nitride; and a comparatively thick conductive film formed of tungsten, aluminum, or the like formed to be wrapped by the barrier film.

Next, a structure of a shunt portion of the memory gate electrode MG and the select gate electrode CG formed in the feeding region will be described with reference to FIGS. 2 and 3.

As illustrated in FIGS. 2 and 3, the feeding region is arranged to be adjacent to the memory cell forming region, and the feeding region is formed on the device isolation portion STI. The memory cell forming region is a region in which memory cells are formed in an array, and the feeding region is a region for supplying voltage to the select gate electrode CG and the memory gate electrode MG. The select gate electrode CG formed in the memory cell forming region is terminated at the feeding region, and the memory gate electrode MG in a sidewall shape is formed to a sidewall of the select gate electrode CG via the insulating films 6b and 6t and the charge storage layer CSL.

In a shunt portion of the memory gate electrode MG (hereinafter, called an MG shunt region) formed in the feeding region, a pad electrode PAD formed of a second conductive film in the same layer of the memory gate electrode MG is formed, and the pad electrode PAD is formed by running over a partial region of a shunt region of the select gate electrode CG (hereinafter, called a CG shunt portion) formed in the feeding region. The pad electrode PAD is formed in the same step as a step of forming the memory gate electrode MG by self alignment on the sidewall of the select gate electrode CG, and the memory gate electrode MG in a sidewall shape and the pad electrode PAD are connected.

A contact hole (first contact hole) CM is formed to the interlayer insulating film 9 that is formed on the main surface of the semiconductor substrate 1, the contact hole CM reaching the silicide layer 3 that is formed on an upper surface of the pad electrode PAD. The pad electrode PAD is electrically connected to the first layer wiring M1 via a plug (first plug) PM formed of the third conductive film buried in the contact hole CM.

A height of the select gate electrode CG formed in the memory cell forming region from the main surface of the semiconductor substrate 1 to an upper surface of the select gate electrode CG is denoted by a first height d1. The CG shunt portion is formed of the select gate electrode CG having the first height d1 and the select gate electrode CG having a second height d2 that is smaller than the first height d1 from the main surface of the semiconductor substrate 1 to an upper surface of the select gate electrode CG. The select gate electrode CG having the first height d1 is formed by being connected to the select gate electrode CG having the first height d1 formed in the memory cell forming region. The select gate electrode CG having the second height d2 is formed at the termination portion of the CG shunt portion by being connected to the select gate electrode CG having the first height d1. The pad electrode PAD is formed by running over a partial region of the select gate electrode CG having the second height d2 of the CG shunt portion.

The feeding region is formed on the device isolation region STI. This is because, even when the contact hole CM penetrates through the pad electrode PAD and the insulating films 6b and 6t and the charge storage layer CSL upon forming the contact hole CM before forming the plug PM on the pad electrode PAD, causing an over etching reaching the main surface of the semiconductor substrate 1, the plug PM formed after forming the contact hole CM is prevented from being electrically connected to the semiconductor substrate 1. Since it is necessary to consider an alignment margin of an active region ACT and the CG shunt portion, at a boundary portion of the memory cell forming region and the CG shunt portion in the feeding region, the select gate electrode CG having the first height d1, which is connected to the select gate electrode CG in the memory cell forming region, is formed in addition to the select gate electrode CG having the second height d2 on the termination portion side.

In this manner, according to the first embodiment, in the feeding region, the pad electrode PAD is formed to run over the partial region of the select gate electrode CG having the second height d2 that is smaller than the first height d1, and thus a third height third height d3, which is a height from the main surface of the semiconductor substrate 1 to an upper surface of the pad electrode PAD running over the partial region of the select gate electrode CG of the CG shunt portion, is smaller than that in the case of forming the pad electrode PAD running over the select gate electrode CG having the first height d1 (see FIG. 127). In this manner, effects described hereinafter can be attained.

After forming a memory cell and a capacitor element and then forming a MISFET in a peripheral circuit region, the interlayer insulating film 9 is formed on the main surface of the semiconductor substrate 1. A thickness of the interlayer insulating film 9 is determined by an element having the largest height from the main surface of the semiconductor substrate 1. This is because a margin is ensured, the margin with respect to variations in a polishing amount upon planarizing the third insulating film by polishing using a CMP (chemical mechanical polishing) method after depositing the third insulating film for forming the interlayer insulating film 9. By ensuring the thickness of the interlayer insulating film 9 formed on an element having the largest height from the main surface of the semiconductor substrate 1, a problem that a surface of the element is also polished due to variations in the polishing amount upon polishing using a CMP method is avoided. Generally, an element having the largest height from the main surface of the semiconductor substrate 1 is the select gate electrode CG of the memory cell or the gate electrode of the MISFET in the peripheral circuit region. Meanwhile, when forming the pad electrode PAD running over the partial region of the select gate electrode CG, the part of the pad electrode PAD running over the select gate electrode CG is the element having the largest height from the semiconductor substrate 1.

However, in the first embodiment, as described above, a part of the select gate electrode CG formed in the feeding region is formed to have the second height d2 with respect to the select gate electrode CG having the first height d1 formed in the memory cell forming region, and the pad electrode PAD is formed to run over the partial region of the select gate electrode CG having the second height second height d2, and thus the third height third height d3 can be small. Thus, the margin can be ensured without thickly forming the thickness of the interlayer insulating film 9 to be formed thereafter. Therefore, a depth of a contact hole to be formed thereafter will not be deep, thereby ensuring an opening diameter near a bottom of the contact hole. By ensuring the opening diameter near the bottom of the contact hole, a high resistance occurring between the plug formed by burying a conductive film in the contact hole and a connection portion or no conduction can be prevented. In addition, the interlayer insulating film 9 is not necessarily formed thickly, it is possible to prevent a shape failure occurring in the pad electrode PAD due to a lack of thickness of a photoresist pattern upon an etching for forming the contact hole.

Herein, conditions of the first height d1, the second height d2, and the third height d3 for attaining the above-described effects will be considered. When the pad electrode PAD is formed to run over the select gate electrode CG in the feeding region, a surface portion of the silicide layer 3 formed to the upper surface of the pad electrode PAD becomes the highest portion from the main surface of the semiconductor substrate 1. As described above, it is sufficient as long as the height of the element to be the largest from the main surface of the semiconductor substrate 1 can be reduced, the above-described effects are attained when d1>d2. Also, when a relation of d1≥d3 is satisfied while the relation of d1>d2 is satisfied, it is more preferable because the height from the main surface of the semiconductor substrate 1 will not be increased than that before forming the pad electrode PAD even when the pad electrode PAD is formed.

As illustrated in FIGS. 2 and 3, the pad electrode PAD is formed by stretching the second conductive film in the same layer as the memory gate electrode MG in the same direction as the select gate electrode CG. Meanwhile, the shape of the pad electrode PAD in the first embodiment is not limited to the type of extending the pad electrode PAD in the same direction as the select gate electrode CG, and the pad electrode PAD can be formed to extend in a direction crossing a direction in which the select gate electrode CG extends.

Figure 4:
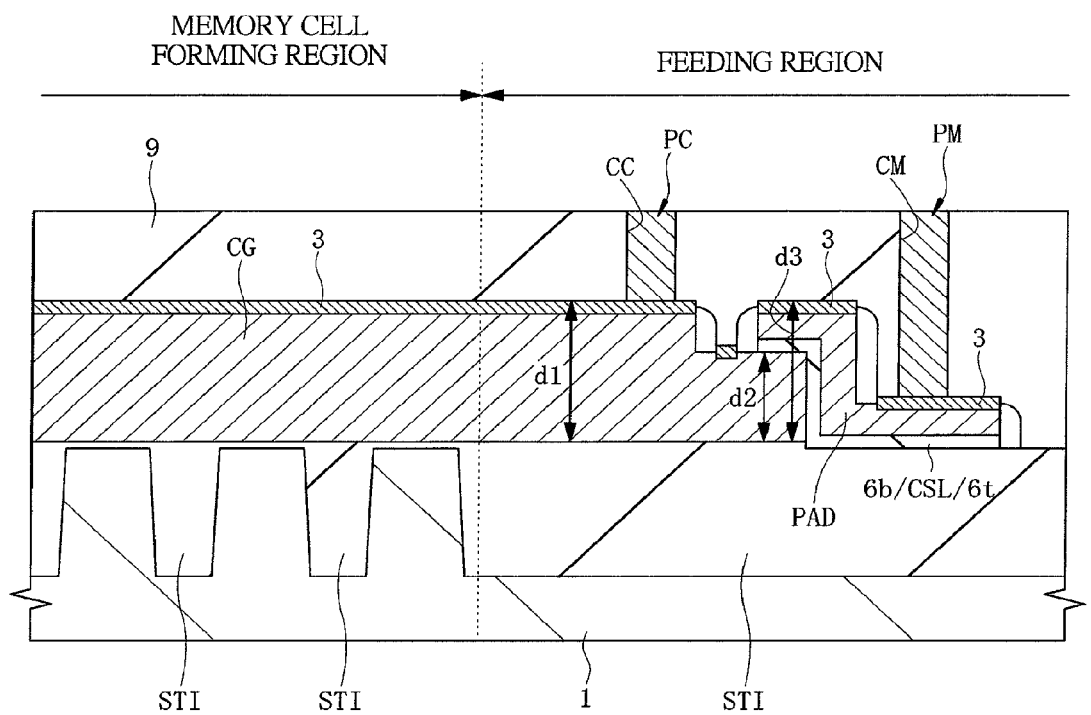
FIG. 4 is a cross-sectional view of a main part illustrating a first modification example of the feeding region of the non-volatile memory cell according to the first embodiment of the present invention.

Next, a first modification example of the feeding region according to the first embodiment will be described with reference to a cross-sectional view of a main part of the feeding region illustrated in FIG. 4.

In the CG shunt portion in the feeding region described above with reference to FIGS. 2 and 3, the thickness of the select gate electrode CG is set to the second height d2 through the whole region of the CG shunt portion except for the boundary portion of the memory cell region and the CG shunt portion, and a contact hole CC is formed to reach the silicide layer 3 formed on the upper surface of the select gate electrode CG in the CG shunt portion having the second height d2. Meanwhile, in the first modification example of the feeding region illustrated in FIG. 4, the select gate electrode CG having the second height d2 and the select gate electrode CG having the first height d1 are formed in the CG shunt portion, and the pad electrode PAD is formed by running over the partial region of the select gate electrode CG of the CG shunt portion having the second height d2, and the contact hole CC is formed to reach the silicide layer 3 formed to the upper surface of the select gate electrode CG of the CG shunt portion having the first height d1.

When forming the contact hole CC reaching the select gate electrode CG of the shunt portion having the second height d2 (see FIGS. 2 and 3), a depth of the contact hole CC is close to that of other contact holes, and thus a size shift amount can be suppressed, and the contact hole CC having a diameter substantially close to a set size can be formed.

As compared to that, in the first modification example of forming the contact hole CC reaching the select gate electrode CG of the CG shunt portion having the first height d1, the diameter of the contact hole CC tends to be larger than that of other contact holes. Therefore, in consideration of an alignment margin of the contact hole CC and the select gate electrode CG of the CG shunt portion, it is necessary to make the layout of the select gate electrode CG of the CG shunt portion large. However, when the diameter of the contact hole CC is large, a connection resistance of a plug PC buried inside the contact hole CC and the silicide layer 3 formed to the upper surface of the select gate electrode CG can be small.

Figure 5:
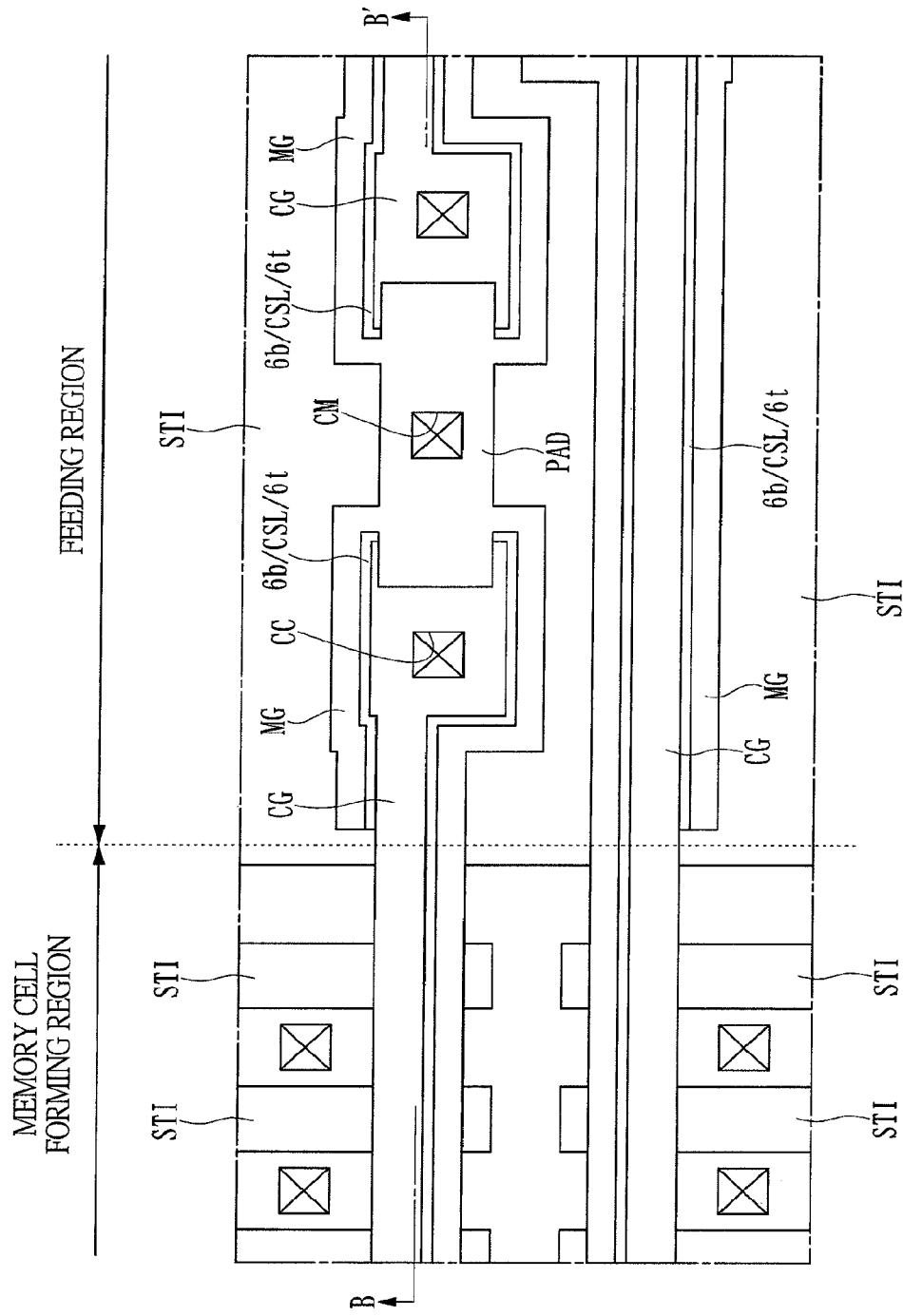
FIG. 5 is a cross-sectional view of a main part illustrating a second modification example of the feeding region of the non-volatile memory cell according to the first embodiment of the present invention.
Figure 6:
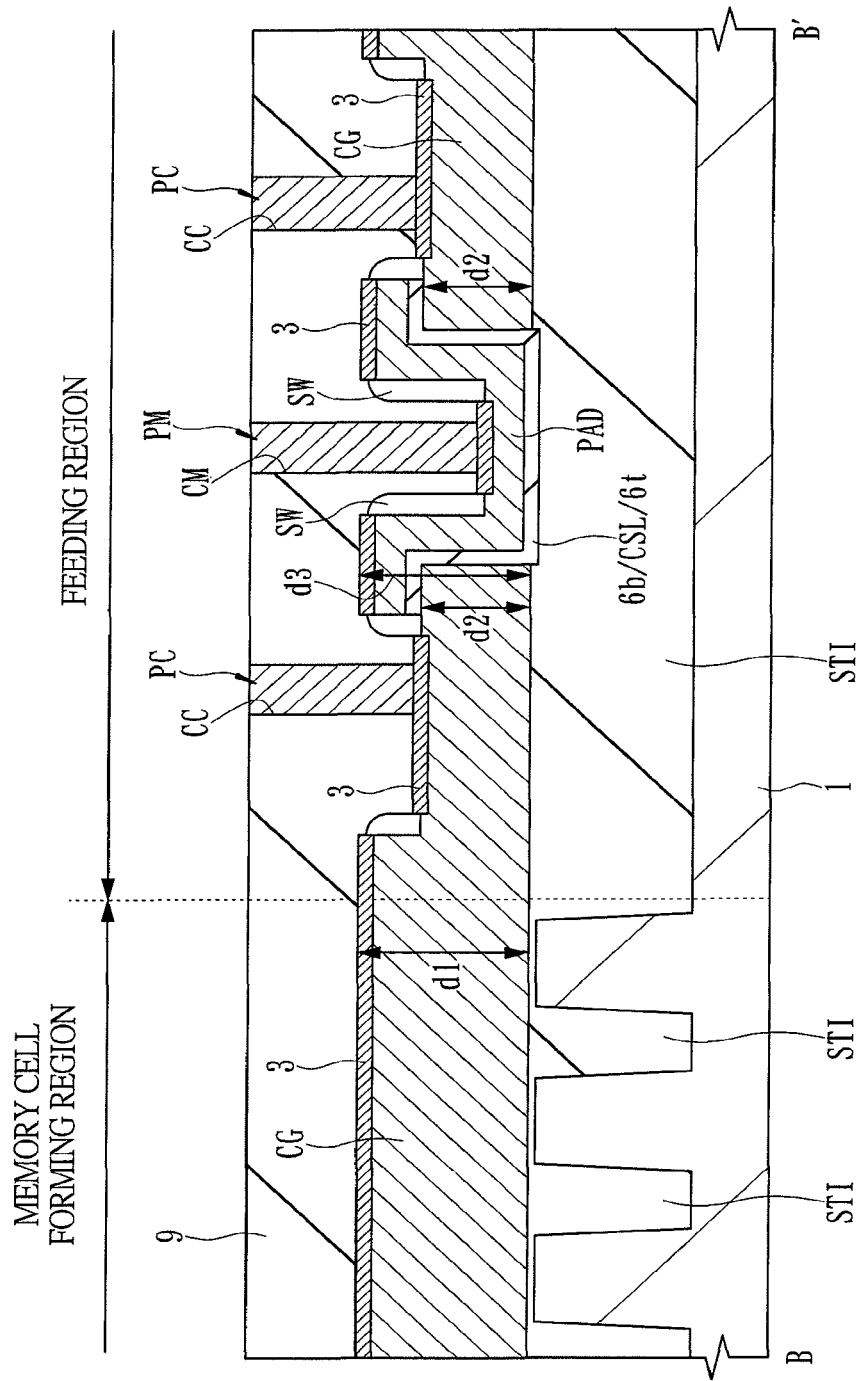
FIG. 6 is a cross-sectional view of a main part taken along the line B-B' of FIG. 5 (a cross-sectional view of a main part of a shunt portion of the memory gate electrode and the select gate electrode)

A second modification example of the feeding region according to the first embodiment will be described with reference to FIGS. 5 and 6. FIG. 5 is a plan view describing the second modification example of the feeding region, and FIG. 6 is a cross-sectional view of a main part taken along the line B-B' in FIG. 5 (cross-sectional view of a main part of the memory gate electrode MG and the shunt portion of the select gate electrode CG). In the second modification example of the feeding region, using the present invention to one feeding region shared by two memory cell forming regions will be described.

For example, the first memory cell forming region and the second memory cell forming region are arranged next to each other, and the feeding region is arranged to be sandwiched between the first memory cell forming region and the second memory cell forming region. Note that, in FIGS. 5 and 6, only one of the first and second memory cell forming regions is illustrated. The feeding region is formed on the device isolation portion STI. The first and second memory cell forming regions are regions in which memory cells are formed in an array, and the feeding region is a region of supplying voltage to the first memory cell forming region and the second memory cell forming region. The select gate electrode CG of the first memory cell forming region and the select gate electrode CG of the second memory cell forming region terminate at the feeding region, and the termination portion of the select gate electrode CG formed in the first memory cell forming region and the termination portion of the select gate electrode CG formed in the second memory cell forming region are arranged in the same straight line. On a sidewall of the select gate electrode CG, the memory gate MG in a sidewall shape is formed via the insulating films 6b and 6t and the charge storage layer CSL.

At the MG shunt portion formed in the feeding region, the pad electrode PAD formed of the second conductive film in the same layer as the memory gate electrode MG is formed by running over both: a partial region of a first CG shunt portion (termination portion of the select gate electrode CG in the first memory cell forming region) having the second height d2 and formed in the feeding region; and a partial region of a second CG shunt portion (termination portion of the select gate electrode CG in the second memory cell forming region) having the second height d2. The pad electrode PAD is formed in the same step of forming the memory gate electrode MG by self alignment to the sidewall of the select gate electrode CG, and the memory gate electrode MG in the sidewall shape and the pad electrode PAD are connected. Therefore, via the pad electrode PAD, the memory gate electrode MG formed to the sidewall of the select gate electrode CG off the first memory cell forming region and the memory gate electrode MG formed to the sidewall of the select gate electrode CG of the second memory cell forming region are electrically connected.

To the interlayer insulating film 9 formed on the main surface of the semiconductor substrate 1, a contact hole CM reaching the silicide layer 3 formed to the upper surface of the pad electrode PAD is formed, and the pad electrode PAD is electrically connected to the first layer wiring via a plug PM formed of the third conductive film buried in the contact hole CM. Here, as illustrated in FIG. 6, sidewalls SW are formed to sidewalls of the pad electrode PAD. Thus, when the distance between the first CG shunt portion and the second CG shunt portion is too short, the region for forming the contact hole CM is filled by the sidewall SW. In this case, an insulating film (omitted in FIG. 6), which works as an etching stopper film upon forming the contact hole CM, is further formed on the sidewalls SW, and thus it is difficult to form the contact hole CM as desired. Therefore, it is necessary to set the distance between the first CG shunt portion and the second CG shunt portion so that the region for forming the contact hole CM is ensured even when the sidewalls SW are formed.

Further, in the same manner as the feeding region described above with reference to FIGS. 2 and 3, the second height d2 from the main surface of the semiconductor substrate 1 to the upper surface of the select gate electrodes CG of the first and second CG shunt portions, over which the pad electrode PAD running, is formed to be lower than the first height d1 from the main surface of the semiconductor substrate 1 to the upper surface of the select gate electrode CG of the memory cell forming region.

In this manner, also in the feeding region shared by the two memory cell forming regions, the relationship of d1>d2 is satisfied, and thus the third height d3 can be small and it is not necessary to thickly form the interlayer insulating film 9. According to the foregoing, as described with reference to FIGS. 2 and 3, a high resistance and no conduction at the bottom of the plug or a shape failure of the pad electrode PAD can be prevented.

Further, when forming a pad electrode PAD as that of the second modification example, to form a photoresist pattern upon processing the second conductive film which forms the pad electrode PAD, the photolithography can focus on the second conductive film running over the first CG shunt portion and the second CG shunt portion. Therefore, since there is no bump upon focusing of the photolithography, accuracy of the photolithography is improved and a shape failure of the pad electrode PAD formed by processing the second conductive film can be prevented.

Figure 7:
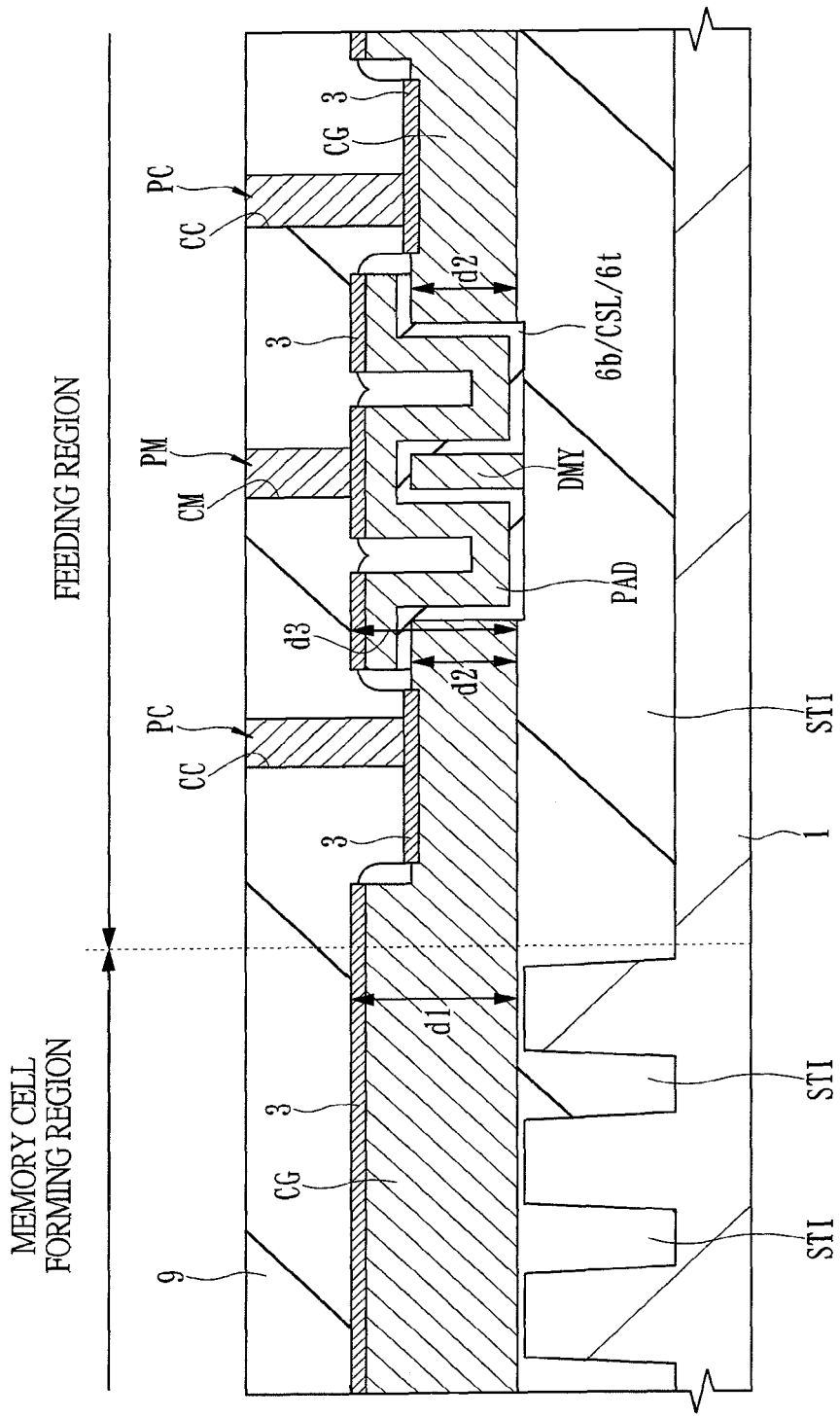
FIG. 7 is cross-sectional view of a main part illustrating a third modification example of the feeding region of the non-volatile memory cell according to the first embodiment of the present invention.

A third modification example according to the first embodiment will be described with reference to a cross-sectional view of the feeding region illustrated in FIG. 7. The third modification example of the feeding region is, in the same manner as the feeding region of the second modification example, a feeding region shared by two memory cell forming regions. Meanwhile, in the feeding region, a dummy portion DMY is formed between the first CG shunt portion (termination portion of the select gate electrode CG in the first memory cell forming region) and the second CG shunt portion (termination portion of the select gate electrode CG of the second memory cell forming region). And, the termination portion of the select gate electrode CG in the first memory cell forming region, the dummy portion DMY, and the termination portion of the select gate electrode CG in the second memory cell forming region are arranged in the same straight line.

While the dummy portion DMY is formed by the second conductive film in the same layer as the select gate electrode CG, the dummy portion DMY is not electrically connected to the select gate electrode CG of the first CG shunt portion or the select gate electrode CG of the second CG shunt portion and is spaced apart from the select gate electrode CG of the first CG shunt portion or the select gate electrode CG of the second CG shunt portion. A height from the main surface of the semiconductor substrate 1 to an upper surface of the dummy portion DMY is substantially the same as the second height d2 of the select gate electrodes CG of the first and second CG shunt portions from the main surface of the semiconductor substrate 1 to the upper surface of the select gate electrode CG.

In addition, in the same manner as the feeding region described above with reference to FIGS. 5 and 6, the second height d2 from the main surface of the semiconductor substrate 1 to the upper surface of the select gate electrode CG of the first and second shunt portions over which the pad electrode PAD is running is formed to be lower than the first height d1 from the main surface of the semiconductor substrate 1 to the upper surface of the select gate electrode CG of the memory forming region.

At the MG shunt portion formed in the feeding region, the pad electrode PAD, which is formed of the second conductive film in the same layer as the memory gate electrode MG, runs over the select gate electrode CG of the first CG shunt portion, the dummy portion DMY, and the select gate electrode CG of the second CG shunt portion. In addition, the contact hole CM reaching the silicide layer that is formed to the upper surface of the pad electrode PAD is formed to the interlayer insulating film 9 formed on the main surface of the semiconductor substrate 1. The contact hole CM is formed to reach the silicide layer 3 formed to the upper surface of the pad electrode PAD on the dummy portion DMY.

In this manner, also when the dummy portion DMY is arranged between the first CG shunt portion and the second CG shunt portion, the relationship of d1>d2 is satisfied in the feeding region shared by the two memory cell forming regions, and, the height from the main surface of the semiconductor substrate 1 to the upper surface of the dummy portion DMY is also substantially the same as the second height d2 being smaller than the first height d1, and thus the third height d3 can be small and it is not necessary to thickly form the interlayer insulating film 9. Accordingly, a high resistance and no conduction at the bottom surface of the plug or a shape failure of the dummy portion DMY can be prevented. In addition to that, in the third modification example, by forming the contact hole CM reaching the silicide layer 3 that is formed to the upper surface of the pad electrode PAD on the dummy portion DMY, the diameter of the contact hole CM can be large, and thus a contact resistance between the plug PM buried inside the contact hole CM and the silicide layer 3 formed to the upper surface of the pad electrode PAD can be small.

Further, in the same manner as the second modification example, to form a pad electrode PAD as that of the third modification example, the photolithography can focus on the second conductive film running over the first CG shunt portion and the second CG shunt portion to form a photoresist pattern upon processing the second conductive film which forms the pad electrode PAD. Therefore, since there is no bump upon focusing of the photolithography, accuracy of the focus in the photolithography is improved, and a shape failure of the pad electrode PAD formed by processing the second conductive film can be prevented.

Next, an example of a method of manufacturing a semiconductor device including a non-volatile memory cell according to the first embodiment will be described in the order of steps with reference to FIGS. 8 to 26. FIGS. 8 to 26 are cross-sectional views of: a memory region; a feeding region (MG shunt portion and CG shunt portion); a capacitor element region; and a peripheral circuit region (low-voltage nMIS region, low-voltage pMIS region, high-voltage nMIS region, and high-voltage pMIS region) during a manufacturing process of the semiconductor device. As to the memory region and the peripheral circuit region, cross-sectional views in a gate-length direction are illustrated, and, as to the feeding region, in the same manner as FIGS. 2 and 3, cross-sectional views in a direction perpendicular to the gate-length direction are illustrated. MISFETs formed in the peripheral circuit region constitute processors of CPU etc., logic circuits, input/output circuits, peripheral circuits of memories such as decoders and sense amplifiers, booster circuits, and so forth.

Figure 8:
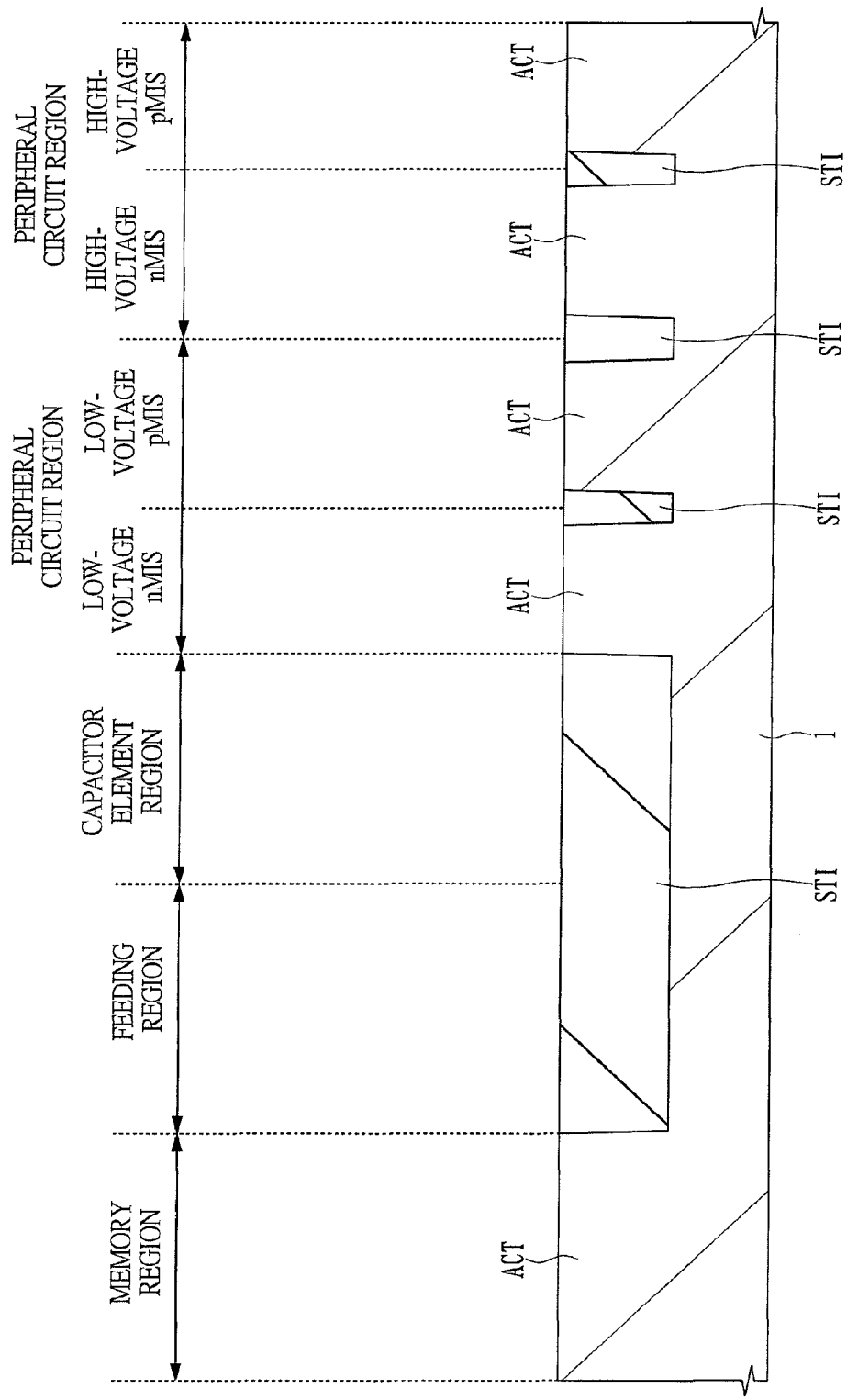
FIG. 8 is a cross-sectional view of a main part illustrating a manufacturing process of a semiconductor device including the non-volatile memory cell according to the first embodiment of the present invention.

First, as illustrated in FIG. 8, to the main surface of the semiconductor substrate (at this stage, a thin plate of a semiconductor in a plane and substantially circular shape, called semiconductor wafer) 1, for example, the device isolation portions STI in a groove shape and active regions ACT arranged to be surrounded by the device isolation portions STI are formed. More specifically, after forming isolation grooves to predetermined portions of the semiconductor substrate 1, an insulating film such as silicon oxide is deposited on the main surface of the semiconductor substrate 1, and further, the insulating film is polished by a CMP method or the like so that the insulating film is left only in the isolation grooves, thereby burying the insulating film inside the isolation grooves. In this manner, the device isolation portions STI are formed. The device isolation portions STI are also formed to the semiconductor substrate 1 in the feeding region and the capacitor element region.

Figure 9:
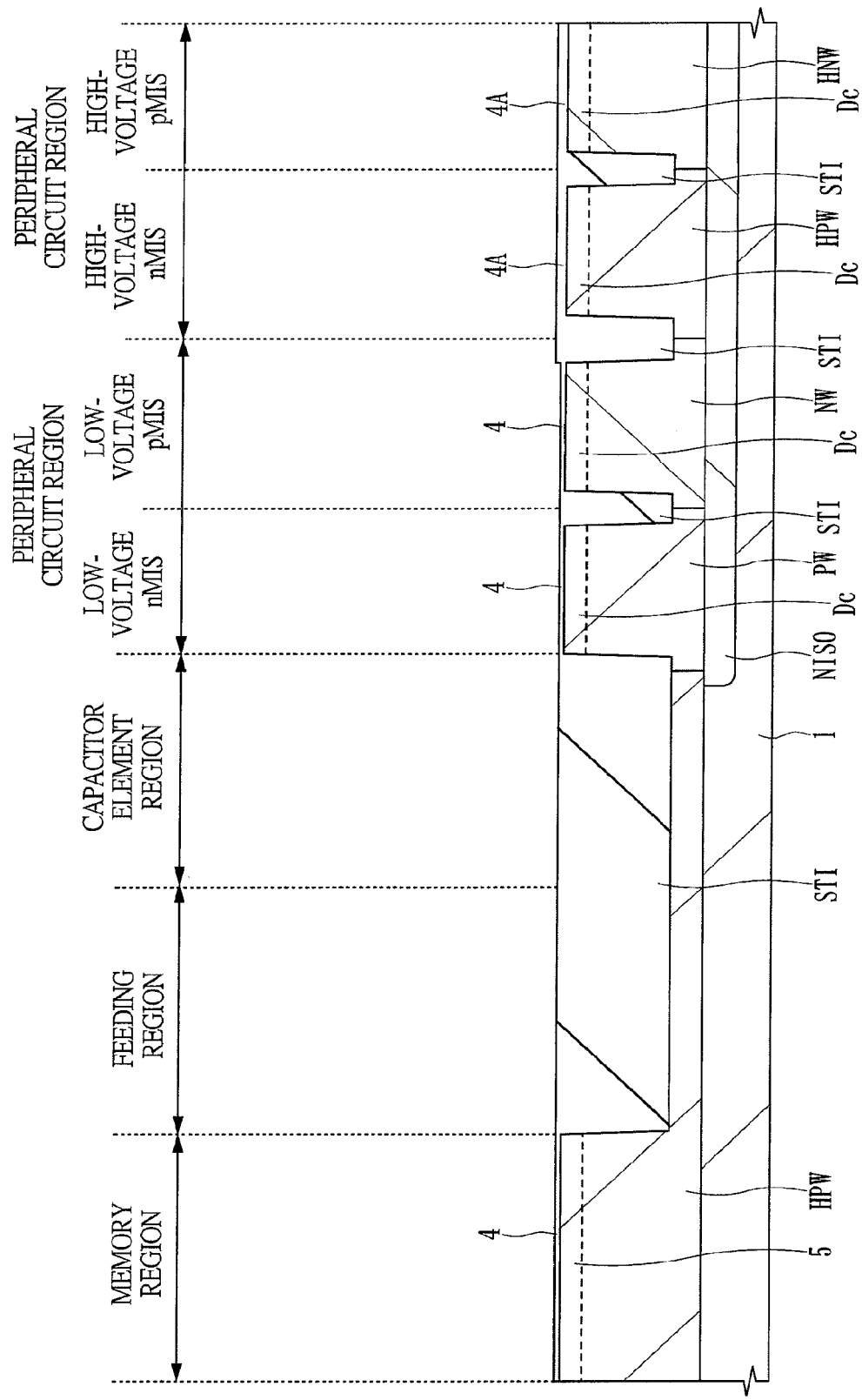
FIG. 9 is a cross-sectional view of the semiconductor device including the non-volatile memory cell in the same portion as FIG. 8 during the manufacturing process of the semiconductor device continued from FIG. 8.

Next, as illustrated in FIG. 9, an n-type impurity is selectively ion-implanted into the semiconductor substrate 1 in the peripheral circuit region, thereby forming a buried n-well NISO. Subsequently, a p-type impurity is selectively ion-implanted into the semiconductor substrate 1 in the memory region and the high-voltage nMIS region, thereby forming the p-well HPW; and an n-type impurity is selectively ion-implanted into the semiconductor substrate 1 in the high-voltage pMIS region, thereby forming the n-well HNW. In the same manner, a p-type impurity is selectively ion-implanted into the semiconductor substrate 1 in the low-voltage nMIS region, thereby forming a p-well PW; and an n-type impurity is selectively ion-implanted into the semiconductor substrate 1 in the low-voltage pMIS region, thereby forming an n-well NW.

Next, a p-type impurity, for example, boron is selectively ion-implanted into the semiconductor substrate 1 in the memory region. In this manner, to the semiconductor substrate 1 in the memory region, a semiconductor region 5 of p-type for channel formation of the select nMIS (Qnc) is formed. In the same manner, a predetermined impurity is ion-implanted into the semiconductor substrate 1 in each of the low-voltage nMIS region, low-voltage pMIS region, high-voltage nMIS region, and high-voltage pMIS region of the peripheral circuit region, respectively. In this manner, semiconductor region Dc for channel formation is formed to the semiconductor substrate 1 in each of low-voltage nMIS region, low-voltage pMIS region, high-voltage nMIS region, and high-voltage pMIS region of the peripheral circuit region.

Next, by performing an oxidation processing on the semiconductor substrate 1, a gate insulating film 4A formed of, for example, silicon oxide and having a thickness of about 20 nm is formed to the main surface of the semiconductor substrate 1. Subsequently, after removing the gate insulating films 4A in the memory region, low-voltage nMIS region, and low-voltage pMIS region, an oxidation processing is performed to the semiconductor substrate 1. In this manner, a gate insulating film (first gate insulating film) 4 formed of, for example, silicon oxide and having a thickness of about 1 to 5 nm is formed as an insulating film to the main surface of the semiconductor substrate 1. At the same time, the gate insulating film (third gate insulating film) 4 formed of, for example, silicon oxide and having a thickness of about 1 to 5 nm is formed as an insulating film to the main surface of the semiconductor substrate 1 in the low-voltage nMIS region and low-voltage pMIS region. The gate insulating film 4 is not limited to silicon oxide, and it may be formed of a high-dielectric-constant film of, for example, hafnium oxide (HfSiON).

Figure 10:
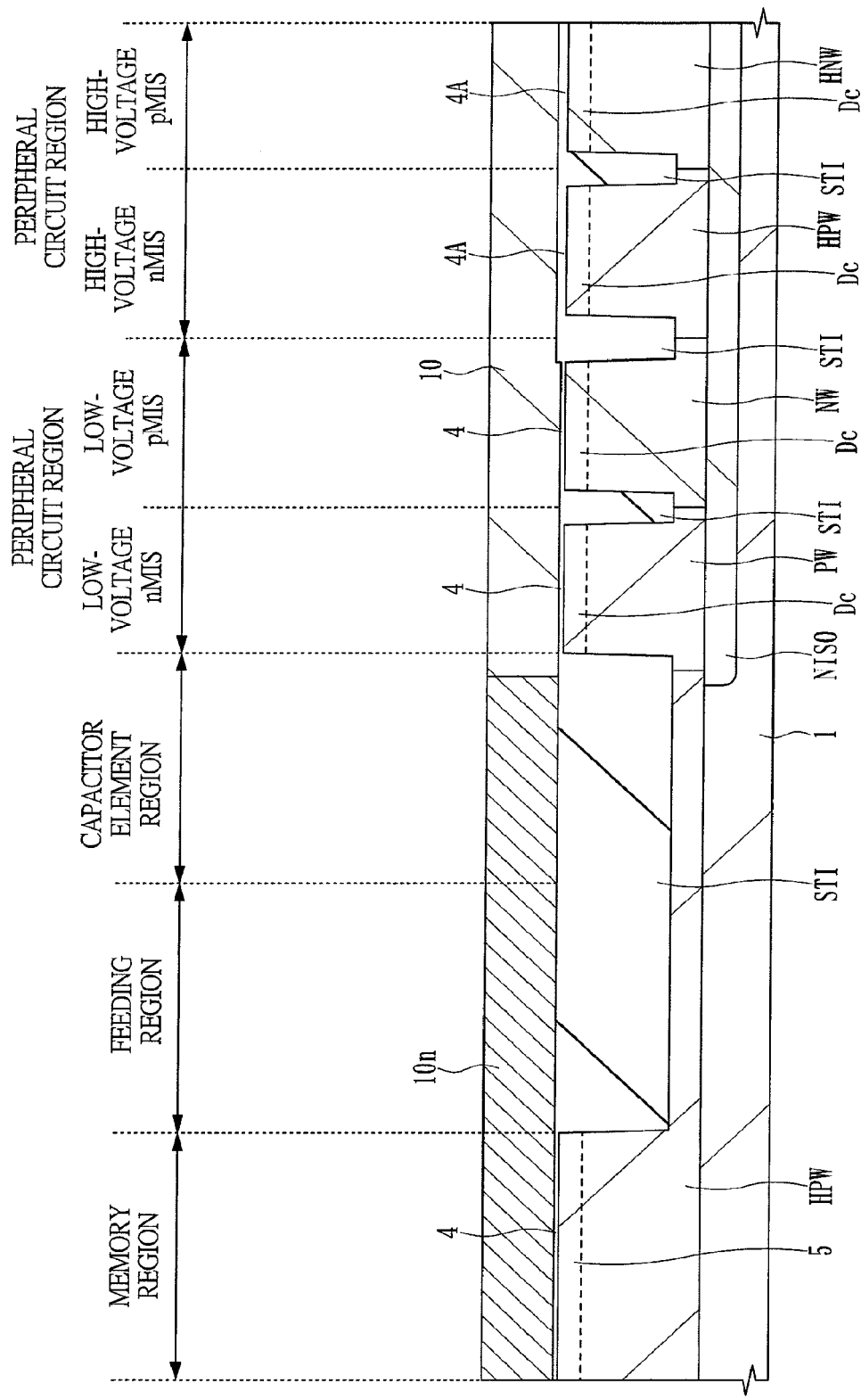
FIG. 10 is a cross-sectional view of the semiconductor device including the non-volatile memory cell in the same portion as FIG. 8 during the manufacturing process of the semiconductor device continued from FIG. 9.

Next, as illustrated in FIG. 10, after depositing a conductive film 10 formed of, for example, amorphous silicon to the main surface of the semiconductor substrate 1 by a CVD (chemical vapor deposition) method, an n-type impurity is introduced into the conductive film 10 in the memory region, feeding region, and capacitor element region by an ion implantation method or the like, thereby forming an n-type conductive film (first conductive film) $10n$. Thicknesses of the conductive films 10 and $10n$ are, for example, about 140 nm.

Figure 11:
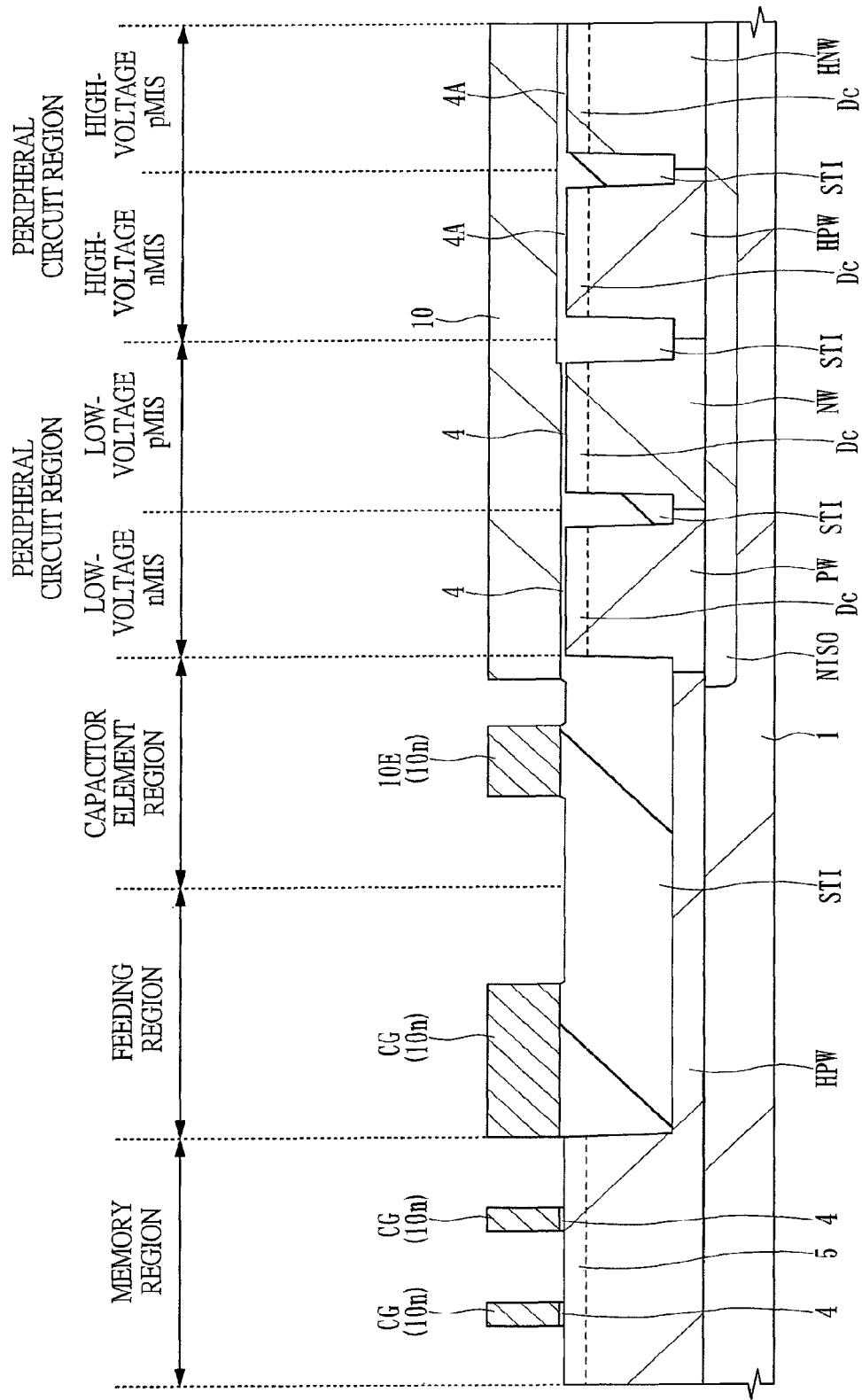
FIG. 11 is a cross-sectional view of the semiconductor device including the non-volatile memory cell in the same portion as FIG. 8 during the manufacturing process of the semiconductor device continued from FIG. 10.

Next, as illustrated in FIG. 11, the n-type conductive film $10n$ in the memory region, feeding region, and capacitor element region is patterned by lithography technology and dry-etching technology. In this manner, to the memory region and the feeding region, the select gate electrodes CG of the select nMIS (Qnc) formed of the n-type conductive films $10n$ are formed. A gate length of the select gate electrode CG in the memory region is, for example, about 100 nm. At the same time, a bottom electrode 10E formed of the n-type conductive film $10n$ is formed in the capacitor element region.

Figure 12:
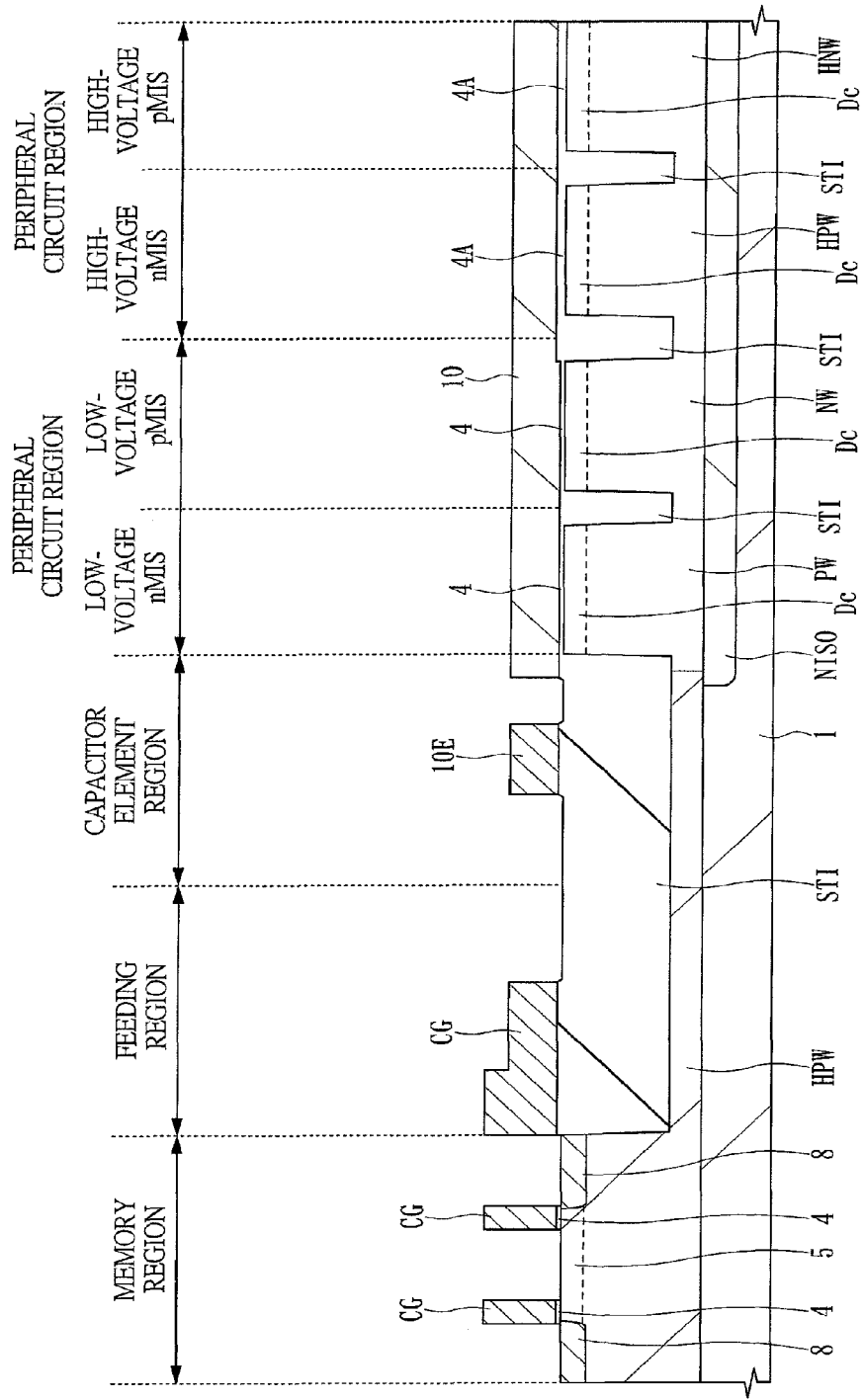
FIG. 12 is a cross-sectional view of the semiconductor device including the non-volatile memory cell in the same portion as FIG. 8 during the manufacturing process of the semiconductor device continued from FIG. 11.

Next, as illustrated in FIG. 12, by using photolithography and dry etching, the n-type conductive films $10n$ in the CG shunt portion in the feeding region and the capacitor element region, and the conductive film 10 in the peripheral circuit region are thinned to a predetermined thickness (second height d2).

Next, using the select gate electrode CG of the select nMIS (Qnc) and a photoresist pattern as masks, an n-type impurity, for example, arsenic or phosphorus is ion-implanted into the main surface of the semiconductor substrate 1 in the memory region, thereby forming the n-type semiconductor region 8 for channel formation of the memory nMIS (Qnm).

Figure 13:
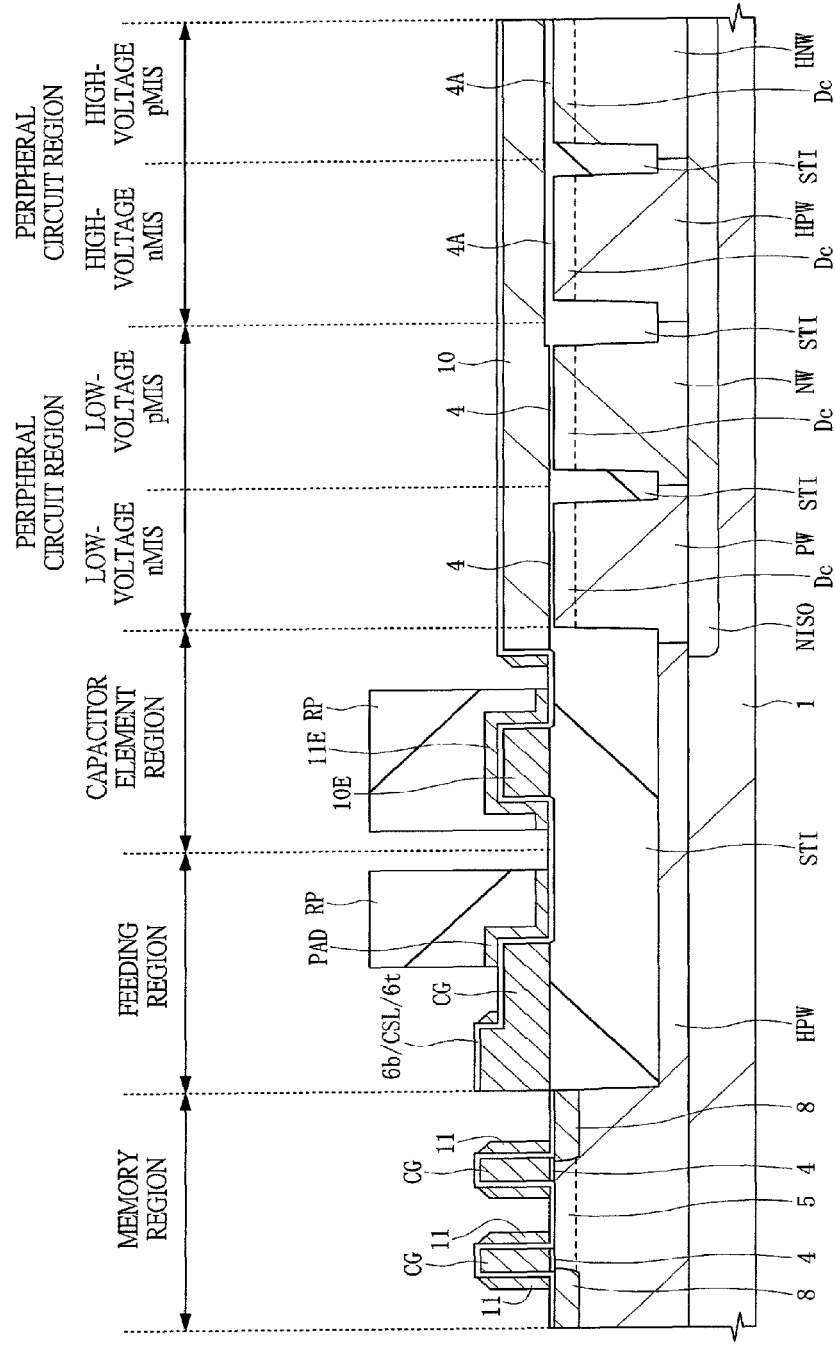
FIG. 13 is a cross-sectional view of the semiconductor device including the non-volatile memory cell in the same portion as FIG. 8 during the manufacturing process of the semiconductor device continued from FIG. 12.

Next, as illustrated in FIG. 13, on the main surface of the semiconductor substrate 1, the insulating film $6b$ formed of, for example, silicon oxide as an insulating film, the charge storage layer CSL formed of, for example, silicon nitride as an insulating film having trap levels, and the insulating film $6t$ formed of, for example, silicon oxide as an insulating film are formed in series. The insulating film $6b$ is formed by, for example, a thermal oxidation method or an ISSG (in-situ steam generation) oxidation method, the charge storage layer CSL is formed by, for example, a CVD method, and the insulating film $6t$ is formed by, for example, a CVD method or an ISSG method. An example of a total thickness of the insulating films $6b$ and $6t$ and the charge storage layer CSL is about 20 nm. And, the insulating films $6b$ and $6t$ may be formed of silicon oxide containing nitride, and the charge storage layer CSL may be formed of a high-dielectric-constant film having a higher dielectric constant than a silicon nitride film such as an aluminum oxide film (alumina), hafnium oxide film, or tantalum oxide film.

Next, the second conductive film formed of low-resistance polycrystalline silicon is deposited on the main surface of the semiconductor substrate 1. The second conductive film is formed by a CVD method and has a thickness of, for example, about 50 nm.

Next, by using photolithography and anisotropic dry etching, the second conductive film is processed. In this manner, in the CG shunt portions in the memory region and the feeding region, sidewalls 11 are formed to both side surfaces of the select gate electrode CG of the select nMIS (Qnc) via the insulating films $6b$ and $6t$ and the charge storage layer CSL. At the same time, in the MG shunt portion in the feeding region, a partial region, which is formed to be low by etching illustrated in FIG. 12 described above in the CG shunt portion in the feeding region, is covered by a photoresist pattern RP, thereby forming the pad electrode PAD via the insulating films $6b$ and $6t$ and the charge storage layer CSL. Further, in the capacitor element region, the bottom electrode 10E is covered by the photoresist pattern RP, thereby forming a top electrode 11E via the insulating films $6b$ and $6t$ and the charge storage layer CSL.

Since the conductive film 10 of the CG shunt portion is thinly formed to have the second height d2, the second conductive film formed at the portion is formed at a position at a lower height from the main surface of the semiconductor substrate 1 than the second conductive film formed on the region not etched in the step illustrated in FIG. 12 described above. Therefore, as compared to the case of forming the second conductive film without thinly forming the conductive film 10 of the CG shunt portion, a bump in the region, in which the photoresist pattern RP is formed, in the CG shunt portion is small, and thus a focus shift in the photolithography due to the bump is reduced and processing accuracy of the photoresist pattern RP is improved. Therefore, a shape failure of the pad electrode PAD formed by processing the second conductive film can be prevented.

Figure 14:
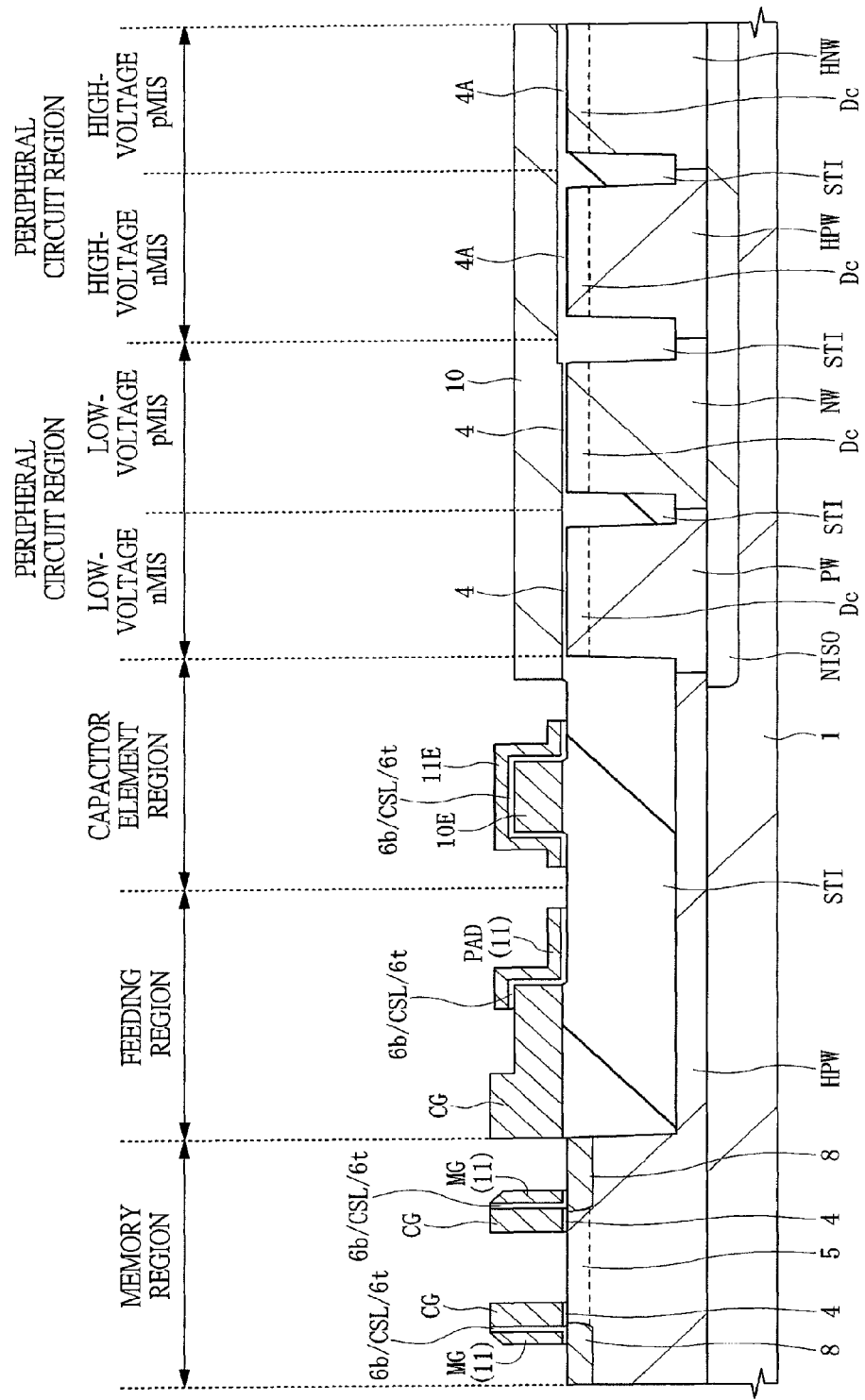
FIG. 14 is a cross-sectional view of the semiconductor device including the non-volatile memory cell in the same portion as FIG. 8 during the manufacturing process of the semiconductor device continued from FIG. 13.

Next, as illustrated in FIG. 14, with using a photoresist pattern as a mask, the sidewalls 1 exposed from the photoresist pattern are etched. In this manner, in the memory region, the memory gate electrodes MG (sidewalls 11) of the memory nMIS (Qnm) are formed to only one side surface of each of the select gate electrodes CG of the select nMIS (Qnc). A gate length of the memory gate electrode MG is, for example, about 65 nm.

Next, in the memory region, the insulating films 6b and 6t and the charge storage layer CSL are selectively etched except for: those between the select gate electrode CG and the memory gate electrode MG and between the semiconductor substrate 1 and the memory gate electrode MG in the memory region; those between the select gate electrode CG and the memory gate electrode MG and between the device isolation portion STI and the memory gate electrode MG in the MG shunt portion in the feeding region; and those between the bottom electrode 10E and the top electrode 11E in the capacitor element region.

In the capacitor element region, using the insulating films 6b and 6t and the charge storage layer CSL as a capacitor insulating film (dielectric film), a capacitor element formed of: the bottom electrode 10E formed of the first conductive film in the same layer as the select gate electrode CG of the select nMIS (Qnc); and the top electrode 11E formed of the second conductive film in the same layer as the memory gate electrode MG of the memory nMIS (Qnm) is formed. The capacitor element forms, for example, a charge pump circuit used in a power supply circuit which outputs voltage higher than input voltage. The charge pump circuit can boost voltage by switching connection states of a plurality of capacitor elements using a switch or the like. Also, since the capacitor element is formed on the device isolation portion STI formed to the semiconductor substrate 1 and a parasitic capacitance formed by the substrate portion and the bottom electrode 10E is negligibly small, the above operation can be stably performed. Further, even when a position of a contact hole reaching the top electrode 11E formed in a later step and a position of a contact hole reaching the bottom electrode 10E shift due to a shift of the photoresist pattern etc., as they shift over the device isolation portion STI, the wiring and the semiconductor substrate 1 will not be short-circuited via the contact holes.

Figure 15:
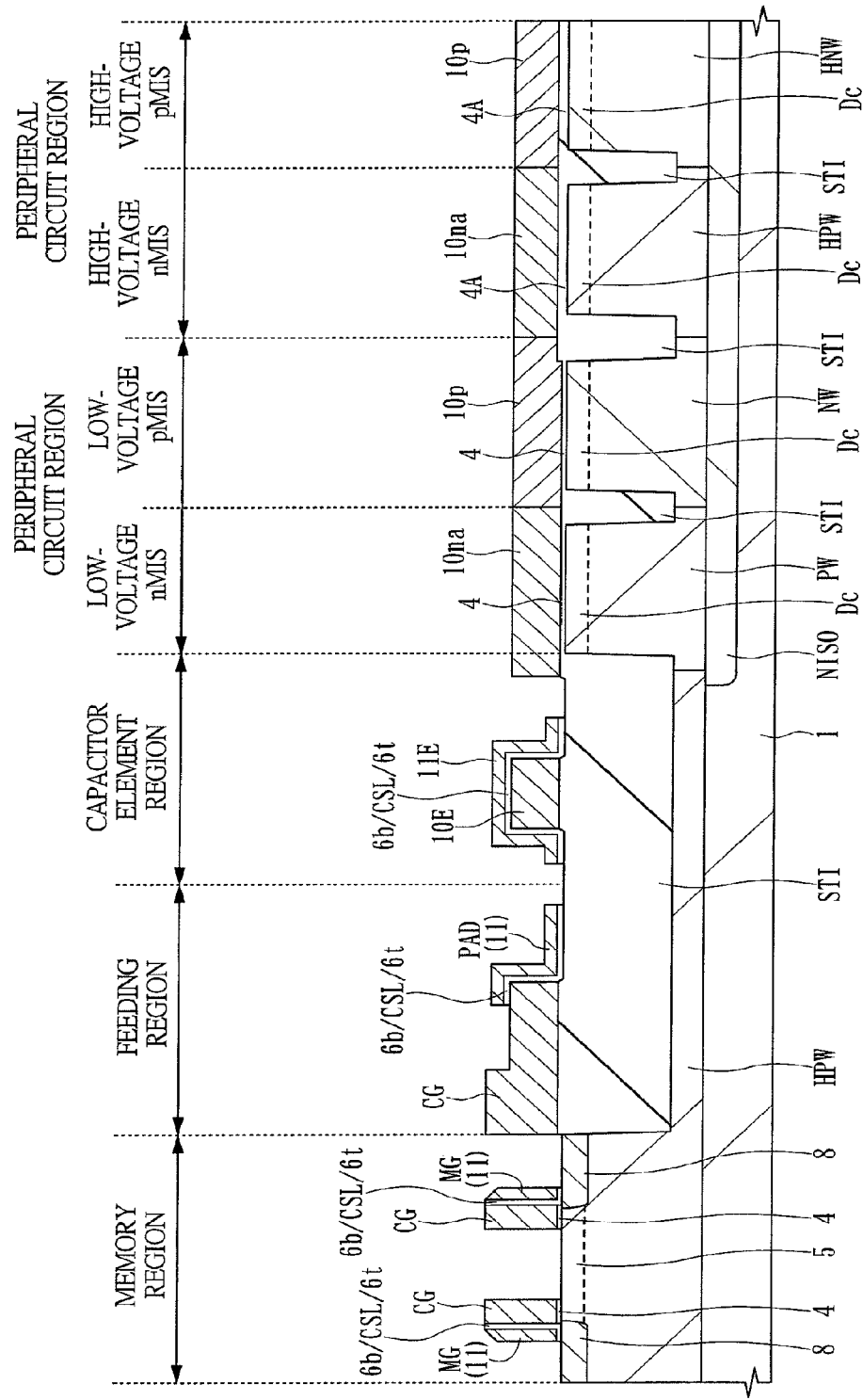
FIG. 15 is a cross-sectional view of the semiconductor device including the non-volatile memory cell in the same portion as FIG. 8 during the manufacturing process of the semiconductor device continued from FIG. 14.

Next, as illustrated in FIG. 15, an n-type impurity is introduced into the conductive film 10 in the low-voltage nMIS region and the high-voltage nMIS region in the peripheral circuit region by an ion implantation method or the like, thereby forming an n-type conductive film 10na. Also, a p-type impurity is introduced into the conductive film in the low-voltage pMIS region and the high-voltage pMIS region in the peripheral circuit region by an ion implantation method or the like, thereby forming a p-type conductive film 10p.

Figure 16:
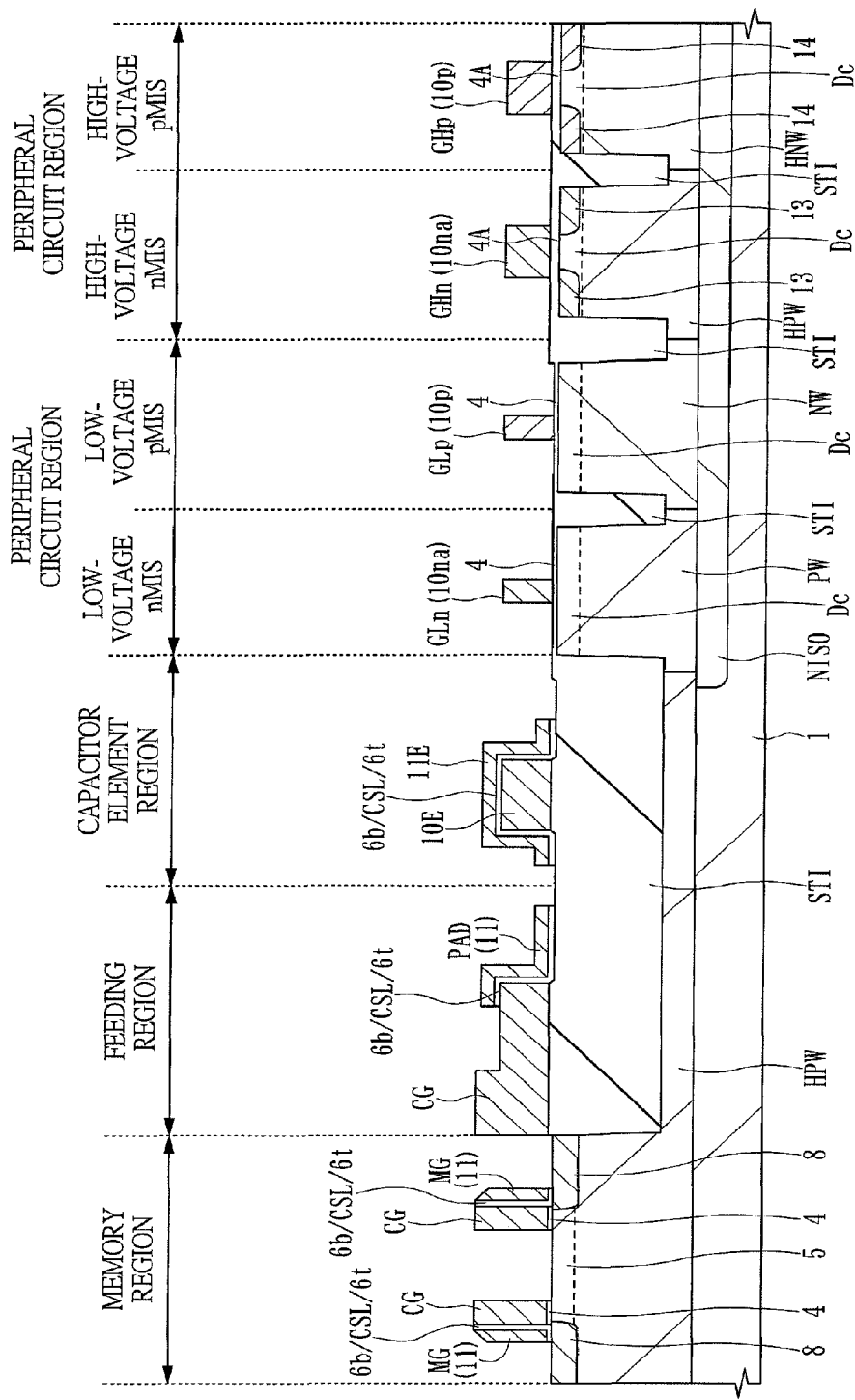
FIG. 16 is a cross-sectional view of the semiconductor device including the non-volatile memory cell in the same portion as FIG. 8 during the manufacturing process of the semiconductor device continued from FIG. 15.

Next, as illustrated in FIG. 16, the conductive films 10na and 10p in the peripheral circuit region are patterned using photolithography and dry etching, thereby forming: a gate electrode GLn formed of the conductive film 10na of the low-voltage nMIS; a gate electrode GLp formed of the conductive film 10p of the low-voltage pMIS; a gate electrode GHn formed of the conductive film 10na of the high-voltage nMIS; and a gate electrode GHp formed of the conductive film 10p of the high-voltage pMIS. Gate lengths of the gate electrode GLn of the low-voltage nMIS and the gate electrode GLp of the low-voltage pMIS in the active regions are, for example, about 100 nm. Gate lengths of the gate electrode GHn of the high-voltage nMIS and the gate electrode GHp of the high-voltage pMIS are, for example, about 400 nm.

As the gate lengths of the MISFETs become shorter along miniaturization, a resist pattern upon etching the conductive films 10na and 10p in the peripheral circuit region is very thinly formed in this step. The pad electrode PAD is formed at a high position as compared to other elements on the main surface of the semiconductor substrate 1 because the pad electrode PAD is formed by running over the select gate electrode CG. Thus, the resist pattern on the pad electrode PAD may be thin as the resist pattern is not formed at a desired thickness. In this case, there is a possibility that the resist pattern is eliminated by etching upon etching the gate electrodes GLn, GLp, GHn, and GHp. Since the pad electrode PAD is formed of low-resistance polycrystalline silicon same as the conductive films 10na and 10p, when the resist pattern on the pad electrode PAD is eliminated, the pad electrode PAD is trimmed, possibly causing a problem of a shape failure occurring in the pad electrode PAD.

Meanwhile, in the first embodiment, since the pad electrode PAD is formed by running over the select gate electrode CG that is thinly formed, the third height d3 from the main surface of the semiconductor substrate 1 to the upper surface of the pad electrode PAD is formed to be low when the pad electrode PAD is formed. Thus, a bump is reduced and it is easy to form the resist pattern at a desired thickness, and the problem of a shape failure occurring in the pad electrode PAD can be avoided. Also, by the step illustrated in FIG. 12 described above, the amount of etching the conductive films 10na and 10p is reduced when forming the gate electrodes GLn, GLp, GHn, and GHp, and thus it becomes difficult to eliminate the resist pattern and the problem of eliminating the resist pattern on the pad electrode PAD can be avoided.

Next, to the main surface of the semiconductor substrate 1 in the high-voltage nMIS of the peripheral circuit region, an n-type impurity for example, arsenic is ion-implanted using a photoresist pattern as a mask, thereby forming n⁻-type semiconductor regions 13 to the main surface of the semiconductor substrate 1 in the high-voltage nMIS region of the peripheral circuit region in a self-aligned manner to the gate electrode GHn. In the same manner, to the main surface of the semiconductor substrate 1 in the high-voltage pMIS region of the peripheral circuit region, a p-type impurity, for example, boron fluoride is ion-implanted, thereby forming p⁻-type semiconductor regions 14 to the main surface of the semiconductor substrate 1 in the high-voltage pMIS region of the peripheral circuit region in a self-aligned manner to the gate electrode GHp.

Figure 17:
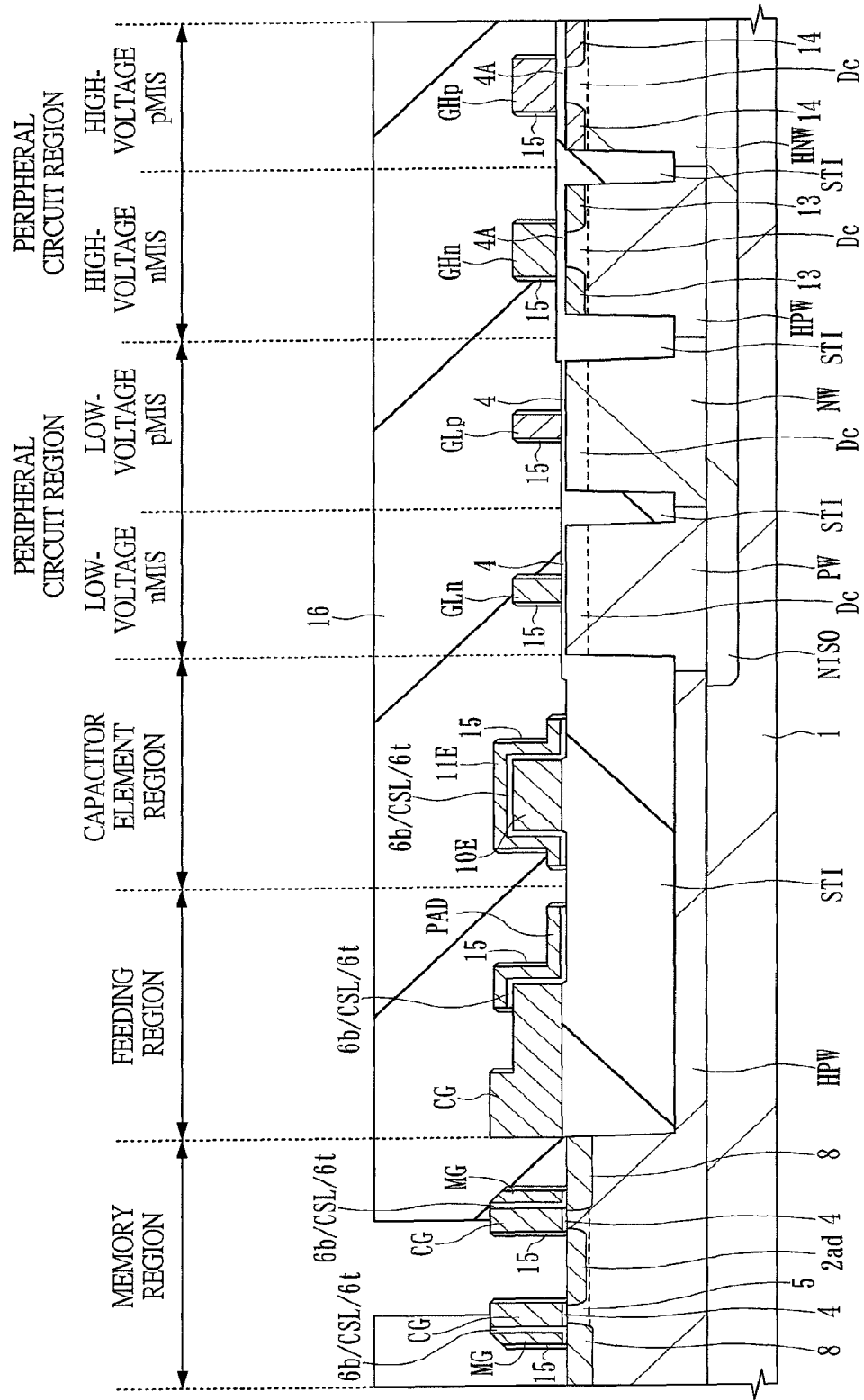
FIG. 17 is a cross-sectional view of the semiconductor device including the non-volatile memory cell in the same portion as FIG. 8 during the manufacturing process of the semiconductor device continued from FIG. 16.

Next, as illustrated in FIG. 17, after an insulating film having a thickness of about 10 nm formed of, for example, silicon oxide is deposited by a CVD method on the main surface of the semiconductor substrate 1, the insulating film is processed by anisotropic dry etching. In this manner, in the memory region, sidewalls 15 are formed to: a side surface of the select gate electrode CG opposite to the memory gate electrode MG and a side surface of the memory gate electrode MG in the memory region; a side surface of the pad electrode PAD at the MG shunt portion in the feeding region; a side surface of the top electrode 11E in the capacitor element region; and both side surfaces of the gate electrode GLn of the low-voltage nMIS, gate electrode GLp of the low-voltage pMIS, gate electrode GHn of the high-voltage nMIS, and gate electrode GHp of the high-voltage pMIS in the peripheral circuit region, respectively. A spacer length of the sidewall 15 is, for example, about 6 nm. In this manner, a side surface of the gate insulating film 4 exposed between the select gate electrode CG of the select nMIS (Qnc) and the semiconductor substrate 1, and side surfaces of the insulating films 6b and 6t and the charge storage layer CSL exposed between the memory gate electrode MG of the memory nMIS (Qnm) and the semiconductor substrate 1 can be covered by the sidewalls 15. As the sidewalls 15 are formed, an effective channel length of the n$^-$-type semiconductor region and the p$^-$-type semiconductor region can be large in a step of forming the n$^-$-type semiconductor region in the low-voltage nMIS region and a step of forming the p$^-$-type semiconductor region in the low-voltage pMIS of the peripheral circuit region described later. Therefore, a short-channel effect of the low-voltage nMIS and the low-voltage pMIS can be suppressed.

Next, after forming a photoresist pattern 16 having its edge portion positioned at the upper surface of the select gate electrode CG of the select nMIS (Qnc) in the memory region, the photoresist pattern 16 covering a part of the select gate electrode CG on the memory gate electrode MG side of the memory nMIS (Qnm) and the memory gate electrode MG, an n-type impurity, for example, arsenic is ion-implanted into the main surface of the semiconductor substrate 1 using the select gate electrode CG, memory gate electrode MG, and the photoresist pattern 16 as masks, thereby forming an n$^-$-type semiconductor region 2ad to the main surface of the semiconductor substrate 1 in a self-aligned manner to the select gate electrode CG.

Figure 18:
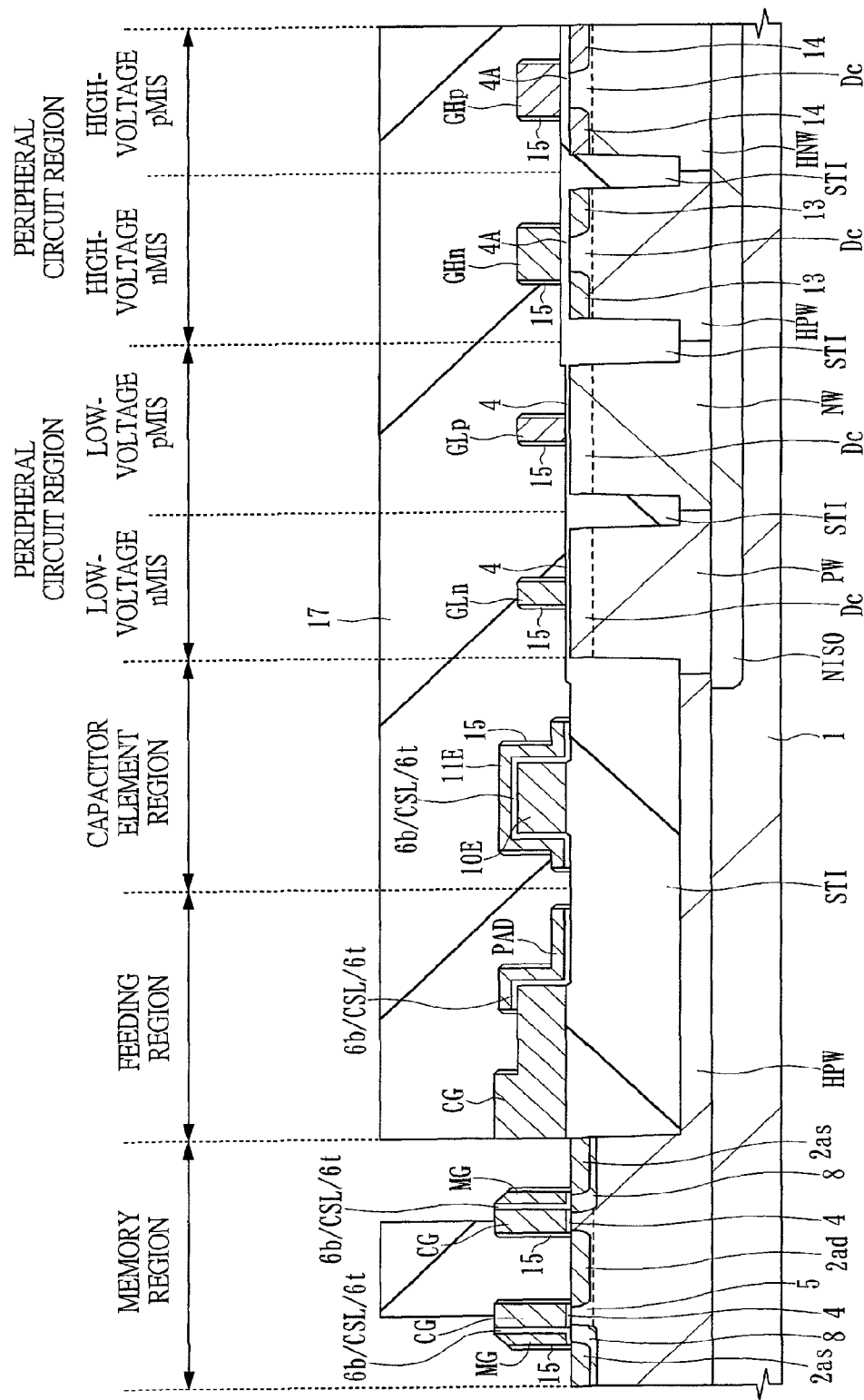
FIG. 18 is a cross-sectional view of the semiconductor device including the non-volatile memory cell in the same portion as FIG. 8 during the manufacturing process of the semiconductor device continued from FIG. 17.

Next, as illustrated in FIG. 18, after removing the photoresist pattern 16, a photoresist pattern 17 having its edge portion positioned at the upper surface of the select gate electrode CG of the select nMIS (Qnc) in the memory region, the photoresist pattern 17 covering a part of the select gate electrode CG opposite to the memory gate electrode MG of the select nMIS (Qnc) in the memory region, an n-type impurity, for example, arsenic is ion-implanted into the main surface of the semiconductor substrate 1 using the select gate electrode CG, memory gate electrode MG, and the photoresist pattern 17 as masks, thereby forming n$^-$-type semiconductor regions 2as to the main surface of the semiconductor substrate 1 in a self-aligned manner to the memory gate electrode MG.

Here, the n$^-$-type semiconductor region 2ad has been formed first and then the n$^-$-type semiconductor regions 2as have been formed. Meanwhile, the n$^-$-type semiconductor regions 2as may be formed first and then the n$^-$-type semiconductor region 2ad may be formed. In addition, subsequent to the ion implantation of an n-type impurity to form the n$^-$-type semiconductor region 2ad, a p-type semiconductor region may be formed to surround a lower portion of the n$^-$-type semiconductor region 2ad by ion-implanting a p-type impurity, for example, boron to the main surface of the semiconductor substrate 1.

Figure 19:
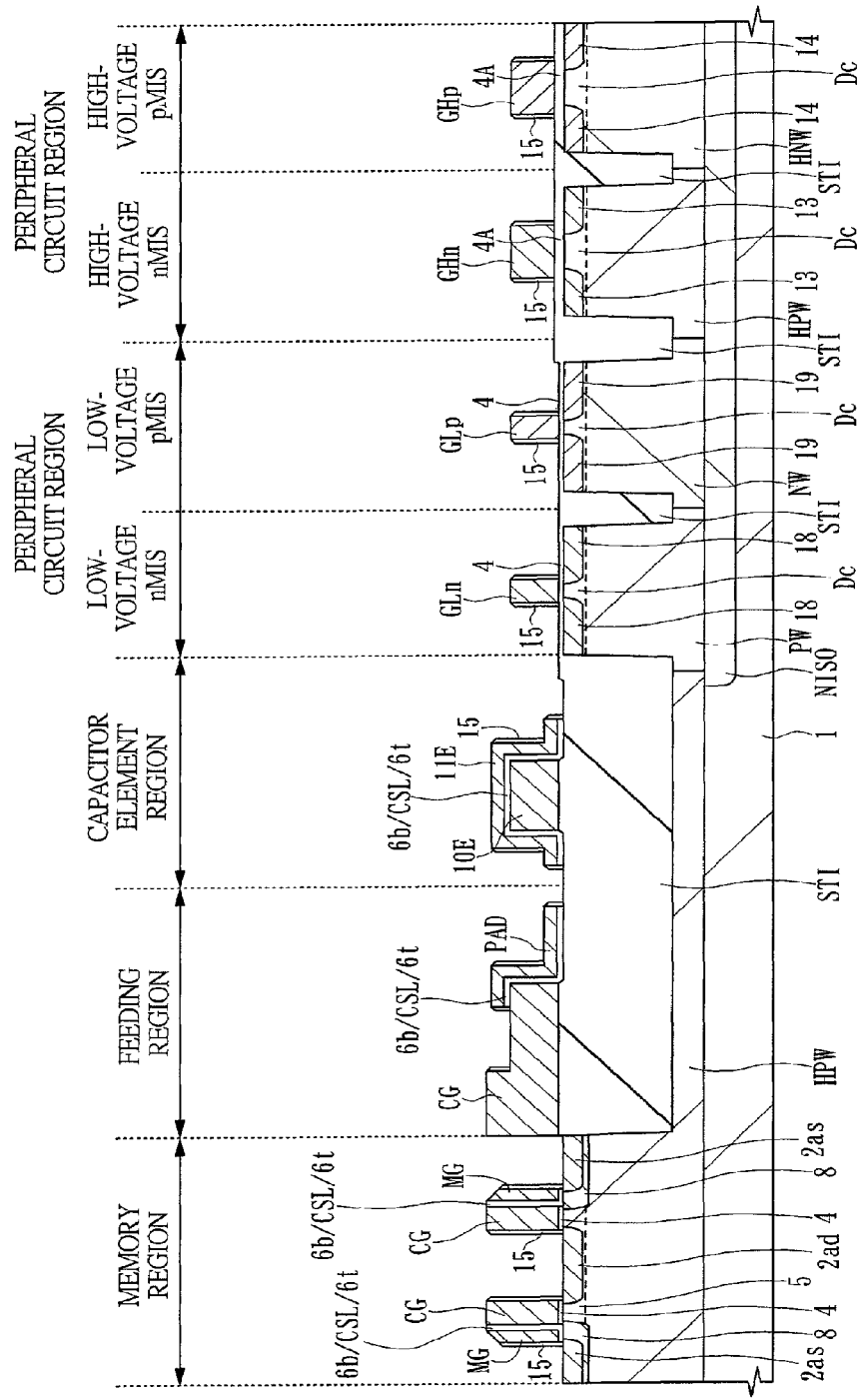
FIG. 19 is a cross-sectional view of the semiconductor device including the non-volatile memory cell in the same portion as FIG. 8 during the manufacturing process of the semiconductor device continued from FIG. 18.

Next, as illustrated in FIG. 19, to the main surface of the semiconductor substrate 1 in the low-voltage nMIS region of the peripheral circuit region, an n-type impurity, for example, arsenic is ion-implanted using a photoresist pattern as a mask, thereby forming n$^-$-type semiconductor regions 18 to the main surface of the semiconductor substrate 1 in the low-voltage nMIS region of the peripheral circuit region in a self-aligned manner to the gate electrode GLn. In the same manner, to the main surface of the semiconductor substrate 1 in the low-voltage pMIS region of the peripheral circuit region, a p-type impurity, for example, boron fluoride is ion-implanted using a photoresist pattern as a mask, thereby forming p$^-$-type semiconductor regions 19 to the main surface of the semiconductor substrate 1 in the low-voltage pMIS region of the peripheral circuit region in a self-aligned manner to the gate electrode GLp.

Figure 20:
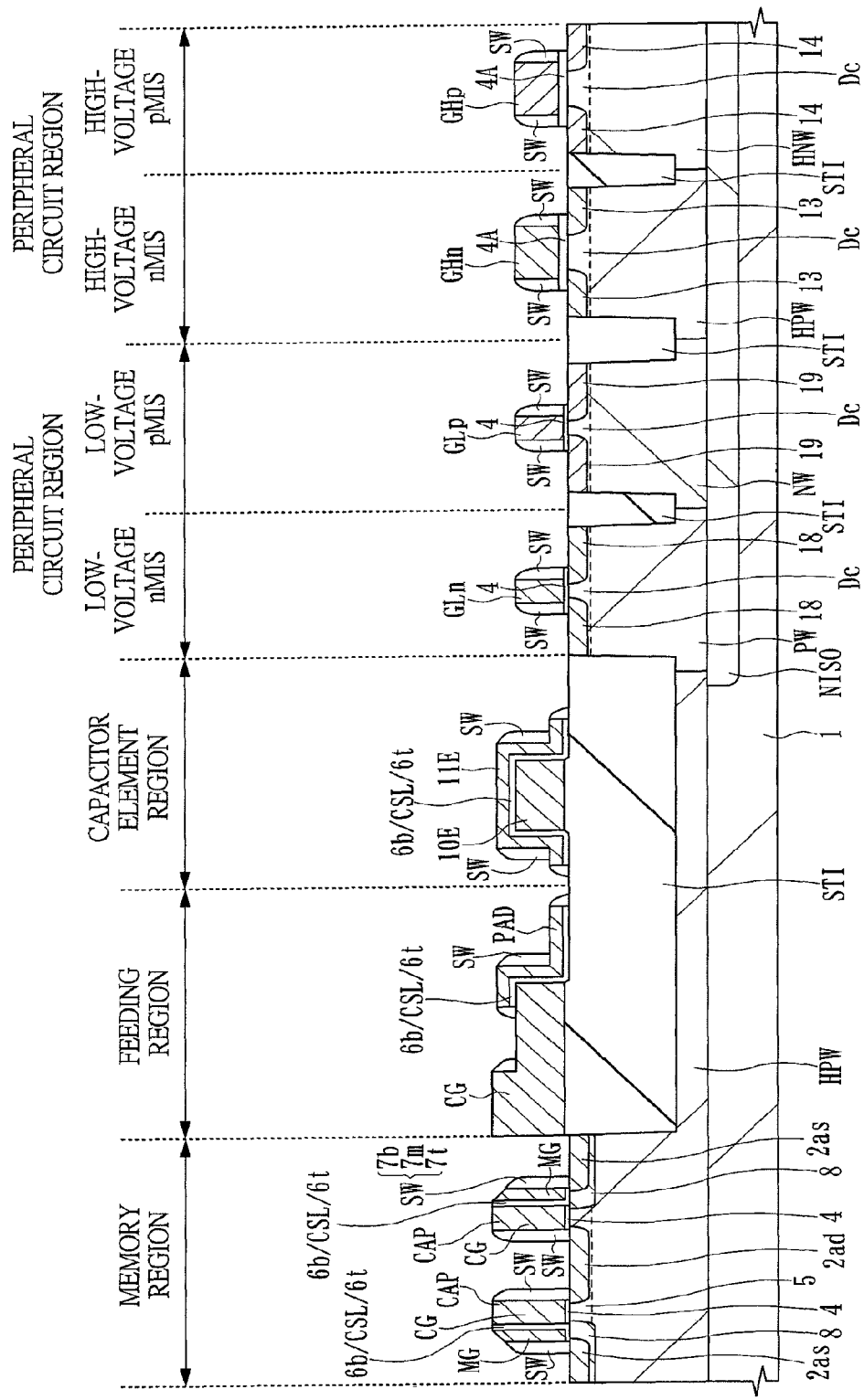
FIG. 20 is a cross-sectional view of the semiconductor device including the non-volatile memory cell in the same portion as FIG. 8 during the manufacturing process of the semiconductor device continued from FIG. 19.

Next, as illustrated in FIG. 20, on the main surface of the semiconductor substrate 1, for example, a silicon oxide film 7b, a silicon nitride film 7m, and a silicon oxide film 7t are deposited in series by a CVD method, and these films are etched back by an anisotropic etching. In this manner, sidewalls SW are formed to: a side surface of the select gate electrode CG opposite to the memory gate electrode MG, and a side surface of the memory gate electrode MG in the memory region; a side surface of the pad electrode PAD of the MG shunt portion in the feeding region; a side surface of the upper electrode 11E in the capacitor element region; and both side surfaces of each of the gate electrode GLn of the low-voltage nMIS, gate electrode GLp of the low-voltage pMIS, gate electrode GHn of the high-voltage nMIS, and gate electrode GHp of the high-voltage pMIS. A thickness of the silicon oxide film 7b is, for example, about 20 nm, a thickness of the silicon nitride film 7m is, for example, 25 nm, and a thickness of the silicon oxide film 7t is, for example, about 50 nm.

Figure 21:
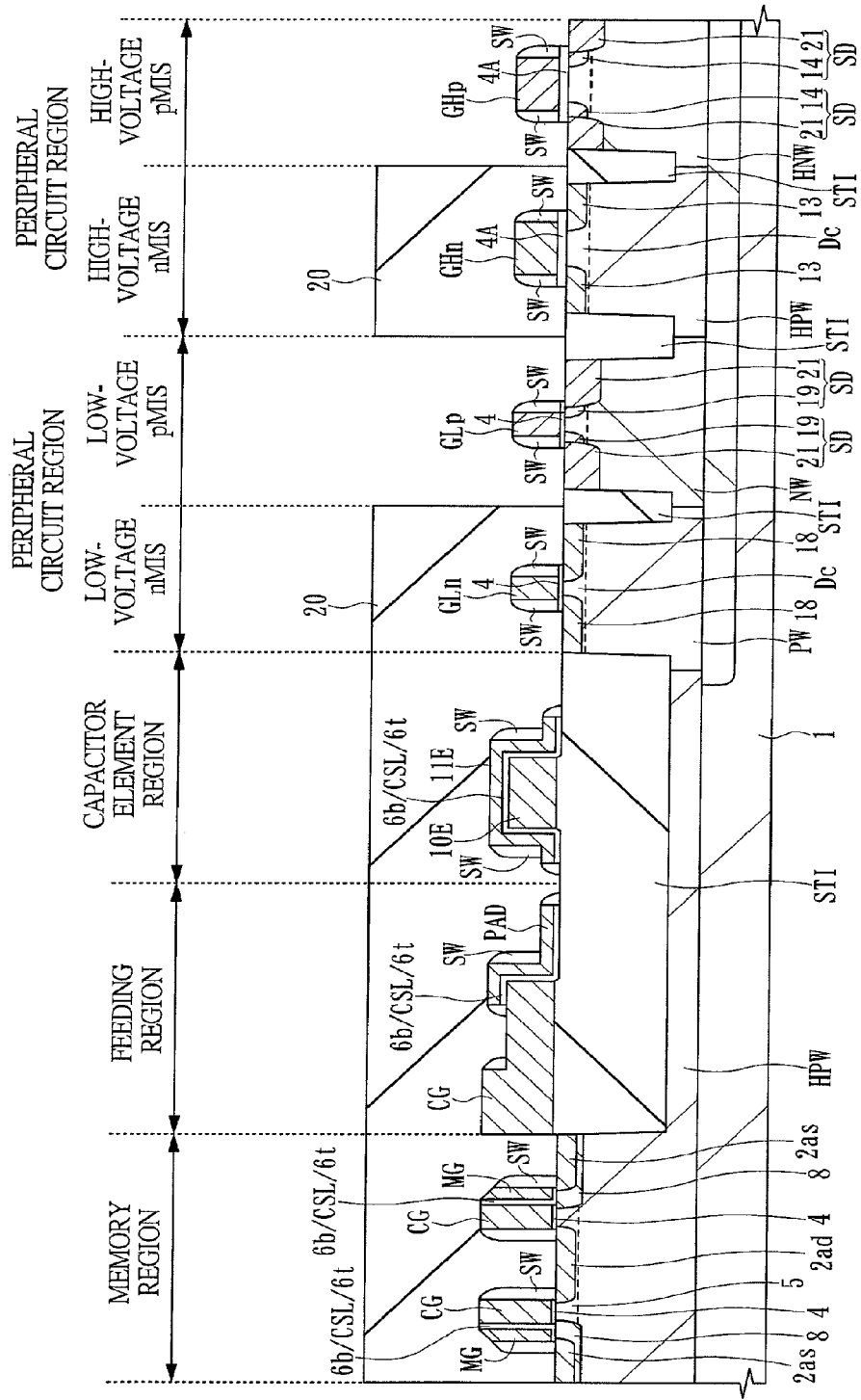
FIG. 21 is a cross-sectional view of the semiconductor device including the non-volatile memory cell in the same portion as FIG. 8 during the manufacturing process of the semiconductor device continued from FIG. 20.

Next, as illustrated in FIG. 21, to the main surface of the semiconductor substrate 1 in the low-voltage pMIS region and the high-voltage pMIS region of the peripheral circuit region, a p-type impurity, for example, boron or boron fluoride is ion-implanted using a photoresist pattern 20 as a mask, thereby forming p$^+$-type semiconductor regions 21 in a self-aligned manner to the gate electrode GLp of the low-voltage pMIS and the gate electrode GHp of the high-voltage pMIS. In this manner, source/drain regions SD of the high-voltage pMIS formed of the p$^-$-type semiconductor regions 14 and the p$^+$-type semiconductor regions 21 are formed, and source/drain regions SD formed of the p$^-$-type semiconductor regions 19 and the p$^+$-type semiconductor regions 21 are formed.

Figure 22:
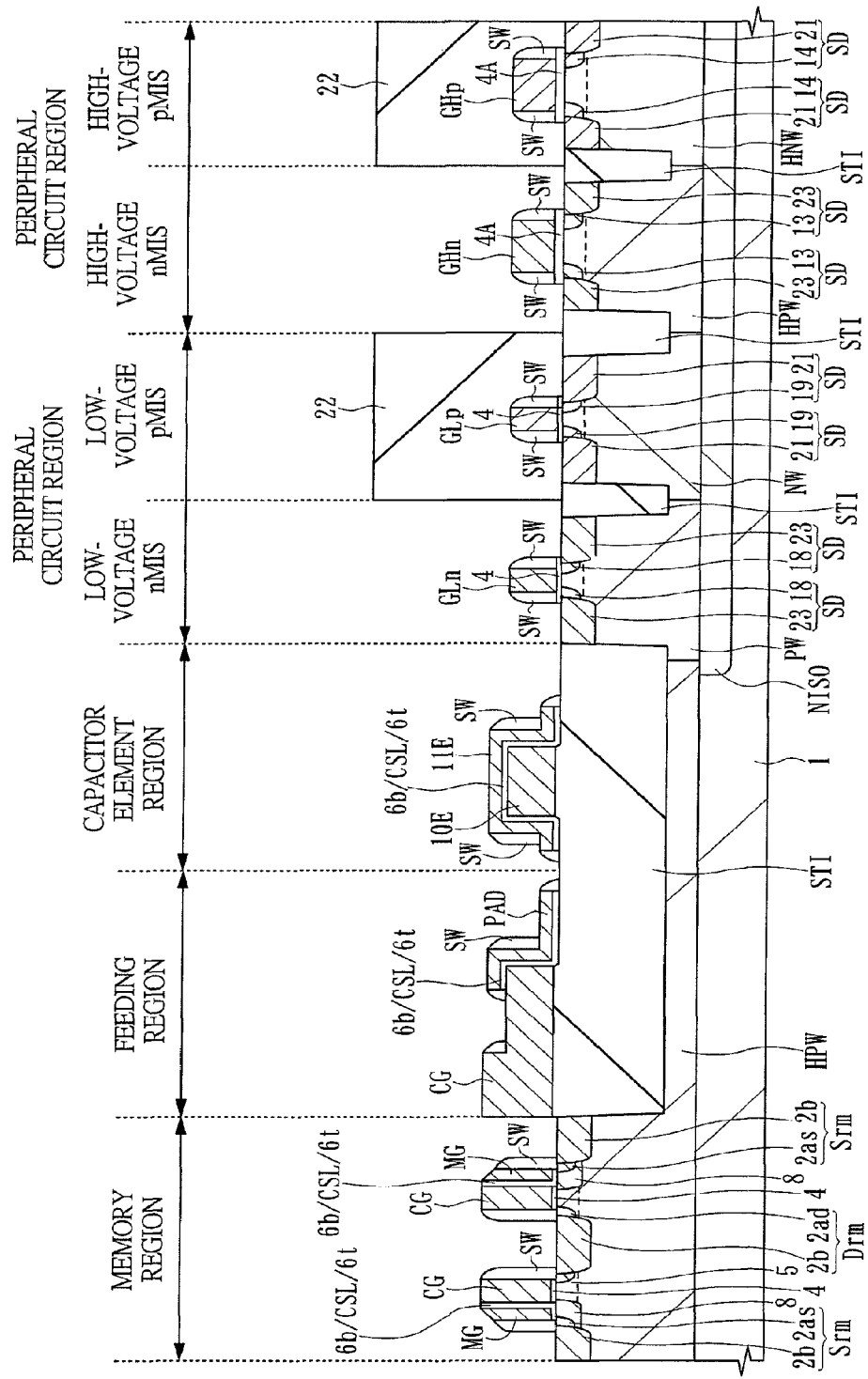
FIG. 22 is a cross-sectional view of the semiconductor device including the non-volatile memory cell in the same portion as FIG. 8 during the manufacturing process of the semiconductor device continued from FIG. 21.

Next, as illustrated in FIG. 22, into the main surface of the semiconductor substrate 1 in the low-voltage nMIS region and high-voltage nMIS region of the memory region and peripheral circuit region, an n-type impurity, for example, arsenic and phosphorus are ion-implanted using a photoresist pattern 22 as a mask, thereby forming n$^+$-type semiconductor regions 2b in a self-aligned manner to the select gate electrode CG of the select nMIS (Qnc) and the memory gate electrode MG of the memory nMIS (Qnm) in the memory region; and forming n$^+$-type semiconductor regions 23 in a self-aligned manner to the gate electrode GLn of the low-voltage nMIS and the gate electrode GHn of the high-voltage nMIS in the peripheral circuit region. In this manner, the drain region Drm formed of the n$^-$-type semiconductor region tad and the n$^+$-type semiconductor region 2b, and the source regions Srm formed of the n$^-$-type semiconductor region 2as and the n$^+$-type semiconductor region 2b are formed in the memory region. In addition, source/drain regions SD of the high-voltage nMIS formed of the n$^-$-type semiconductor regions 13 and the n$^+$-type semiconductor regions 23, and source/drain regions SD of the low-voltage nMIS formed of the n$^-$-type semiconductor regions 18 and the n$^+$-type semiconductor regions 23 are formed in the peripheral circuit region.

Figure 23:
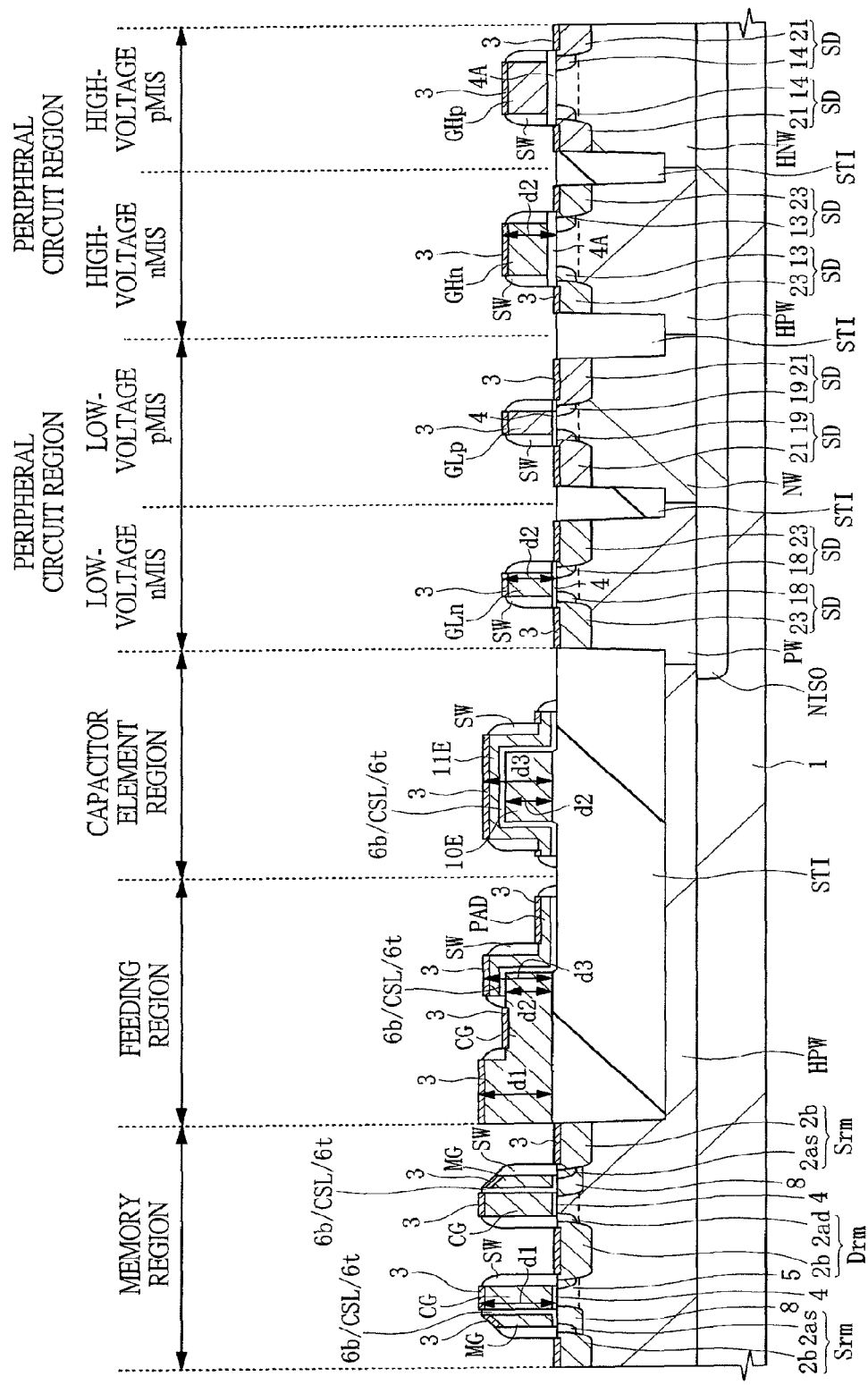
FIG. 23 is a cross-sectional view of the semiconductor device including the non-volatile memory cell in the same portion as FIG. 8 during the manufacturing process of the semiconductor device continued from FIG. 22.

Next, as illustrated in FIG. 23, the silicide layers 3 are formed in a salicide (self-align silicide) process to: the upper surfaces of the memory gate electrodes MG, the upper surface of the select gate electrode CG, and upper surfaces of the n$^+$-type semiconductor regions 2b of the memory nMIS (Qnm) in the memory region; the upper surfaces of the pad electrode PAD of the MG shunt portion, and the upper surface of the select gate electrode CG of the select nMIS (Qnc) of the CG shunt portion in the feeding region; an upper surface of the gate electrode GLn and upper surfaces of the n$^+$-type semiconductor regions 23 of the low-voltage nMIS, an upper surface of the gate electrode GLp and upper surfaces of the p$^+$-type semiconductor regions 21 of the low-voltage pMIS, an upper surface of the gate electrode GHn and upper surfaces of the n$^+$-type semiconductor regions 23 of the high-voltage nMIS, and an upper surface of the gate electrode GHp and upper surfaces of the p$^+$-type semiconductor regions 21 of the high-voltage pMIS, in the peripheral circuit region; and an upper surface of a part of the top electrode 11E not overlapping the select gate electrode CG and the sidewalls SW in plane in the capacitor element region. As the silicide layer 3, for example, nickel silicide, cobalt silicide, or the like is used.

By forming the silicide layers 3, contact resistances between the silicide layers 3 and plugs etc. to be formed to upper portions of the silicide layers 3 can be reduced. In addition, in the memory region, resistances of the memory gate electrode MG, source region Srm, and drain region Drm of the memory nMIS themselves can be reduced. Moreover, in the peripheral circuit region, resistances of the gate electrode GLn of the low-voltage nMIS, the gate electrode GLp of the low-voltage pMIS, the gate electrode GHn of the high-voltage nMIS, and the gate electrode GHp of the high-voltage pMIS themselves, and resistances of the source/drain regions SD themselves can be reduced.

According to the foregoing steps, the memory cell, the capacitance element, and the low-voltage nMIS, low-voltage pMIS, high-voltage nMIS, and high-voltage pMIS formed in the peripheral circuit region according to the first embodiment are substantially completed.

As described in FIG. 3 above, the height from the main surface of the semiconductor substrate 1 to the upper surface of the select gate electrode CG is the first height d1. The CG shunt portion in the feeding region is formed of: the select gate electrode CG having the first height d1; and the select gate electrode CG having the height of the second height d2 that is lower than the first height from the main surface of the semiconductor substrate 1 to the upper surface of the select gate electrode CG. The pad electrode PAD connected to the memory gate electrode MG is formed by running over the select gate electrode CG having the second height d2. Since the second height d2 is lower than the first height d1, the pad electrode PAD can be formed to be lower than that when being formed by running over the select gate electrode CG having the first height d1. In the capacitor element region, the capacitor insulating film formed of the insulating films 6b and 6t and the charge storage layer CSL is formed on the bottom electrode 10E formed of the conductive film 10 having the second electrode d2, and the top electrode 11E formed of the second conductive film is formed on the capacitor insulating film. A height of the bottom electrode 10E is, in the step illustrated in FIG. 12, reduced from the first height d1 to the second height d2 by etching, and then, the capacitor insulating film and the top electrode 11E are formed, so that a height from the main surface of the semiconductor substrate 1 of the whole of the capacitor element can be formed to be low.

According to the foregoing steps, a maximum height of the elements formed on the main surface of the semiconductor substrate 1 becomes low, and it is possible to ensure a margin during a polishing by a CMP method on the third insulating film which forms the interlayer insulating film 9 without thickly forming the interlayer insulating film 9 formed in a later step. Therefore, even when a deep contact hole is formed to the interlayer insulating film 9, an opening diameter near the bottom of the contact hole can be ensured, and a high resistance or no conduction between the plug formed by burying a conductive film in the contact hole and a connection portion can be prevented. Moreover, a shape failure of the pad electrode PAD occurring upon etching for forming the contact hole due to a lack of a thickness of a photoresist pattern can be prevented.

To attain the effect, in the step illustrated in FIG. 12, the conductive film 10 is etched to establish the condition of d1>d2 regarding the height of the select gate electrode CG. Meanwhile, in addition to the above condition, it is more preferable to establish a condition of d1≥d3 in the relationship of the first height d1 and the third height d3 that is a height from the main surface of the semiconductor substrate 1 to the upper surface of the pad electrode PAD running over the partial region of the select gate electrode CG of the CG shunt portion and also is a height from the main surface of the semiconductor substrate 1 to the upper surface of the top electrode 11E of the capacitor element. This is because, when the condition of d1≥d3 is established, even when the pad electrode PAD or the upper electrode 11E is formed, the height of the select gate electrode CG from the main surface of the semiconductor substrate 1 will not be increased as compared with that before forming the pad electrode PAD or the upper electrode 11E, and thus the inconvenience mentioned above due to thickly forming the interlayer insulating film 9 can be avoided. Meanwhile, the heights of the gate electrodes GLn, GLp, GHn, and GHp of the MISFETs (low-voltage nMIS, low-voltage pMIS, high-voltage nMIS, and high-voltage pMIS) in the peripheral circuit region are also etched to be thin until the second height d2 in the step illustrated in FIG. 12. Therefore, in the step illustrated in FIG. 16, the amount of etching upon etching the gate electrodes GLn, GLp, GHn, and GHp is reduced, and thus the resist pattern is difficult to be eliminated, and a problem of elimination of the resist pattern on the pad electrode PAD that is formed to be higher than other elements during the etching can be avoided.

Figure 24:
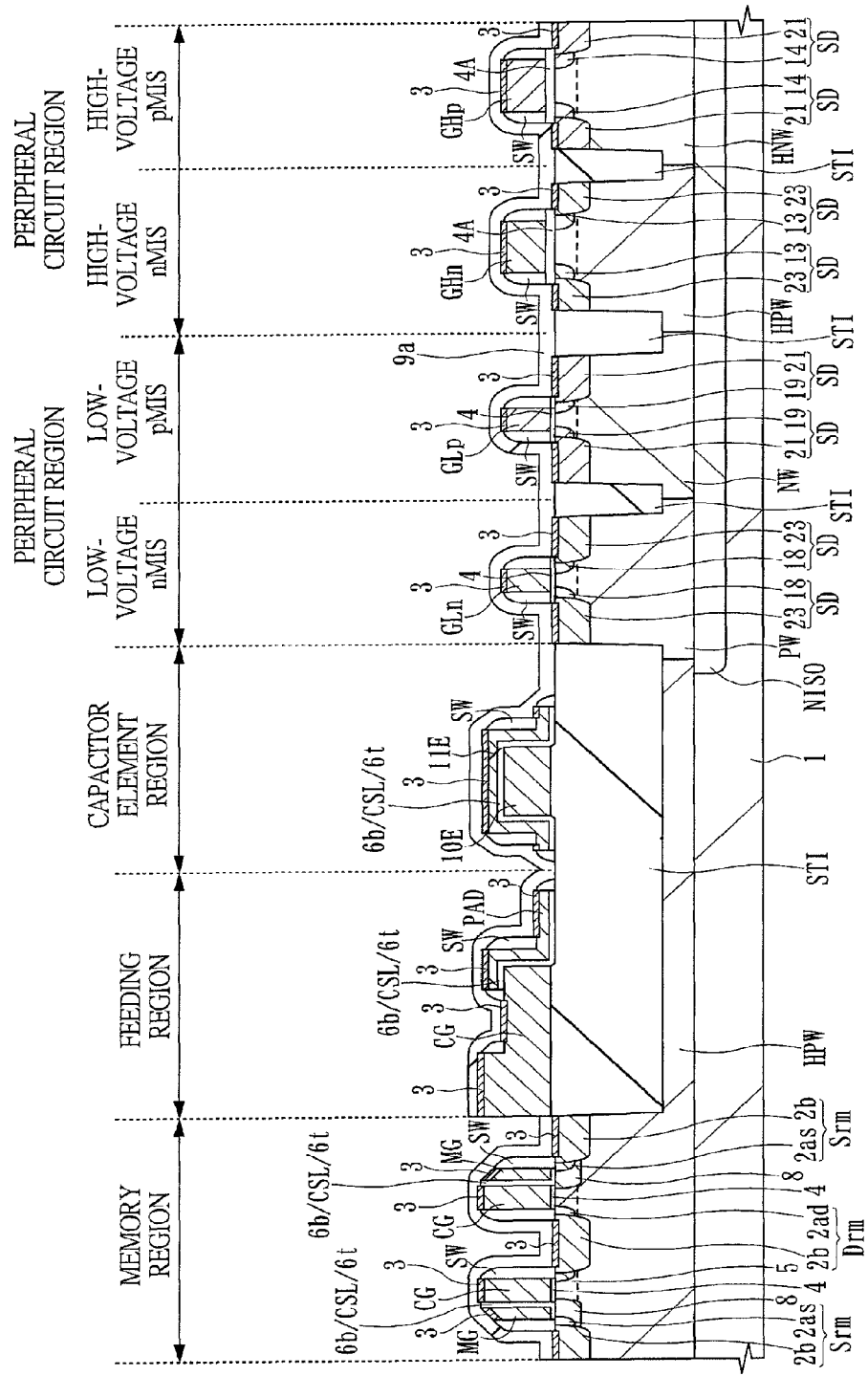
FIG. 24 is a cross-sectional view of the semiconductor device including the non-volatile memory cell in the same portion as FIG. 8 during the manufacturing process of the semiconductor device continued from FIG. 23.

Next, as illustrated in FIG. 24, the silicon nitride film 9a is deposited as an insulating film on the main surface of the semiconductor substrate 1 by a CVD method. The silicon nitride film 9a works as an etching-stopper film upon forming a contact hole described later.

Figure 25:
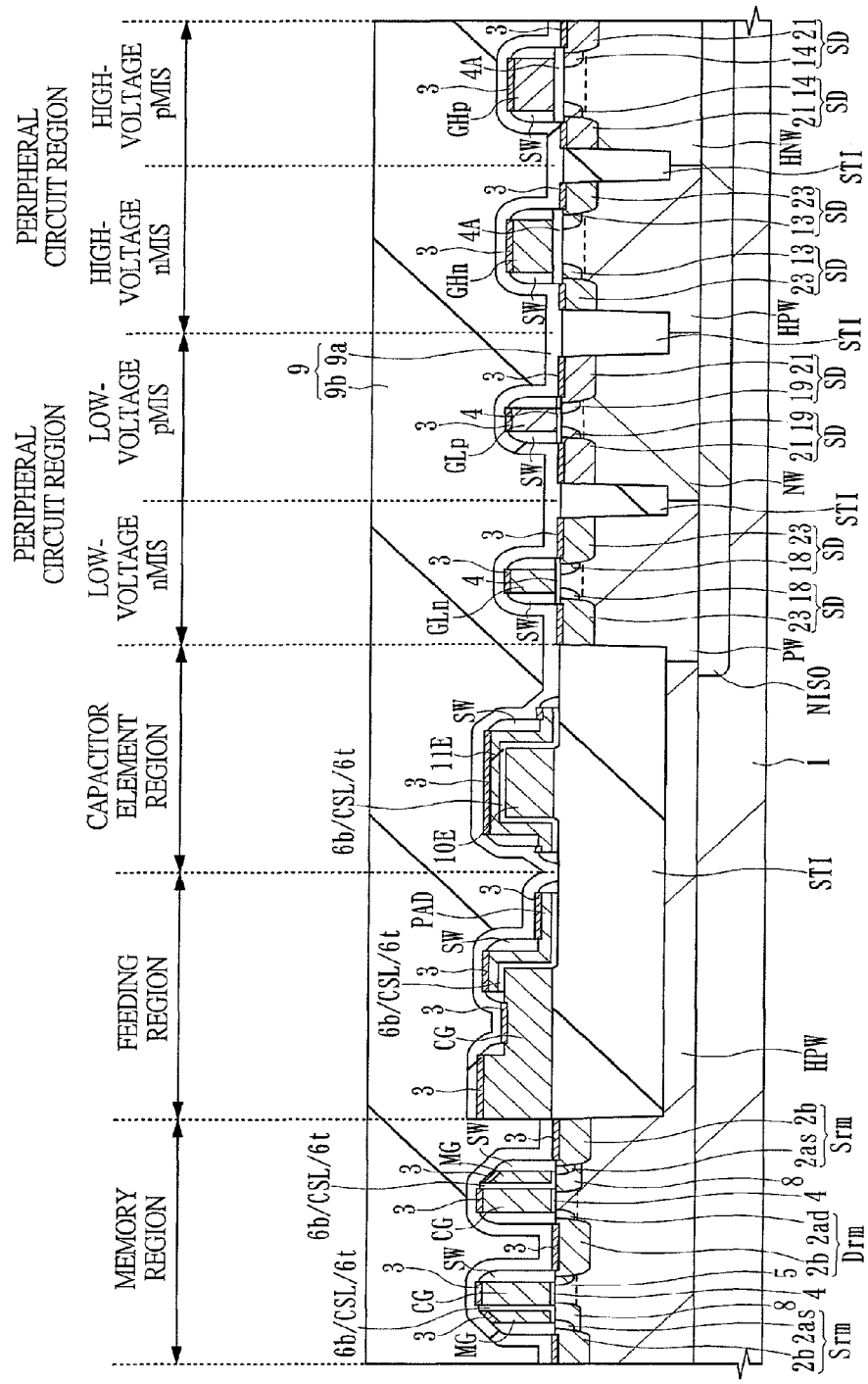
FIG. 25 is a cross-sectional view of the semiconductor device including the non-volatile memory cell in the same portion as FIG. 8 during the manufacturing process of the semiconductor device continued from FIG. 24.

Subsequently, as illustrated in FIG. 25, the silicon oxide film 9b is deposited as an insulating film by a CVD method, and the silicon oxide film 9b is polished by a CMP method, thereby forming the interlayer insulating film 9 formed of the silicon nitride film 9a and the silicon oxide film 9b. As described above, the height of the pad electrode PAD is formed to be lower than that in FIG. 127B, the height of the elements on the main surface of the semiconductor substrate 1 as a whole is lowered and a margin of a polishing by a CMP method thereafter can be ensured without thickly forming the silicon oxide film 9b. The same goes to the top electrode 11E of the capacitance element.

Figure 26:
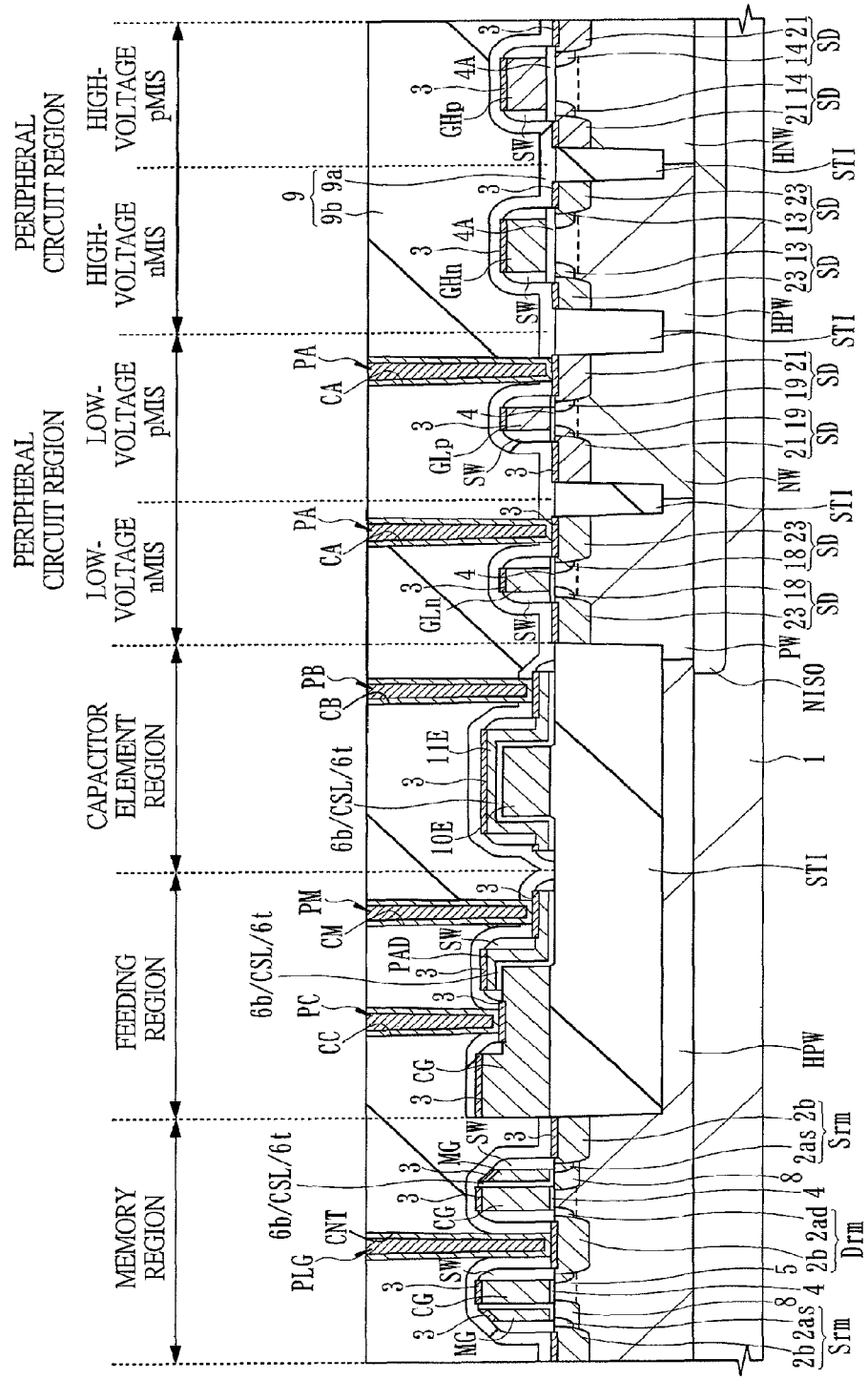
FIG. 26 is a cross-sectional view of the semiconductor device including the non-volatile memory cell in the same portion as FIG. 8 during the manufacturing process of the semiconductor device continued from FIG. 25.

Next, as illustrated in FIG. 26, in the memory region, the contact hole CNT reaching the silicide layer 3 on the drain region Drm is formed to the interlayer insulating film 9. At the same time, in the feeding region, the contact hole CC reaching the silicide layer 3 on the select gate electrode CG of the CG shunt portion is formed, and the contact hole CM reaching the silicide layer 3 on the pad electrode PAD of the MG shunt portion is formed to the interlayer insulating film 9.

In addition, in the peripheral circuit region, on each of the gate electrodes (GHn, GHp, GLn, GLp) of the high-voltage nMIS, high-voltage pMIS, low-voltage nMIS, and low-voltage pMIS, the contact hole CA reaching the silicide layer 3 on the source/drain regions SD is formed. In FIG. 26, to simplify the description, the contact holes CA reaching the source/drain regions of the low-voltage nMIS and the low-voltage pMIS are exemplified.

Further, in the capacitor element region, the contact hole CB reaching the silicide layer 3 on each of the upper surfaces of the top electrode 11E and bottom electrode 10E is formed in a portion where the top electrode 11E and the bottom electrode 10E are not overlapped. In FIG. 26, to simplify the description, the contact hole CB reaching the top electrode 11E is exemplified.

In the situation, since the interlayer insulating film 9 formed in the steps of FIGS. 24 and 25 is formed to be lower than that formed in the step of FIG. 127B, even when a deep contact hole such as the contact hole CMT is formed to the interlayer insulating film 9, an opening diameter near the bottom of the contact hole can be ensured. Moreover, upon performing an etching for forming the contact hole, a shape failure occurring to the pad electrode PAD due to a lack of a thickness of a photoresist pattern can be prevented.

Next, the plug PLG is formed inside the contact hole CNT, the plug PC is formed inside the contact hole CC, the plug PM is formed inside the contact hole CM, the plug PA is formed inside the contact hole CA, and a plug PB is formed inside the contact hole PB. The plugs PLG, PC, PM, PA, and PB are formed of a stacked film including: a relatively thin barrier film of a stacked film of, for example, titanium and titanium nitride; and a relatively thick conductive film formed of a tungsten or aluminum film formed to be wrapped by the relatively thin barrier film. In the situation, as the opening diameter near the bottom of the contact hole is ensured, for example, a high resistance or no conduction at the connection portion between the plug PLG and the silicide layer 3 on the drain region Drm can be prevented. Thereafter, on the interlayer insulating film 9, a first layer wiring (not illustrated) containing copper or aluminum as a main component is formed.

From here, the semiconductor device including the non-volatile memory will be manufactured through a normal manufacturing process of a semiconductor device.

Note that, while the heights from the main surface of the semiconductor substrate 1 to the top surfaces of the gate electrodes GLn, GLp, GHn, and GHp of the low-voltage nMIS, low-voltage pMIS, high-voltage nMIS, and high-voltage pMIS formed in the peripheral circuit region are set to be the second height d2, the conductive film 10 may not be etched by forming a resist pattern to the whole of the peripheral circuit region. In this case, the height from the main surface of the semiconductor substrate 1 to the upper surfaces of the gate electrodes GLn, GLp, GHn, and GHp are formed to be the first height d1, and the etching step illustrated in FIG. 12 described above is not included, and thus the gate electrodes GLn, GLp, GHn, and GHp can be formed without variations in height.

Second Embodiment

A different point of a second embodiment from the first embodiment described above is a cap insulating film CAP formed via an insulating film on the upper surface of the first conductive film forming the select gate electrode CG of the select nMIS (Qnc) in the memory cell forming region.

More specifically, in the first embodiment described above, the select gate electrode CG of the select nMIS (Qnc) in the memory cell forming region and the select gate electrode CG of the CG shunt portion in the feeding region are formed of the first conductive film, and the thickness of the select gate electrode CG of the CG shunt portion in the feeding region is processed to be thinner than the thickness of the select gate electrode CG in the memory cell forming region, i.e., to be the second height d2. In addition, the pad electrode PAD is formed by running over the thinly processed select gate electrode CG. In this manner, the third height third height d3, which is a height from the main surface of the semiconductor substrate 1 to the upper surface of the pad electrode PAD running over the partial region of the select gate electrode CG of the CG shunt portion, is lower than that in the case of forming the pad electrode PAD on the select gate electrode CG having the first height d1.

However, in the second embodiment, the cap insulating film CAP is formed on the select gate electrode CG of the select nMIS (Qnc) in the memory cell forming region via an insulating film, and the cap insulating film CAP is not formed on the select gate electrode CG of the CG shunt portion in the feeding region, so that the pad electrode PAD is formed on the select gate electrode CG to which the cap insulating film CAP is not formed, thereby making the third height d3 lower than that when forming the pad electrode PAD on the cap insulating film CAP.

Figure 27:
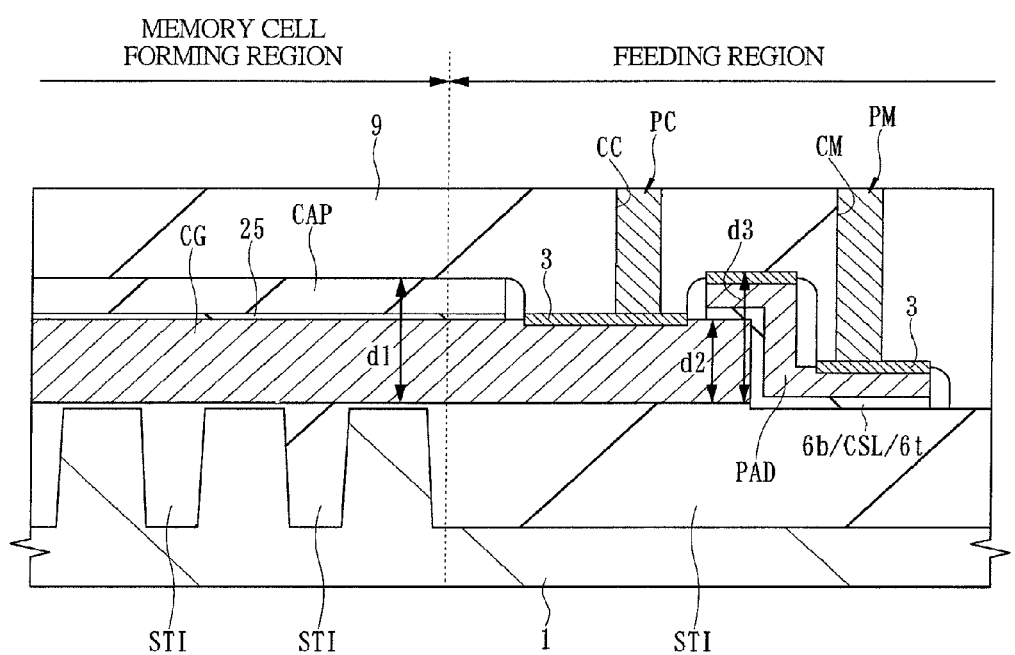
FIG. 27 is a cross-sectional view of a main part (a cross-sectional view of a main part of a memory gate electrode and a select gate electrode) in a feeding region of a non-volatile memory cell according to a second embodiment of the present invention.

An example of structures of the memory gate electrode MG forming a non-volatile memory cell of the second embodiment and a feeding region of the select gate electrode CG will be described with reference to FIG. 27. FIG. 27 is a cross-sectional view of a main part of the memory gate electrode MG and the select gate electrode CG in the feeding region.

As illustrated in FIG. 27, in the same manner as the first embodiment, in the MG shunt portion, the pad electrode PAD formed of the second conductive film in the same layer as the memory gate electrode MG (not illustrated) is formed by running over a partial region of the select gate electrode CG of the CG shunt portion. The pad electrode PAD is formed in the same step as forming the memory gate electrode MG to a sidewall of the select gate electrode CG in a self-aligned manner, and the memory gate electrode MG in the sidewall shape and the pad electrode PAD are connected.

In the memory cell forming region, the select nMIS (Qnc) is formed, and the cap insulating film CAP formed of the second conductive film is formed to the upper surface of the select gate electrode CG of the select nMIS (Qnc) via an insulating film 25 formed of a sixth insulating film. A height from the main surface of the semiconductor substrate 1 to an upper surface of a stacked film formed of the select gate electrode CG, insulating film 25, and cap insulating film CAP is set to the first height d1. Meanwhile, the feeding region includes a region in which the insulating film 25 and the cap insulating film CAP are not formed on the upper surface of the select gate electrode CG, that is, a region in which only the select gate electrode CG is formed. A height from the main surface of the semiconductor substrate 1 to the upper surface of the select gate electrode CG in that region is set to the second height d2. As the pad electrode PAD is formed on the select gate electrode CG having the second height d2 from which the insulating film 25 and the cap insulating film CAP are removed, the height d3 is lower than that when forming the pad electrode PAD on the cap insulating film CAP.

To the interlayer insulating film 9 in the feeding region, the contact hole CC is formed reaching the silicide layer 3 formed to the upper surface of the select gate electrode CG from which the insulating film 25 and the cap insulating film CAP are removed. The select gate electrode CG in the feeding region is electrically connected to the first layer wiring via the plug PC formed of the third conductive film buried inside the contact hole CC. Also, to the interlayer insulating film 9 in the feeding region, the contact hole CM reaching the silicide layer 3 formed to the upper surface of the pad electrode PAD is formed. The pad electrode PAD is electrically connected to the first layer wiring via the plug PM formed of the third conductive film buried inside the contact hole CM.

As described above, according to the second embodiment, the cap insulating film CAP is formed to the upper surface of the select gate electrode CG in the memory cell forming region via the insulating film 25, and the insulating film 25 and the cap insulating film CAP are not formed to the upper surface of the select gate electrode CG of the CG shunt portion. In this manner, the third height d3 of the upper surface of the pad electrode PAD running over the partial region of the select gate electrode CG of the CG shunt portion from the main surface of the semiconductor substrate 1 is lower than that when forming the pad electrode PAD on the cap insulating film CAP. Thus, the same effects as those of the first embodiment can be obtained.

Particularly, when the thickness of the stacked film of the insulating films 6b and 6t, the charge storage layer CSL, and the pad electrode PAD is thinner than or same as a thickness of the stacked film of the insulating film 25 and the cap insulating film CAP, a relationship of d1≥d3 is established, and, as the maximum height from the main surface of the semiconductor substrate 1 will not be increased by forming the pad electrode PAD, it is more preferable.

Next, first and second modification examples of the memory gate electrode MG formed in the feeding region and the shunt portion of the select gate electrode CG according to the second embodiment will be described.

Figure 28:
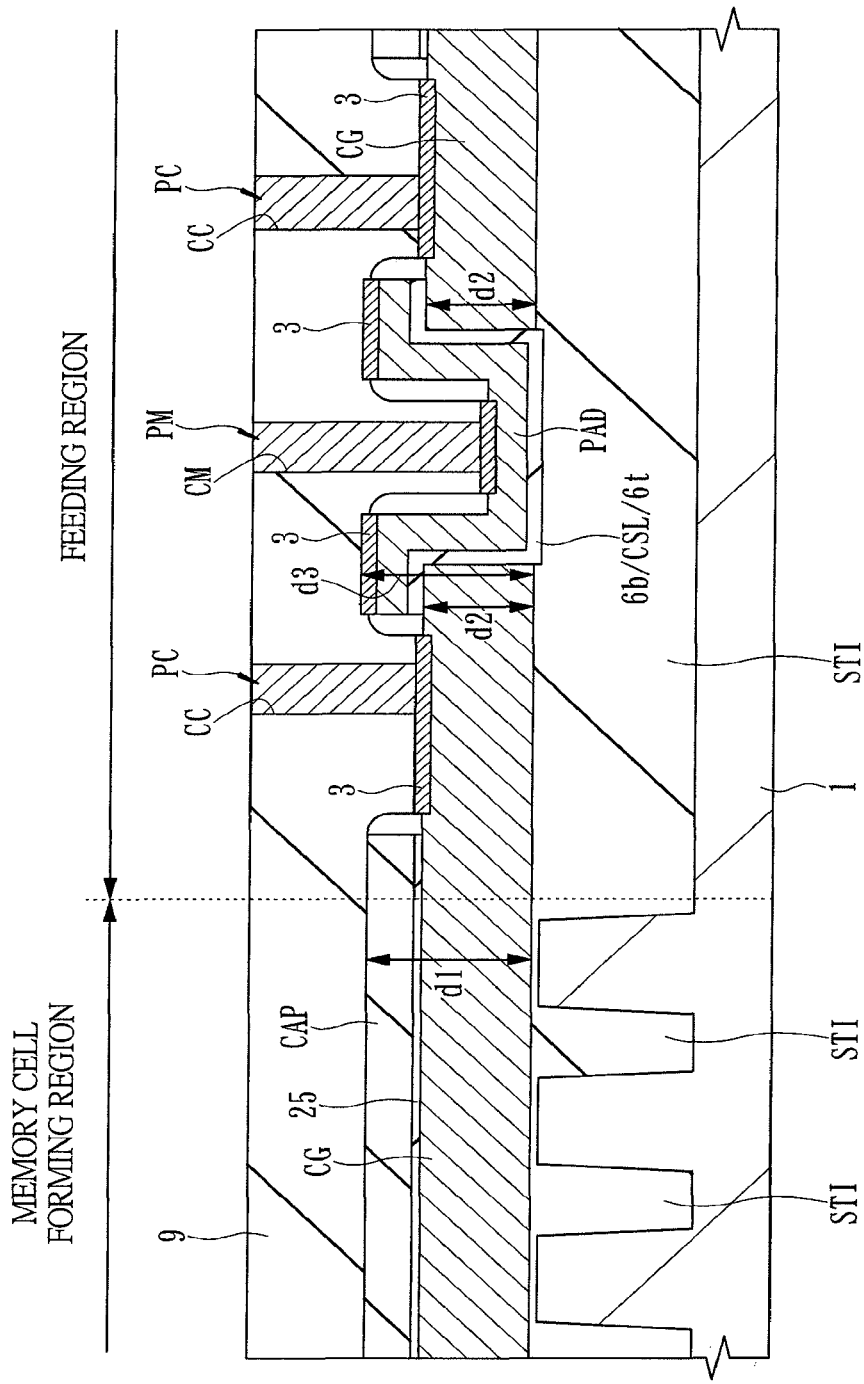
FIG. 28 is a cross-sectional view of a main part illustrating a first modification example of the feeding region of the non-volatile memory cell according to the second embodiment of the present invention.

The first modification example of the feeding region according to the second embodiment will be described with reference to the cross-sectional view of a main part of the feeding region (cross-sectional view of the memory gate electrode MG and the CG shunt portion of the select gate electrode CG) illustrated in FIG. 28. The first modification example of the feeding region according to the second embodiment is similar to that of the second modification example of the feeding region according to the first embodiment, and the present invention is applied in one feeding region shared by two memory cell forming regions.

More specifically, in the MG shunt portion formed in the feeding region, the pad electrode PAD formed of the second conductive film in the same layer as the memory gate electrode MG is formed, the pad electrode PAD running over both a partial region of a first CG shunt portion (termination portion of the select gate electrode CG in a first memory cell forming region) and a partial region of a second CG shunt portion (termination portion of the select gate electrode CG in a second memory cell forming region) formed in the feeding region. The pad electrode PAD is formed in the same step of forming the memory gate electrode MG to the sidewall of the select gate electrode CG in a self-aligned manner, and the memory gate electrode MG in the sidewall shape and the pad electrode PAD are connected. Therefore, via the pad electrode PAD, the memory gate electrode MG formed to the sidewall of the select gate electrode CG of the first CG shunt portion and the memory gate electrode MG formed to the sidewall of the select gate electrode CG of the second CG shunt portion are electrically connected.

In the same manner as the feeding region described above with reference to FIG. 27, in the select nMIS formed in the memory cell forming region, the cap insulating film CAP is formed to the upper surface of the select gate electrode CG of the select nMIS (Qnc) via the insulating film 25, but the insulating film 25 and the cap insulating film CAP are not formed to the upper surface of the select gate electrode CG formed to the CG shunt portion in the feeding region. Therefore, the second height d2 of the select gate electrode CG of the first and second CG shunt portions from the main surface of the semiconductor substrate 1 to the upper surface of the select gate electrode CG is lower than the first height d1 from the main surface of the semiconductor substrate 1 to the upper surface of the stacked film of the select gate electrode CG, insulating film 25, and cap insulating film CAP in the memory cell forming region. In this manner, the effects same as that of the second modification example of the feeding region according to the first embodiment described above can be obtained.

As described above, particularly, when the relationship of d1≥d3 is established, the maximum height from the main surface of the semiconductor substrate 1 is not increased from that before forming the pad electrode PAD by forming the pad electrode PAD, and it is more preferable.

Figure 29:
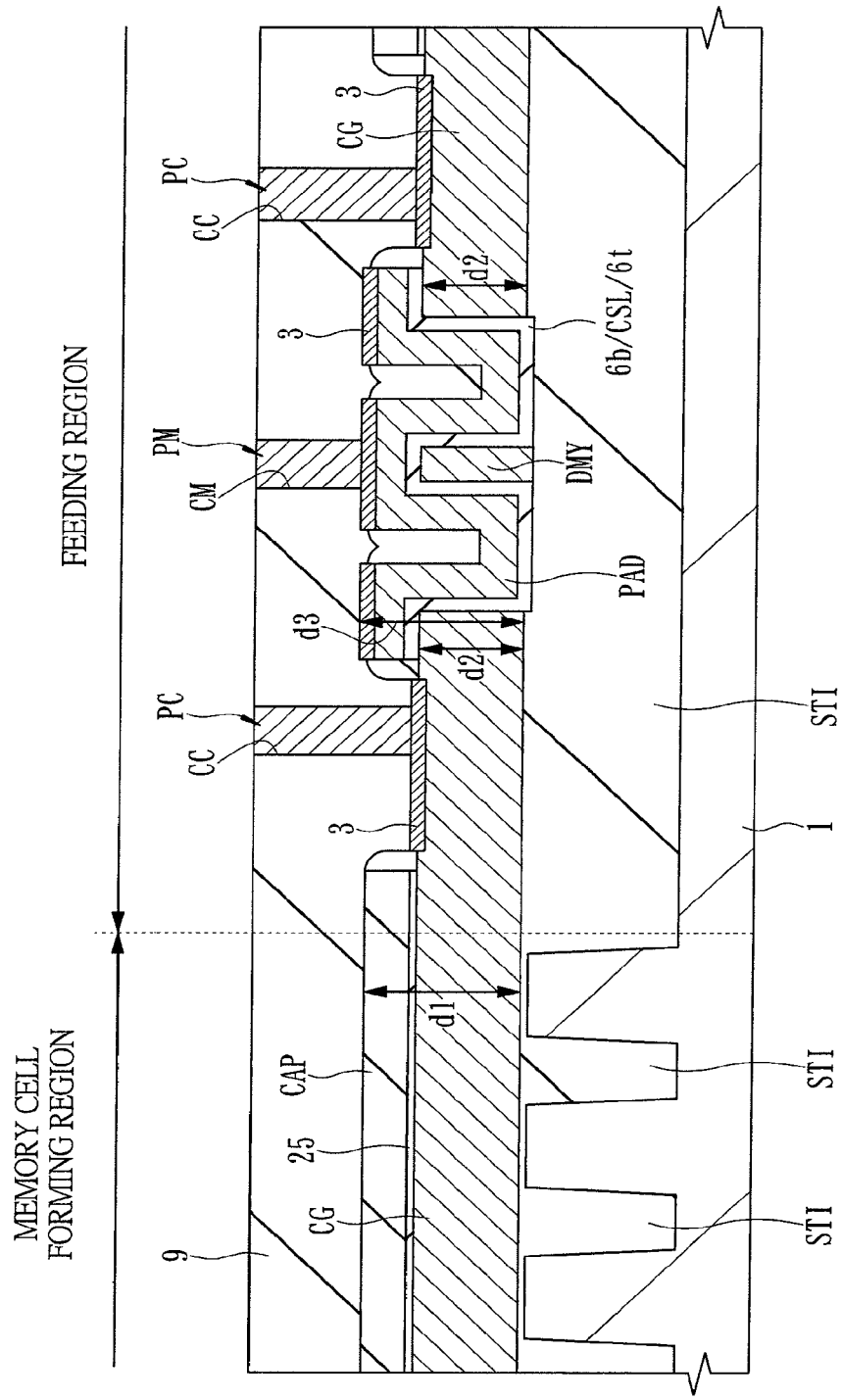
FIG. 29 is a cross-sectional view of a main part illustrating a second modification example of the feeding region of the non-volatile memory cell according to the second embodiment of the present invention.

The second modification example of the feeding region according to the second embodiment will be described with reference to the cross-sectional view of a main part (cross-sectional view of a main part of the memory gate electrode MG and the shunt portion of the select gate electrode CG) of the feeding region illustrated in FIG. 29.

The second modification example of the feeding region according to the second embodiment is same as the third modification example of the feeding region according to the first embodiment, and the present invention is applied to one feeding region shared by two memory cell forming regions in which the dummy portion DMY is arranged between the first CG shunt portion (termination portion of the select gate electrode CG in the first memory cell forming region) and the second CG shunt portion (termination portion of the select gate electrode CG in the second memory cell forming region).

While the dummy portion DMY is formed of the first conductive film in the same layer as the select gate electrode CG, the insulting film 25 and the cap insulating film CAP are not formed to the upper surface of the dummy portion DMY. The dummy portion DMY is not electrically connected to the select gate electrode CG of the first CG shunt portion or the select gate electrode CG of the second CG shunt portion, and is spaced apart from the select gate electrode CG of the first CG shunt portion or the select gate electrode CG of the second CG shunt portion. The height of the dummy portion DMY from the main surface of the semiconductor substrate 1 is substantially the same as the second height d2 from the main surface of the semiconductor substrate 1 to the upper surface of the select gate electrode CG of the first and second CG shunt portions.

In the same manner as the feeding region described with reference to FIG. 27 above, in the select nMIS (Qnc) formed in the memory cell forming region, the cap insulating film CAP is formed to the upper surface of the select gate electrode CG via the insulating film 25, but the insulating film 25 and the cap insulating film CAP are not formed to the upper surface of the select gate electrode CG formed in the CG shunt portion in the feeding region. Therefore, the second height d2 of the select gate electrode CG of the first and second CG shunt portions from the main surface of the semiconductor substrate 1 to the upper surface of the select gate electrode CG is lower than the first height d1 from the main surface of the semiconductor substrate 1 to the upper surface of the stacked film of the select gate electrode CG, insulating film 25, and cap insulating film CAP in the memory cell forming region.

In this manner, the same effects as those of the third modification example of the feeding region according to the first embodiment described above can be obtained.

As described above, particularly, when the relationship of d1≥d3 is established, as the maximum height from the main surface of the semiconductor substrate 1 is not increased from that before forming the pad electrode PAD by forming the pad electrode PAD, it is more preferable.

Next, an example of a method of manufacturing a semiconductor device including the non-volatile memory cell according to the second embodiment will be described in the order of steps with reference to FIGS. 30 to 36. FIGS. 30 to 36 are cross-sectional views of a main part of the memory region, feeding region (MG shunt portion and CG shunt portion), capacitor element region, and peripheral circuit region (low-voltage nMIS region, low-voltage pMIS region, high-voltage nMIS region, and high-voltage pMIS region) during a manufacturing process of the semiconductor device. The memory region and the peripheral circuit region are illustrated by cross-sectional views in a gate-length direction, and the feeding region is illustrated by cross-sectional views in a direction perpendicular to the gate-length direction in the same manner as FIG. 27 described above. Note that the manufacturing procedure until forming the gate insulating films 4 and 4A to the main surface of the semiconductor substrate 1 is the same as that of the first embodiment, and thus descriptions thereof will be omitted.

Figure 30:
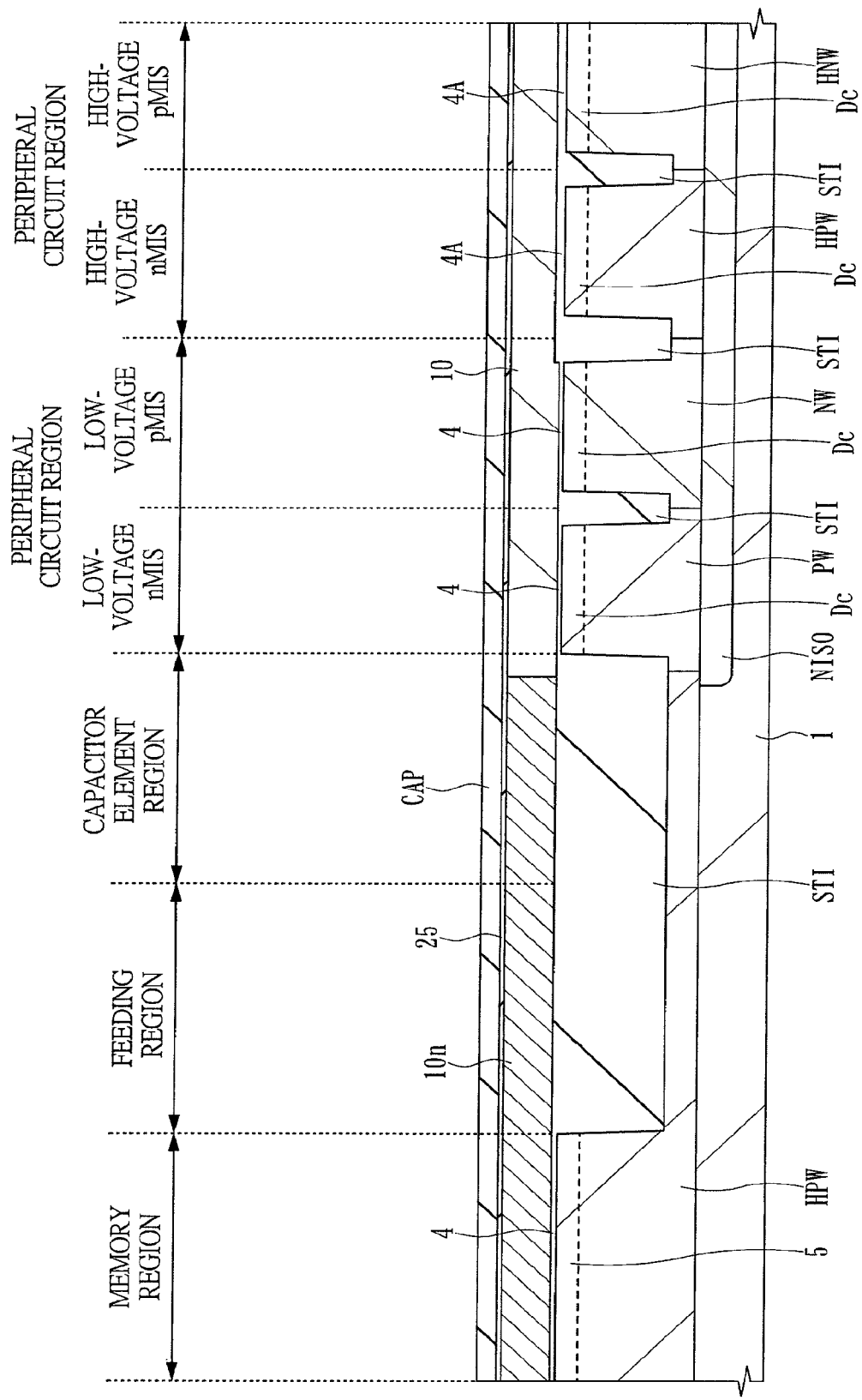
FIG. 30 is a cross-sectional view of a main part illustrating a manufacturing process of a semiconductor device including the non-volatile memory cell according to the second embodiment of the present invention.

As illustrated in FIG. 30, on the main surface of the semiconductor substrate 1, the conductive film 10 formed of, for example, amorphous silicon is deposited by a CVD method, and then an n-type impurity is introduced to the conductive film 10 in the memory region, feeding region, and capacitor element region by an ion implantation method or the like, thereby forming the n-type conductive film (first conductive film) 10n. Thicknesses of the conductive films 10 and 10n are, for example, about 140 nm. Subsequently, by subjecting the semiconductor substrate 1 to a thermal oxidation treatment, the insulating film (sixth insulating film) 25 is formed to the conductive films 10 and 10n. The insulating film 25 is formed of, for example, silicon oxide, and has a thickness of, for example, 5 to 10 nm. Subsequently, the cap insulating film CAP (second insulating film) is deposited on the insulating film 25 by a CVD method. The cap insulating film CAP is formed of, for example, silicon nitride, silicon oxide, silicon oxide containing nitride, or silicon carbide, and has a thickness of, for example, 50 nm.

Figure 31:
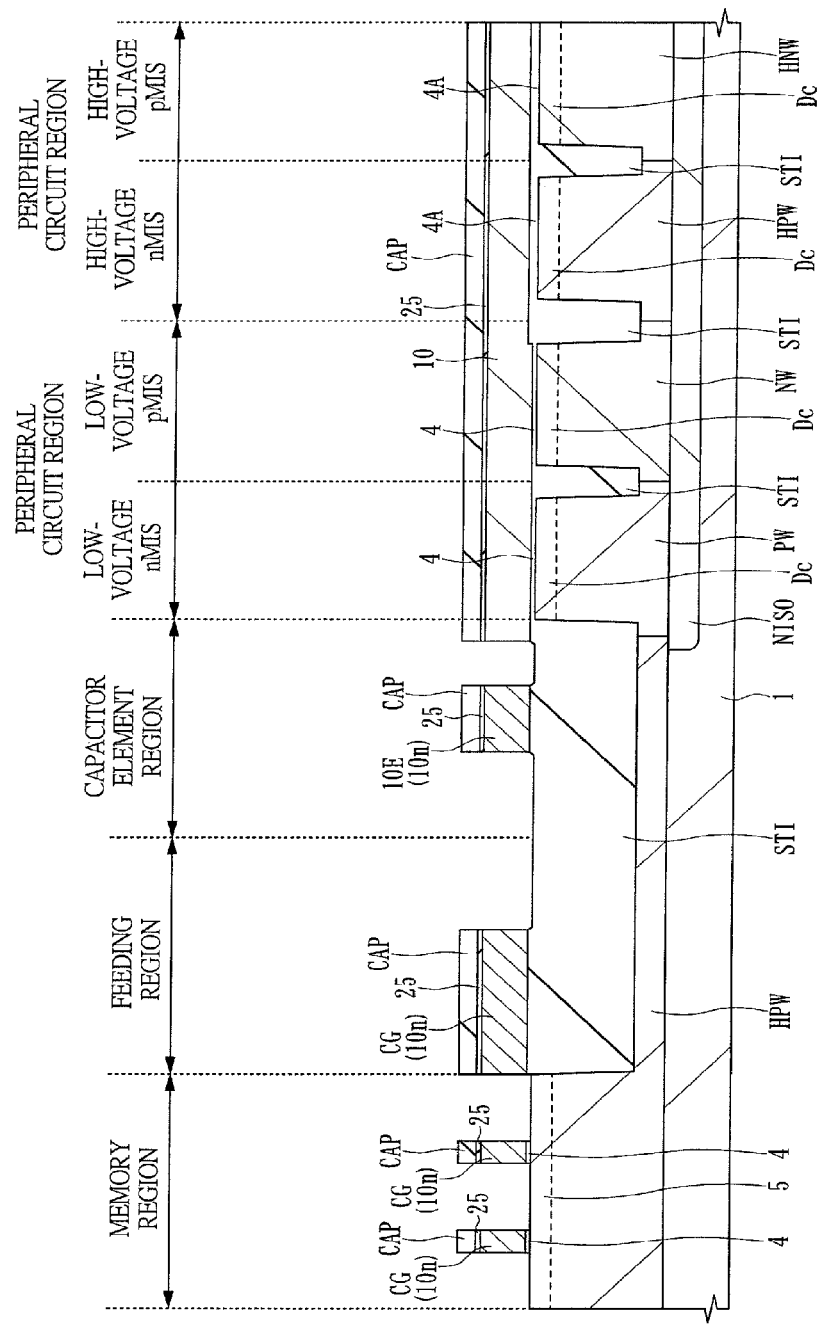
FIG. 31 is a cross-sectional view of the semiconductor device including the non-volatile memory cell in the same portion as FIG. 30 during the manufacturing process of the semiconductor device continued from FIG. 30.

Next, as illustrated in FIG. 31, the cap insulating film CAP, insulating film 25, and n-type conductive film 10n in the memory region, feeding region, and capacitor element region are sequentially patterned using photolithography and dry etching. In this manner, the select gate electrode CG of the select nMIS (Qnc) formed of the n-type conductive film 10n is formed. A gate length of the select gate electrode CG in the memory region is, for example, about 100 nm. At the same time, the bottom electrode 10E formed of the n-type conductive film 10n is formed in the capacitor element region.

Figure 32:
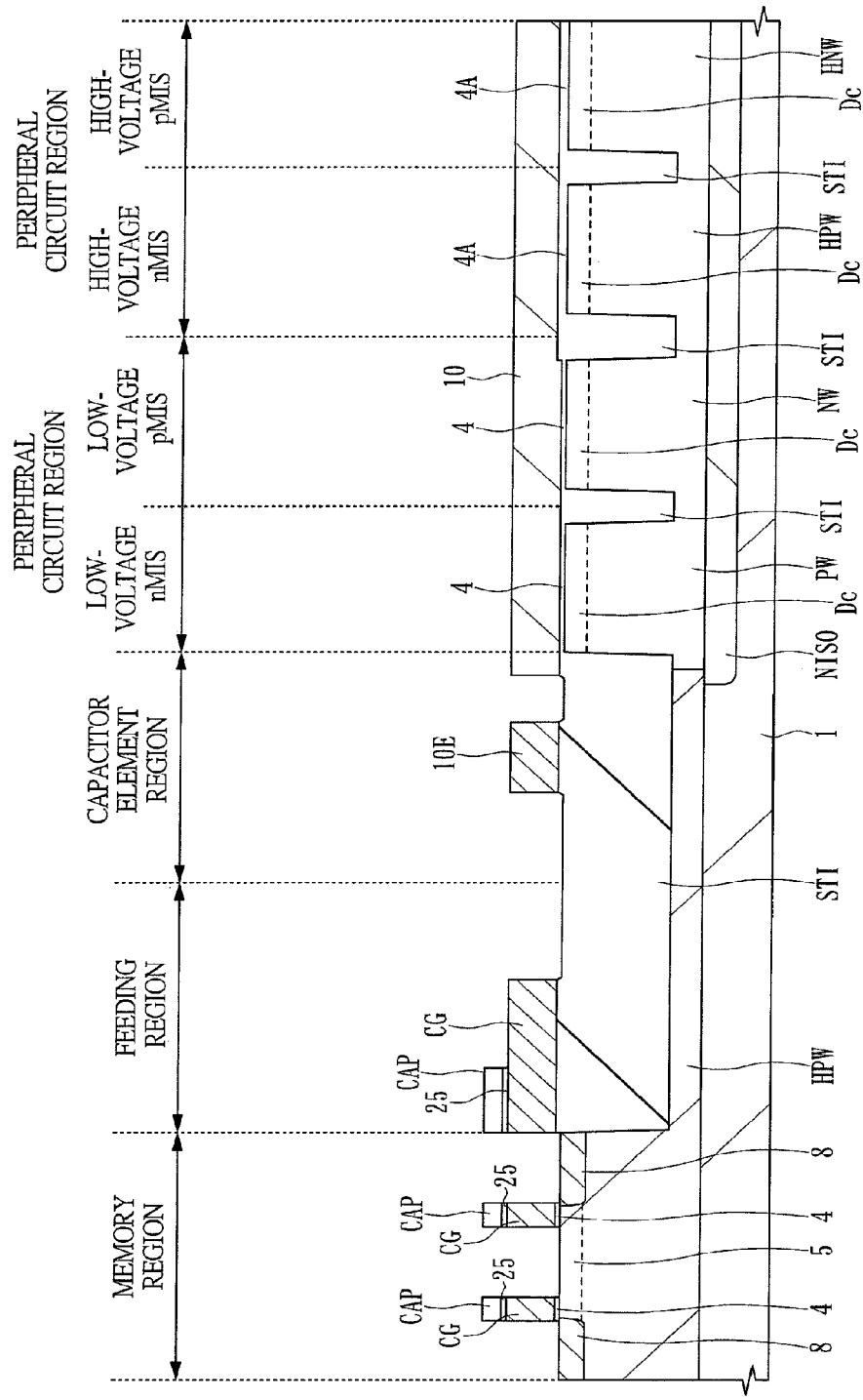
FIG. 32 is a cross-sectional view of the semiconductor device including the non-volatile memory cell in the same portion as FIG. 30 during the manufacturing process of the semiconductor device continued from FIG. 31.

Next, as illustrated in FIG. 32, the cap insulating film CAP in the CG shunt portion in the feeding region, capacitor element region, and peripheral circuit region are removed. Here, in the peripheral circuit region, the silicide layer 3 is necessary to be formed on each gate electrode of the low-voltage nMIS, low-voltage pMIS, high-voltage nMIS, and high-voltage pMIS formed in later steps. Therefore, the cap insulating film CAP in the peripheral circuit region is necessary to be removed in this step. In addition, in the capacitor element region, when the cap insulating film CAP is left therein, a dielectric film between the bottom electrode 10E and the top electrode 11E to be formed in a later step becomes too thick, resulting in a reduction of a capacitance value. Therefore, in this step, the cap insulating film CAP in the capacitor element region is necessary to be removed.

In addition, upon removing the cap insulating film CAP in this step, the insulating film 25 works as an etching stopper.

Next, using the cap insulating film CAP, the select gate electrode CG of the select nMIS (Qnc), and a photoresist pattern as a mask, an n-type impurity, for example, arsenic or phosphorus is ion-implanted into the main surface of the semiconductor substrate 1 in the memory region, thereby forming the n-type semiconductor regions 8 for forming a channel of the memory nMIS (Qnm).

Figure 33:
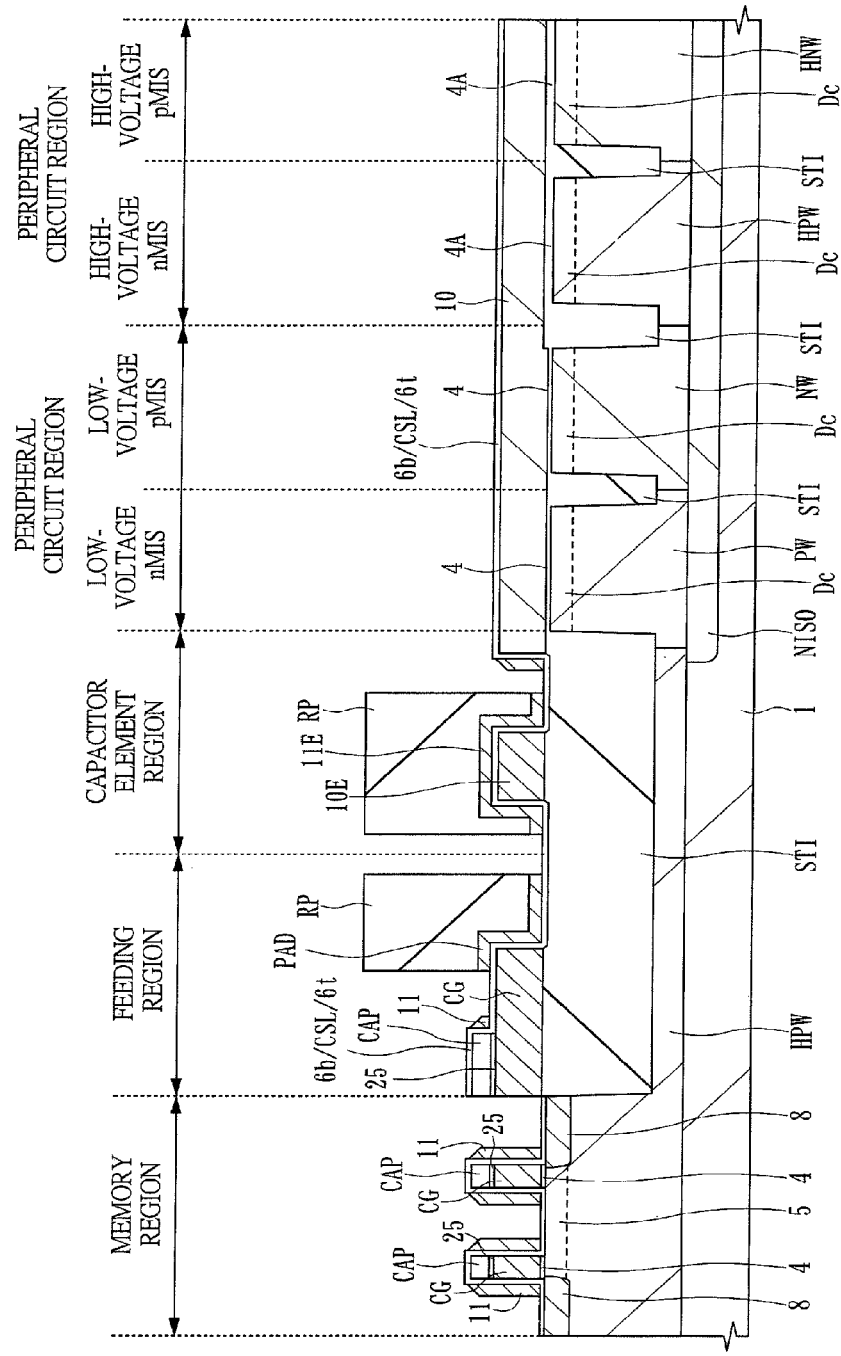
FIG. 33 is a cross-sectional view of the semiconductor device including the non-volatile memory cell in the same portion as FIG. 30 during the manufacturing process of the semiconductor device continued from FIG. 32.

Next, as illustrated in FIG. 33, the insulating films 25 remaining in the CG shunt portion of the feeding region, capacitor element region, and peripheral circuit region are completely removed, and then, the insulating film 6b formed of, for example, silicon oxide, the charge storage layer CSL formed of, for example, silicon nitride, and the insulating film 6t formed of, for example, silicon oxide are formed in series. The insulating film 6b is formed by, for example, a thermal oxidation method or an ISSG oxidation method. The charge storage layer CSL is formed by a CVD method. The insulating film 6t is formed by, for example, a thermal oxidation method or an ISSG oxidation method. The insulating films 6b and 6t may be formed of silicon oxide containing nitride. A total thickness of the insulating films 6b and 6t and the charge storage layer CSL can be, for example, about 20 nm.

Next, the second conductive film formed of low-resistance polycrystalline silicon is deposited on the main surface of the semiconductor substrate 1. The second conductive film is formed of a CVD method, and has a thickness of, for example, 50 nm.

Before depositing the second conductive film, as the insulating film 25 and the cap insulating film CAP formed to the upper surface of the select gate electrode CG of the CG shunt portion are previously removed in the feeding region in the step illustrated in FIG. 32, a height (third height d3) of the second conductive film deposited on the select gate electrode CG of the CG shunt portion via the insulating films 6b and 6t and charge storage layer CSL from the main surface of the semiconductor substrate 1 to the upper surface of the pad electrode PAD is lower than or same as the height (first height d1) of the upper surface of the stacked film of the select gate electrode CG, insulating film 25, and cap insulating film CAP in the memory region from the main surface of the semiconductor substrate 1.

Next, the second conductive film is processed by using photolithography and anisotropic dry etching. In this manner, in the memory region, sidewalls 11 are formed to both side surfaces of the stacked films of the select gate electrode CG, insulating film 25, and cap insulating film CAP via the insulating films 6b and 6t and charge storage layer CSL. At the same time, in the CG shunt portion in the feeding region, the sidewalls 11 are formed to both side surfaces of the select gate electrode CG via the insulating films 6b and 6t and charge storage layer CSL. Further, in the MG shunt portion in the feeding region, a partial region of the CG shunt portion is covered by a resist pattern RP, thereby forming the pad electrode PAD via the insulating films 6b and 6t and charge storage layer CSL. Moreover, in the capacitor element region, the bottom electrode 10E is covered by the photoresist pattern RP, thereby forming the top electrode 11E via the insulating films 6b and 6t and charge storage layer CSL.

In the CG shunt portion, as the cap insulating film CAP has been removed in the step illustrated in FIG. 32 described above, the height (third height d3) of the pad electrode PAD running over the select gate electrode CG of the CG shunt portion from the main surface of the semiconductor substrate 1 to the upper surface of the pad electrode PAD is lower than or same as the height (first height d1) to the upper surface of the stacked layer of the select gate electrode CG, insulating film 25, and cap insulating film CAP in the memory region. A thickness of the select gate electrode CG of the select nMIS (Qnc) in the memory region is, for example, about 150 nm, a thickness of the insulating film 25 is, for example, about 10 nm, and a thickness of the cap insulating film CAP is, for example, about 50 nm. Thus, a height from the main surface of the semiconductor substrate 1 to the upper surface of the cap insulating film CAP in the memory region (not including the thickness of the gate insulating film 4) is, for example, about 210 nm. Meanwhile, a thickness of the pad electrode PAD of the MG shunt portion in the feeding region is, for example, about 40 nm, a total thickness of the insulating films 6b and 6t and charge storage layer CSL are, for example, about 20 nm. Thus, a height from the main surface of the semiconductor substrate 1 to the upper surface of the pad electrode PAD in the feeding region is, for example, about 210 nm.

Therefore, as compared to forming the second conductive film to the portion where the stacked film of the select gate electrode CG of the CG shunt portion, insulating film 25, and cap insulating film CAP, a bump in the region in which the photoresist pattern RP is formed is small at the CG shunt portion, and thus a focus shift in a lithography process due to a bump is reduced, a processing accuracy of the photoresist pattern RP is improved, and a shape failure of the pad electrode PAD formed by processing the second conductive film can be prevented.

Figure 34:
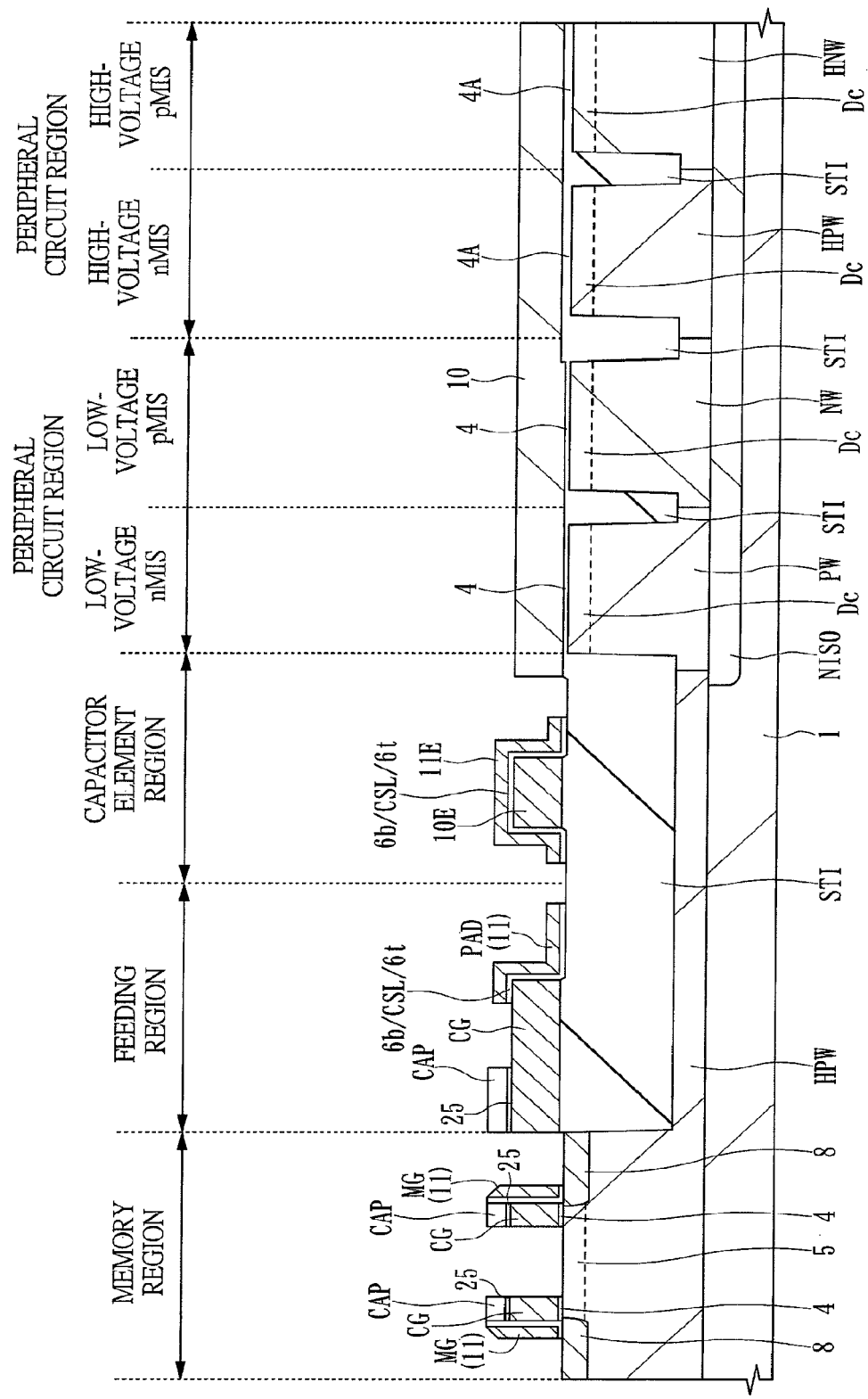
FIG. 34 is a cross-sectional view of the semiconductor device including the non-volatile memory cell in the same portion as FIG. 30 during the manufacturing process of the semiconductor device continued from FIG. 33.

Next, as illustrated in FIG. 34, using a photoresist pattern as a mask, the sidewalls 11 exposed from the photoresist pattern are etched. In this manner, in the memory region, the memory gate electrodes MG (sidewalls) 11 of the memory nMIS (Qnm) are formed only on one side surface of each of the stacked films of the select gate electrode CG, insulating film 25, and cap insulating film CAP. The gate length of the memory gate electrode MG is, for example, about 65 nm.

Next, the insulating films 6b and 6t and charge storage layer CSL are selectively removed except for those left: between the memory gate electrode MG and the stacked film of the select gate electrode CG, insulating film 25, and cap insulating film CAP, and between the semiconductor substrate 1 and the memory gate electrode MG in the memory region; between the select gate electrode CG and the pad electrode PAD and between the device isolation portion STI and the pad electrode PAD in the MG shunt portion in the feeding region; and between the bottom electrode 10E and the top electrode 11E in the capacitor element region.

In the capacitor element region, a capacitor element is formed having: the bottom electrode 10E formed of the first conductive film in the same layer as the select gate electrode CG of the select nMIS (Qnc); and the top electrode 11E formed of the second conductive film in the same layer as the memory gate electrode MG of the memory nMIS (Qmc), by taking the insulating films 6b and 6t and charge storage layer CSL as a capacitor insulating film (dielectric film).

Next, following a manufacturing process same as the first embodiment described above (cf., FIGS. 15 and 16), the conductive film 10 of the low-voltage nMIS region and the high-voltage nMIS region in the peripheral circuit region is turned into the n-type conductive film 10na, and the conductive film 10 of the low-voltage pMIS region and high-voltage pMIS region in the peripheral circuit region is turned into the p-type conductive film 10p, and then the conductive films 10na and 10p in the peripheral circuit region are patterned by lithography technology and dry etching technology, thereby forming the gate electrode GLn formed of the conductive film 10na of the low-voltage nMIS, gate electrode GLp formed of the conductive film 10p of the low-voltage pMIS, the gate electrode GHn formed of conductive film 10na of the high-voltage nMIS, the gate electrode GHp formed of the conductive film 10p of the high-voltage pMIS.

As the gate length is shortened by miniaturization (scaling), the resist pattern used upon etching of the conductive films 10na and 10p in the peripheral circuit region in this step is very thinly formed. In the region in which the pad electrode PAD is formed, due to the bump, the resist pattern on the pad electrode PAD is not formed at a desired thickness, and may be thin. In this case, upon etching the gate electrodes GLn, GLp, GHn, and GHp, the resist pattern is feared to be eliminated. Since the pad electrode PAD is formed of low-resistance polycrystalline silicon same as the conductive films 10na and 10p, if the resist pattern on the pad electrode PAD is eliminated, the pad electrode PAD may be etched and a problem of occurrence of a shape failure of the pad electrode PAD may be posed.

Meanwhile, in the second embodiment, as the pad electrode PAD is formed by running over the select gate electrode CG from which the insulating film 25 and the cap insulating film CAP are removed, the third height d3 of the pad electrode PAD from the main surface of the semiconductor substrate 1 to the upper surface of the pad electrode PAD when the pad electrode PAD is formed is low. Thus, the bump is reduced and it is easy to form the resist pattern at a desired thickness, and the problem of occurrence of a shape failure of the pad electrode PAD can be avoided.

Next, following a manufacturing process same as that of the first embodiment (cf. FIGS. 17 to 23), the drain region Drm formed of the n⁻-type semiconductor region 2ad and n⁺-type semiconductor region 2b and the source region Srm formed of the n⁻-type semiconductor region 2as and n⁺-type semiconductor region 2b are formed in the memory region. The source/drain regions SD of the high-voltage nMIS formed of the n⁻-type semiconductor region 13 and the n⁺-type semiconductor region 23, and the source/drain regions SD of the low-voltage nMIS formed of the n⁻-type semiconductor region 18 and the n⁺-type semiconductor region 23 are formed in the peripheral circuit region.

Figure 35:
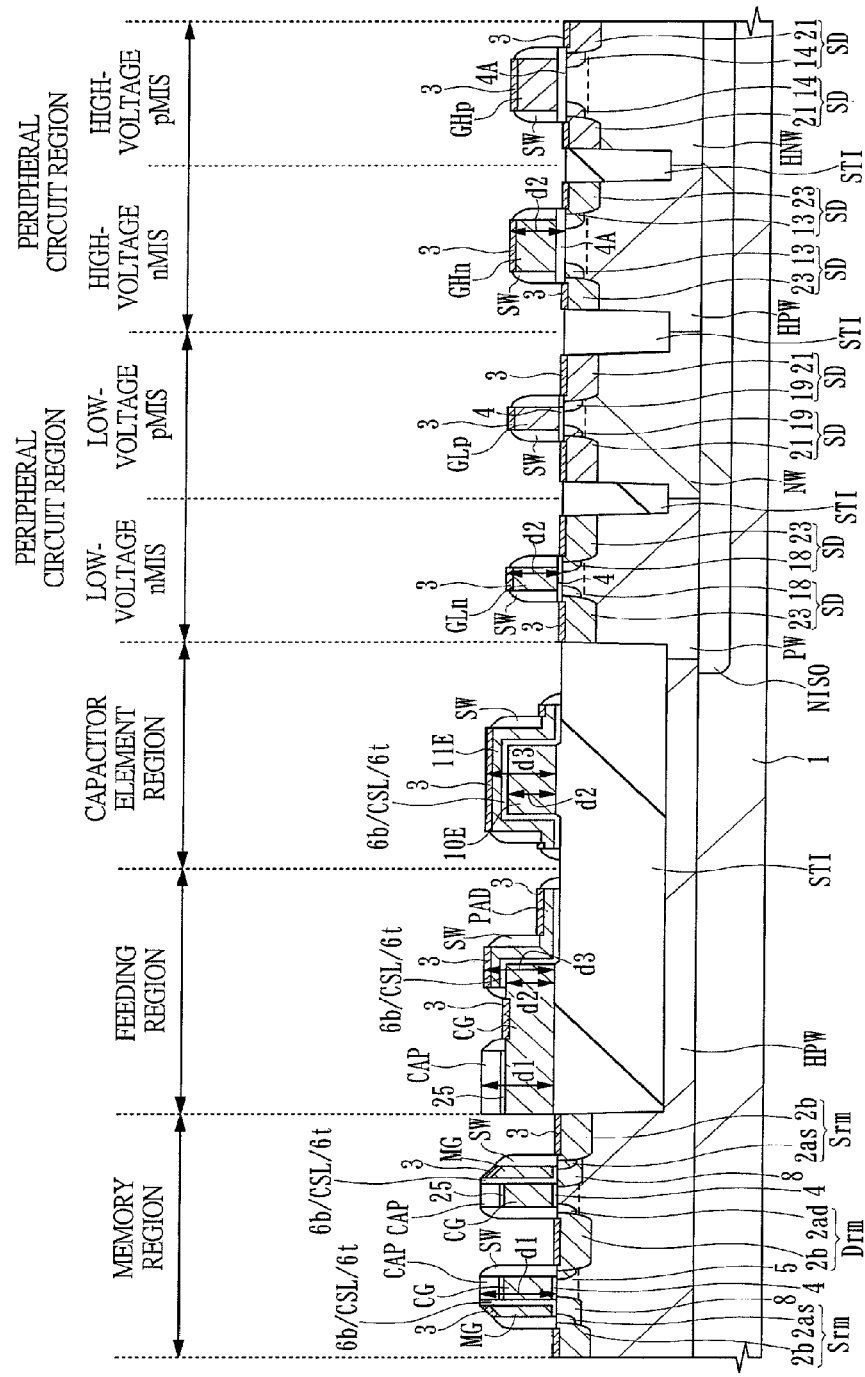
FIG. 35 is a cross-sectional view of the semiconductor device including the non-volatile memory cell in the same portion as FIG. 30 during the manufacturing process of the semiconductor device continued from FIG. 34.

Next, as illustrated in FIG. 35, the silicide layers 3 are formed to: the upper surfaces of the memory gate electrodes MG, and upper surfaces of the n⁺-type semiconductor regions 2b of the memory nMIS (Qnm) in the memory region; the upper surface of the pad electrode PAD of the MG shunt portion, and the upper surface of the select gate electrode CG, to which the cap insulating film CAP is not formed, of the select nMIS (Qnc) of the CG shunt portion in the feeding region; an upper surface of the gate electrode GLn and upper surfaces of the n⁺-type semiconductor regions 23 of the low-voltage nMIS, an upper surface of the gate electrode GLp and upper surfaces of the p⁺-type semiconductor regions 21 of the low-voltage pMIS, an upper surface of the gate electrode GHn and upper surfaces of the n⁺-type semiconductor regions 23 of the high-voltage nMIS, and an upper surface of the gate electrode GHp and upper surfaces of the p⁺-type semiconductor regions 21 of the high-voltage pMIS in the peripheral circuit region; and an upper surface of a part of the top electrode 11E not overlapping with the select gate electrode CG and the sidewalls SW in plane in the capacitor element region.

Through the foregoing process, the capacitor element and the low-voltage nMIS, low-voltage pMIS, high-voltage nMIS, and high-voltage pMIS formed in the peripheral circuit region according to the second embodiment are substantially completed.

As illustrated in FIG. 35, the pad electrode PAD is formed on the select gate electrode CG from which the insulating film 25 and the cap insulating film CAP are removed. In addition, the capacitor insulating film (insulating films 6b and 6t and charge storage layer CSL) of the capacitor element and the top electrode 11E are also formed on the bottom electrode 10E from which the insulating film 25 and cap insulating film CAP are removed. In this manner, the maximum height of the elements on the main surface of the semiconductor substrate 1 after forming the pad electrode PAD and top electrode 11E can be lower than that when forming the pad electrode PAD and top electrode 11E on the cap insulating film CAP. As a result, even when the interlayer insulating film 9 to be formed in a later step is not thickly formed, a margin upon polishing the third insulating film that forms the interlayer insulating film 9 by a CMP method can be ensured. Therefore, also when forming a deep contact hole to the interlayer insulating film 9, an opening diameter near the bottom of the contact hole can be ensured, and a high resistance or no conduction of the plug formed by burying a conductive film to the contact hole can be prevented. Moreover, upon performing an etching for forming the contact hole, occurrence of a shape failure to the pad electrode PAD due to a lack of a thickness of the photoresist pattern can be prevented.

As described above, particularly, when the relationship of d1≥d3 is established, as the maximum height from the main surface of the semiconductor substrate 1 is not changed from that before forming the pad electrode PAD by forming the pad electrode PAD, it is more preferable.

Next, following a manufacturing process as that of the first embodiment described above (cf., FIGS. 24 and 25), the silicon nitride film 9a is deposited as an insulating film on the main surface of the semiconductor substrate 1 by a CVD method. The silicon nitride film 9a works as an etching stopper upon forming a contact hole described below. Subsequently, the silicon oxide film 9b is formed as an insulating film by a CVD method and polished by a CMP method, thereby forming the interlayer insulating film 9 formed of the silicon nitride film 9a and silicon oxide film 9b. Since the height of the pad electrode PAD from the main surface of the semiconductor substrate 1 is formed to be low as described above, the height of the whole elements on the main surface of the semiconductor substrate 1 is low, and thus a margin in an upcoming polishing by a CMP method can be ensured without thickly depositing the silicon oxide film 9b. The same goes to the top electrode 11E of the capacitor element.

Figure 36:
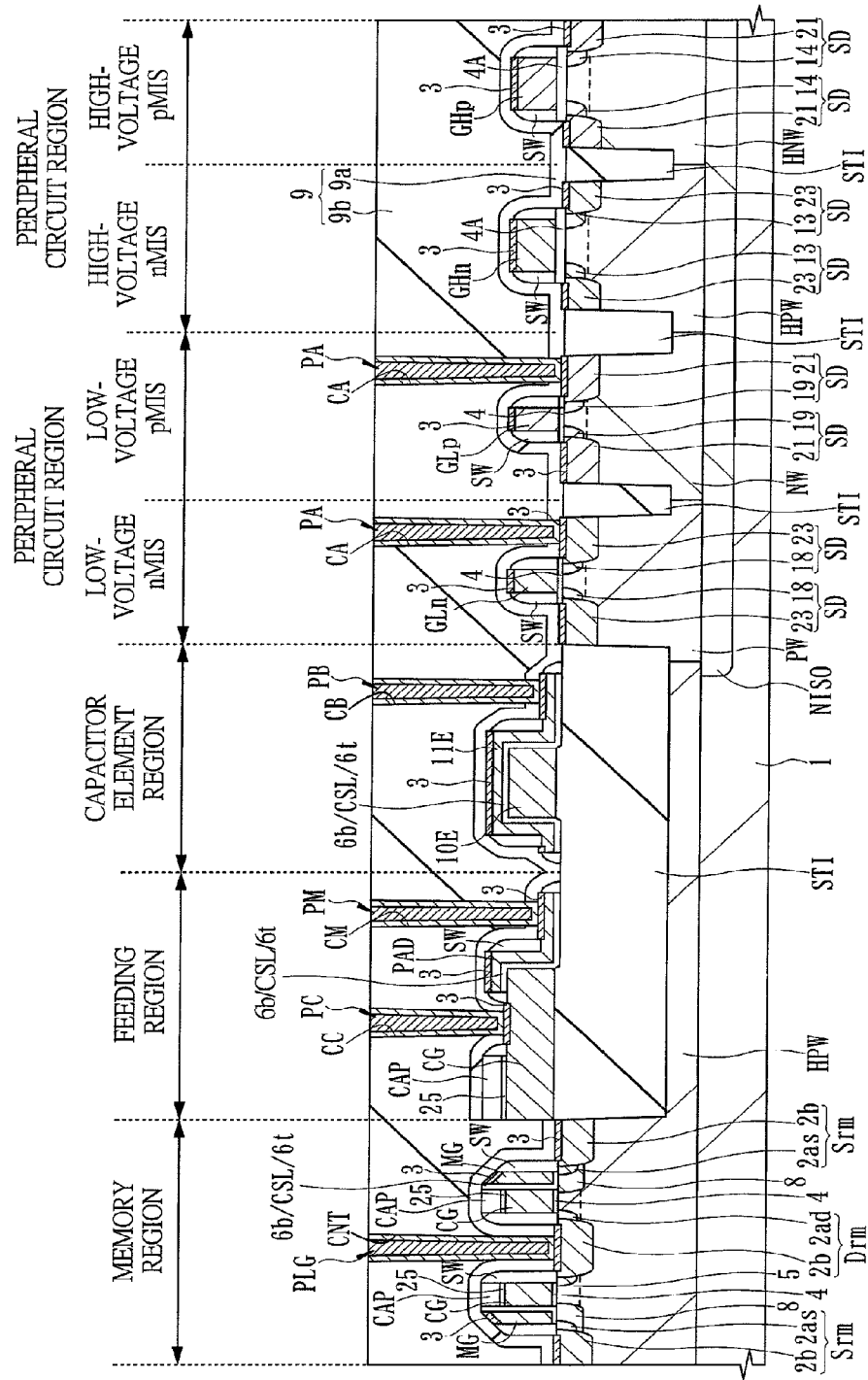
FIG. 36 is a cross-sectional view of the semiconductor device including the non-volatile memory cell in the same portion as FIG. 30 during the manufacturing process of the semiconductor device continued from FIG. 35.

Next, as illustrated in FIG. 36, the contact hole CNT reaching the silicide layer 3 on the drain region Drm is formed to the interlayer insulating film 9 in the memory region. At the same time, in the feeding region, the contact hole CC reaching the silicide layer 3 on the select gate electrode CG of the CG shunt portion is formed, and the contact hole CM reaching the silicide layer 3 on the pad electrode PAD of the MG shunt portion is formed.

Further, in the peripheral circuit region, the contact holes CA reaching the silicide layer 3 are formed on the gate electrodes (GHn, GHp, GLn, GLp) and the source/drain regions SD of the high-voltage nMIS, high-voltage pMIS, low-voltage nMIS, and low-voltage pMIS, respectively. In the capacitor element region, in a portion where the top electrode 11E and the bottom electrode 10E are not overlapped in a plane, the contact holes CB are formed reaching the silicide layers 3 of each of upper surfaces the top electrode 11E and bottom electrode 10E.

At this time, since the interlayer insulating film 9 is formed to be low, the opening diameter near the bottom of the contact hole can be ensured even when a deep contact hole such as the contact hole CNT is formed to the interlayer insulating film 9. Also, upon performing an etching for forming the contact hole, occurrence of a shape failure to the pad electrode PAD due to a lack of a thickness of the photoresist pattern can be prevented.

Next, the plug PLG is formed inside the contact hole CNT, the plug PC is formed in the contact hole CC, the plug PM is formed inside the contact hole CM, the plug PA is formed inside the contact hole CA, and the plug PB is formed inside the contact hole CB. Thereafter, by forming the first layer wiring, the memory cell, the capacitor element, and the low-voltage nMIS, low-voltage pMIS, high-voltage nMIS, and high-voltage pMIS formed in the peripheral circuit region are substantially completed.

From here, the semiconductor device including the non-volatile memory will be manufactured through a normal manufacturing process of a semiconductor device.

Note that, while the insulating film 25 has been formed between the select gate electrode CG of the select nMIS (Qnc) and the cap insulating film CAP in the second embodiment, the present invention can be also applied to a non-volatile memory in which the insulating film 25 is not formed. Meanwhile, in this case, the upper surface of the select gate electrode CG is feared to be etched also in the etching for removing the pad electrode PAD.

The above-described first embodiment and second embodiment can be used in a semiconductor device including a semiconductor element having a first gate electrode and a second gate electrode formed to be adjacent to each other via an insulating film, the semiconductor device having a feeding region for supplying voltage to the first gate electrode and supplying voltage to the second gate electrode. Specifically, the present invention can be used in a semiconductor device including a memory cell of a split-gate structure of two-transistor configuration. The same goes to third to fifth embodiments described below.

Third Embodiment

The present invention is a semiconductor device including a non-volatile memory (non-volatile memory element, flash memory, non-volatile semiconductor memory device), and the non-volatile memory uses a trap insulating film (an insulating film capable of storing charges) to mainly a charge storage portion. In the following embodiments, the non-volatile memory is basically an n-channel type MISFET (metal insulator semiconductor field effect transistor) and the descriptions will be made based on a memory cell using the trap insulating film. In addition, polarities (polarities of applied voltages upon program, erase, and read, and polarities of carriers) will be mentioned to describe operation of using a memory cell based on an n-channel MISFET. If the memory cell is based on a p-channel type MISFET, the same operation can be achieved in principle when all polarities of applied voltages and conductivities of carriers are reversed.

Figure 37:
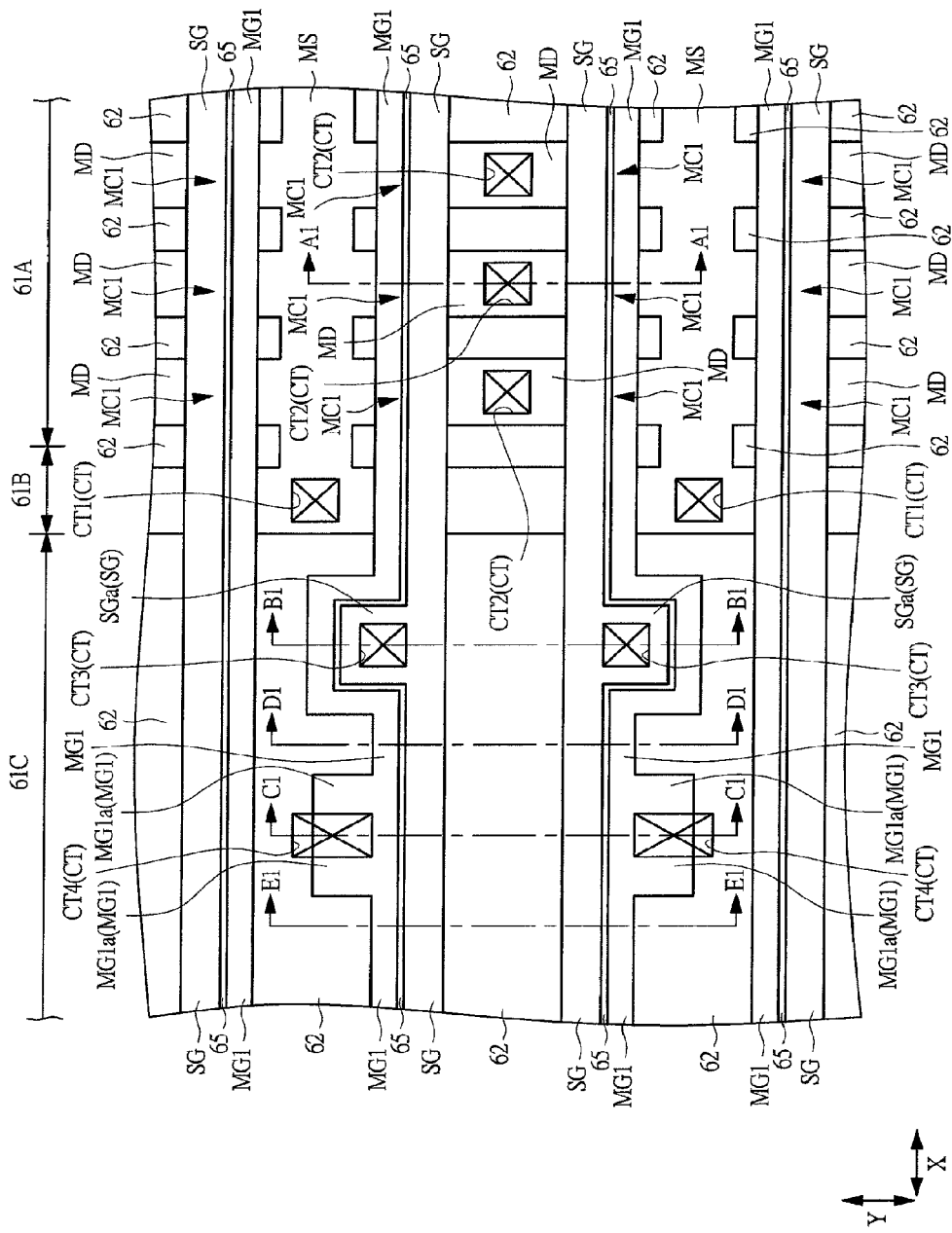
FIG. 37 is a plan view of a main part of a semiconductor device according to a third embodiment of the present invention.
Figure 38:
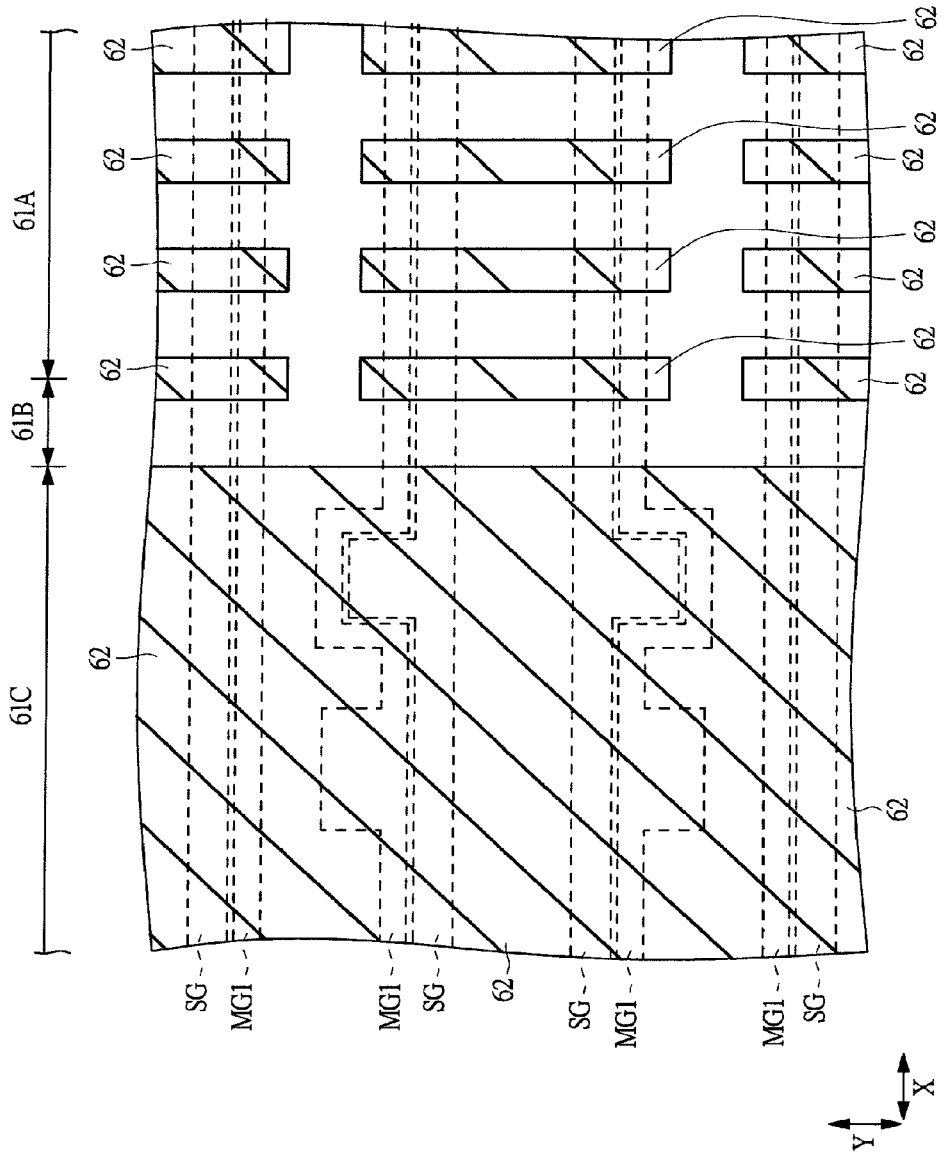
FIG. 38 is a plan view of a main part of the semiconductor device according to the third embodiment of the present invention.
Figure 44:
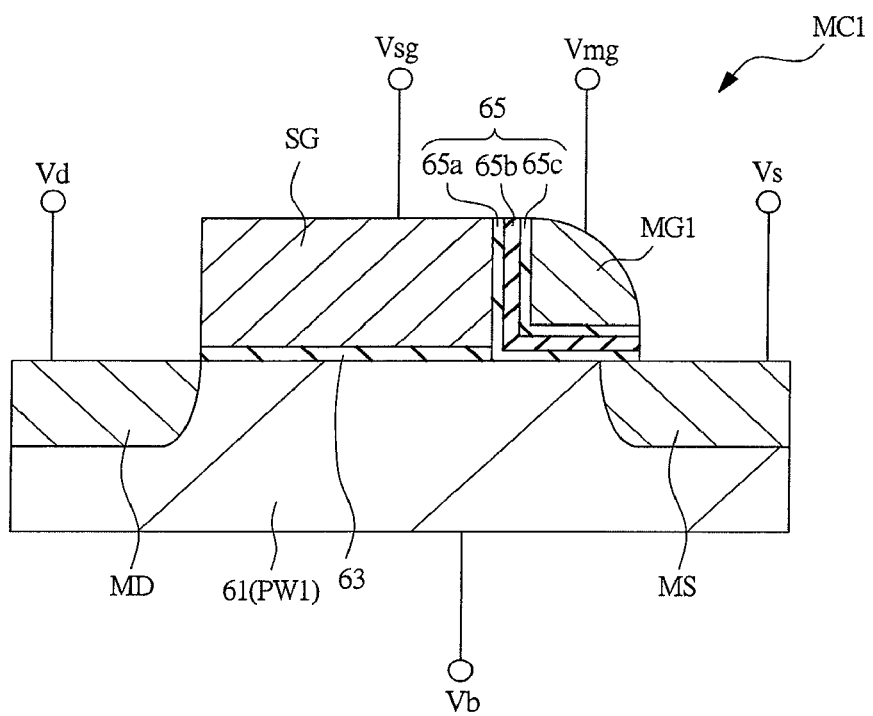
FIG. 44 is a cross-sectional view of a main part illustrating a schematic cross-sectional structure of a memory cell in the semiconductor device according to the third embodiment of the present invention.

A structure of the semiconductor device of the present invention will be described with reference to the attached drawings. FIGS. 37 and 38 are plan views of a main part of the semiconductor device of the present invention, and FIGS. 39 to 43 are cross-sectional views of a main part of the semiconductor device of the present invention. A cross section taken along the line A1-A1 in FIG. 37 corresponds to FIG. 39, a cross section taken along the line B1-B1 in FIG. 37 corresponds to FIG. 40, a cross section taken along the line C1-C1 in FIG. 37 corresponds to FIG. 41, a cross section taken along the line D1-D1 in FIG. 37 corresponds to FIG. 42, and a cross section taken along the line E1-E1 in FIG. 37 corresponds to FIG. 43. FIG. 44 is a cross-sectional view of a main part illustrating a schematic cross-sectional structure of a memory cell M1 in the semiconductor device of the present invention.

To facilitate understanding, a planar layout of a select gate electrode SG, a memory gate electrode MG1, an insulating film 65 between the select gate electrode SG and the memory gate electrode MG1, a source semiconductor region MS, a drain semiconductor region MD, a device isolation region 62, a contact hole CT, etc. is illustrated in the plan view of FIG. 37, and illustration of other components are omitted. While FIG. 38 illustrates a planar region same as FIG. 37, hatching is added to the device isolation region 62, and the select gate electrode SG and memory gate electrode MG1 are illustrated by dotted lines. The region without hatching corresponds to an active region (active region defined by the device isolation regions 62) in FIG. 38. Also, in FIG. 38, illustration of the contact hole CT is omitted. In FIG. 44, a cross-sectional region corresponding to the right half of FIG. 39 (cross-sectional region for one memory cell) is illustrated, and a semiconductor substrate 61, a p-type well PW1, insulating films 63 and 65, a select gate electrode SG, a memory gate electrode MG1, and semiconductor regions MS and MD are illustrated. Meanwhile, illustrations of a sidewall insulating film 68, a metal silicide layer 71, an insulating film 72, the contact hole CT, a plug PG, and a wiring MM1 are omitted.

The semiconductor device of the present embodiment illustrated in FIGS. 37 to 44 is a semiconductor device including a non-volatile memory.

For example, to a memory cell region (memory cell forming region, memory-cell-array forming region) 61A of the semiconductor substrate (semiconductor wafer) formed of p-type single crystal silicon having a resistivity of about 1 to 10 Ωcm, a MISFET (metal insulator semiconductor field effect transistor; MIS transistor; MIS-type field effect transistor) to be a memory cell of the non-volatile memory is formed.

To the semiconductor substrate 61, the device isolation regions 62 for isolating devices (elements) are formed, and a p-type well PW1 is formed in an active region isolated (defined) by the device isolation regions 62.

To the p-type well PW1 of the memory cell region 61A, a memory cell array MC1 of the non-volatile memory formed of a memory transistor and a select transistor (control transistor) is formed. In the memory cell region 61A, a plurality of the memory cells MC1 are formed in an array, and the memory cell region 61A is electrically isolated from other regions by the device isolation regions 62. That is, the memory cell region 61A corresponds to a region in which the plurality of memory cells MC1 are formed (arranged, arrayed) in an array in a main surface of the semiconductor substrate 61.

The memory cell MC1 of the non-volatile memory formed in the memory cell region 61A is a memory cell of split-gate type using a MONOS film, and including two connected MISFETs of a select transistor (control transistor) having the select gate electrode (control gate electrode) SG and a memory transistor having the memory gate electrode (gate electrode for a memory) MG1.

Here, the MISFET having the gate insulating film including a charge storage portion and the memory gate electrode MG1 is called memory transistor (transistor for memory), and the MISFET having the gate insulating film and the select gate electrode SG is called select transistor (transistor for selecting memory cell, control transistor). Thus, the memory gate electrode MG1 is a gate electrode of the memory transistor, and the select gate electrode SG is a gate electrode of the select transistor, and thus the select gate electrode SG and memory gate electrode MG1 are gate electrodes forming (a memory cell of) the non-volatile memory.

Hereinafter, a configuration of the memory cell MC1 will be specifically described.

As illustrated in FIGS. 38 and 44, the memory cell MC1 of the non-volatile memory includes: the n-type semiconductor regions MS and MD for source and drain formed in the p-type well PW1 of the semiconductor substrate 61; the select gate electrode SG formed above the semiconductor substrate 61 (p-type well PW1); and the memory gate electrode MG1 formed above the semiconductor substrate 61 (p-type well PW1) and being adjacent to the select gate electrode SG. In addition, the memory cell MC1 of the non-volatile memory further includes: the insulating film (gate insulating film) 63 formed between the select gate electrode SG and the semiconductor substrate 61 (p-type well PW1); and the insulating film 65 formed between the memory gate electrode MG1 and the semiconductor substrate 61 (p-type well PW1). The memory gate electrode MG1 of each memory cell MC1 forms a word line of each of the memory cells MC1.

The select gate electrode SG and the memory gate electrode MG1 are arranged next to each other and extended along the main surface of the semiconductor substrate 61 interposing the insulating film 65 between their facing side surfaces (sidewalls). The select gate electrode SG and the memory gate electrode MG1 are formed between the semiconductor region MD and the semiconductor region MS above the semiconductor substrate 61 (p-type well PW1) interposing the insulating films 63 and 65 (note that the select gate electrode SG interposes the insulating film 63 and the memory gate electrode MG1 interposes the insulating film 65). The memory gate electrode MG1 is positioned on the semiconductor region MS side, and the select gate electrode SG is positioned on the semiconductor region MD side.

The select gate electrode SG and the memory gate electrode MG1 are adjacent to each other interposing the insulating film 65 therebetween, and the memory gate electrode MG1 is formed in a sidewall spacer shape on one sidewall (side surface) of the select gate electrode SG interposing the insulating film 65. Hereinafter, the "sidewall spacer shape" may be called "sidewall shape." The insulating film 65 is extended across both of a region between the memory gate electrode MG1 and the semiconductor substrate 61 (p-type well PW1) and a region between the memory gate electrode MG1 and the select gate electrode SG.

The insulating film 63 formed between the select gate electrode SG and the semiconductor substrate 61 (p-type well PW1) (i.e., the insulating film 63 under the select gate electrode SG) works as a gate insulating film of the select transistor. Also, the insulating film 65 between the memory gate electrode MG1 and the semiconductor substrate 61 (p-type well PW1) (i.e., the insulating film 65 under the memory gate electrode MG1) works as a gate insulating film (gate insulating film having a charge storage portion inside) of the memory transistor.

The insulating film 65 is a gate insulating film having a stacked-layer structure of: an insulating film for storing charges (i.e., charge storage portion) of, for example, a silicon nitride film 65b; and insulating films positioned above and under the charge storing insulating film of, for example, a silicon oxide film 65c and a silicon oxide film 65a. That is, the insulating film 65 is formed of a stacked film including the silicon oxide film (oxide film) 65a, the silicon nitride film (nitride film) 65b, and the silicon oxide film (oxide film) 65c. In other words, the insulating film 65 is formed of an ONO (oxide-nitride-oxide) film of the silicon oxide film (oxide film) 65a, the silicon nitride film (nitride film) 65b, and the silicon oxide film (oxide film) 65c stacked in this order from the farthest side from the memory gate electrode MG1. As the silicon nitride film 65b is a trap insulating film and works as a charge storage film (charge storage portion) for storing charges, the insulating film 65 can be taken as an insulating film having a charge storage portion (here, the silicon nitride film 65b) inside.

Note that, while the insulating film 65 is illustrated in FIG. 44 as a stacked film of the silicon oxide film 65a, silicon nitride film 65b, and silicon oxide film 65c, the insulating film 65 is illustrated as a simple insulating film for simplifying illustration in the cross-sectional views of FIGS. 39 to 43. However, in fact, also in the cross-sectional views of FIGS. 39 to 43, the insulating film 65 is formed of a stacked film of the silicon oxide film 65a, silicon nitride film 65b, and silicon oxide film 65c.

The insulating film 63 is formed of, for example, a silicon oxide film or a silicon oxynitride film. Also, other than the silicon oxide film or silicon oxynitride film, a metal oxide film having a higher dielectric constant than a silicon nitride film such as a hafnium oxide film, aluminum oxide film (alumina), or a tantalum oxide film may be used for the insulating film 63.

The semiconductor region MS is a semiconductor region which works as one of a source region and a drain region, and the semiconductor region MD is a semiconductor region which works as the other one of the source region and drain region. Herein, the semiconductor region MS is a semiconductor region which works as the source region, and the semiconductor region MD is a semiconductor region which works as a drain region. The semiconductor regions MS and MD are formed of semiconductor regions (n-type impurity diffusion layers) into which an n-type impurity is introduced, and each of them has an LDD (lightly-doped drain) structure. That is, the semiconductor region MS includes an $n^-$-type semiconductor region 67a and an $n^+$-type semiconductor region 69a having a higher impurity concentration than the $n^-$-type semiconductor region 67a, and the semiconductor region MD includes an $n^-$-type semiconductor region 67b and an $n^+$-type semiconductor region 69b having a higher impurity concentration than the $n^-$-type semiconductor region 67b. The $n^+$-type semiconductor region 69a has a deeper junction depth and a higher impurity concentration than the $n^-$-type semiconductor region 67a, and the $n^+$-type semiconductor region 69b has a deeper junction depth and a higher impurity concentration than the $n^-$-type semiconductor region 67b.

As illustrated in FIG. 37, a plurality of the memory cells MC1 of the non-volatile memory are arranged in an array to the main surface of the semiconductor substrate 61 (more specifically, to the memory cell region 61A). Among the plurality of memory cells MC1 arranged in an array (matrix) in an X direction and a Y direction in FIG. 37, the select gate electrodes SG of the memory cells MC1 aligned in the X direction are integrally formed being connected in the X direction. That is, one of the select gate electrodes SG extended in the X direction of FIG. 37 forms a select gate electrode of the plurality of memory cell MC1 aligned in the X direction in FIG. 37, and a plurality of lines of the select gate electrodes SG extended in the X direction are arranged to be aligned in the Y direction in FIG. 37. Therefore, each of the select gate electrodes SG is extended in the X direction in FIG. 37, and also works as a select gate line which electrically connects select gate electrodes of the plurality of memory cells MC1 aligned in the X direction in FIG. 37 and the select gate electrodes of the plurality of memory cells MC1 aligned in the X direction in FIG. 37 to each other.

Among the plurality of memory cells MC arranged in an array (matrix) in the X direction and Y direction in FIG. 37, the memory gate electrodes MG1 next to each other of the memory cells MC1 aligned in the X direction in FIG. 37 are integrally formed being connected in the X direction. That is, one of the memory gate electrodes MG1 extended in the X direction in FIG. 37 forms a memory gate electrode of the plurality of memory cells MC1 aligned in the X direction in FIG. 37, and a plurality of lines of the memory gate electrodes MG1 extended in the X direction are arranged to be aligned in the Y direction in FIG. 37. Therefore, each of the memory gate electrodes MG1 is extended in the X direction in FIG. 37, and also works as a memory gate line which electrically connects the memory gate electrodes of the plurality of memory cells MC1 aligned in the X direction in FIG. 37 and the memory gate electrodes of the plurality of memory cells MC1 aligned in the X direction in FIG. 37 to each other. The memory gate electrode MG1 is adjacent to the select gate electrode SG interposing the insulating film 65 therebetween. Note that the X direction and Y direction in FIG. 37 are directions parallel to the main surface of the semiconductor substrate 61, in which the Y direction is a direction crossing the X direction; more preferably, the Y direction is a direction perpendicular to the X direction.

Figure 39:
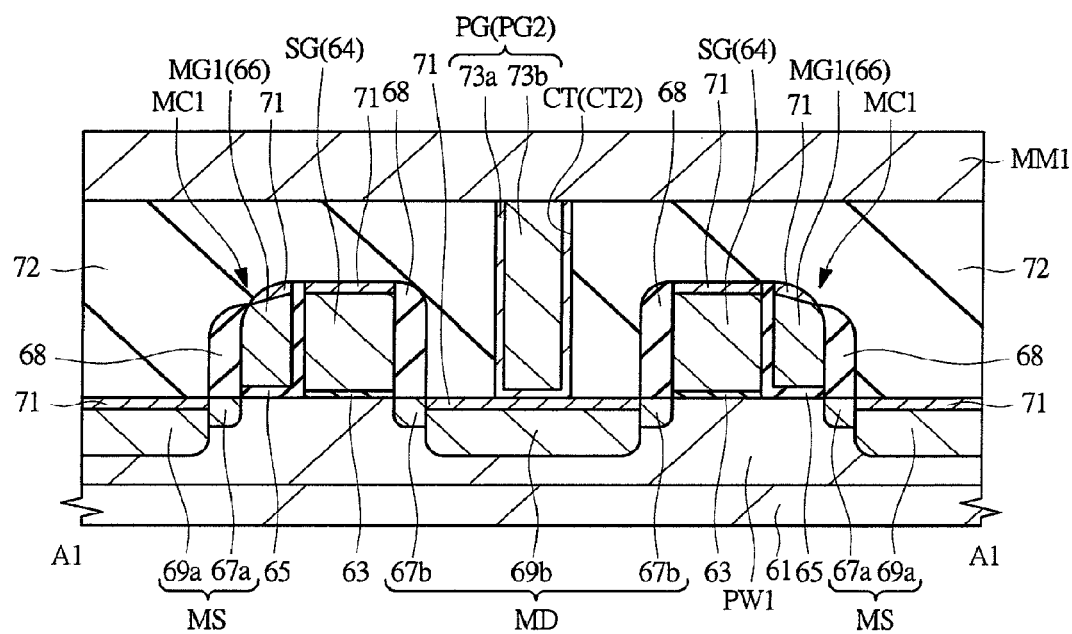
FIG. 39 is a cross-sectional view of a main part (cross-sectional view taken along the line A1-A1) of the semiconductor device according to the third embodiment of the present invention.

Among the plurality of memory cells MC1 arranged in an array in the X direction and Y direction in FIG. 37, the memory cells MC1 which are adjacent to each other in the Y direction in FIG. 37 interposing the semiconductor region MD which is the drain region share the drain semiconductor region MD which is the drain region, as illustrated in FIGS. 37 and 39, and also, the memory cells MC1 next to (adjacent to) each other in the Y direction in FIG. 37 interposing the semiconductor region MS which is the source region share the semiconductor region MS which is the source region.

On sidewalls of the memory gate electrode MG1 and select gate electrode SG (sidewalls not adjacent to each other), sidewall insulating films (sidewalls, sidewall spacers) 68 formed of an insulator (insulating film) such as silicon oxide are formed. That is, the sidewall insulating films 68 are formed on a sidewall (side surface) of the memory gate electrode MG1 that is on the opposite side of the side adjacent to the select gate electrode SG interposing the insulating film 65, and on a sidewall (side surface) of the select gate electrode SG on the opposite side of the side adjacent to the memory gate electrode MG1 via the insulating film 65.

The $n^-$-type semiconductor region 67a forming the source semiconductor region MS is formed in a self-aligned manner to the sidewall of the memory gate electrode MG1, and the $n^+$-type semiconductor region 69a is formed in a self-aligned manner to the side surface (side surface opposite to that abutting the memory gate electrode MG1) of the sidewall insulating film 68 on the sidewall of the memory gate electrode MG1. Therefore, the $n^-$-type semiconductor region 67a having a low concentration is formed under the sidewall insulating film 68 on the sidewall of the memory gate electrode MG1, and the $n^+$-type semiconductor region 69a having a high concentration is formed outside the $n^-$-type semiconductor region 67b having a low concentration. Therefore, the $n^-$-type semiconductor region 67a having a low concentration is formed to be adjacent to the channel region of the memory transistor; and the $n^+$-type semiconductor region 69a having a high concentration abuts the $n^-$-type semiconductor region 67a having a low concentration and is formed to be away from the channel region of the memory transistor by the $n^-$-type semiconductor region 67a.

The $n^-$-type semiconductor region 67b forming the drain semiconductor region MD is formed in a self-aligned manner to the sidewall of the select gate electrode SG, and the $n^+$-type semiconductor region 69b is formed to the side surface (side surface opposite to that abutting the select gate electrode SG) of the sidewall insulating film 68 on the select gate electrode SG. Therefore, the $n^-$-type semiconductor region 67b having a low concentration is formed under the sidewall insulating film 8 on the sidewall of the select gate electrode SG, and the n$^+$-type semiconductor region 69b having a high concentration is formed outside the n$^-$-type semiconductor region 67b having a low concentration. Therefore, the n$^-$-type semiconductor region 67b having a low concentration is formed to be adjacent to the channel region of the select transistor; and the n$^+$-type semiconductor region 69b having a high concentration abuts the n$^-$-type semiconductor region 67b having a low concentration, and is formed to be away from the channel region of the select transistor by the n$^-$-type semiconductor region 67b.

The channel region of the memory transistor is formed to a semiconductor substrate region (p-type well PW1) under the insulating film 65 under the memory gate electrode MG1, and the channel region of the select transistor is formed to a semiconductor substrate region (p-type well PW1) under the insulating film 63 under the select gate electrode SG. To the channel-forming region of the select transistor under the insulating film 63 under the select gate electrode SG, a semiconductor region (p-type semiconductor region or n-type semiconductor region) for threshold adjustment of the select transistor is formed as needed. To the channel-forming region of the memory transistor under the insulating film 65 under the memory gate electrode MG1, a semiconductor region (p-type semiconductor region and n-type semiconductor region) for threshold adjustment of the memory transistor is formed as needed.

The select gate electrode SG is formed of a conductor, and formed by patterning a silicon film 64 (for example, a polycrystalline silicon film to which an n-type impurity is introduced) formed on the semiconductor substrate 61. Meanwhile, the memory gate electrode MG1 is formed of a conductor and formed by anisotropically etching (etching back) a silicon film 66 (for example, a polycrystalline silicon film to which an n-type impurity is introduced) formed on the semiconductor substrate 61 to cover the select gate electrode SG and leaving the silicon film 66 on the sidewall of the select gate electrode SG via the insulating film 65. The memory gate electrode MG1 formed of the silicon film 66 is formed on one of the sidewalls of the select gate electrode SG formed of the patterned silicon film 64 via the insulating film 65.

The select gate electrode SG and the memory gate electrode MG1 being adjacent to each other via the insulating film 65 are not only extended to the memory cell region 61A but also further extended to a word shunt region 61C. The word shunt region 61C is a region for leading out the select gate electrode SG and the memory gate electrode MG to a wiring MM1, and, as observed in a comparison between FIGS. 37 and 38, the device isolation region 62 is formed to the whole of the word shunt region 61C. Therefore, in the word shunt region 61C, the select gate electrode SG and memory gate electrode MG1 being adjacent to each other via the insulating film 65 are extended on the device isolation region 62.

In each of the memory cells MC1 in the memory cell forming region 61A, the insulating film 63 which works as an gate insulating film is formed under the select gate electrode SG (i.e., between the select gate electrode SG and the semiconductor substrate 61 (p-type well PW1)), regardless of a forming method of the insulating film 63.

However, when the insulating film 63 is formed by a general thermal oxidation method, the insulating film 63 is not formed on the device isolation region 62 upon forming the insulating film 63, and thus the insulating film 63 is not formed under a portion of the select gate electrode SG (for example, the select gate electrode SG in the word shunt region 61C) being extended on the device isolation region 62, and the select gate electrode SG is directly arranged on the device isolation region 62. That is, the insulating film 63 is not formed between the select gate electrode SG and the device isolation region 62.

Meanwhile, when the insulating film 63 is formed by deposition by a CVD method or sputtering, the insulating film 63 is also formed on the device isolation region 62 upon forming the insulating film 63, and thus the insulating film 63 is also formed under the portion of the select gate electrode SG being extended on the device isolation region 62 (for example, select gate electrode SG in the word shunt region 61C). That is, the insulating film 63 is formed between the select gate electrode SG and the device isolation region 62. Note that, in FIGS. 40 to 43, an example of forming the insulating film 63 by a thermal oxidation, that is, an example of not having the insulating film 63 interposed between the device isolation region 62 and the select gate electrode SG is illustrated.

Also, in each of the memory cells MC1 in the memory cell region 61A, the insulating film 65 is formed between the memory gate electrode MG1 and the semiconductor substrate 61 (p-type well PW1) and between the memory gate electrode MG1 and the select gate electrode SG. As the insulating film 65 possibly be also formed on the device isolation region 62 upon deposition, the insulating film 65 is also formed under a portion of the memory gate electrode MG1 being extended on the device isolation region 62 (for example, the memory gate electrode MG1 in the word shunt region 61C). Therefore, in the region in which the memory gate electrode MG1 is extended on the device isolation region 62 (for example, the word shunt region 61C), the insulating film 65 is formed between the memory gate electrode MG1 and the device isolation region 62 and between the memory gate electrode MG1 and the select gate electrode SG. That is, in the region in which the memory gate electrode MG1 is extended on the device isolation region 62 (for example, word shunt region 61C), the insulating film 65 is extended across both regions of the region between the memory gate electrode MG1 and the device isolation region 62 and the region between the memory gate electrode MG1 and the select gate electrode SG.

Note that, even when the insulating film 65 is not formed between the memory gate electrode MG1 and the device isolation region 62, it does not adversely affect the operation of the non-volatile memory. Therefore, the present application does not eliminate an example of not forming the insulating film 65 between the memory gate electrode MG1 and device isolation region 62. That is, in the region in which the memory gate electrode MG1 is extended on the active region (here, the p-type well PW1) of the semiconductor substrate 61, the insulating film 65 is necessary to be formed between the memory gate electrode MG1 and the active region (here, the p-type well PW1) of the semiconductor substrate 61. Meanwhile, in the region (for example, the word shunt region 61C) in which the memory gate electrode MG1 is extended on the device isolation region 62, not only an example of forming the insulating film 65 between the memory gate electrode MG1 and the device isolation region 62 but also an example of not forming the insulating film 65 between the memory gate electrode MG1 and the device isolation region 62 are acceptable.

A metal silicide layer 71 is formed to upper surfaces (surfaces) of the select gate electrodes SG, memory gate electrodes MG1, n$^+$-type semiconductor regions 69a and 69b by salicide (self aligned silicide) technology, so that the metal silicide layer 71 reduces a diffusion resistance and/or a contact resistance. The metal silicide layer 71 is formed of, for example, a cobalt silicide layer, a nickel silicide layer, or the like.

An insulating film (interlayer insulating film) 72 is formed as an interlayer insulating film on the semiconductor substrate 61 to cover the select gate electrode SG, memory gate electrode MG1, and sidewall insulating film 68. The insulating film 72 is formed of a single film of a silicon oxide film or a stacked film of a silicon nitride film and a silicon oxide film formed on the silicon nitride film, the silicon oxide film being thicker than the silicon nitride film.

Contact holes (opening portions, through-holes) CT are formed to the insulating film 72. The contact holes CT penetrate through the insulating film 72. A plug (conductor portion, conductor portion for connection) PG is formed (buried) inside the contact hole CT. The plug PG can be taken as a conductor portion (conductor portion for connection) buried inside the contact hole CT.

The plug PG is formed of a barrier conductor film 73a formed on a bottom portion and a sidewall of the contact hole CT, and a main conductor film 73b formed on the barrier conductor film 73a to fill the contact hole CT. The barrier conductor film 73a is formed of, for example, a titanium film, titanium nitride film, or a stacked film of a titanium film and a titanium nitride film. The main conductor film 73b is formed of, for example, a tungsten film.

On the insulating film 72 in which the plugs PG are buried, the wiring (first wiring layer) MM1 is formed. The wirings MM1 can be taken as buried wirings (for example, buried copper wirings), and are buried by a damascene method in wiring trenches in the insulating film 74 formed on the insulating film 72. The wiring MM1 is not limited to the buried wiring and can be variously modified. For example, the wiring MM1 can be a wring (for example, an aluminum wiring or tungsten wiring) formed by patterning a conductor film formed on the insulating film 72.

Among the contact holes CT and the plugs PG filling the contact holes CT, contact holes CT1 (illustrated in FIG. 37) and plugs PG1 filling the contact holes CT (the plugs PG1 filling the contact holes CT1 are not illustrated in the cross-sectional views) for connections to the source semiconductor regions MS are formed to an upper portion of the source semiconductor region MS of a source dummy region 61B at an end portion (outer periphery portion) of the memory cell region 61A. As the contact holes CT1 and the plugs PG filling the contact holes CT1 for connections to the source semiconductor regions MS are arranged in the source dummy region 61B at the end portion (outer periphery portion) of the memory cell region 61A, the source dummy region 61B is a memory cell dummy region and works as a countermeasure to crystal defects. Therefore, it is preferable not to arrange the memory cell MC1 (not to use it as a memory cell MC1) in the source dummy region 61B.

Also, among the contact holes CT and plugs PG filling the contact holes CT, contact holes CT2 (illustrated in FIGS. 37 and 39) and plugs PG2 filling the contact holes CT2 for connections to the drain semiconductor regions MD are formed to an upper portion of the drain semiconductor region MD (the n+-type semiconductor regions 69b of the drain semiconductor regions MD) of each of the memory cells MC1 in the memory cell region 61A.

Also, among the contact holes CT and the plugs PG filling the contact holes CT, contact holes CT3 (illustrated in FIGS. 37 and 40) and plugs PG3 filling the contact holes CT3 for connections to the select gate electrodes SG are formed to an upper portion of contact portions SGa of the select gate electrodes SG in the word shunt region 61C. Further, among the contact holes CT and the plugs PG filling the contact holes CT, contact holes CT4 (illustrated in FIGS. 37 and 41) and plugs PG4 filling the contact holes CT4 for connections to the select gate electrodes SG are formed to an upper portion of contact portions MG1a of the memory gate electrodes MG1 in the word shunt region 61C.

Next, the select gate electrode SG and the memory gate electrode MG1 in the word shunt region 61C will be described in more detail.

While the select gate electrode SG in the memory cell region 61A works as a gate electrode of the select transistor forming the memory cell MC1, the select gate electrode SG in the word shunt region 61C is positioned above the device isolation region 62, and works as a select gate line which mutually electrically connects select gate electrodes of the plurality of memory cells MC1 aligned in the X direction in FIG. 37 instead of working as a gate electrode of the select transistor in the memory cell MC1. Also, while the memory gate electrode MG1 in the memory cell region 61A works as a gate electrode of the memory transistor forming the memory cell MC1, the memory gate electrode MG1 in the word shunt region 61C is positioned above the device isolation region 62 and works as a memory gate line which mutually electrically connects the memory gate electrodes of the plurality of memory cells MC1 aligned in the X direction in FIG. 37 instead of working as a gate electrode of the memory transistor in the memory cell MC1.

In the word shunt region 61C, the select gate electrode SG has a contact portion SGa for connection to the contact hole CT3 and the plus PG3 filling the contact hole CT3. When viewed in a plane (i.e., in a plane parallel to the main surface of the semiconductor substrate 61), the contact portion SGa is extended in a direction crossing the extending direction of the select gate electrode SG (here, the X direction in FIG. 37), more preferably, in a direction perpendicular to the extending direction of the select gate electrode SG (here, the X direction in FIG. 37). Thus, in the select gate electrode SG, the contact portion SGa has a larger width (width in the direction orthogonal to the extending direction of the select gate electrode SG) than the other region than the contact portion SGa. Therefore, the contact portion SGa can be regarded as a portion (wide portion) of the select gate electrode SG having a large width in the select gate electrode SG. Herein, the width of the select gate electrode SG corresponds to a width in a direction orthogonal to the extending direction (here, Y direction) of the select gate electrode SG (here, the X direction in FIG. 37).

The contact portion SGa is integrally formed with the select gate electrode SG. That is, by patterning the silicon film 64 formed on the main surface of the semiconductor substrate 61, the contact portion SGa is also integrally formed with the select gate electrode SG. Thus, the contact portion SGa can be regarded as a part of the select gate electrode SG, but the contact portion SGa is not a portion which works as a gate electrode of the select transistor in the memory cell MC1 of the non-volatile memory. Therefore, the contact portion SGa of the select gate electrode SG is preferable to be provided in the other region (here, the word shunt region 61C) than the memory cell region 61A in which the plurality of memory cells MC1 are arranged in an array, and also preferable to be arranged on the device isolation region 62.

Figure 40:
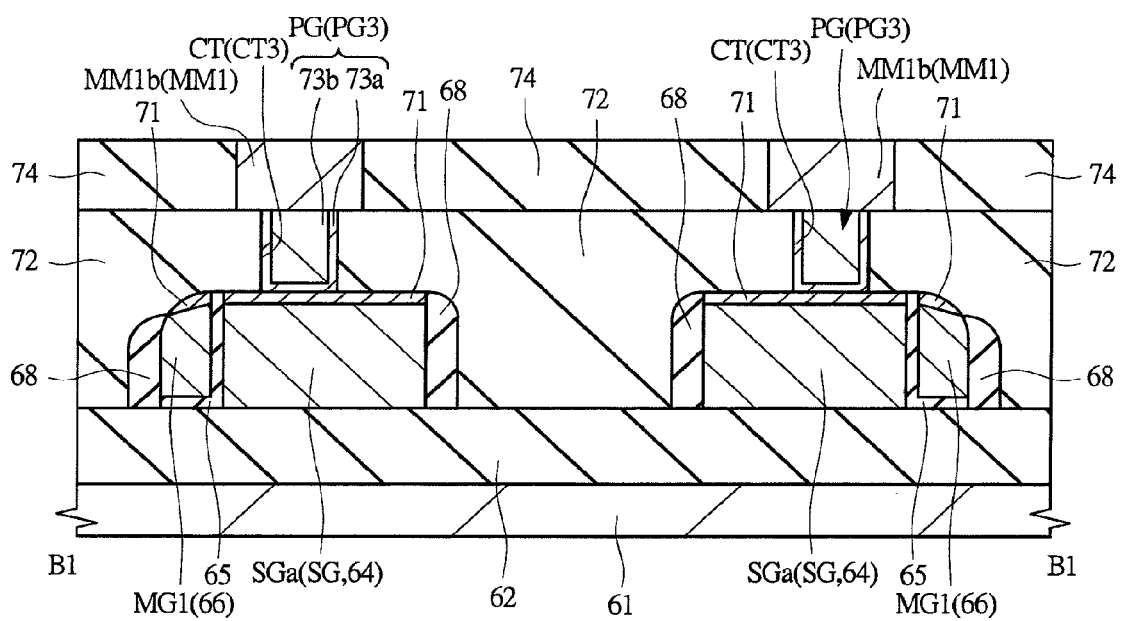
FIG. 40 is a cross-sectional view of a main part (cross-sectional view taken along the line B1-B1) of the semiconductor device according to the third embodiment of the present invention.

The contact hole CT3 is formed to the insulating film (interlayer insulating film) 72 on the contact portion SGa having a relatively larger width in the select gate electrode SG, and the plug PG3 buried in the contact hole CT3 is electrically connected to the contact portion SGa of the select gate electrode SG. The plug PG3 abuts and is electrically connected to the contact portion SGa of the select gate electrode SG at a bottom portion of the contact hole CT3. When the metal silicide layer 71 is formed to an upper portion of the select gate electrode SG, as illustrated in FIG. 40, the plug PG3 buried in the contact hole CT3 abuts and is electrically connected to the metal silicide layer 71 on the contact portion SGa at the bottom portion of the contact hole CT3, so that the plug PG3 is electrically connected to (the contact portion SGa of) the select gate electrode SG.

As the plug PG3 is electrically connected to a select gate wiring (wiring to be connected to the select gate electrode SG) MM1b among the wirings MM1, the select gate wiring MM1b is electrically connected to the contact portion SGa of the select gate electrode SG via the plug PG3 buried in the contact hole CT3.

As the contact hole CT3 and the plug PG3 filling the contact hole CT3 are formed on the contact portion SGa of the select gate electrode SG, a part of the select gate electrode SG (here, the contact portion SGa) can be surely exposed at the bottom portion of the contact hole CT3, so that the plug PG3 can be surely connected (electrically connected) to the select gate electrode SG. Also, exposure of the memory gate electrode MG1 at the bottom portion of the contact hole CT3 can be surely prevented, and a short-circuiting of the select gate electrode SG and the memory gate electrode MG1 by the plug PG3 can be prevented.

Note that, as described above, the select gate electrode SG including the contact portion SGa is formed of the patterned silicon film 64. That is, while more details will be described later, the select gate electrode SG including the contact portion SGa is formed by patterning the silicon film 64 formed on the main surface of the semiconductor substrate 61 using a resist pattern (corresponding to a photoresist pattern RP1 described later) on the silicon film 64 as a mask. The resist pattern (corresponding to the photoresist pattern RP1 described later) used here has a same planar shape (same pattern shape) as the select gate electrode SG including the contact portion SGa.

Meanwhile, the memory gate electrode MG1 is formed on one of the sidewalls of the select gate electrode SG via the insulating film 65 and extended on the semiconductor substrate 61 with the select gate electrode SG, and also, the memory gate electrode MG1 has the contact portion MG1a for connection to the contact hole CT4 and the plug PG4 filling the contact hole CT4 in the word shunt region 61C. Among the memory gate electrodes MG1, the other portion than the contact portion MG1a is formed in a sidewall shape (sidewall spacer shape) via the insulating film 65 on one of the sidewalls of the select gate electrode SG, and the portion formed in the sidewall shape and the contact portion MG1a are integrally formed. Thus, the contact portion MG1a can be regarded as a part of the memory gate electrode MG1, and does not work as a gate electrode of the memory transistor in the memory cell MC1 of the non-volatile memory. Therefore, the contact portion MG1a of the memory gate electrode MG1 is preferable to be provided to a region (here, the word shunt region 61C) other than the memory cell region 61A in which the plurality of memory cells MC1 are arranged, and also preferable to be arranged on the device isolation region 62.

In the memory gate electrode MG1, the contact portion MG1a is integrally formed with the portion (adjacent in the X direction in FIG. 37) being adjacent to the contact portion MG1a and formed in a sidewall shape (i.e., the other portion than the contact portion MG1a among the memory gate electrodes MG1). In addition, the contact portion MG1a is extended, from a position adjacent to one of the sidewalls of the select gate electrode SG (sidewall on the side where the memory gate electrode MG1 is formed) via the insulating film 65, in a direction to be away from the adjacent select gate electrode SG (here, a direction parallel to the Y direction in FIG. 37 and also a direction to be away from the adjacent select gate electrode SG). When viewed in a plane (i.e., in a plane parallel to the main surface of the semiconductor substrate 61), the contact portion MG1a is extended in a direction crossing the extending direction (here, the X direction in FIG. 37) of the memory gate electrode MG1, more preferably, in a direction perpendicular to the extending direction (here, the X direction in FIG. 37) of the memory gate electrode MG1.

As one of main features of the present embodiment, the contact portion MG1a of the memory gate electrode MG1 does not run over the select gate electrode SG. That is, the contact portion MG1a does not have a portion positioned above the select gate electrode SG. As described above, the device isolation region 62 is formed to the whole of the word shunt region 61C, and the select gate electrodes SG and the memory gate electrodes MG1 are extended on the device isolation region 62 in the word shunt region 61C, and thus the contact portion MG1a of the memory gate electrode MG1 is extended from the position on the one of the sidewalls of the select gate electrode SG to the position above the device isolation region without running over the select gate electrode SG. Note that the insulating film 65 is interposed between the contact portion MG1a of the memory gate electrode MG1 and the sidewall of the select gate electrode SG.

The memory gate electrode MG1 is formed by etching back (anisotropically etching) the silicon film 66 formed on the semiconductor substrate 61 to cover the select gate electrode SG and leaving the insulating film 66 in a sidewall shape on the sidewall of the select gate electrode SG via the insulating film 65. While details will be described later, in the etch-back step of the silicon film 66, a resist pattern (corresponding to a photoresist pattern RP2 described below) is formed on the silicon film 66 and the silicon film 66 is left under the resist pattern, so that the contact portion MG1a of the memory gate electrode MG1 is formed. While a planar shape (pattern shape) of the resist pattern (corresponding to a photoresist pattern RP2 described below) used here includes the planar pattern shape of the contact portion MG1a in the plane, the planar shape of resist pattern is not completely identical to the planar shape (planer pattern shape) of the contact portion MG1a. This is because a part of the insulating film 66 left under the resist pattern (corresponding to a photoresist pattern RP2 described below) is removed in an isotropic etching step thereafter (corresponding to a step S10 described below). Note that the wording "in a plane" in the present embodiment and the following embodiments means a plane parallel to the main surface of the semiconductor substrate 61.

Figure 41:
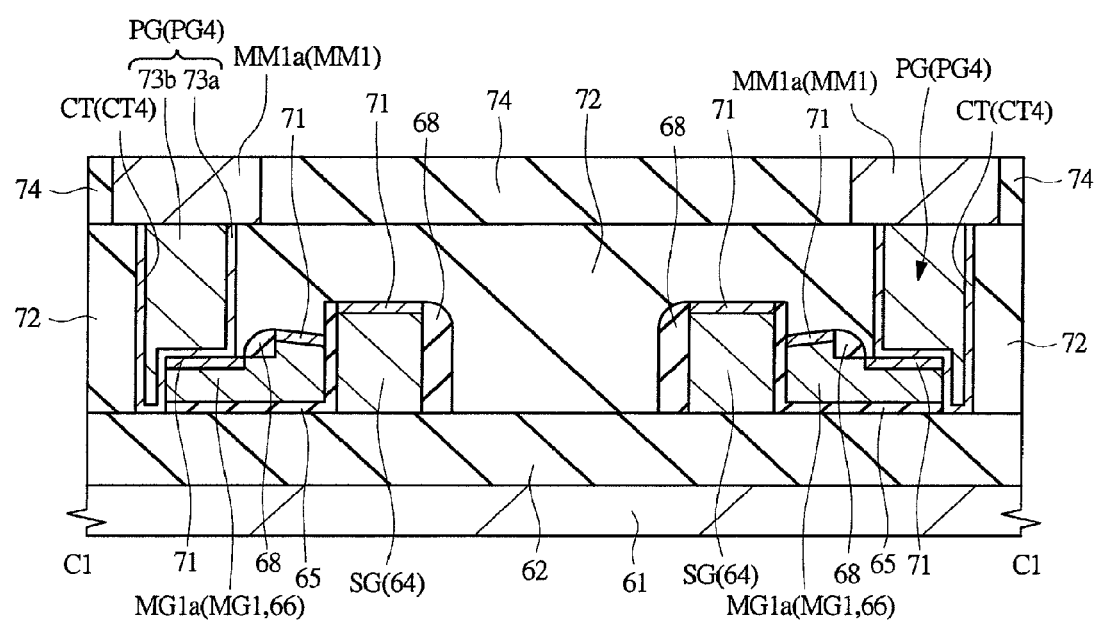
FIG. 41 is a cross-sectional view of a main part (cross-sectional view taken along the line C1-C1) of the semiconductor device according to the third embodiment of the present invention.
Figure 42:
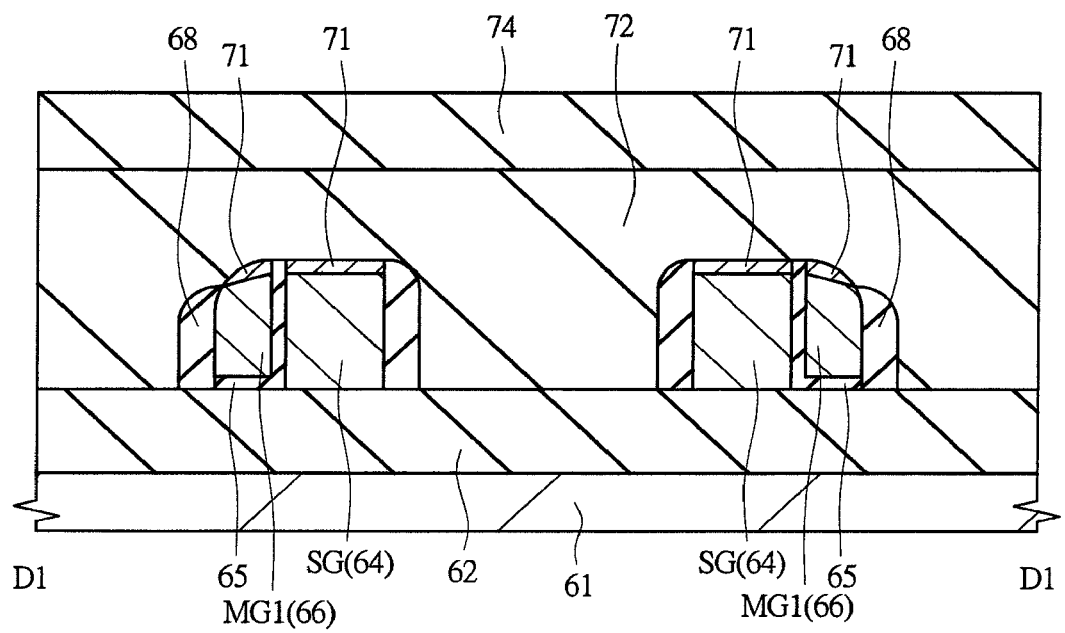
FIG. 42 is a cross-sectional view of a main part (cross-sectional view taken along the line D1-D1) of the semiconductor device according to the third embodiment of the present invention.
Figure 43:
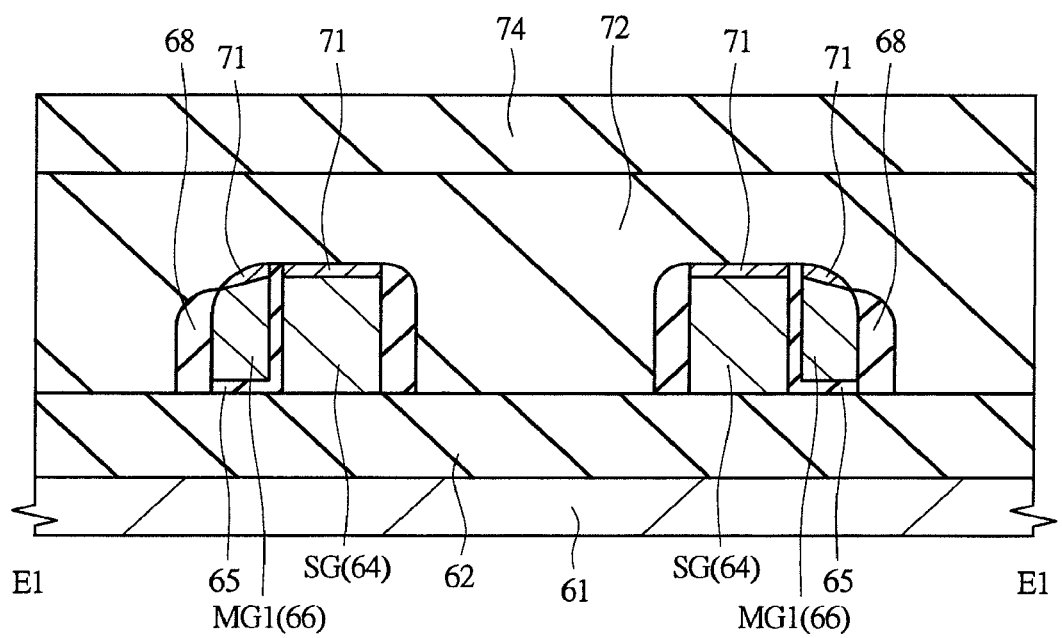
FIG. 43 is a cross-sectional view of a main part (cross-sectional view taken along the line E1-E1) of the semiconductor device according to the third embodiment of the present invention.

The contact hole CT4 is formed to the insulating film (interlayer insulating film) 72 on the contact portion MG1a of the memory gate electrode MG1 and the plug (conductor portion) PG4 buried in the contact hole CT4 is electrically connected to the contact portion MG1a of the memory gate electrode MG1. The plug PG4 abuts and is electrically connected to the contact portion MG1a of the memory gate electrode MG1 at a bottom portion of the contact hole CT4. When the silicide layer 71 is formed to an upper portion of the memory gate electrode MG1, as illustrated in FIG. 41, the plug PG4 buried in the contact hole CT4 abuts and is electrically connected to the silicide layer 71 on the contact portion MG1a at the bottom portion of the contact hole CT4, and thus the plug PG4 is electrically connected to (the contact portion MG1a of) the memory gate electrode MG1.

As the plug PG4 is electrically connected to the memory gate wiring (wiring to be connected to the memory gate electrode MG1) MM1a among the wirings MM1, the memory gate wiring MM1a is electrically connected to the contact portion MG1a of the memory gate electrode MG1 via the plug PG4 buried in the contact hole CT4.

The contact portion MG1a of the memory gate electrode MG1 is flatly extended on the device isolation region 62 and has a substantially flat upper surface in a region away from the (the insulating film 65 on the sidewall) of the select gate electrode SG by more than or equal to a distance corresponding to a thickness of the contact portion MG1a (corresponding to a deposited thickness of the silicon film 66 and also a gate length of the memory gate electrode MG1). The contact hole CT4 and the plug PG4 filling the contact hole CT4 are formed on the flat portion of the contact portion MG1a.

When the contact hole CT4 and the plug PG4 filling the contact hole CT4 are formed on the memory gate electrode MG1 in a sidewall shape without the contact portion MG1a different from the present embodiment, it is not easy to surely form the contact hole CT4 on the memory gate electrode MG1 in a sidewall shape without overlapping with the select gate electrode SG. For example, as a margin to a position shift of the contact hole is small, there are possibilities that reliability of the electric connection between the plug PG4 and the memory gate electrode MG1 is lowered, and a manufacturing yield of the semiconductor device is lowered.

In the present embodiment, by forming the contact hole CT4 and the plug PG4 filling the contact hole CT4 on the contact portion MG1a of the memory gate electrode MG1, the contact portion MG1a which is a part of the memory gate electrode MG1 can be surely exposed at the bottom portion of the contact hole CT4, and the plug PG4 can be surely connected (electrically connected) to the memory gate electrode MG1. Also, exposure of the select gate electrode SG at the bottom portion of the contact hole CT4 can be adequately prevented, and short-circuiting between the select gate electrode SG and the memory gate electrode MG1 by the plug PG4 can be prevented.

Also, in the memory gate electrode MG1, in consideration of a misalignment of the contact hole CT4 upon opening the contact hole CT4, the planar shape (pattern shape) of the contact portion MG1a is formed to be a predetermined size not to cause a misalignment (phenomenon such that the contact portion MG1a and the contact hole CT4 have no overlap in a plane, and the contact portion MG1a is not exposed from the contact hole CT4). That is, the planar shape (planar size) of the contact portion MG1a is designed to have at least a part of the contact hole CT4 being overlapped with the contact portion MG1a in a plane even when an opening position of the contact hole CT4 is varied in a measure due to a process variation. In this manner, the contact portion MG1a of the memory gate electrode MG1 is more surely exposed at the bottom portion of the contact hole CT4, and the plug PG4 is more surely connected (electrically connected) to the memory gate electrode MG1.

Also, the contact portion MG1a of the memory gate electrode MG1 is extended on the device isolation region 62 from a position adjacent to the sidewall of the select gate electrode SG via the insulating film 65 toward a direction to be away from the select gate electrode SG, and the contact hole CT4 is formed on the contact portion MG1a positioned above the device isolation region 62. Thus, not only a situation where the contact hole CT4 is included in the contact portion MG1a of the memory gate electrode MG1 in a plane, but also a situation where only a part of the contact hole CT4 is overlapped with the contact portion MG1a of the memory gate electrode MG1 and the other part of the contact hole CT4 is not overlapped with the contact portion MG1a of the memory gate electrode MG1 in a plane are acceptable. Therefore, at the stage of designing the semiconductor device, the layout of the contact hole CT4 and the contact portion MG1a can be designed to have the contact hole CT4 being partially overlapped with the contact portion MG1a of the memory gate electrode MG1, and this situation is illustrated in FIG. 37.

When the contact hole CT4 is included in the contact portion MG1a of the memory gate electrode MG1 in a plane, a part of the contact portion MG1a of the memory gate electrode MG1 is exposed at the bottom portion of the contact hole CT4, and the device isolation region 62 is not exposed. When not the whole of the contact hole CT4 is overlapped with the contact portion MG1a but only a part of the contact hole CT4 is overlapped with the contact portion MG1a of the memory gate electrode MG1, not only a part of the contact portion MG1a of the memory gate electrode MG1 but also the device isolation region 62 may be exposed at the bottom portion of the contact hole CT4 (FIG. 41 illustrates this situation). At the bottom portion of the contact hole CT4, even when the device isolation region 62 is exposed in addition to the contact portion MG1a, as the device isolation region 62 is an insulator, short-circuiting of the plug PG4 buried in the contact hole CT4 and a conductive member, which normally should not be connected, can be prevented. Also, as a side surface at a lower portion of the plug PG4 is contacted with the contact portion MG1a, an electric connection between the plug PG4 and the contact portion MG1a can be ensured.

Figure 45:
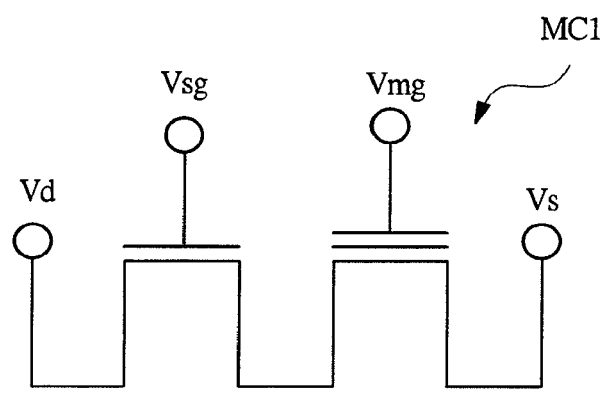
FIG. 45 is an equivalent circuit diagram of the memory cell.

FIG. 45 is an equivalent circuit diagram of the memory cell MC1. FIG. 46 is a table (explanatory diagram) illustrating examples of conditions of voltages applied to each part of the select memory cell upon "program," "erase," and "read" according to the present embodiment. In the table of FIG. 46, a voltage Vd to be applied to the drain region (semiconductor region MD) of the memory cell (select memory cell) illustrated in FIGS. 44 and 45, a voltage Vsg to be applied to the select gate electrode SG, a voltage Vmg to be applied to the memory gate electrode MG1, a voltage Vs to be applied to a source region (semiconductor region MS), and a base voltage Vb to be applied to the p-type well PW1 are described. Note that the voltages illustrated in the table of FIG. 46 are examples of conditions of applied voltages, and they are not limited to this and can be variously modified. Also, in the present embodiment, injection of electrons into the silicon nitride film 65b which is a charge storage portion in the insulating film 65 of the memory transistor is defined as "program," and injection of holes is defined as "erase."

A programming method can be a hot-electron programming called SSI (source side injection). For example, the voltages as listed in the row of "program" in FIG. 46 are applied to respective parts of a select memory cell to be programmed so that electrons are injected into the silicon nitride film 65b in the insulating film 65 of the select memory cell. Hot electrons are generated in a channel region (between the source and drain) below and between two gate electrodes (the memory gate electrode MG1 and the select gate electrode SG), and the hot electrons are injected to the silicon nitride film 65b which is the charge storage portion in the insulating film 65 below the memory gate electrode MG1. The injected hot electrons are trapped at trap levels in the silicon nitride film 65b in the insulating film 65, resulting in an increase in a threshold voltage of the memory transistor.

An erasing method can be a BTBT (band-to-band tunneling) hot-hole injection erase. That is, erase is performed by injecting holes generated by BTBT (band-to-band tunneling) into the charge storage portion (the silicon nitride film 65b in the insulating film 65). For example, voltages as listed in the row of "erase" in FIG. 46 are applied to respective parts of the select memory cell to be erased to generate holes by the BTBT (band-to-band tunneling) phenomenon and accelerate the holes, thereby injecting the holes into the silicon nitride film 65b in the insulating film 65 of the select memory cell, and lowering the threshold voltage of the memory transistor.

Upon read, for example, the voltages as listed in the row of "read" in FIG. 46 are applied to respective parts of the select memory cell to be read. The voltage Vmg to be applied to the memory gate electrode MG1 upon read is set to a value between the threshold voltage of the memory transistor in a programmed state and a threshold voltage in an erased state, thereby determining the programmed state and the erased state.

Next, a manufacturing process of the semiconductor device according to the present embodiment will be described with reference to the accompanied drawings.

Figure 47:
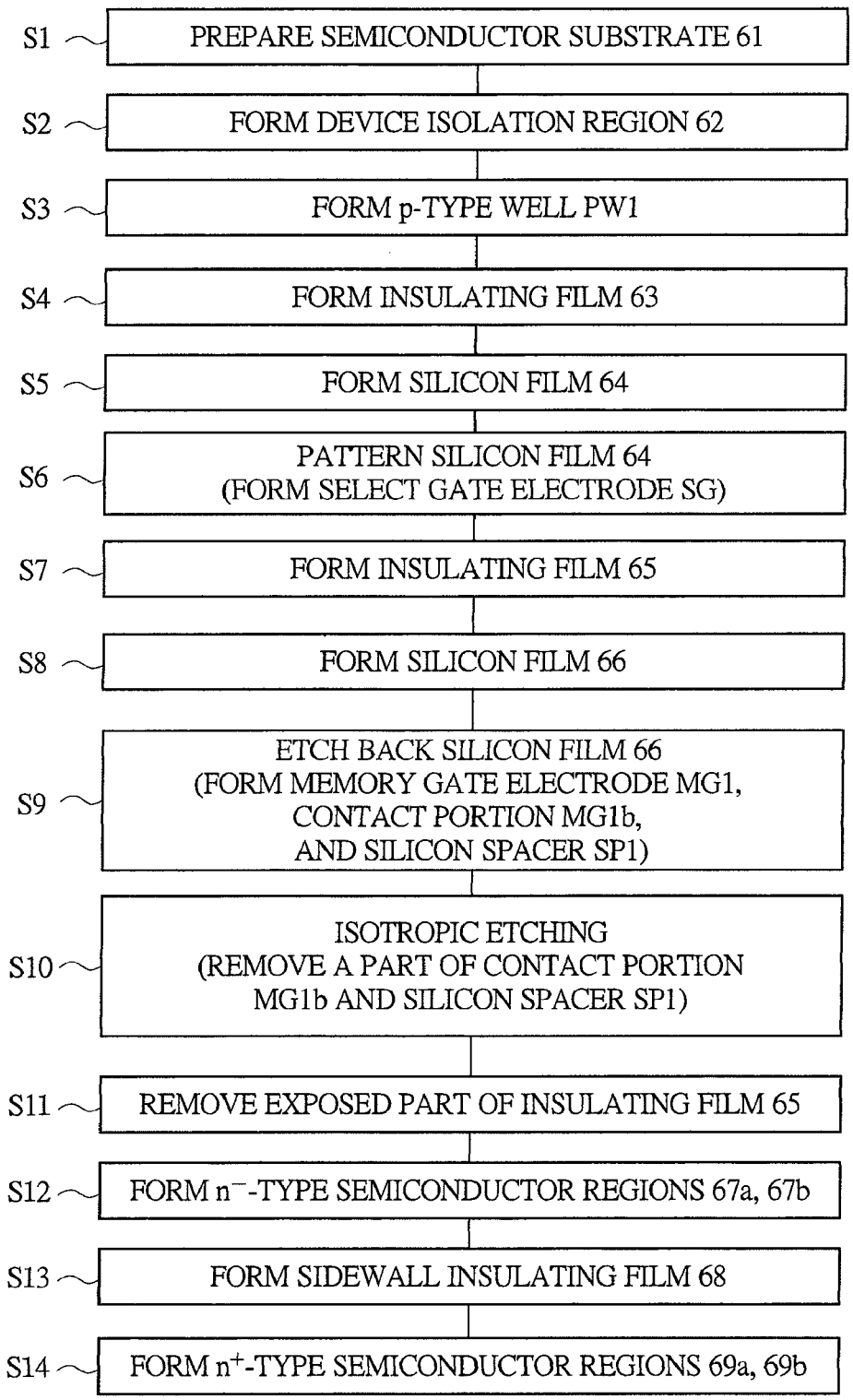
FIG. 47 is a process flow diagram illustrating a part of a manufacturing process of the semiconductor device according to the third embodiment of the present invention.

FIG. 47 is a process flow diagram illustrating a part of the manufacturing process of the semiconductor device according to the present embodiment. FIGS. 48 to 87 are plan views or cross-sectional views of a main part during the manufacturing process of the semiconductor device according to the present embodiment. Among FIGS. 48 to 87, FIGS. 48, 53, 58, 61, 64, and 73 are plan views of a main part, and FIGS. 49-52, 54-57, 59, 60, 62, 63, 65-72, and 74-87 are cross-sectional views of a main part.

While an embodiment of forming n-channel type MISFETs (select transistor and memory transistor) in the memory cell region 61A will be described in the present embodiment, p-channel type MISFETs (select transistor and memory transistor) can be formed in the memory cell region 61A by reversing the polarity.

Figure 48:
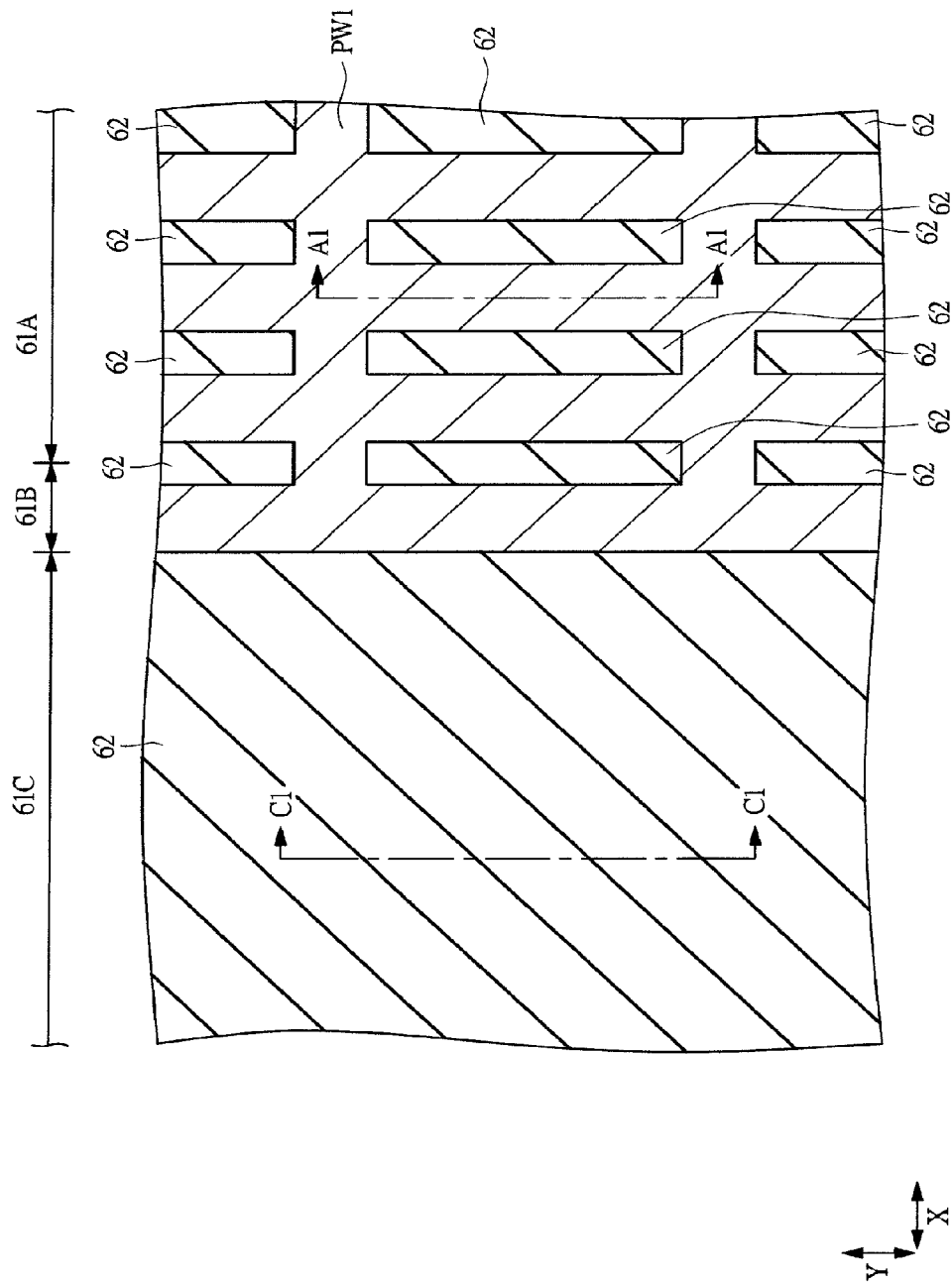
FIG. 48 is a plan view of a main part of the semiconductor device during the manufacturing process according to the third embodiment of the present invention.
Figure 49:
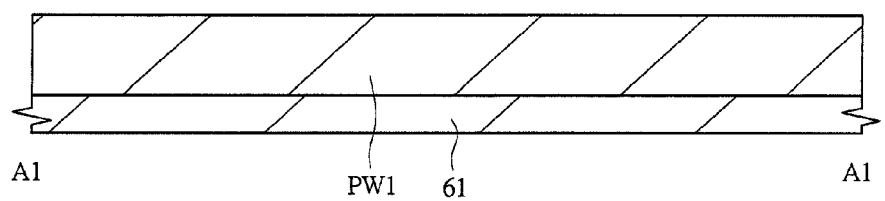
FIG. 49 is a cross-sectional view of a main part (cross-sectional view taken along the line A1-A1) of the semiconductor device during the manufacturing process same as that of FIG. 48.
Figure 50:
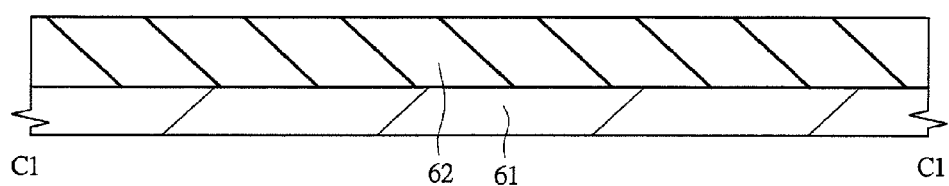
FIG. 50 is a cross-sectional view of a main part (cross-sectional view taken along the line C1-C1) of the semiconductor device during the manufacturing process same as that of FIGS. 48 and 49.

First, as illustrated in FIG. 48 (plan view of a main part), FIG. 49 (cross-sectional view taken along the line A1-A1), and FIG. 50 (cross-sectional view taken along the line C1-C1), the semiconductor substrate (semiconductor wafer) 61 formed of single crystal silicon or the like having a resistivity of about 1 to 10 Ωcm is prepared (step S1 in FIG. 47). Then, to the main surface of the semiconductor substrate 61, the device isolation regions (device isolation insulating regions) 62 which define (section) active regions are formed (step S2 in FIG. 47). The device isolation region 62 is formed of an insulator such as silicon oxide, and can be formed by, for example, STI (shallow trench isolation) method etc. For example, after forming trenches for device isolation to the main surface of the semiconductor substrate 61, an insulating film formed of, for example, silicon oxide is buried in the trenches for device isolation, thereby forming the device isolation regions 62. As illustrated in FIG. 48, in the memory cell region 61A, the device isolation regions 62 are formed between regions to which respective memory cells MC1 are formed, and, in the word shunt region 61C, the device isolation region 62 is formed to the whole of the main surface of the semiconductor substrate 61.

Next, a p-type impurity such as boron (B) is ion-implanted etc., thereby forming the p-type wells PW1 (step S3 in FIG. 47). The p-type well PW1 is formed to a predetermined depth from the main surface of the semiconductor substrate 61. The p-type well PW1 is mainly formed to the memory cell region 61A, and the memory cell region 61A is electrically isolated from the other regions by the device isolation regions 62.

Next, to adjust the threshold voltage of the select transistor to be formed later to the memory cell region 61A, if needed, a doped-channel ion implantation is performed to a surface portion (surface layer portion) of the memory cell region 61A.

Note that, while FIG. 48 is a plan view, to facilitate viewing of the drawing, different hatchings are added to the device isolation region 62 and the p-type well PW1, respectively.

Figure 51:
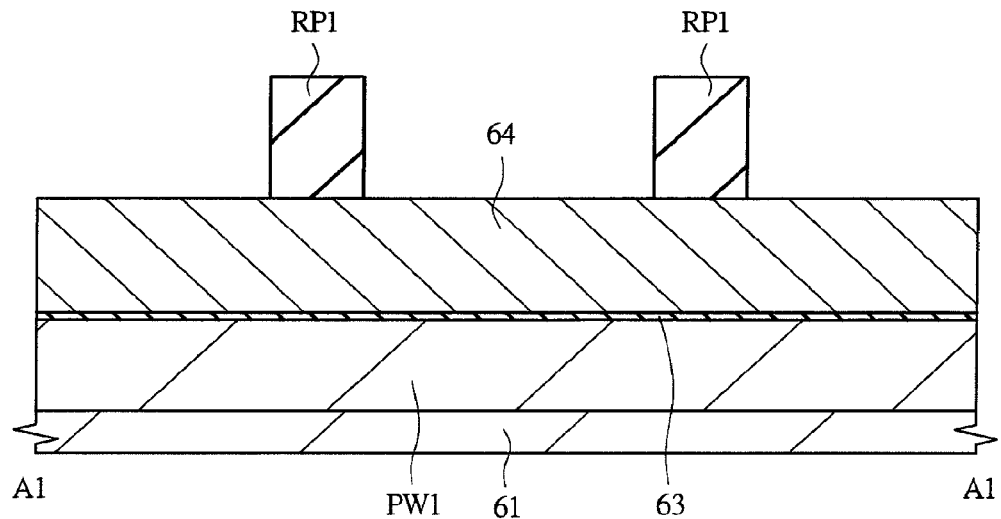
FIG. 51 is a cross-sectional view (cross-sectional view taken along the line A1-A1) of the semiconductor device during the manufacturing process continued from FIGS. 48 to 50.
Figure 52:
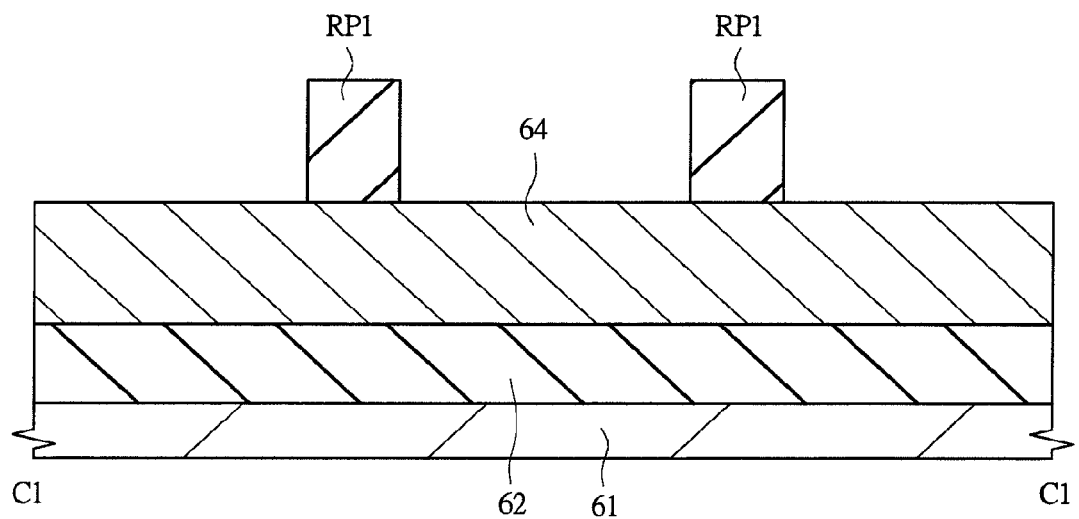
FIG. 52 is a cross-sectional view of a main part (cross-sectional view taken along the line C1-C1) of the semiconductor device during the manufacturing process same as that of FIG. 51.

Next, after subjecting a surface of the semiconductor substrate 61 (p-type well PW1) to a cleaning process by diluted hydrofluoric acid etc., as illustrated in FIG. 51 (cross-sectional view taken along the line A1-A1) and FIG. 52 (cross-sectional view taken along the line C1-C1), the insulating film 63 for a gate insulating film is formed to the main surface of the semiconductor substrate 61 (surface of the p-type well PW1) (step S4 in FIG. 47). The insulating film 63 is an insulating film to be a gate insulating film of the select transistor to be formed later. The insulating film 63 is formed of, a thin silicon oxide film or a silicon oxynitride film, and formed by, for example, thermal oxidation etc. When a silicon oxynitride film is used for the insulating film 63, the silicon oxynitride film can be formed by subjecting a silicon oxide film formed by thermal oxidation etc. to a nitridation process. A thickness of the insulating film 63 can be, for example, about 2 to 3 nm. While the insulating film 63 is not formed on the device isolation region 62 upon forming the insulating film 63 by a thermal oxidation (this situation is illustrated in FIG. 52), the insulating film 63 is formed also on the device isolation region 62 upon forming the insulating film 63 by a CVD method or a sputtering method.

Next, as illustrated in FIGS. 51 and 52, on the insulating film 63 in memory cell region 61A and on the main surface of the semiconductor substrate 61 including a portion above the device isolation region 62 in the word shunt region 61C, the silicon film (first conductor film) 64 is formed (deposited) as a conductor film (conductive film) for forming the select gate electrode SG (step S5 in FIG. 47). The silicon film 64 can be formed by using a CVD (chemical vapor deposition) method or the like. A thickness of the silicon film 64 (deposited thickness) can be, for example, 100 to 200 nm. After forming the silicon film 64, a photoresist pattern (though not being illustrated, this photoresist pattern is formed to the entire region of the peripheral circuit region described later) is formed on the silicon film 64 by using photolithography. Using the photoresist pattern as a mask, an n-type impurity is introduced into the memory cell region 61A (including the source dummy region 61B) and the silicon film 64 in the word shunt region 61C by ion implantation or the like. In this manner, the silicon film 64 in the memory cell region 61A (including the source dummy region 61B) and the word shunt region 61C is turned into an n-type silicon film 64.

Figure 53:
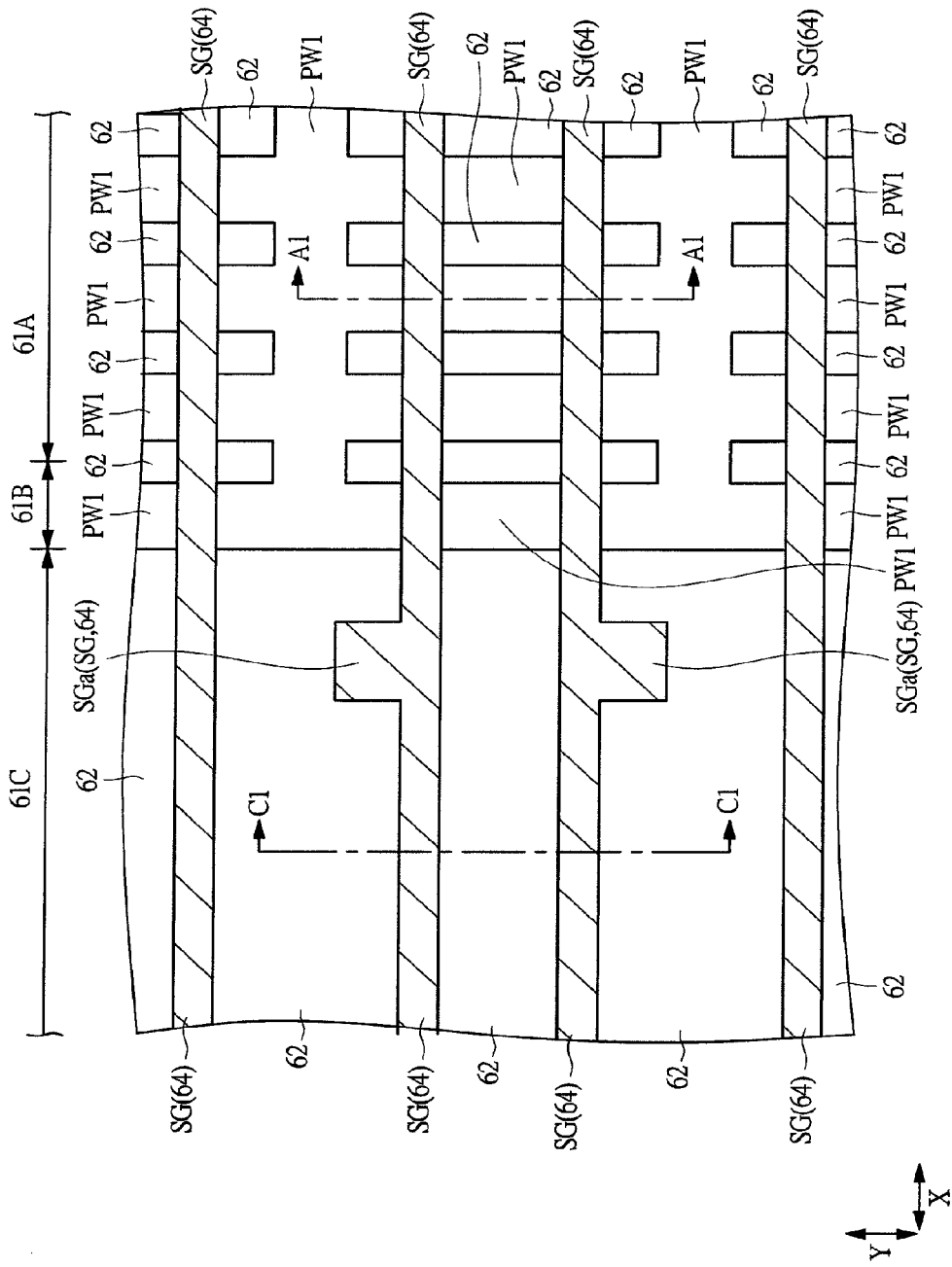
FIG. 53 is a plan view of a main part of the semiconductor device during the manufacturing process continued from FIGS. 51 and 52.
Figure 54:
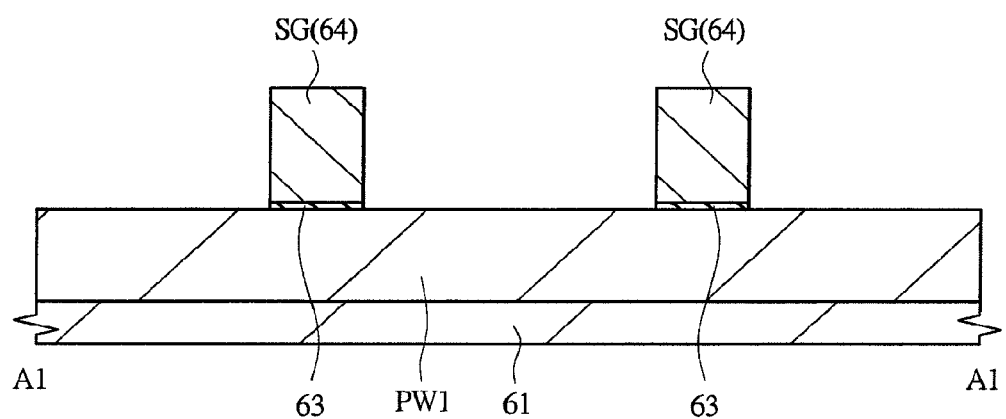
FIG. 54 is a cross-sectional view of a main part (cross-sectional view taken along the line A1-A1) of the semiconductor device during the manufacturing process same as that of FIG. 53.
Figure 55:
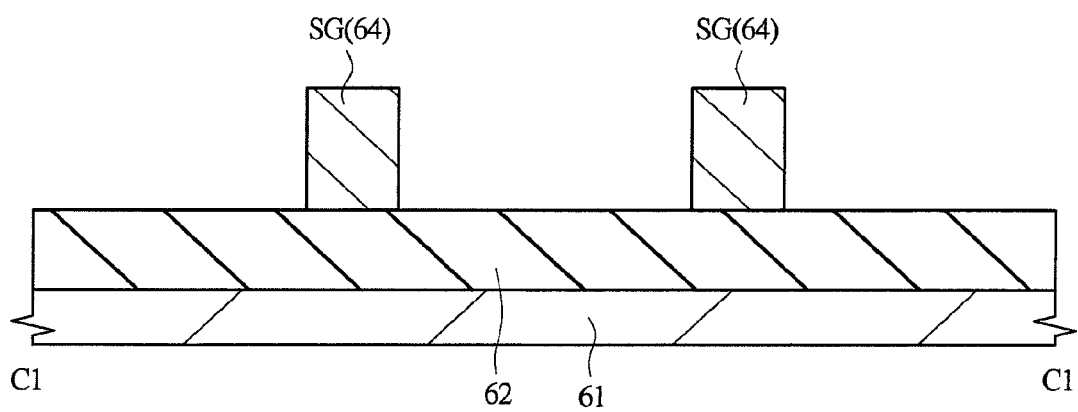
FIG. 55 is a cross-sectional view of a main part (cross-sectional view taken along the line C1-C1) of the semiconductor device during the manufacturing process same as that of FIGS. 53 and 54.

Next, a photoresist pattern (resist pattern) RP1 is formed on the silicon film 64 by using photolithography technology, and then, using the photoresist pattern RP1 as an etching mask, the silicon film 64 is patterned by etching (dry etching) as illustrated in FIG. 53 (plan view of a main part), FIG. 54 (cross-sectional view taken along the line A1-A1), and FIG. 55 (cross-sectional view taken along the line C1-C1) (step S6 in FIG. 47). The patterned silicon film 64 forms the select gate electrode SG. The pattern of the formed select gate electrode SG has the same pattern shape as the photoresist pattern RP1, and the select gate electrode SG integrally includes the contact portion SGa arranged in the word shunt region 61C. In the memory cell region 61A, the insulating film 63 remaining under the select gate electrode SG becomes a gate insulating film of the select transistor. Then, the photoresist pattern RP1 is removed. FIGS. 53 to 55 correspond to the stage where the photoresist pattern RP1 has been already removed. Note that, while FIG. 53 is a plan view, hatching is added to the select gate electrode SG to facilitate viewing. Note that the photoresist pattern RP1 and photoresist patterns RP1a, RP2, RP3, and RP4 described below can be taken as photoresist patterns used in etching.

In the memory cell region 61A, the insulating film 63 in other portions than that covered by the select gate electrodes SG (i.e., the insulating film 63 other than that to be gate insulating films) may be removed by the dry etching performed in the step S6 or performing a wet etching after the dry etching.

Next, to adjust the threshold voltage of the memory cell transistor to be formed later to the memory cell region 61A, if needed, a channel-doped ion implantation is performed to a surface portion (surface layer portion) of the p-type well PW1 in the memory cell region 61A.

Figure 56:
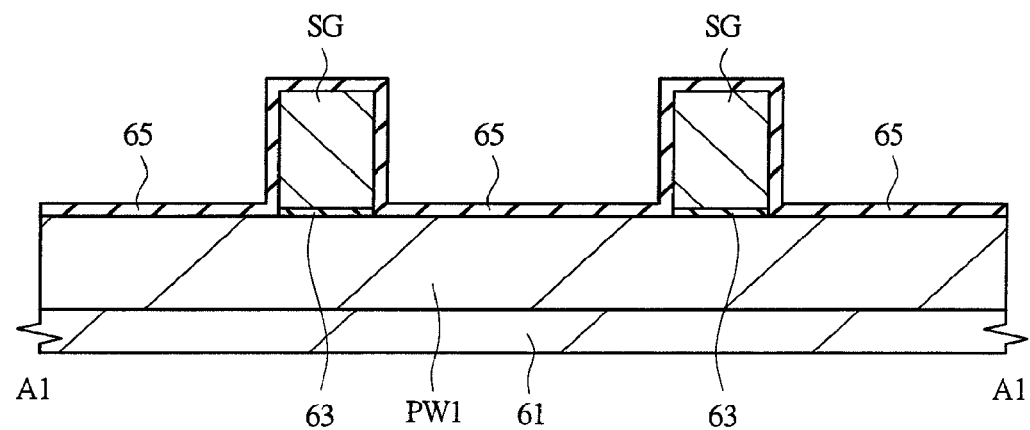
FIG. 56 is a cross-sectional view of a main part (cross-sectional view taken along the line A1-A1) of the semiconductor device during the manufacturing process continued from FIGS. 53 to 55.
Figure 57:
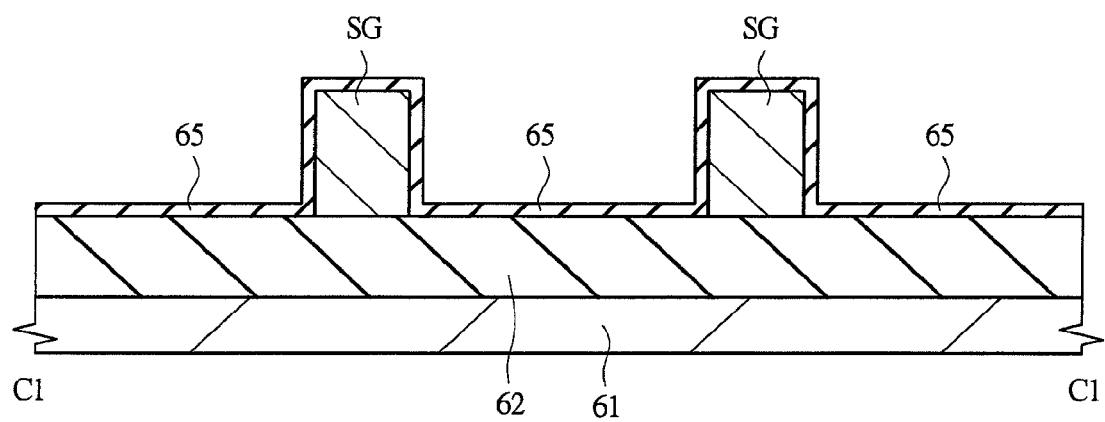
FIG. 57 is a cross-sectional view of a main part (cross-sectional view taken along the line C1-C1) of the semiconductor device during the manufacturing process same as that of FIG. 56.

Next, after performing a washing process and subjecting the main surface of the semiconductor substrate 61 to a cleaning process, as illustrated in FIG. 56 (cross-sectional view taken along the line A1-A1) and FIG. 57 (cross-sectional view taken along the line C1-C1), the insulating film 65 for gate insulating film of the memory transistor is formed on the main surface of the semiconductor substrate 61 and the surfaces of the select gate electrodes SG (step S7 in FIG. 47).

The insulating film 65 is an insulating film having a charge storage portion inside, and formed of the stacked film (ONO film) as the insulating film of the silicon oxide film 65a, silicon nitride film 65b, and silicon oxide film 65c formed in series from the bottom. Meanwhile, to facilitate viewing, in FIGS. 56 and 57, the stacked film of the silicon oxide film 65a, silicon nitride film 65b, and silicon oxide film 65c is simply illustrated as the insulating film 65. Thus, in reality, the insulating film 65 is formed of a stacked film of the silicon oxide film (oxide film) 65a, silicon nitride film (nitride film) 65b on the silicon oxide film 65a, and silicon oxide film (oxide film) 65c on the silicon nitride film 65b. In the step S7, as illustrated in FIGS. 56 and 57, the insulating film 65 is formed to the main surface (surface) of the semiconductor substrate 61 (including the p-type well PW1 and device isolation region 62), and the surfaces (side surfaces and upper surfaces) of the select gate electrodes SG (note that the insulating film 65 is not formed to lower portions of the select gate electrodes SG). While the insulating film 65 is generally also formed on the device isolation region 62 in view of the film formation process, the insulating film 65 may not be formed on the device isolation region 62.

In addition, while the silicon nitride film 65b is formed as the insulating film having trap levels in the present embodiment, the insulating film is not limited to a silicon nitride film and can be a high-dielectric constant film having a higher dielectric constant than a silicon nitride film, such as an aluminum oxide film (alumina), a hafnium oxide film, or a tantalum oxide film. Alternatively, the insulating film may be formed of silicon nano-dots.

In the insulating film 65, the silicon oxide film can be formed by, for example, an oxidation treatment (thermal oxidation treatment) or a CVD method, or a combination of oxidation treatment and CVD. The silicon nitride film can be formed by, for example, a CVD method. For example, after forming the bottom silicon oxide film (corresponding to the silicon oxide film 65a) in the insulating film 65 by a thermal oxidation treatment, the silicon nitride film in the insulating film 65 is deposited by a CVD method, and further, the top silicon oxide film (corresponding to the silicon oxide film 65c) can be formed by a CVD method and a thermal oxidation treatment. A thickness of the silicon oxide film 65a in the insulating film 65 can be, for example, about 3 to 6 nm, a thickness of the silicon nitride film 65b can be, for example, about 5 to 10 nm, and a thickness of the silicon oxide film 65c can be, for example, 4 to 7 nm.

The insulating film 65 works as a gate insulating film of the memory transistor to be formed later, and has a charge storage function. Thus, the insulating film 65 has a stacked structure of at least three layers, and has its inner layer (the silicon nitride film 65b) having a lower potential barrier height than that of its outer layer (the silicon oxide films 65a and 65c). The structure can be achieved by making the insulating film 65 as a stacked film including the silicon oxide film 65a, the silicon nitride film 65b on the silicon oxide film 65a, and the silicon oxide film 65c on the silicon nitride film 65b.

Figure 58:
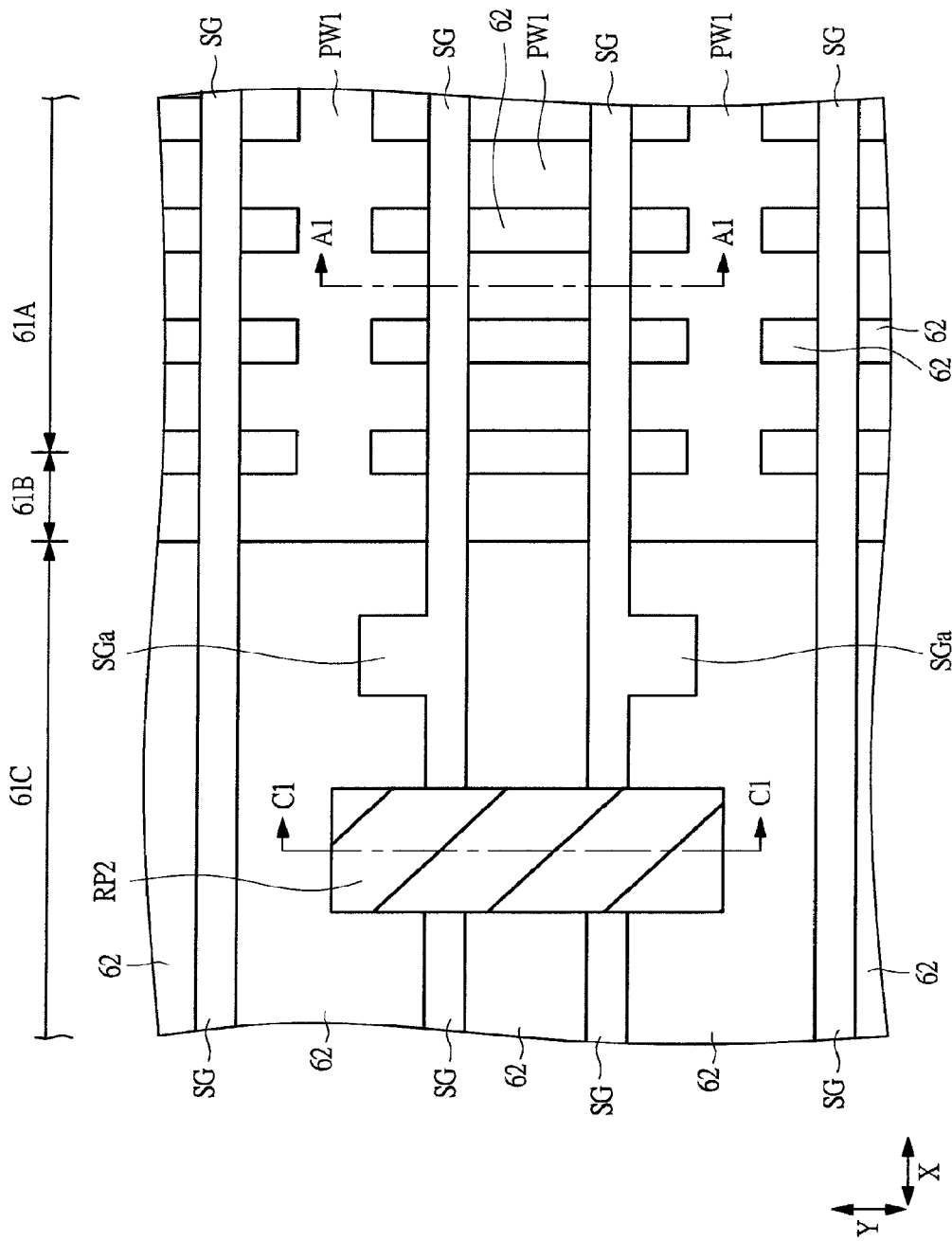
FIG. 58 is a plan view of a main part of the semiconductor device during the manufacturing process continued from FIGS. 56 and 57.
Figure 59:
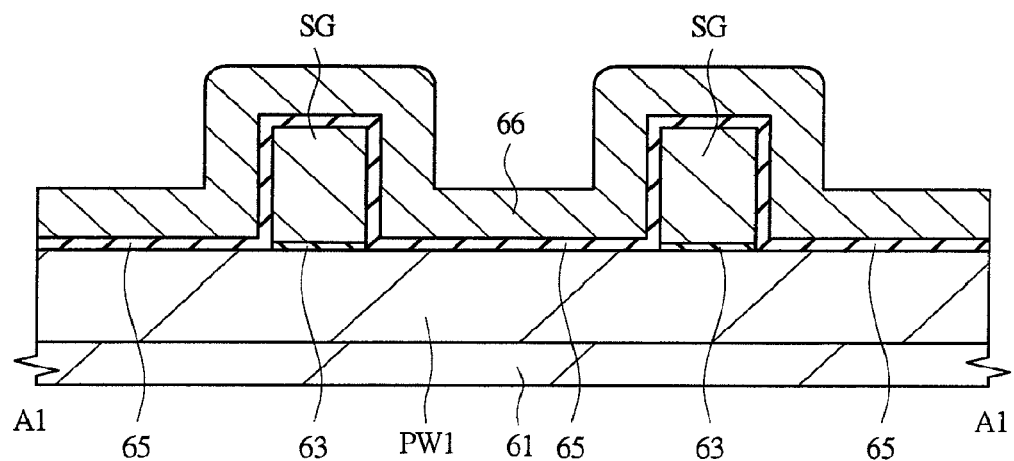
FIG. 59 is a cross-sectional view of a main part (cross-sectional view taken along the line A1-A1) of the semiconductor device during the manufacturing process same as that of FIG. 58.
Figure 60:
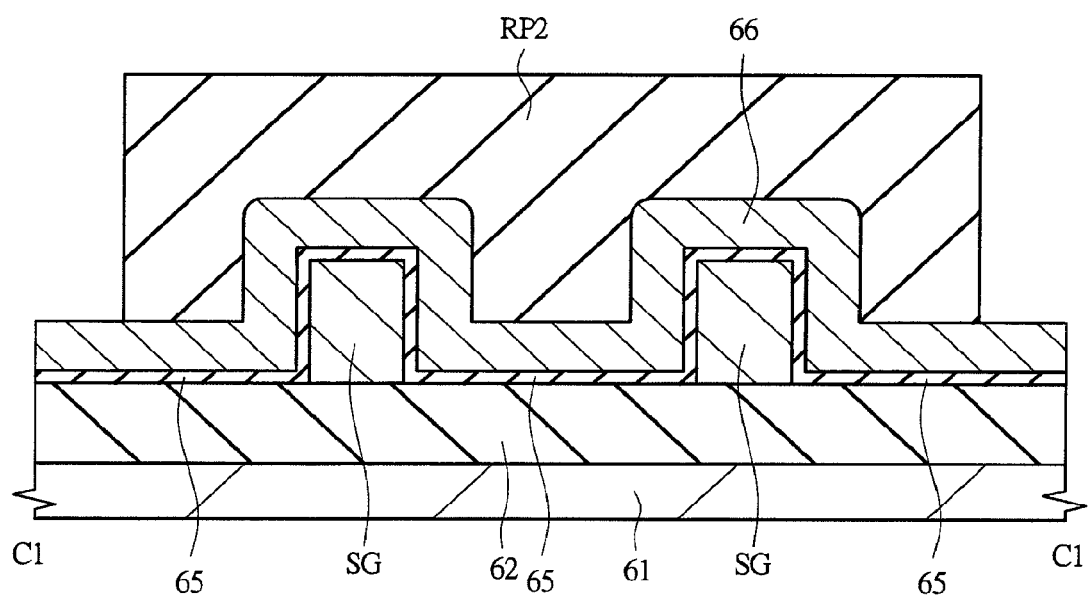
FIG. 60 is a cross-sectional view of a main part (cross-sectional view taken along the line C1-C1) of the semiconductor device during the manufacturing process same as that of FIGS. 58 and 59.

Next, as illustrated in FIG. 58 (plan view of a main part), FIG. 59 (cross-sectional view taken along the line A1-A1), and FIG. 60 (cross-sectional view taken along the line C1-C1), on the whole of the main surface of the semiconductor substrate 61, i.e., on the insulating film 65, the silicon film (second conductor film) 66 is formed (deposited) as a conductor film (conductive film) to cover the select gate electrode SG (step S8 in FIG. 47). Note that, while FIG. 58 is a plan view, the silicon film 66 and insulating film 65 are transparent in FIG. 58 and hatching is added to the photoresist pattern RP2 described below to facilitate viewing.

The silicon film 66 is formed of, for example, a silicon film such as a polycrystalline film (doped polysilicon film) into which an n-type impurity (for example, phosphorus (P)) is introduced, and can be formed by using a CVD method or the like. A thickness (deposited thickness) of the silicon film 66 can be, for example, about 50 to 100 nm.

Next, on the silicon film 66, the photoresist pattern (resist pattern) RP2 is formed by using photolithography technology. Then, using the photoresist pattern RP2 as an etching mask, the silicon film 66 exposed from the photoresist pattern RP2 is etched back by anisotropic dry etching (step S9 in FIG. 47).

Figure 61:
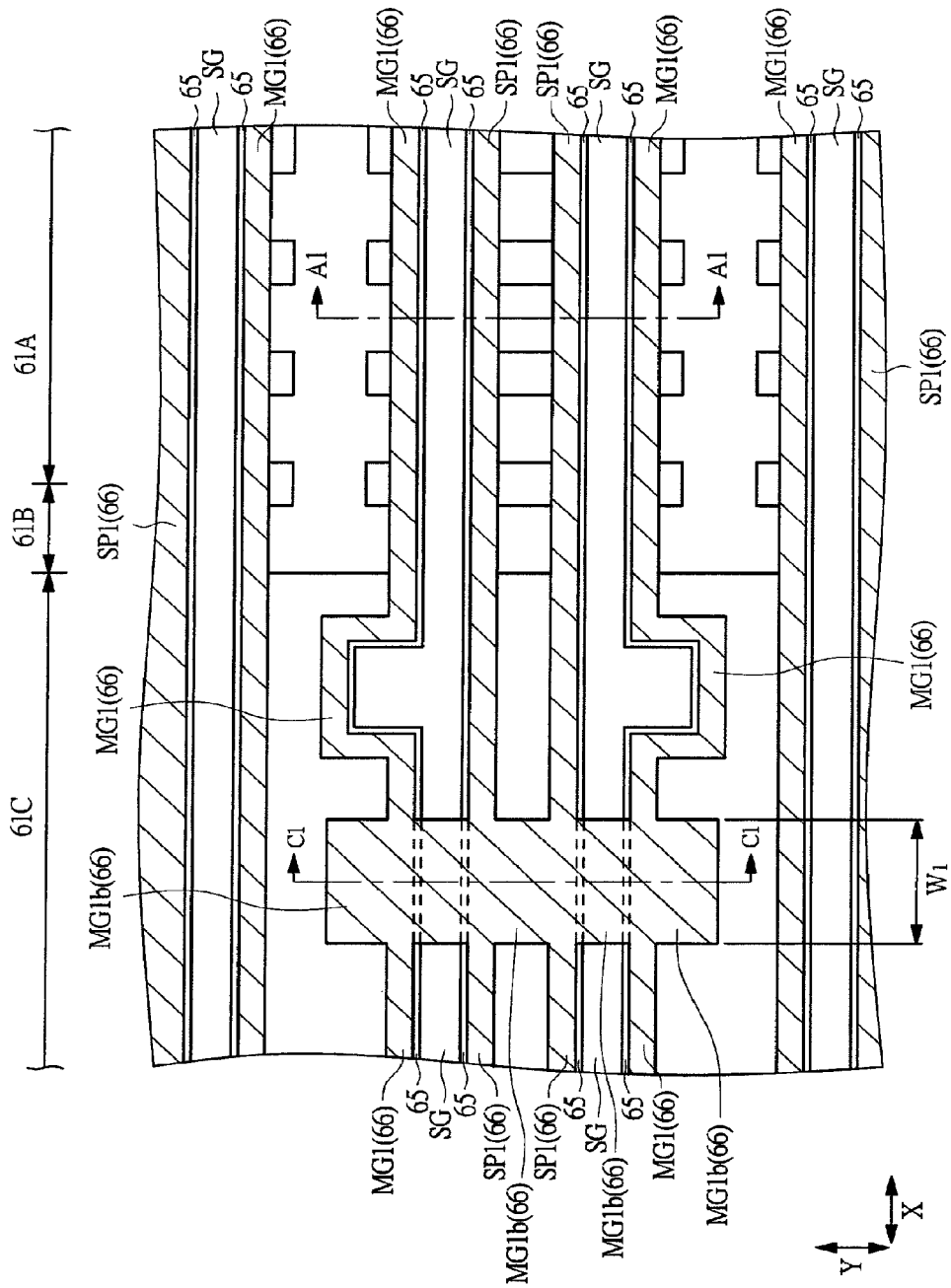
FIG. 61 is a plan view of the semiconductor device during the manufacturing process continued from FIGS. 58 to 60.

In the etch-back process of the step S9, the silicon film 66 is anisotropically etched (etched back) only by the deposited thickness of the silicon film 66 so that the silicon film 66 is left on both of the sidewalls of the select gate electrode SG (via the insulating film 65) in a sidewall (sidewall spacer) shape; and the silicon film 66 under the photoresist pattern RP2 is left, and the silicon film 66 in the other region is removed. In this manner, as illustrated in FIG. 61 (plan view of a main part), FIG. 62 (cross-sectional view taken along the line A1-A1), and FIG. 63 (cross-sectional view taken along the line C1-C1), the memory gate electrode MG1 is formed of the silicon film 66 left in a sidewall shape on one of the sidewalls of the select gate electrode SG via the insulating film 65, and a silicon spacer (conductor spacer) SP1 is formed of the silicon film 66 left in a sidewall shape on the other sidewall via the insulating film 65. The silicon spacer SP1 can be regarded as a sidewall spacer formed of a conductor, that is, a conductor spacer. In addition, a contact portion MG1b is formed by the remaining silicon film 66 not being etched under the photoresist pattern RP2. A part of the contact portion MG1b will be the contact portion MG1a later. Since the etch-back process in the step S9 is an anisotropic etching, the formed contact portion MG1b has the same pattern shape (planar shape) as the photoresist pattern RP2.

Figure 62:
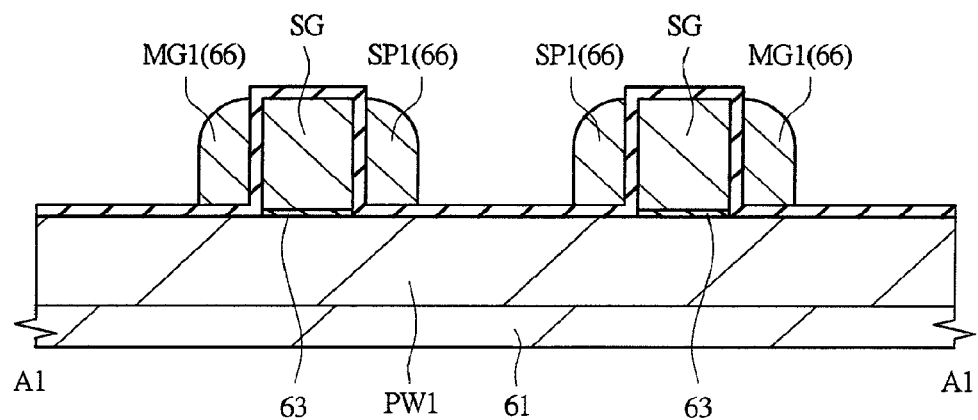
FIG. 62 is a cross-sectional view of a main part (cross-sectional view taken along the line A1-A1) of the semiconductor device during the manufacturing process same as that of FIG. 61.
Figure 63:
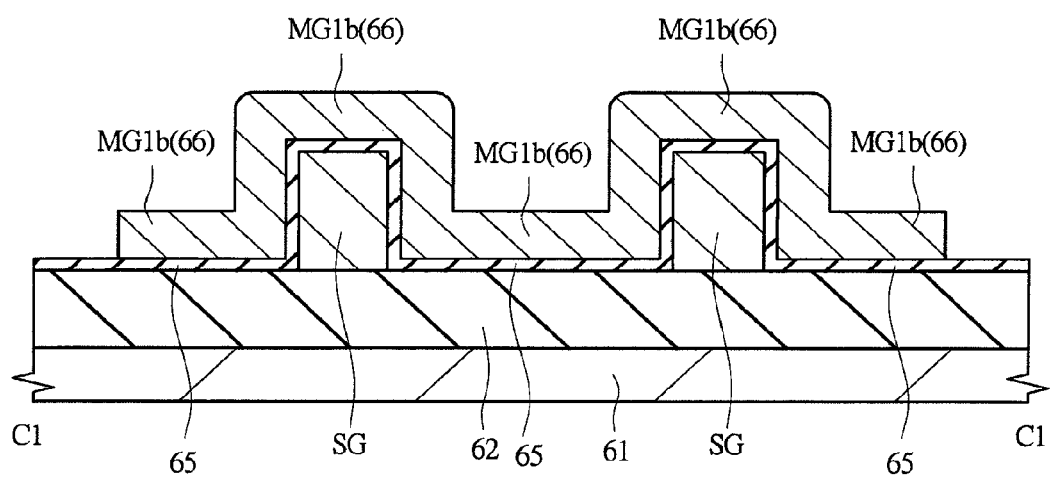
FIG. 63 is a cross-sectional view of a main part (cross-sectional view taken along the line C1-C1) of the semiconductor device during the manufacturing process same as that of FIGS. 61 and 62.

As illustrated in FIGS. 58 and 60, in the word shunt region 61C, the photoresist pattern RP2 is formed to cross the select gate electrode SG, more preferably, to be orthogonal to the select gate electrode SG. That is, the photoresist pattern RP2 being extended to cross (preferably, be orthogonal to) the select gate electrode SG is formed on the silicon film 66. Therefore, as the contact portion MG1b is formed to cross (preferably, be orthogonal to) the select gate electrode SG, the contact portion MG1b has a portion running over the select gate electrode SG (i.e., a portion positioned on the select gate electrode SG). Thereafter, the photoresist pattern RP2 is removed. FIGS. 61 to 63 correspond to the stage where the photoresist pattern RP2 has been already removed. Note that, while FIG. 61 is a plan view, to facilitate understanding, the insulating film 65 is transparent, and hatching is added to the remaining silicon film 66 (i.e., the silicon spacer SP1, the memory gate electrode MG1 and the contact portion MG1b) in FIG. 61.

In this manner, at the stage upon performing the etch-back process of the step S9, the silicon film 66 other than that being covered by the photoresist pattern RP2 becomes a sidewall shape to be the memory gate electrode MG1 and the silicon spacer SP1, and the silicon film 66 covered by the photoresist pattern RP2 becomes the contact portion MG1b leaving the entire thickness of the deposited thickness of the silicon film 66. And, the memory gate electrode MG1 and the silicon spacer SP1 are formed on the sidewalls of the select gate electrode SG opposite to each other, and the structure is substantially symmetry across the pattern of the select gate electrode SG. Also, at the stage upon performing the etch-back process of the step S9, the insulating film 65 not covered by the memory gate electrode MG1, the silicon spacer SP1, and the contact portion MG1b is exposed. The insulating film 65 under the memory gate electrode MG1 in the memory cell region 61A becomes the gate insulating film of the memory transistor. As the memory gate length (gate length of the memory gate electrode MG1) is determined depending on the deposited thickness of the silicon film 66, the memory gate length can be adjusted by adjusting the deposited thickness of the silicon film 66 deposited in the step S8 described above.

Figure 64:
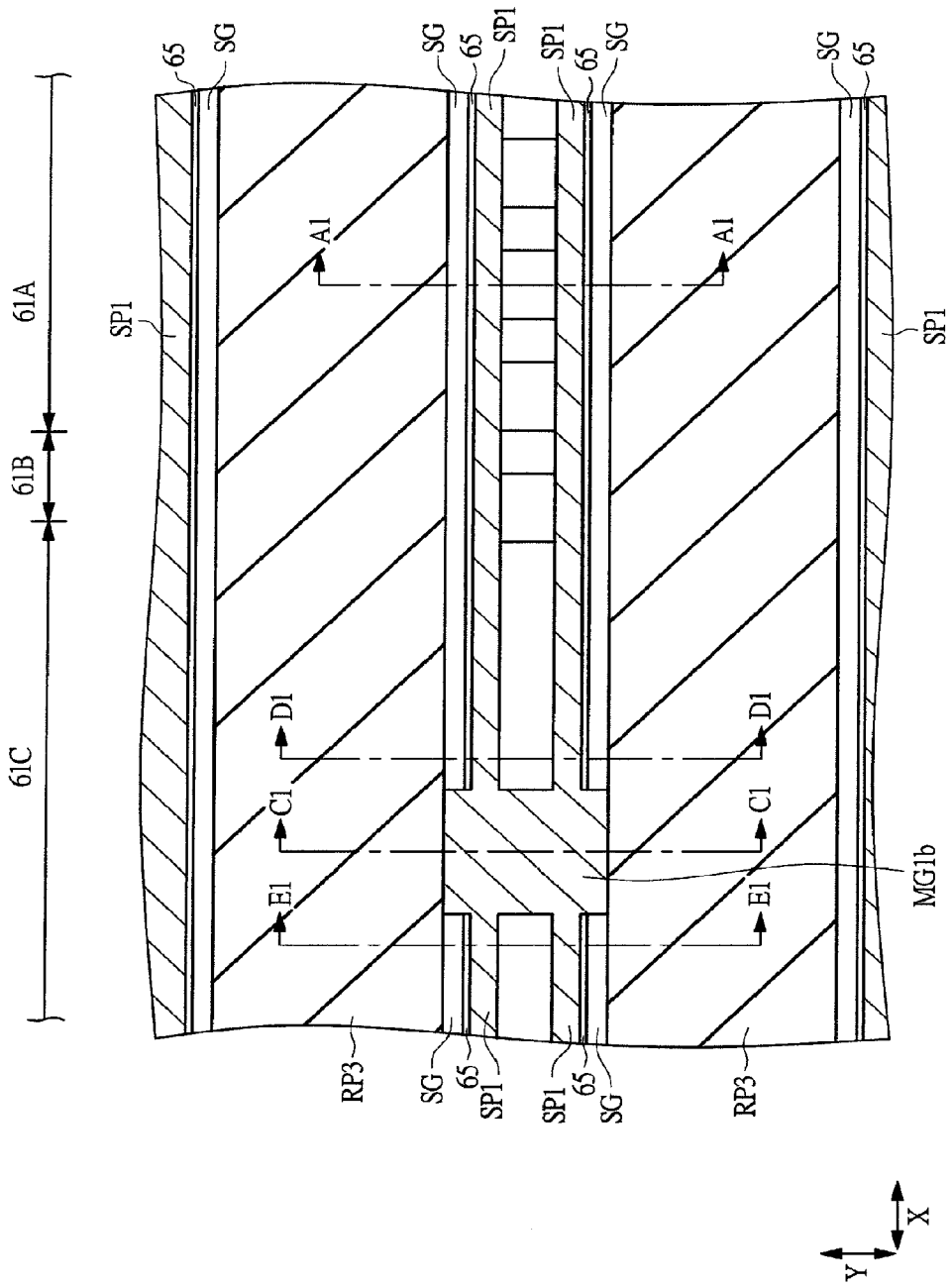
FIG. 64 is a plan view of the semiconductor device during the manufacturing process continued from FIGS. 61 to 63.
Figure 65:
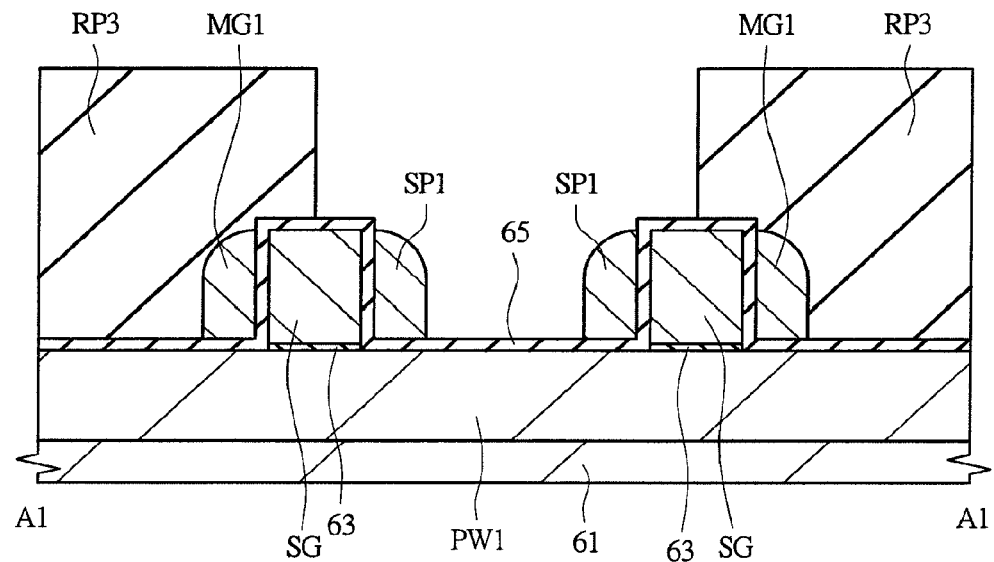
FIG. 65 is a cross-sectional view of a main part (cross-sectional view taken along the line A1-A1) of the semiconductor device during the manufacturing process same as that of FIG. 64.
Figure 66:
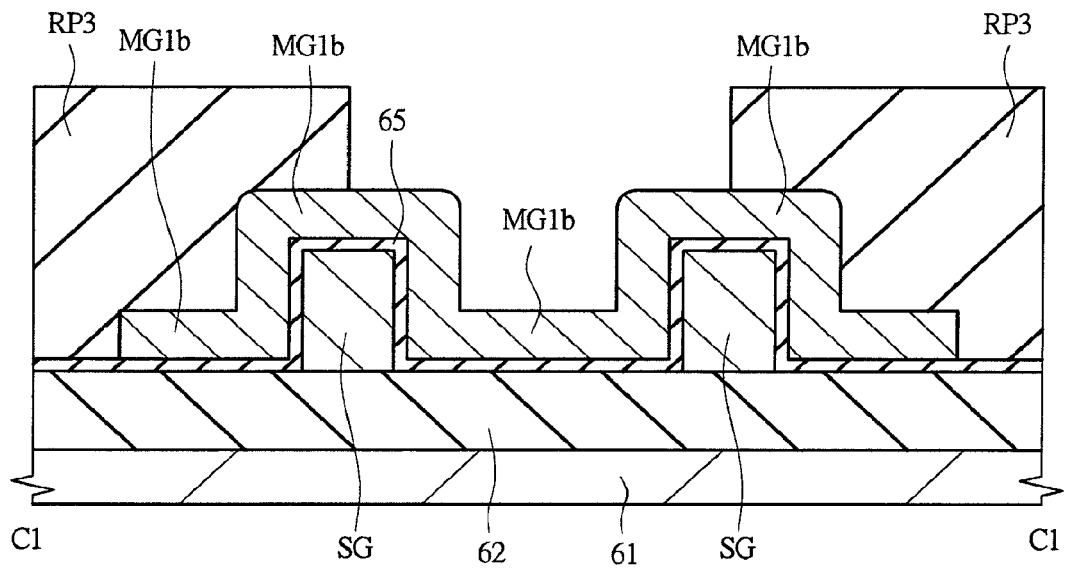
FIG. 66 is a cross-sectional view of a main part (cross-sectional view taken along the line C1-C1) of the semiconductor device during the manufacturing process same as that of FIGS. 64 and 65.
Figure 67:
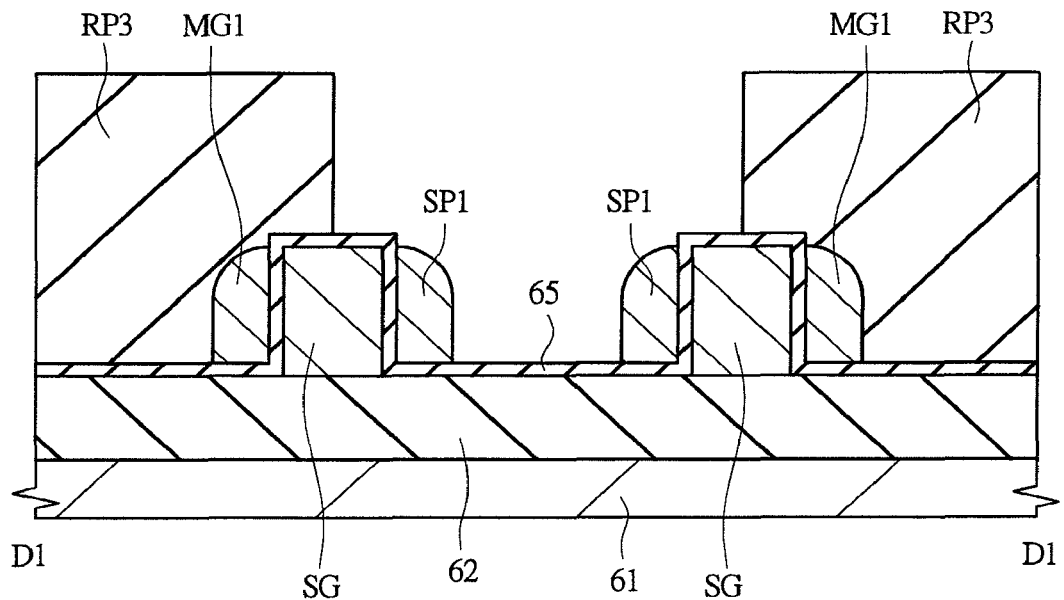
FIG. 67 is a cross-sectional view of a main part (cross-sectional view taken along the line D1-D1) of the semiconductor device during the manufacturing process same as that of FIGS. 64 to 66.
Figure 68:
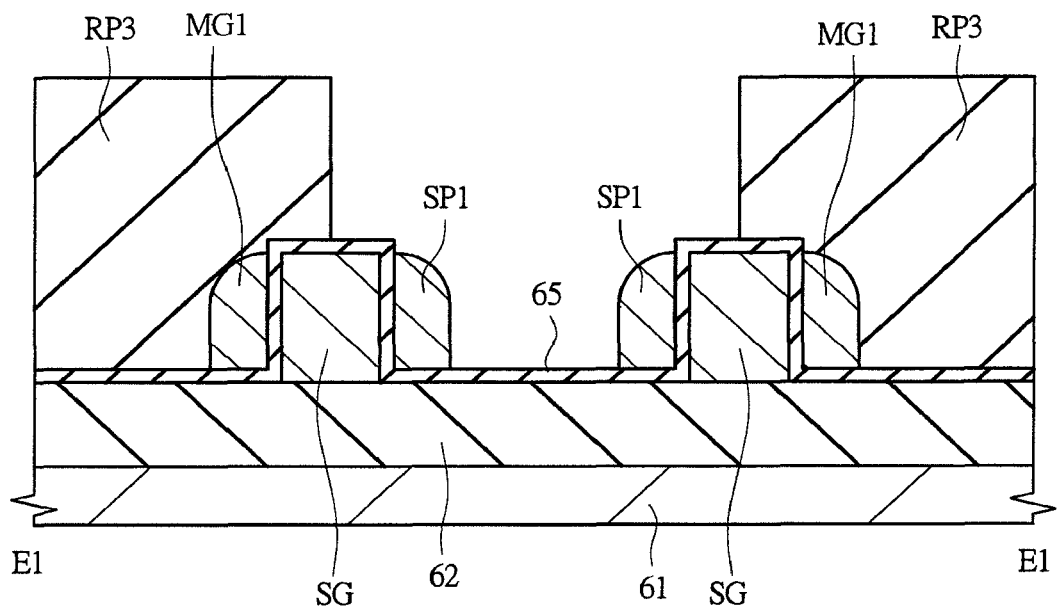
FIG. 68 is a cross-sectional view of a main part (cross-sectional view taken along the line E1-E1) of the semiconductor device during the manufacturing process same as that of FIGS. 64 to 67.

Next, as illustrated in FIG. 64 (plan view of a main part), FIG. 65 (cross-sectional view taken along the line A1-A1), FIG. 66 (cross-sectional view C1-C1), FIG. 67 (cross-sectional view taken along the line D1-D1), and FIG. 68 (cross-sectional view taken along the line E1-E1), the photoresist pattern (resist pattern) RP3 covered by the memory gate electrode MG1 and exposing the silicon spacer SP1 is formed on the semiconductor substrate 61 by photolithography technology. The photoresist pattern RP3 is formed to cover a part of the contact portion MG1b and the memory gate electrode MG1 other than the contact portion MG1b, and to expose another part of the contact portion MG1b and the silicon spacer SP1. Note that, while the FIG. 64 is a plan view, to facilitate understanding, the insulating film 65 is transparent, and hatching is added to the silicon spacer SP1 and the contact portion MG1b exposed without being covered by the photoresist pattern RP3 in FIG. 64.

Figure 69:
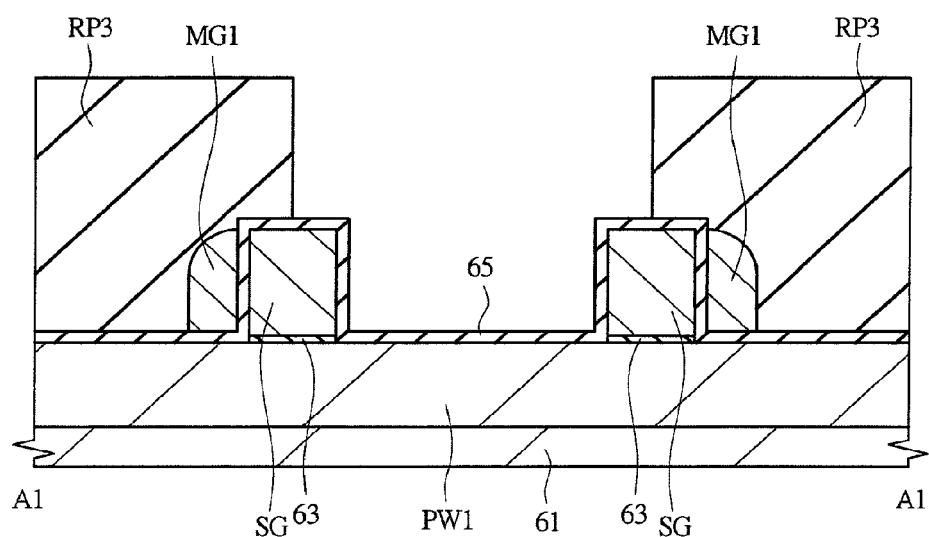
FIG. 69 is a cross-sectional view of a main part (cross-sectional view taken along the line A1-A1) of the semiconductor device during the manufacturing process continued from FIGS. 64 to 68.
Figure 70:
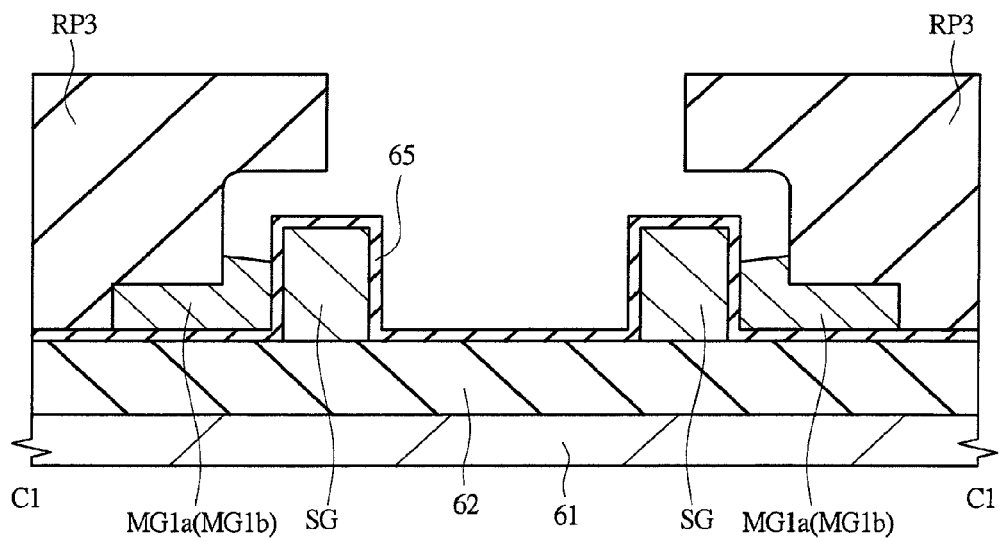
FIG. 70 is a cross-sectional view of a main part (cross-sectional view taken along the line C1-C1) of the semiconductor device during the manufacturing process same as that of FIG. 69.
Figure 71:
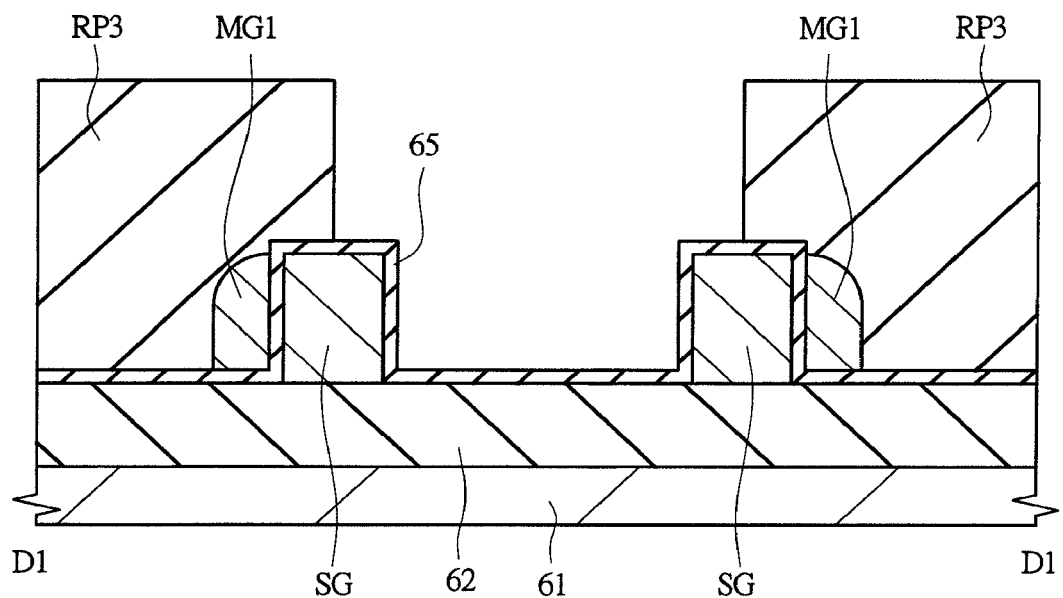
FIG. 71 is a cross-sectional view of a main part (cross-sectional view taken along the line D1-D1) of the semiconductor device during the manufacturing process same as that of FIGS. 69 and 70.
Figure 72:
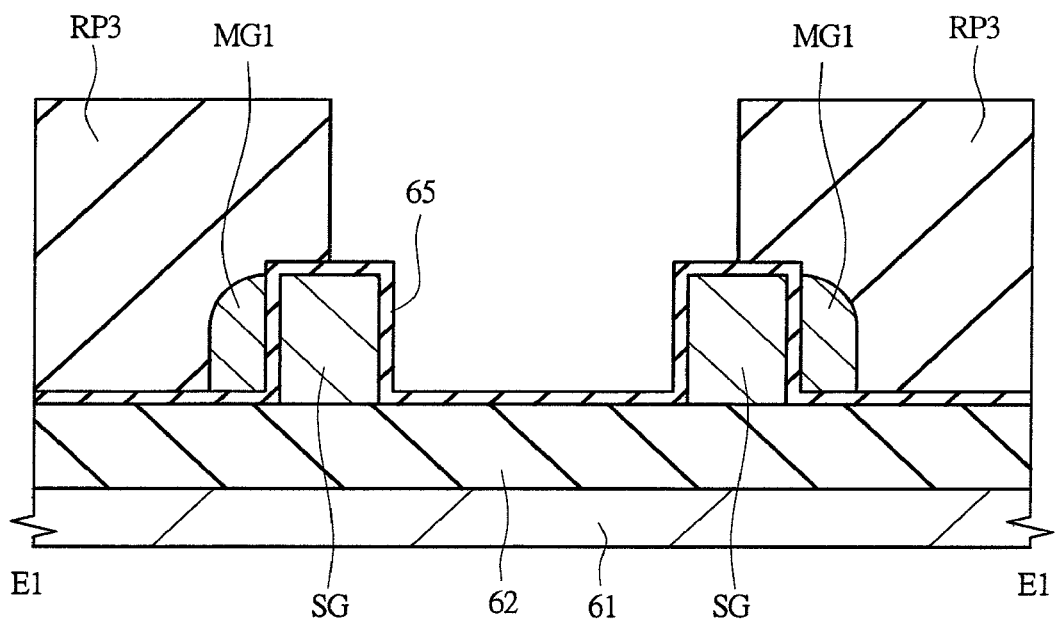
FIG. 72 is a cross-sectional view of a main part (cross-sectional view taken along the line E1-E1) of the semiconductor device during the manufacturing process same as that of FIGS. 69 to 71.
Figure 73:
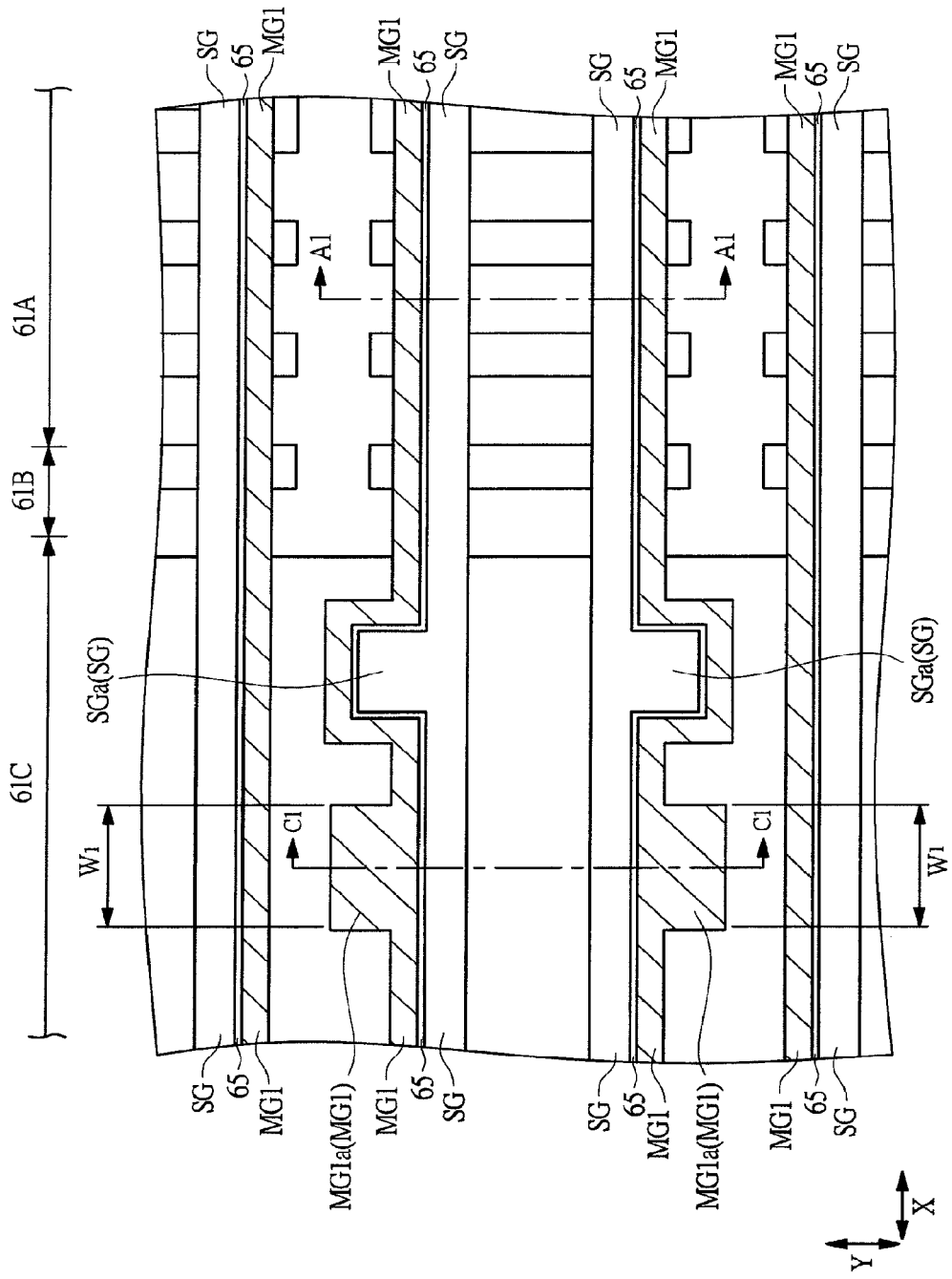
FIG. 73 is a plan view of the semiconductor device during the manufacturing process continued from FIGS. 69 to 72.
Figure 74:
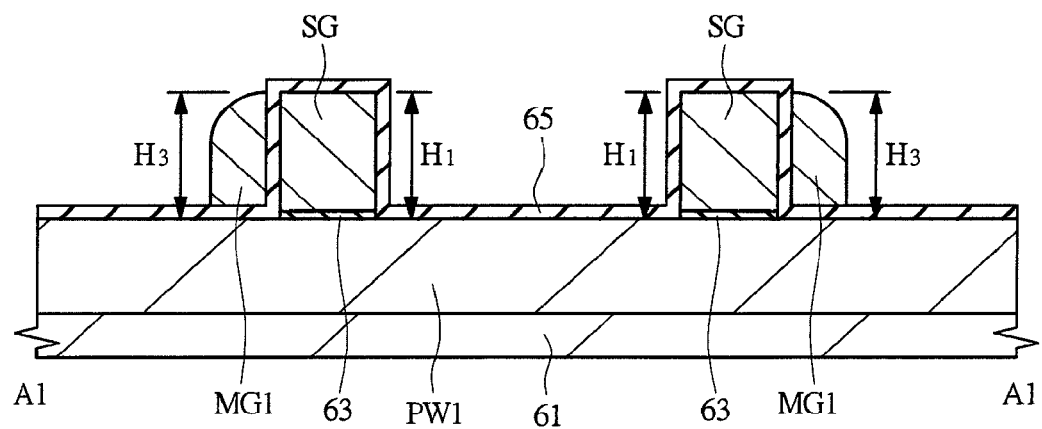
FIG. 74 is a cross-sectional view of a main part (cross-sectional view taken along the line A1-A1) of the semiconductor device during the manufacturing process same as that of FIG. 73.

Next, as illustrated in FIG. 69 (cross-sectional view taken along the line A1-A1), FIG. 70 (cross-sectional view taken along the line C1-C1), FIG. 71 (cross-sectional view taken along the line D1-D1), and FIG. 72 (cross-sectional view taken along the line E1-E1), an isotropic etching is performed using the photoresist pattern RP3 as an etching mask, thereby removing the silicon spacer SP1 (step S10 in FIG. 47). Thereafter, as illustrated in FIG. 73 (plan view of a main part), FIG. 74 (cross-sectional view taken along the line A1-A1), and FIG. 75 (cross-sectional view taken along the line C1-C1), the photoresist pattern RP3 is removed. In the etching process in the step S10, it is important to perform isotropic etching. Note that, while the FIG. 73 is a plan view, to facilitate understanding, the insulating film 65 is transparent, and hatching is added to the remaining silicon film 66 (i.e., the memory gate electrode MG1 and the contact portion MG1a) in FIG. 73.

As illustrated in FIGS. 64 to 68, the photoresist pattern RP3 is formed not to be overlapped with the silicon spacer SP1 in a plane. That is, the silicon spacer SP1 is not covered by the photoresist pattern RP3, and the etching of the step S10 is performed in a state having the silicon spacer SP1 being exposed. Thus, all of the silicon spacer SP1 is removed by the etching in the step S10.

Also, as illustrated in FIGS. 64 and 66, the photoresist pattern RP3 is formed to be overlapped with a part of the contact portion MG1b in a plane, and not to be overlapped with another part of the contact portion MG1b in a plane. That is, the contact portion MG1b has a part covered by the photoresist pattern RP3 and a part not covered by the photoresist pattern RP3. Therefore, the contact portion MG1b has a part exposed upwards and not being covered by the photoresist pattern RP3, and this part (of the contact portion MG1b not covered by the photoresist pattern RP3) is removed by the etching in the step S10.

Different from the present embodiment, when the etching performed in the step S10 is an anisotropic etching, the part of the contact portion GM1b covered by the photoresist pattern RP3 is not etched and remains. However, in the present embodiment, a feature in the etching process of the step S10 is performing isotropic etching.

Since the etching performed in the step S10 is isotropic etching, when the contact portion MG1b not covered by the photoresist pattern RP3 is etched in a longitudinal direction (a thickness direction, i.e., a direction substantially perpendicular to the main surface of the semiconductor substrate 61), the contact portion MG1b have a portion whose upper part is covered by the photoresist pattern RP3 and whose side surface is exposed, and the contact portion MG1b is side-etched from the exposed portion.

Therefore, in the isotropic etching step of the step S10, the contact portion MG1b not only has a portion not covered by the photoresist pattern RP3 and removed, but also a part of a portion covered by the photoresist pattern RP3 and removed by side etching. In the contact portion MG1b, a remaining part, which has not been removed in the isotropic etching step in the step S10, becomes the contact portion MG1a. Therefore, the contact portion MG1a is formed of a part of the contact portion MG1b, and the other part than the part to be the contact portion MG1a is removed by the etching in the step S10. The contact portion MG1a (i.e., the remaining part of the contact portion MG1b not removed by the isotropic etching step in the step S10) is integrally formed with the memory gate electrode MG1 (i.e., the memory gate electrode MG1 other than the contact portion MG1a) in a sidewall shape.

Also, as illustrated in FIGS. 64 to 68, the photoresist pattern RP3 is formed to be overlapped with the memory gate electrode MG1 in a sidewall shape in a plane. That is, the photoresist pattern RP3 is formed to include the memory gate electrode MG1 in a sidewall shape in a plane. Note that "the memory gate electrode MG1 in a sidewall shape" before the isotropic etching of the step S10 corresponds to "the memory gate electrode MG1 other than the contact portion MG1b," and "the memory gate electrode MG1 in a sidewall shape" after the isotropic etching of the step S10 corresponds to "the memory gate electrode MG1 other than the contact portion MG1a."

Therefore, when the photoresist pattern RP3 is formed, the memory gate electrode MG1 in a sidewall shape (i.e., memory gate electrode MG1 other than the contact portion MG1b) is covered by the photoresist pattern RP3, and not exposed in both the longitudinal direction (vertical direction) and a crosswise direction (horizontal direction) as the select gate electrode SG is provided in the crosswise direction. As the etching of the step S10 is performed in this state (a state in which the memory gate electrode MG1 is not exposed in both the longitudinal direction and the crosswise direction), the memory gate electrode MG1 in a sidewall shape is not etched by the etching of the step S10, and eventually remains.

Also, while the etching performed in the etching process of the step S10 is necessarily an isotropic etching, either of dry etching or wet etching can be used. Note that dry etching is more preferable than wet etching, and using isotropic dry etching as the etching in the etching process of the step S10 has advantages including good controllability of etching amount and small variations. When using dry etching, for example, $O_2/CF_4$ etc. can be used as an etching gas.

According to such a step S10, the silicon spacer SP1 is removed and the memory gate electrode MG1 in a sidewall shape is left, so that the contact portion MG1b becomes the contact portion MG1a.

Figure 76:
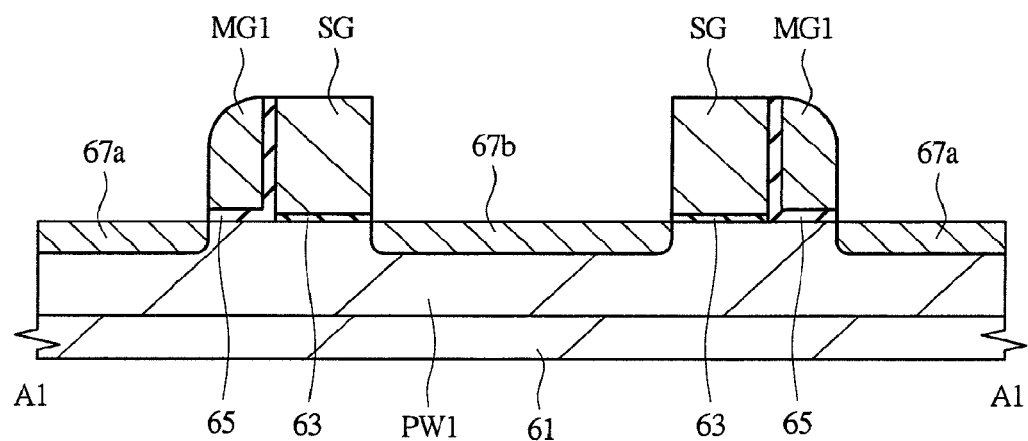
FIG. 76 is a cross-sectional view of a main part (cross-sectional view taken along the line A1-A1) of the semiconductor device during the manufacturing process continued from FIGS. 73 to 75.
Figure 77:
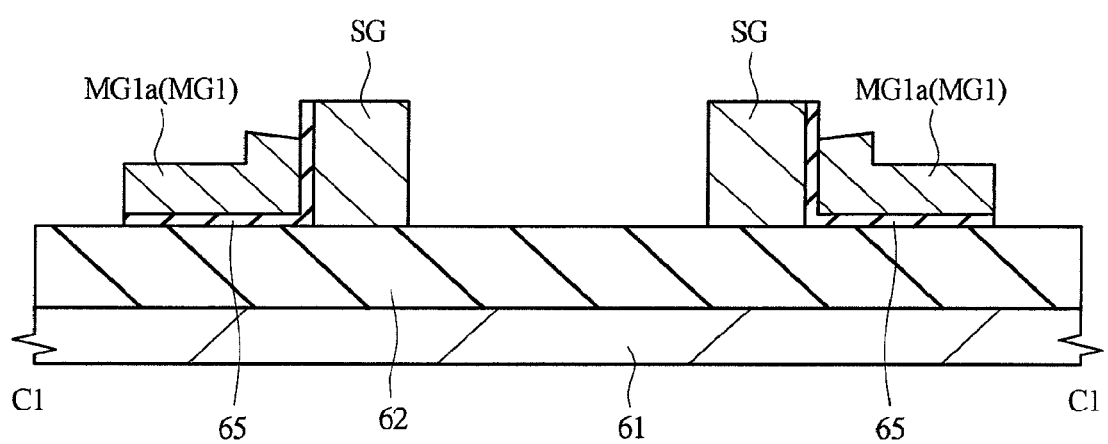
FIG. 77 is a cross-sectional view of a main part (cross-sectional view taken along the line C1-C1) of the semiconductor device during the manufacturing process same as that of FIG. 76.

Next, as illustrated in FIG. 76 (cross-sectional view taken along the line A1-A1) and FIG. 77 (cross-sectional view taken along the line C1-C1), in the insulating film 65, an exposed part not covered by the memory gate electrode MG1 (including the contact portion MG1a) is removed by etching (for example, wet etching) (step S11 in FIG. 47). Here, the insulating film 65 positioned under the memory gate electrode MG1 and the insulating film 65 positioned between the memory gate electrode MG1 and the select gate electrode SG are not removed and remains. Thus, both the insulating film 65 positioned under the contact portion MG1a and the insulating film 65 positioned between the contact portion MG1a and the select gate electrode SG are not removed and remains.

Next, an n-type impurity, for example, arsenic (As) or phosphorus (P) etc. is introduced (doped) into the semiconductor substrate 61 (p-type well PW1) using the select gate electrode SG and the memory gate electrode MG1 as an ion-implantation blocking mask, thereby forming the n⁻-type semiconductor regions (impurity diffusion layers) 67a and 67b (step S12 in FIG. 47).

Here, the n⁻-type semiconductor region 67a is formed in a self-aligned manner to a sidewall of the memory gate electrode MG1 (sidewall on a side opposite to that adjacent to the select gate electrode SG via the insulating film 65) in the memory cell region 61A, and the n⁻-type semiconductor region 67b is formed in a self-aligned manner to a sidewall of the select gate electrode SG (sidewall on a side opposite to that adjacent to the memory gate electrode MG1 via the insulating film 65) in the memory cell region 61A. The n⁻-type semiconductor region 67a and the n⁻-type semiconductor region 67b can work as parts of the source/drain regions of the memory cell formed in the memory cell region 61A.

Figure 78:
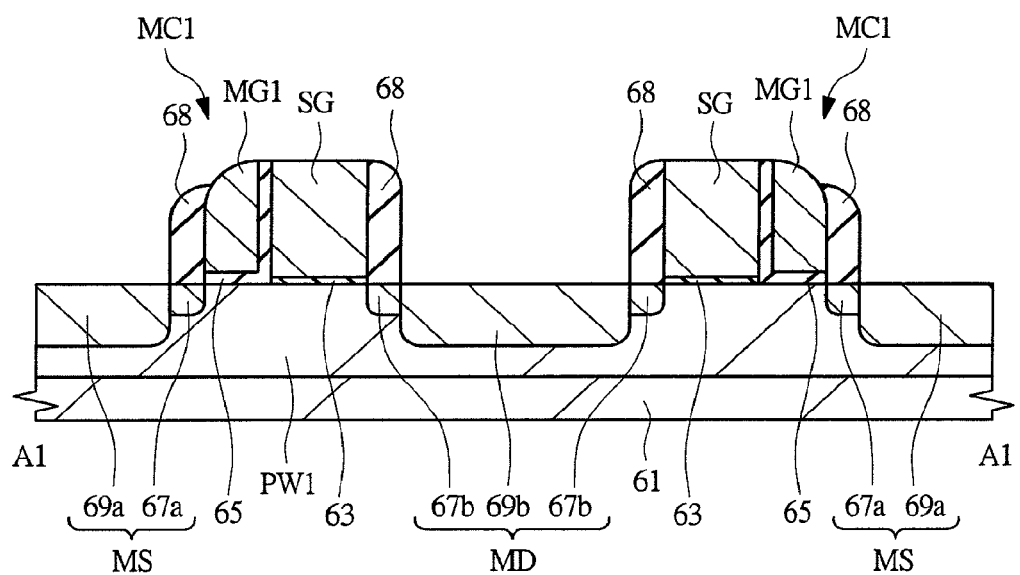
FIG. 78 is a cross-sectional view of a main part (cross-sectional view taken along the line A1-A1) of the semiconductor device during the manufacturing process continued from FIGS. 76 and 77.
Figure 79:
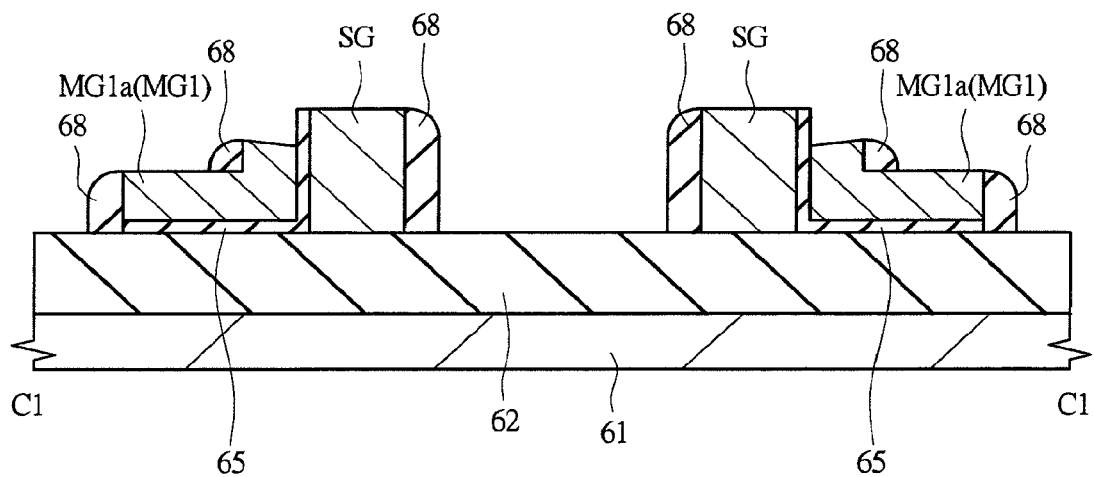
FIG. 79 is a cross-sectional view of a main part (cross-sectional view taken along the line C1-C1) of the semiconductor device during the manufacturing process same as that of FIG. 78.

Next, as illustrated in FIG. 78 (cross-sectional view taken along the line A1-A1) and FIG. 79 (cross-sectional view taken along the line C1-C1), on the sidewalls of the select gate electrode SG and memory gate electrode MG1, (sidewalls on sides opposite to those of the select gate electrodes SG and the memory gate electrodes MG1 adjacent to each other via the insulating film 65), the sidewall insulating films (sidewall, sidewall spacer) 68 formed of an insulator, for example, silicon oxide are formed (step S13 in FIG. 47). For example, an insulating film such as a silicon oxide film is deposited on the entire surface of the main surface of the semiconductor substrate 61, and the insulating film is subjected to an anisotropic etching (etching back), thereby selectively leaving the insulating film only on the sidewalls of the select gate electrodes SG and memory gate electrodes MG1, so that the sidewall insulating films 68 are formed. As illustrated in FIG. 79, the sidewall insulating film 68 may be formed also on the sidewalls (side surfaces) of the contact portions MG1a. While the sidewall insulating film 68 has been formed as a silicon oxide film in the present embodiment, the sidewall insulating film 68 is not limited to silicon oxide film, and the sidewall insulating film 68 may be formed of a silicon nitride film or a stacked film of a silicon oxide film and a silicon nitride film.

Next, an n-type impurity, for example, arsenic (As) or phosphorus (P) etc. is introduced (doped) into the semiconductor substrate 61 (p-type well PW1) using the select gate electrode SG, the memory gate electrode MG1, and the sidewall insulating film 68 on the select gate electrode SG and memory gate electrode MG1 as an ion-implantation blocking mask, thereby forming the n⁺-type semiconductor regions (impurity diffusion layers) 69a and 69b having a high concentration (step S14 in FIG. 47).

Here, the n⁺-type semiconductor region 69a is formed to the sidewall insulating film 68 in a self-aligned manner to the sidewall of the memory gate electrode MG1 in the memory cell region 61A, and the n⁺-type semiconductor region 69b is formed in a self-aligned manner to the sidewall insulating film 68 on the sidewall of the select gate electrode SG in the memory cell region 61A. In this manner, an LDD (lightly doped drain) structure is formed.

The n-type semiconductor region MS, which works as a source region of the memory transistor, is formed of the n⁻-type semiconductor region 67a and the n⁺-type semiconductor region 69a that has a higher impurity concentration than the n⁻-type semiconductor region 67a, and the n-type semiconductor region MD, which works as a drain region of the select transistor, is formed of the n⁻-type semiconductor region 67b and the n⁺-type semiconductor region 69b having a higher impurity concentration than the n⁻-type semiconductor region 67b.

In this manner, the memory cell MC1 of the non-volatile memory is formed in the memory cell region 61A described above.

Next, if needed, an etching (for example, wet etching using diluted hydrofluoric acid) is performed, thereby cleaning (exposing) upper surfaces (surfaces) of the select gate electrode SG, memory gate electrode MG1, and n⁺-type semiconductor regions 69a and 69b. The etching here can be a light etching to the extent of removing natural oxide films.

Figure 80:
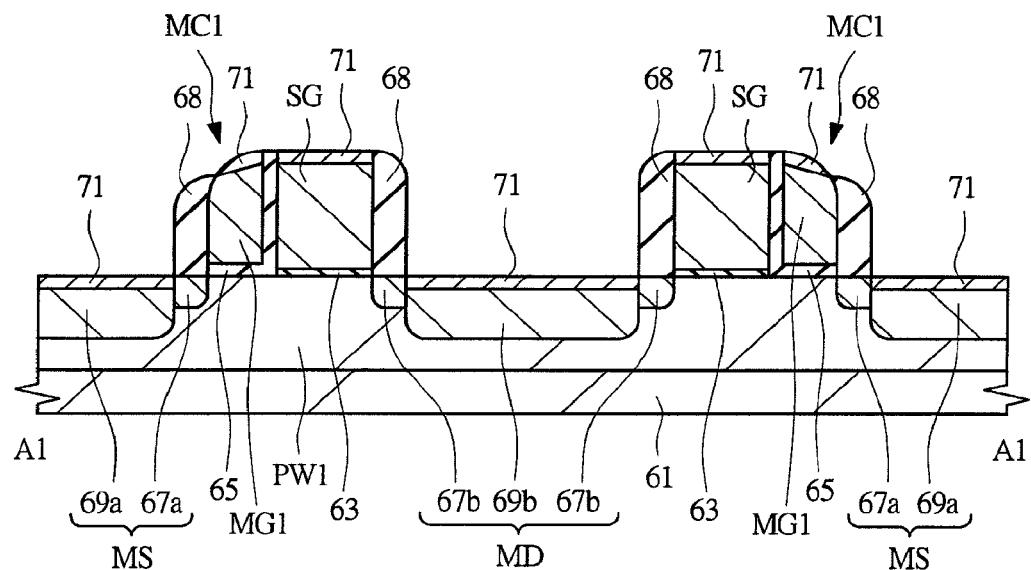
FIG. 80 is a cross-sectional view of a main part (cross-sectional view taken along the line A1-A1) of the semiconductor device during the manufacturing process continued from FIGS. 78 and 79.
Figure 81:
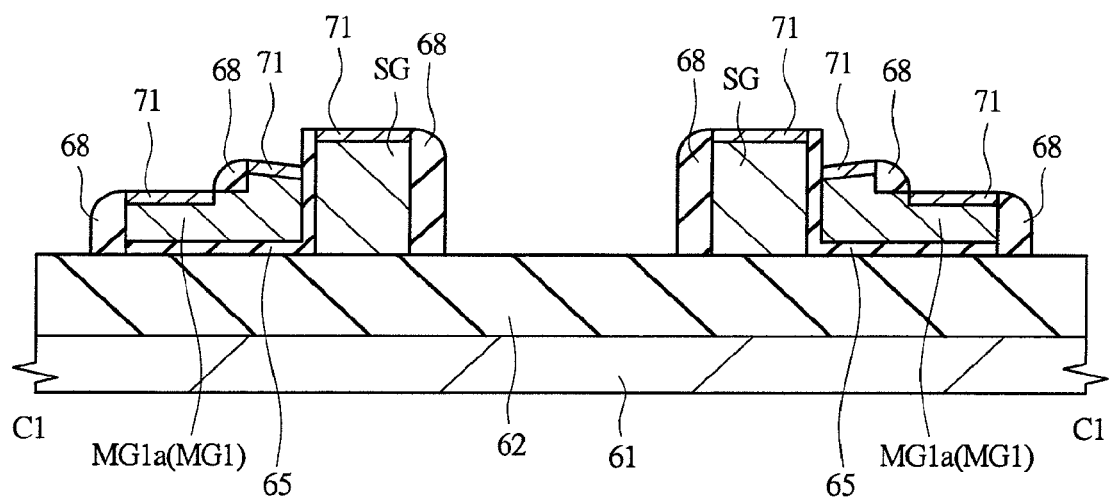
FIG. 81 is a cross-sectional view of a main part (cross-sectional view taken along the line C1-C1) of the semiconductor device during the manufacturing process same as that of FIG. 80.

Next, using salicide technology, as illustrated in FIG. 80 (cross-sectional view taken along the line A1-A1) and FIG. 81 (cross-sectional view taken along the line C1-C1), to upper portions (upper surfaces, surfaces, upper-layer portions) of the select gate electrodes SG, memory gate electrodes MG1, and n⁺-type semiconductor regions 69a and 69b, the metal silicide layers (metal silicide films) 71 are formed, respectively. By forming the metal silicide layers 71, diffusion resistance and/or contact resistance can be lowered. The metal silicide layer 71 can be formed in the following manner.

First, a metal film (not illustrated) is formed (deposited) on the entire surface of the main surface of the semiconductor substrate 61 including the upper surfaces (surfaces) of the select gate electrodes SG, memory gate electrodes MG1, and n⁺-type semiconductor regions 69a and 69b to cover the select gate electrodes SG, memory gate electrodes MG1, and sidewall insulating films 68. This metal film is formed of, for example, a cobalt (Co) film or a nickel (Ni) film etc., and can be formed by using sputtering or the like. Then, a thermal treatment is performed on the semiconductor substrate 61, thereby reacting the metal film and the upper layer portions (surface layer portions) of the select gate electrodes SG, memory gate electrodes MG1, and n⁺-type semiconductor regions 69a and 69b. In this manner, the metal silicide layers 71 are formed to the upper portions (upper surfaces, surfaces, upper layer portions) of the select gate electrodes SG, memory gate electrodes MG1, and n⁺-type semiconductor regions 69a and 69b, respectively. The metal silicide layer 71 can be, for example, a cobalt silicide layer (when the metal film described above is a cobalt film), or a nickel silicide layer (when the metal film is a nickel film). Then, unreacted part of the metal film described above is removed. Cross-sectional views of this stage are illustrated in FIGS. 80 and 81.

Also, as illustrated in FIG. 81, the metal silicide layers 71 are formed to portions not covered by the sidewall insulating films 68 among the upper surfaces of the contact portions MG1a of the memory gate electrodes MG1. In addition, as illustrated in FIG. 40, the metal silicide layers 71 are formed also on the upper surfaces of the contact portions SGa of the select gate electrodes SG.

Figure 82:
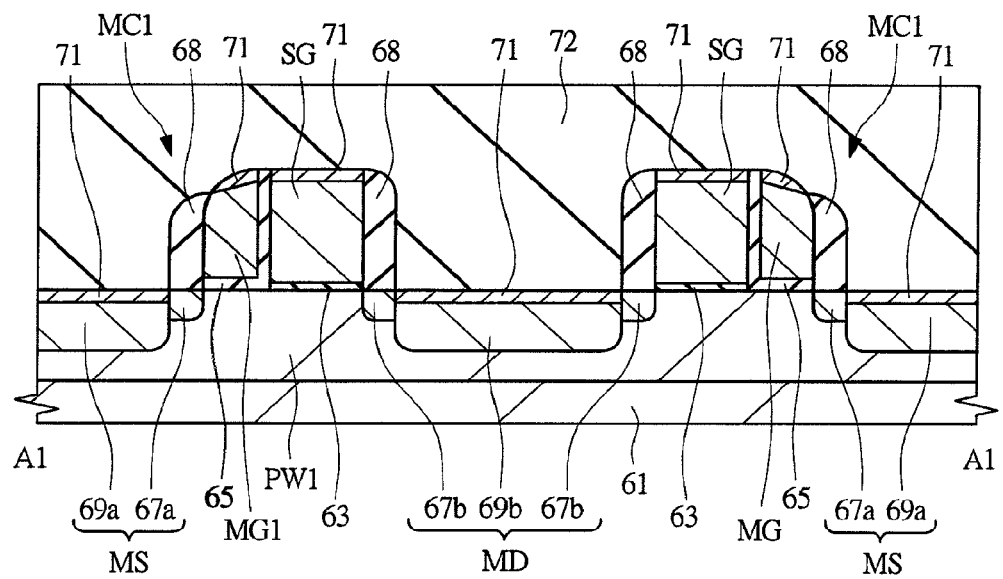
FIG. 82 is a cross-sectional view of a main part (cross-sectional view taken along the line A1-A1) of the semiconductor device during the manufacturing process continued from FIGS. 80 and 81.
Figure 83:
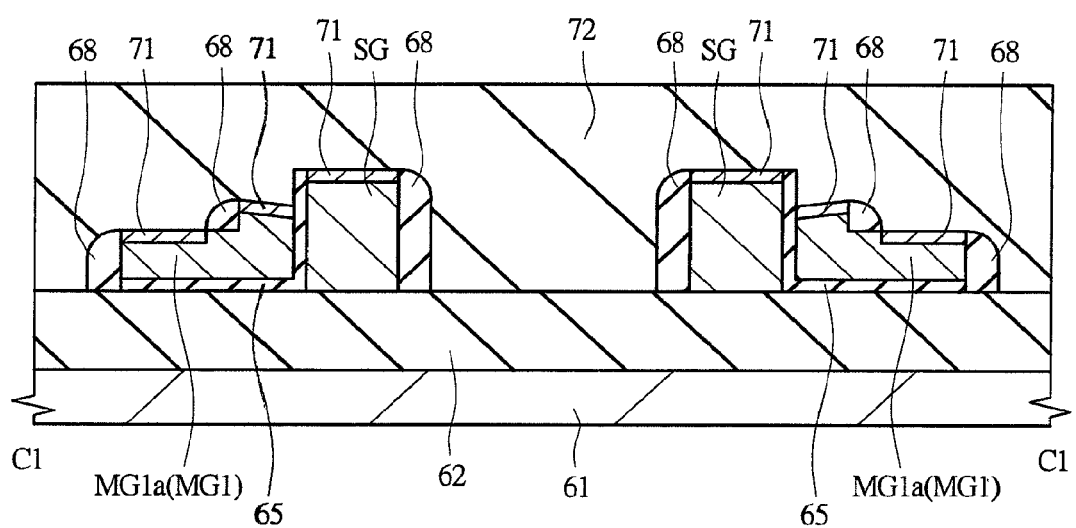
FIG. 83 is a cross-sectional view of a main part (cross-sectional view taken along the line C1-C1) of the semiconductor device during the manufacturing process same as that of FIG. 82.

Next, as illustrated in FIG. 82 (cross-sectional view taken along the line A1-A1) and FIG. 83 (cross-sectional view taken along the line C1-C1), on the entire surface of the semiconductor substrate 61, the insulating film (interlayer insulating film) 72 is formed (deposited) as an interlayer insulating film to cover the select gate electrodes SG, memory gate electrodes MG1, and the sidewall insulating films 68. The insulating film 72 is formed of a single film of a silicon oxide film or a stacked film of a silicon nitride film and a silicon oxide film on the silicon nitride film, and can be formed by a CVD method or the like. When the insulating film 72 is formed of the stacked film of a silicon nitride film and a silicon oxide film on the silicon nitride film, a thickness of the silicon oxide film on the top layer side is larger than that of the silicon nitride film on the bottom layer side. The silicon nitride film on the bottom layer side works as an etching stopper film upon forming the contact holes CT to the insulating film 72. After forming the insulating film 72, the upper surface of the insulating film 72 is planarized by using a CMP (chemical mechanical polishing) method, if needed.

Figure 84:
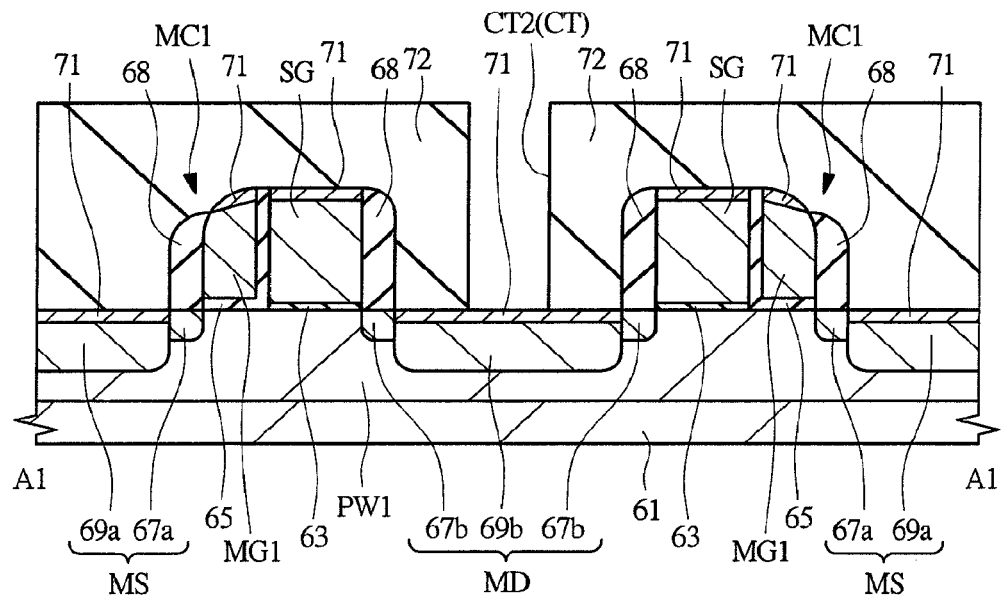
FIG. 84 is a cross-sectional view of a main part (cross-sectional view taken along the line A1-A1) of the semiconductor device during the manufacturing process continued from FIGS. 82 and 83.
Figure 85:
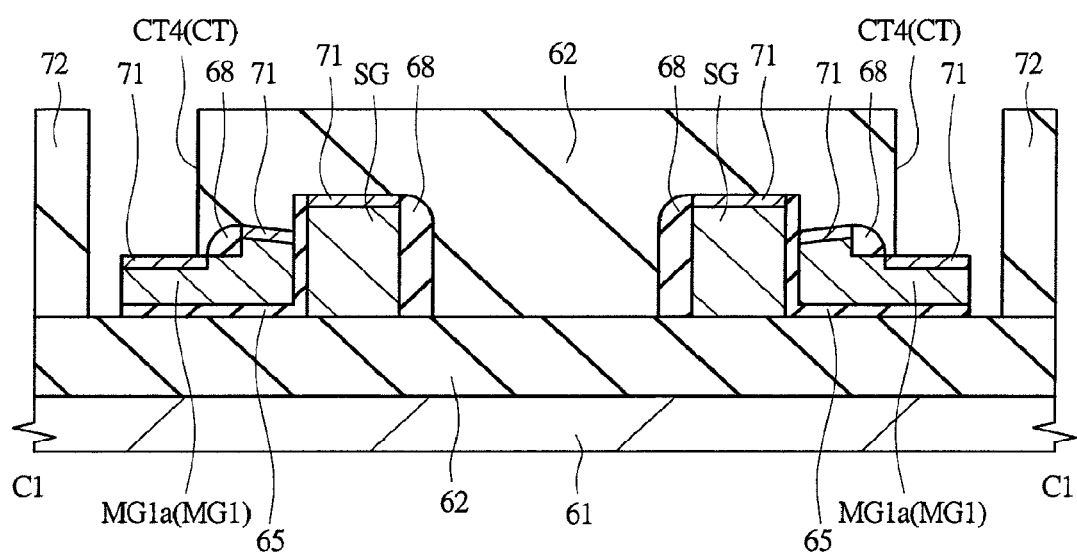
FIG. 85 is a cross-sectional view of a main part (cross-sectional view taken along the line C1-C1) of the semiconductor device during the manufacturing process same as that of FIG. 84.

Next, using a photoresist pattern (not illustrated) formed on the insulating film 72 by using a photolithography method, the insulating film 72 is dry-etched, thereby forming the contact holes (opening portions, through-holes) CT to the insulating film 72 as illustrated in FIG. 84 (cross-sectional view taken along the line A1-A1) and FIG. 85 (cross-sectional view taken along the line C1-C1).

The contact holes CT are formed to upper portions of the $n^+$-type semiconductor regions 69a and 69b, the contact portions SGa, and the contact portions MG1a of the memory gate electrodes MG1. The contact holes CT include the contact holes CT1, CT2, CT3, and CT4 as described above. Among the contact holes CT, the contact holes CT4 are formed to the insulating film (interlayer insulating film) 72 at the upper portions of the contact portions MG1a of the memory gate electrodes MG1. A part of (a part of the metal silicide layer 71 on the surface of) the contact portion MG1a of the memory gate electrode MG1 is exposed at the bottom portion of the contact hole CT4. Also, the contact hole CT2 is formed to the insulating film (interlayer insulating film) 72 at an upper portion of the $n^+$-type semiconductor region 69b, and a part of (a part of the metal silicide layer 71 on the surface of) the $n^+$-type semiconductor region 69b is exposed at the bottom portion of the contact hole CT2. Further, as observed in FIG. 40 described above, the contact holes CT3 are formed to the insulating film (interlayer insulating film) 72 at upper portions of the contact portions SGa of the select gate electrodes SG, and a part of (a part of the metal silicide layer 71 on the surface of) the contact portion SGa of the select gate electrode SG is exposed at the bottom portion of the contact hole CT3.

Figure 86:
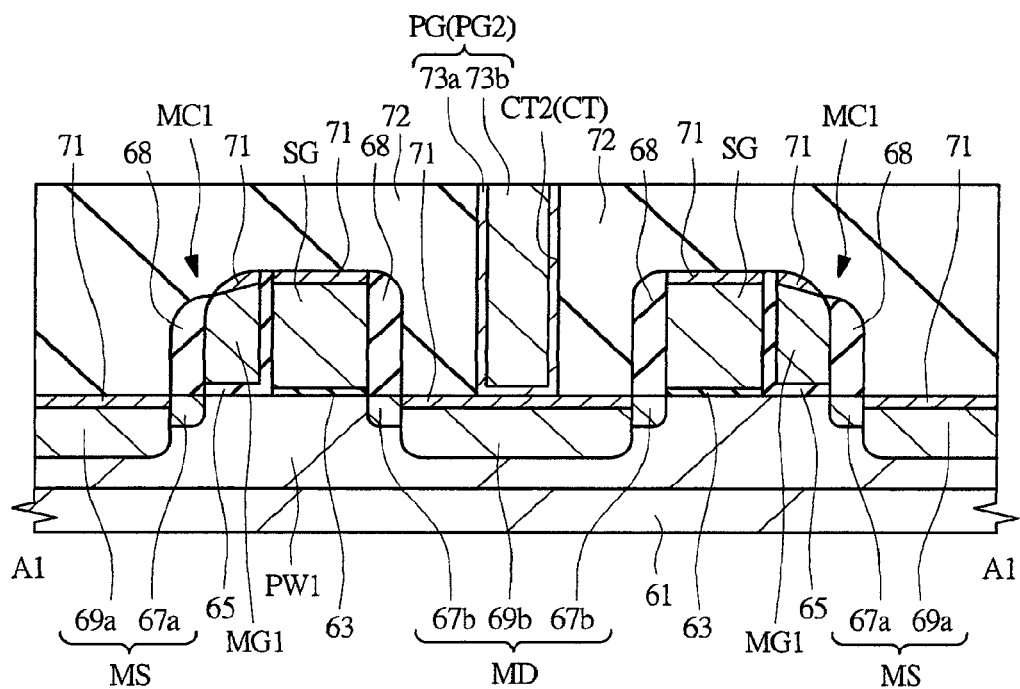
FIG. 86 is a cross-sectional view of a main part (cross-sectional view taken along the line A1-A1) of the semiconductor device during the manufacturing process continued from FIGS. 84 and 85.
Figure 87:
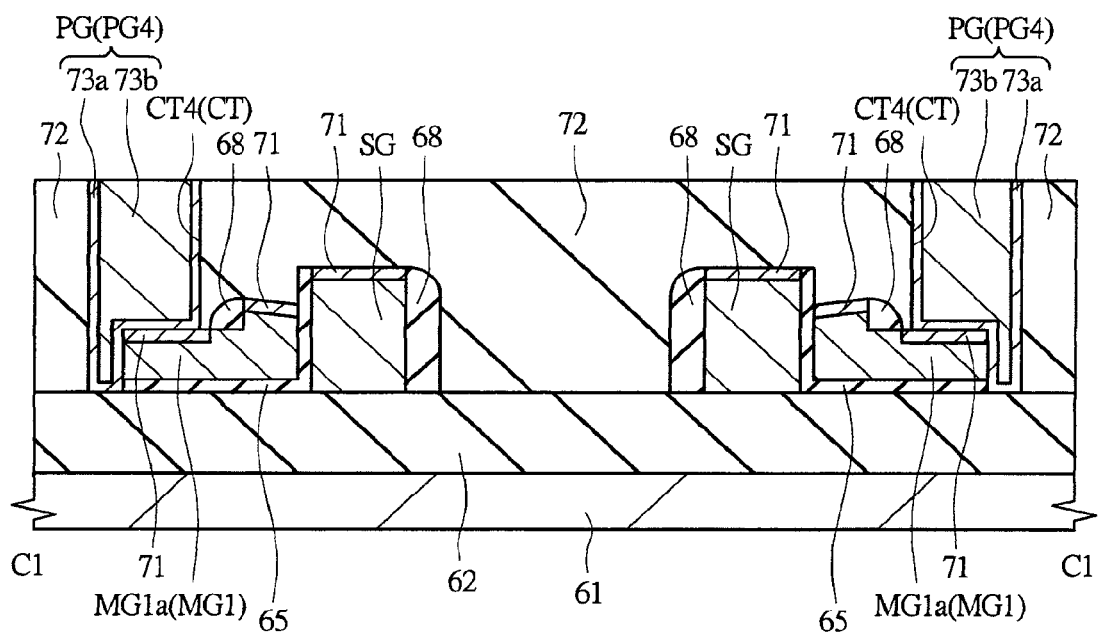
FIG. 87 is a cross-sectional view of a main part (cross-sectional view taken along the line C1-C1) of the semiconductor device during the manufacturing process same as that of FIG. 86.

Next, as illustrated in FIG. 86 (cross-sectional view taken along the line A1-A1) and FIG. 87 (cross-sectional view taken along the line C1-C1), inside the contact holes CT, the conductive plugs PG formed of tungsten (W) or the like are formed as conductor portions (connection conductor portions).

To form the plugs PG, for example, the barrier conductor film 73a is formed on the insulating film 72 including inside portions (on bottom portions and sidewalls) of the contact holes CT. The barrier conductor film 73a can be, for example, a titanium film, a titanium nitride film, or a stacked film of a titanium film and a titanium nitride film. Then, the main conductor film 73b formed of a tungsten film or the like is formed on the barrier conductor film 73a to fill the contact holes CT, and unnecessary parts of the main conductor film 73b and the barrier conductor films 73a are removed by a CMP method or an etch-back method etc., thereby forming the plugs PG.

Among the plugs PG, the plug PG2 buried in the contact hole CT2 abuts and is electrically connected to (the metal silicide layer 71 on the surface of) the $n^+$-type semiconductor region 69b. Among the plugs PG, the plug PG4 buried in the contact hole CT4 abuts and is electrically connected to (the metal silicide layer 71 on the surface of) the contact portion MG1a of the memory gate electrode MG1. Also, as observed in FIG. 40, the plug PG3 buried in the contact hole CT3 abuts and is electrically connected to (the metal silicide layer 71 on the surface of) the contact portion SGa of the select gate electrode SG.

Next, as illustrated in FIGS. 39 to 43, the wiring (wiring layer) MM1 is formed on the insulating film 72 in which the plug PG are buried. Forming such a wiring MM1 by damascene technique (here, single damascene technique) will be described.

First, as illustrated in FIGS. 39 to 43, after forming the insulating film (interlayer insulating film) 74 on the insulating film 72 in which the plugs PG are buried, wiring trenches (trenches to which the wirings MM1 are buried in the insulating film 74) are formed by using photolithography technique and dry etching technique. Then, a barrier conductor film (e.g., titanium nitride film, tantalum film, or tantalum nitride film) is formed on the main surface of the semiconductor substrate 61 (i.e., on the insulating film 74 including the bottom portions and sidewalls of the wiring trenches), and subsequently, a seed layer of copper is formed on the barrier conductor film by a CVD method or sputtering, and further, a copper plating film is formed on the seed layer using an electroplating method to fill the inside of the wiring grooves by the copper plating film. Thereafter, the copper plating film, seed layer, and barrier conductor film in other regions than the inside of the wiring trenches are removed by a CMP method, so that the wiring MM1 of a first layer containing copper as a main conductive material is formed. The wiring MM1 is buried in the wiring trenches 74. Note that, to simplify drawings, in FIGS. 39 to 43, the copper plating film, seed film, and barrier conductor film forming the wiring MM1 are integrally illustrated.

The wiring MM1 is electrically connected to the source region (semiconductor region MS) of the memory transistor, the drain region (drain semiconductor region MD) of the select transistor, the contact portion SGa of the select gate electrode SG, or the contact portion MG1a of the memory gate electrode MG1 via the plug PG buried in the contact hole CT. For example, as illustrated in FIG. 41, the memory gate wiring (wiring to be connected to the memory gate electrode MG1) among the wirings MM1 is electrically connected to the contact portion MG1a of the memory gate electrode MG1 via the plug PG4 buried in the contact hole CT4. Also, as illustrated in FIG. 40, the select gate wiring (wiring to be connected to the select gate wiring SG) MM1b among the wirings MM1 is electrically connected to the contact portion SGa of the select gate electrode SG via the plug PG3 buried in the contact hole CT3.

While wirings of second and following layers are formed by a dual damascene method etc. thereafter, illustration and description thereof will be omitted. Also, the wiring MM1 and wirings of upper layers above the wiring MM1 are not limited to damascene wirings (buried wirings), and they can be formed by patterning a conductor film for wiring, for example, a tungsten wiring or aluminum wiring can be used.

Next, comparing with a semiconductor device of a comparative example, main effects of the present embodiment will be described.

Figure 88:
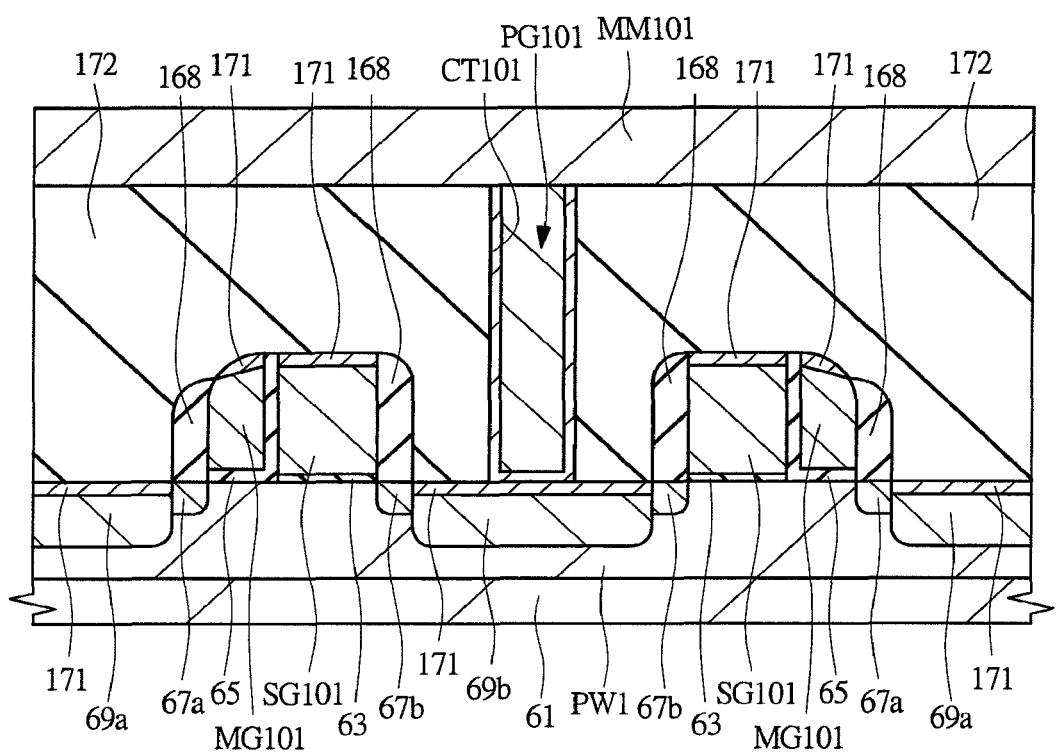
FIG. 88 is a cross-sectional view of a main part of a semiconductor device of a comparative example.
Figure 89:
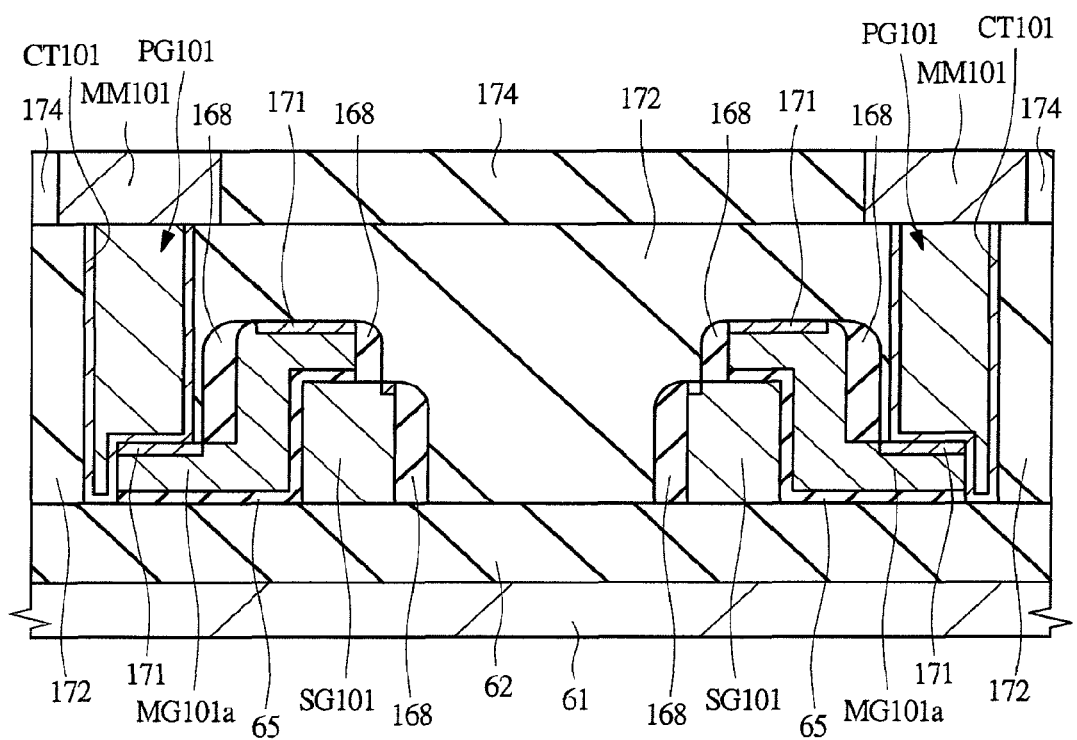
FIG. 89 is a cross-sectional view of a main part of the semiconductor device of the comparative example.

FIGS. 88 and 89 are cross-sectional views of a main part of a semiconductor device of the comparative example, and correspond to FIGS. 39 and 40 of the present embodiment described above. Note that, in the semiconductor device of the comparative example in FIGS. 88 and 89, a memory gate electrode MG101, a select gate electrode SG101, a sidewall insulating film 168, a metal silicide layer 171, an insulating film 172, a contact hole CT101, a plug PG101, an insulating film 174, and a wiring MM101 correspond to the memory gate electrode MG1, the select gate electrode SG, the sidewall insulating film 68, the metal silicide layer 71, the insulating film 72, the contact hole CT, the plug PG, the insulating film 74, and the wiring MM1 of the present embodiment, respectively. Also, in the semiconductor device of the comparative example illustrated in FIGS. 88 and 89, the contact portion MG101a corresponds to the contact portion MG1a of the present embodiment described above.

In the semiconductor device of the comparative example illustrated in FIGS. 88 and 89, the contact portion MG101a of the memory gate electrode MG101 runs over the select gate electrode SG101. That is, a part of the contact portion MG101a of the memory gate electrode MG101 is positioned above the select gate electrode SG101, and the contact portion MG101a is extended across a position above the select gate electrode SG101 to the device isolation region 62. Regarding the contact portion MG101a, upon forming the memory gate electrode MG101 in a sidewall shape by etching back a silicon film (corresponding to the silicon film 66) formed on the main surface of the semiconductor substrate 61, a photoresist pattern (corresponding to RP2 described above) is formed to an upper portion of the silicon film and the silicon film is left under the photoresist pattern to form the contact portion MG101a. Upon removing a silicon spacer (corresponding to the silicon spacer SP1 described above) on one of sidewalls of the select gate electrode SG101 and leaving the memory gate electrode MG101 on the other sidewall of the select gate electrode SG101, a not-etched part of the memory gate electrode MG101a running over the select gate electrode SG101 is left, and the structure, in which the contact portion MG101a is running over the select gate electrode SG101, is maintained also in the semiconductor device of the comparative example after manufacture.

Through the study of the inventors of the present invention, it has been found out that the following problems occur in the semiconductor device of the comparative example illustrated in FIGS. 88 and 89.

In the comparative example in which a part of the contact portion MG101a of the memory gate electrode MG101 is running over the select gate electrode SG101, it is necessary to make a thickness of the insulating film 172 (distance from the main surface of the semiconductor substrate 61 to an upper surface of the insulating film 172) larger so that also the contact portion MG101a running over the select gate electrode SG101 is sufficiently covered by the insulating film 172.

However, it is necessary to form the contact hole CT101 formed to the insulating film 172 to surely penetrate through the insulating film 172. Therefore, when the insulating film 172 is thick, an etching amount of the dry etching upon forming the contact hole CT101 to the insulating film 172 is increased, and an etching amount of the photoresist pattern being formed (not illustrated) is increased. Therefore, a yield is feared to be lowered as a shape abnormality in the contact hole occurs. Also, it becomes necessary to set the over-etching amount larger, and it may cause damages to the part exposed at the bottom portion of the contact hole CT101 due to an over-etching.

Also, when the thickness of the insulating film 172 is large, a depth of the contact hole CT1 formed in the insulating film 172 becomes large. However, it becomes difficult to form a contact hole when an aspect ratio (horizontal to vertical ratio) is too large. Thus, when the thickness of the insulating film becomes too large, to suppress an increase in the aspect ratio of the contact hole CT101, it becomes necessary to increase a planar size (opening area) of the contact hole CT101, but it is a disadvantage to miniaturization of semiconductor devices.

Also, to form a peripheral circuit other than the non-volatile memory in the other regions of the semiconductor substrate 61 which is the same with that to which the non-volatile memory is formed, a gate processing (a patterning step of forming a gate electrode of the peripheral circuit) is performed in a region to form the peripheral circuit (peripheral circuit forming region) while the non-volatile memory forming region (including regions corresponding to the memory cell region 61A, the source dummy region 61B, and the word shunt region 61C) is being covered by a photoresist pattern. Here, in the comparative example, the upper surface of the contact portion MG101a running over the select gate electrode SG101 is at the highest position among the elements formed on the semiconductor substrate 61, and the part is necessary to be covered by a photoresist pattern having a thickness capable of sufficiently protecting in a patterning of the gate electrode of the peripheral circuit. Therefore, as the photoresist pattern is necessary to be thicker than the present embodiment, a thickness of a photoresist pattern for the gate processing (photoresist pattern which covers a gate-electrode formation planned region in the peripheral circuit region) is large. When the thickness of the photoresist pattern for gate processing is large, it becomes difficult to form a miniaturized gate electrode. Thus, the comparative example has a disadvantage in miniaturization of the gate electrode in the peripheral circuit forming region.

Also, in the structure in which a part of the contact portion MG101a is running over the select gate electrode SG101 as the comparative example, variations in position and size of the contact portion MG101a tend to be large. Thus, to ensure a process margin, the size of the contact portion MG101a should be large, resulting in a disadvantage in miniaturization of semiconductor devices.

Meanwhile, in the present embodiment, the contact portion MG1a of the memory gate electrode MG1 is not running over the select gate electrode SG. That is, the contact portion MG1a does not have a part positioned on the select gate electrode SG. The memory gate electrode MG1 in the other region than the contact portion MG1a is formed in a sidewall (sidewall spacer) shape on one sidewall of the select gate electrode SG, and does not run over the select gate electrode SG. Thus, the memory gate electrode MG1 including the contact portion MG1a does not have a part positioned on the select gate electrode SG.

Further, in the present embodiment, while the contact portions MG1a are provided to a plurality of the memory gate electrodes MG1 when a plurality of lines of the select gate electrodes SG and the memory gate electrodes MG1 being adjacent via the insulating film 65 are extended on the main surface of the semiconductor substrate 61, none of the memory gate electrode MG1 has the contact portion MG1*a* running over the select gate electrode SG (the memory gate electrode MG1 does not have a portion positioned on the select gate electrode SG). That is, when a plurality of the select gate electrodes SG and a plurality of the memory gate electrodes MG1 being adjacent via the insulating film 65 are extended on the main surface of the semiconductor substrate 61, none of the memory gate electrodes MG1 (the memory gate electrodes MG1 including the contact portions MG1*a*) has a portion positioned above the select gate electrode SG.

More specifically, in the present embodiment, at the stage of depositing the silicon film 66, while the silicon film 66 is formed to cover the pattern (select gate electrode SG) of the silicon film 64, all portions of the silicon film 66 positioned above the silicon film 64 after the silicon film 66 is deposited are removed thereafter (specifically, in the steps S9 and S10 described above). Therefore, after the isotropic etching step of the step S10 described above, there is no portion where the silicon film 66 is arranged above the silicon film 64 (select gate electrode SG), and this state will be maintained in the manufactured semiconductor device.

Therefore, in the present embodiment, as the insulating film 72 is formed in a state where the contact portion MG1*a* of the memory gate electrode MG1 does not run over the select gate electrode SG (i.e., a state where the silicon film 66 does not have a portion arranged above the silicon film 64), the thickness of the insulating film 72 can be reduced as compared with the comparative example described above in which a part of the contact portion MG101 runs over the select gate electrode SG101. Since the thickness of the insulating film 72 can be reduced, the amount of etching and the amount of over etching in the dry etching upon forming the contact holes CT can be set at a small amount, and occurrence of a shape abnormality in the contact holes CT due to a large amount of etching, and/or occurrence of damage due to overetching can be suppressed or prevented. Therefore, reliability of the semiconductor device can be improved, and also, performance of the semiconductor device can be improved.

In addition, since the insulating film 72 can be formed thinner in the present embodiment than that of the comparative example, when the planar sizes (opening areas) of the contact holes CT are the same, the aspect ratio (horizontal to vertical ratio) of the contact holes CT can be small, and when the aspect ratios of the contact holes CT are the same, the planar sizes (opening areas) of the contact holes CT can be small. Therefore, it becomes easier to form the contact holes CT, and also, a reduction of the planar size (opening area) of the contact holes is possible. Therefore, a manufacturing yield of the semiconductor device can be improved, and miniaturization (area reduction) of the semiconductor device can be achieved. Moreover, the miniaturization (size reduction) of the semiconductor device can be advanced.

In addition, in the present embodiment, a peripheral circuit other than the non-volatile memory can be formed in another region of the semiconductor substrate 61 which is the same semiconductor substrate 61 to which the non-volatile memory is formed. Here, the peripheral circuit means a processor such as a CPU, a control circuit, a sense amplifier, a column decoder, a row decoder, an input/output circuit, and/or the like. A region in which the peripheral circuit is formed will be called a peripheral circuit forming region. While a MISFET and so forth forming the peripheral circuit are formed to the peripheral circuit forming region of the main surface of the semiconductor substrate 61, gate electrodes of the MISFETs in the peripheral circuit forming region can be formed by using the silicon film 64 (i.e., a silicon film in the same layer as the silicon film 64 used to form the select gate electrodes SG) described above. More specifically, after forming the silicon film 64 in the step S5 described above, the silicon film 64 is left in the peripheral circuit forming region until the stage of removing unnecessary portions of the insulating film 65 in the step S11 described above. Before performing the ion implantation for LDD formation (here, for forming the $n^-$-type semiconductor regions 67*a* and 67*b*) in the step S12, the remaining silicon film 64 in the peripheral circuit forming region is patterned using photolithography technology and dry etching technology, thereby forming the gate electrode (gate electrode of the MISFET forming the peripheral circuit) formed of the patterned silicon film 64.

Meanwhile, in the peripheral circuit forming region, upon forming the gate electrodes by patterning the remaining silicon film 64, the silicon film 64 in the peripheral circuit forming region is necessary to be patterned in a state where the non-volatile memory forming region (including the memory cell region 61A, source dummy region 61B, and word shunt region 61C) is covered by a photoresist pattern. This is because the select gate electrode SG and the memory gate electrode MG1 in the non-volatile memory forming region can be prevented from being etched upon patterning the silicon film 64 in the peripheral circuit forming region to form the gate electrodes of the peripheral circuit.

In the present embodiment, as described above, the contact portion MG1*a* of the memory gate electrode MG1 does not run over the select gate electrode SG. More specifically, as the contact portion MG1*a* of the memory gate electrode MG1 does not have a portion positioned above the select gate electrode SG, the memory gate electrode MG1 including the contact portion MG1*a* does not have a portion positioned above the select gate electrode SG. Therefore, as compared with the comparative example described above, in the present embodiment, it is possible to reduce the thickness of the photoresist pattern (i.e., the photoresist pattern which covers the entire of the non-volatile memory forming region and a gate-electrode formation planned region in the peripheral circuit forming region) used upon forming the gate electrodes (gate electrodes of the MISFET forming the peripheral circuit) by patterning the silicon film 64 in the peripheral circuit forming region. Thus, as the gate electrodes (gate electrodes of the MISFETs forming the peripheral circuit) can be formed by patterning the silicon film 64 in the peripheral circuit using a thin photoresist pattern, miniaturization of the gate electrodes (gate electrode of the MISFET forming the peripheral circuit) in the peripheral circuit forming region can be achieved. Therefore, miniaturization (area reduction) of the semiconductor device can be achieved, and miniaturization (area reduction) of the semiconductor device can be advanced.

In addition, in the present embodiment, as the structure in which the contact portion MG1*a* of the memory gate electrode MG1 does not run over the select gate electrode SG is used, it is easier to ensure a process margin and has an advantage in miniaturization of the semiconductor device as compared to the structure of the comparative example in which a part of the contact portion MG101*a* runs over the select gate electrode SG101.

Also, it is preferable that the contact portion MG1*a* does not have a portion positioned higher than the height of the upper surface of the select gate electrode SG and a height of the contact portion MG1*a* (i.e., height of a top portion of the memory gate electrode MG1) is lower than the height of the select gate electrode SG (i.e., height of the upper surface of the select gate electrode SG), and accordingly, the most of the effects described above can be obtained. This point will be described later.

While the various effects described above can be obtained according to the feature in the structure of the present embodiment in this manner, the manufacturing process for obtaining the structure of the present embodiment is also devised. The design will be described hereinafter.

Different from the present embodiment, at the stage where the silicon film 66 is etched back and the memory gate electrode MG1 and the silicon spacer SP1 are formed in the step S9, it is difficult to make the structure in which the contact portion MG1b does not run over the select gate electrode SG (i.e., the contact portion MG1b does not have a portion positioned above the select gate electrode SG) in view of manufacturing technology in consideration of misalignment of a photomask (misalignment of a photoresist pattern) etc. Even if the contact portion MG1b is forcedly made not to run over the select gate electrode SG, the manufacturing yield of the semiconductor device is feared to be lowered.

Accordingly, in the present embodiment, the contact portion MG1b, which has been formed at the stage where the silicon film 66 is etched back and the memory gate electrode MG1 and the silicon spacer SP1 are formed in the step S9, has a portion running over the select gate electrode SG. That is, the contact portion MG1b has a portion positioned above the select gate electrode SG. Such a structure can be easily and surely achieved by forming the photoresist pattern RP2, being extended to cross (more preferably, to be orthogonal to) the select gate electrode SG, on the silicon film 66. Even when a misalignment of a photomask (misalignment of the photoresist pattern RP2) occurs to a certain degree, the structure can be formed without problems. As the margin can be ensured, the manufacturing yield of the semiconductor device can be also improved.

However, since the contact portion MG1b has a portion positioned above the select gate electrode SG, to solve the problems described in relation to the semiconductor device of the comparative example illustrated in FIGS. 88 and 89 described above, it is necessary to remove the portion of the contact portion MG1b positioned above the select gate electrode SG before the step of forming the insulating film 72. Thus, the step of etching of the step S10 is devised.

The photoresist pattern RP3 described above is formed so that the memory gate electrode MG1 (i.e., memory gate electrode MG1 other than the contact portion MG1b) in a sidewall shape is covered by the photoresist pattern RP3, and the silicon spacer SP1 is not covered by the photoresist pattern (i.e., the silicon spacer SP1 is exposed). This can be easily achieved by positioning the edge portion of the photoresist pattern RP3 above the select gate electrode SG as illustrated in FIGS. 64 to 68. When an etching is performed using the photoresist pattern RP3 as an etching mask, any of anisotropic etching and isotropic etching can remove the silicon spacer SP1 and leave the memory gate electrode MG1 in a sidewall shape (i.e., the memory gate electrode MG1 other than the contact portion MG1b). Meanwhile, when the etching is anisotropic etching, a part of the contact portion MG1b remains on the select gate electrode SG, and thus the problem described in relation to the semiconductor device of the comparative example as illustrated in FIGS. 88 and 89 occurs.

Also, in an anisotropic etching using a photoresist pattern, it is difficult to remove a part of the contact portion MG1b positioned above the select gate electrode SG with preventing etching of the memory gate electrode MG1 (i.e., the memory gate electrode MG1 other than the contact portion MG1b) in a sidewall shape in view of manufacturing technology in consideration of a misalignment of a photomask (misalignment of the photoresist pattern). Even if the part of the contact portion MG1b positioned above the select gate electrode SG is forcedly removed, the manufacturing yield of the semiconductor device is feared to be lowered.

Accordingly, in the present embodiment, the part of the contact portion MG1b positioned above the select gate electrode SG is removed by isotropic etching in the step S10.

That is, in the present embodiment, the contact portion MG1b has a portion covered by the photoresist pattern RP3 and a portion not covered by the photoresist pattern RP3, and this can be easily achieved by positioning the edge portion of the photoresist pattern RP3 above the select gate electrode SG as illustrated in FIGS. 64 to 68. When the photoresist pattern RP3 is used as an etching mask, the part of the contact portion MG1b not covered by the photoresist pattern RP3 is removed, and thus an upper part of the contact portion MG1b covered by the photoresist pattern RP3 and an exposed side surface of the contact portion MG1b are generated. By using the isotropic etching as the present embodiment, from the side surface of the contact portion MG1b exposed from the photoresist pattern RP3, a part of the contact portion MG1b whose upper portion is covered by the photoresist pattern RP3 is side-etched to be removed. By a side-etching by the isotropic etching, a part of the MG1b covered by the photoresist pattern RP3 and also positioned above the select gate electrode SG can be removed. By performing the isotropic etching step of the step S10, the contact portion MG1b does not have a portion running over the select gate electrode SG (i.e., a portion positioned above the select gate electrode SG) eventually, so that the contact portion MG1a is formed. Therefore, in the step S10, it is necessary to remove the portion of the contact portion MG1b not covered by the photoresist pattern RP3 and the portion covered by the photoresist pattern RP3 and positioned above the select gate electrode SG by isotropic etching.

Even if a misalignment of the photomask (misalignment of the photoresist pattern RP3) occurs in a certain degree, as long as the edge portion of the photoresist pattern is positioned above the select gate electrode SG, the portion of the contact portion MG1b positioned above the select gate electrode SG can be removed by isotropic etching with preventing etching of the memory gate electrode MG1 (i.e., the memory gate electrode MG1 other than the contact portion MG1b) in a sidewall shape. In this manner, a margin of the misalignment of the photomask (misalignment of the photoresist pattern RP2 described above) can be ensured, and thus the manufacturing yield of the semiconductor device can be improved.

Also, in the present embodiment, an unnecessary portion (a portion positioned above the select gate electrode SG) of the contact portion MG1b is removed in the same step as the step of removing the silicon spacer SP1, and this can be achieved by performing an isotropic etching as the etching in the step S10. In this manner, the number of manufacturing steps can be reduced. Also, throughput of the semiconductor device can be improved, and a manufacturing cost of the semiconductor device can be reduced.

Figure 75:
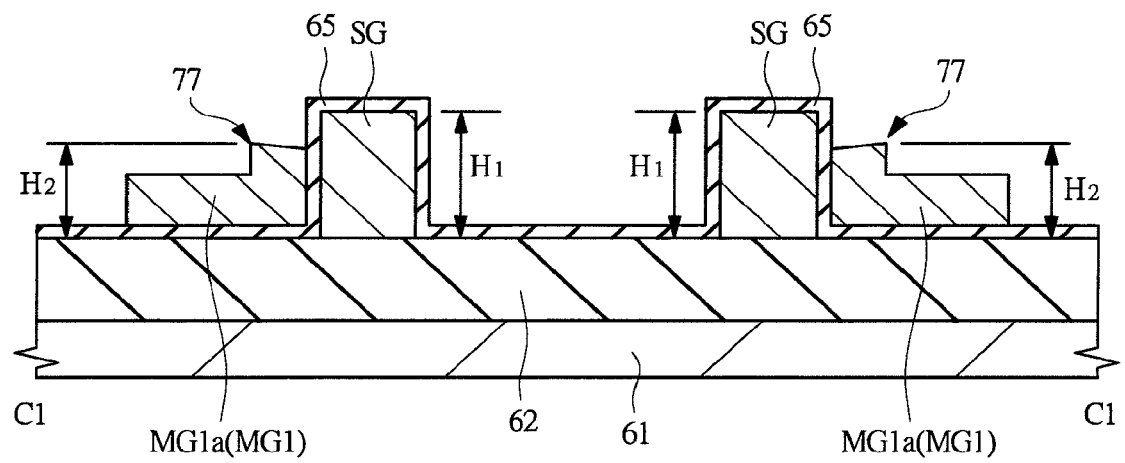
FIG. 75 is a cross-sectional view of a main part (cross-sectional view taken along the line C1-C1) of the semiconductor device during the manufacturing process same as that of FIGS. 73 and 74.

In addition, as illustrated in FIG. 75, in the step S10 described above, when the portion of the contact portion MG1b positioned above the select gate electrode SG is removed by isotropic etching, it is preferable that the contact portion MG1b is isotropically etched (continuously) until the height of the contact portion MG1b does not have a portion positioned higher than a height $H_1$ of the upper surface of the select gate electrode SG. That is, in the step S10, the isotropic etching is preferably performed (continued) until the height of the top portion (uppermost portion) of the contact portion MG1b becomes lower than or equal to the height $H_1$ of the upper surface of the select gate electrode SG. In other words, the isotropic etching in the step S10 is preferably performed until a height $H_2$ to a top portion (uppermost portion) 77 of the contact portion MG1a formed of the remaining contact portion MG1b becomes lower than or equal to the height $H_1$ of the upper surface of the select gate electrode SG (i.e., $H_2 \leq H_1$). In this manner, the height of the contact portion MG1a becomes lower than or equal to the height of the select gate electrode SG, so that the contact portion MG1a does not have a portion positioned higher than the height $H_1$ of the upper surface of the select gate electrode SG. Note that, when the height of the contact portion MG1a (i.e., the height $H_2$ of the top portion 77) formed in the step S10 is lower than or equal to the height of the select gate electrode SG (i.e., the height $H_1$ of the upper surface of the select gate electrode SG), the relationship may be maintained in the manufactured semiconductor device.

Herein, the top portion (uppermost portion) of the contact portions MG1b and MG1a correspond to the highest portion of the contact portions MG1b and MG1a from the main surface of the semiconductor substrate 61 (the upper surface of the device isolation region 62 when the device isolation region 62 is formed). Also, the height $H_2$ of the top portion 77 of the contact portion MG1a corresponds to the height to the top portion 77 of the contact portion MG1a from the main surface of the semiconductor substrate 61 (the upper surface of the device isolation region 62 when the device isolation region 62 is formed). Also, the height $H_1$ of the upper surface of the select gate electrode SG corresponds to the height from the main surface of the semiconductor substrate 61 (the upper to the surface of the device isolation region 62 when the device isolation region 62 is formed) to the upper surface of the select gate electrode SG. The height $H_1$ of the upper surface of the select gate electrode SG can be regarded as the height of the select gate electrode SG. Note that a height from the main surface of the semiconductor substrate 61 corresponds to a height in a perpendicular direction to the main surface of the semiconductor substrate 61. The top portion 77 and the heights $H_1$ and $H_2$ are illustrated in FIG. 75.

That is, while the contact portion MG1a must not run over the select gate electrode SG (i.e., the contact portion MG1a must not have a portion positioned above the select gate electrode), further, the height $H_2$ of the top portion (uppermost portion) 77 of the contact portion MG1a is preferably lower than or equal to the height $H_1$ of the upper surface of the select gate electrode SG (i.e., $H_2 \leq H_1$) A reason of this is as follows.

A height $H_3$ (illustrated in FIG. 74) of the memory gate electrode MG1 in a sidewall shape (i.e., the memory gate electrode MG1 other than the contact portion MG1a) is in the same range or lower than or equal to the height $H_1$ of the upper surface of the select gate electrode SG. Here, the height $H_3$ of the memory gate electrode MG1 in a sidewall shape corresponds to a height from the main surface of the semiconductor substrate 61 (the upper surface of the device isolation region 62 when the device isolation region 62 is formed) to the top portion (uppermost portion) of the memory gate electrode MG1 in a sidewall shape. The top portion (uppermost portion) of the memory gate electrode MG1 in a sidewall shape corresponds to an uppermost portion of a sidewall of the memory gate electrode MG1 in a sidewall shape on the side facing a sidewall of the select gate electrode SG via the insulating film 65.

Therefore, the problems described in relation to the semiconductor device of the comparative example illustrated in FIGS. 88 and 89 are easier to occur as the height $H_2$ of the top portion 77 of the contact portion MG1a is higher than the height $H_1$ of the upper surface of the select gate electrode SG (i.e., $H_2 > H_1$), and as a difference between the heights $H_2$ and $H_1$ is larger. And, when the contact portion MG1a runs over the select gate electrode SG, the difference between the height $H_2$ and the height $H_1$ is the maximum, and the problems described in relation to the semiconductor device of the comparative example illustrated in FIGS. 88 and 89 the most readily occur.

On the contrary, in the present embodiment, in addition to not forming the contact portion MG1a running over the select gate electrode SG, further, the height $H_2$ of the top portion 77 of the contact portion MG1a is formed lower than or equal to the height $H_1$ of the upper surface of the select gate electrode SG (i.e., $H_2 \leq H_1$), so that the contact portion MG1a does not have a portion higher than the height of the upper surface of the select gate electrode SG. In this manner, the problems described in relation to the semiconductor device of the comparative example illustrated in FIGS. 88 and 89 can be more adequately solved.

More specifically, when the height $H_1$ of the select gate electrode is set to be constant, the effect of thinning the insulating film 72 becomes maximum when the height $H_2$ of the top portion 77 of the contact portion MG1a becomes lower than or equal to the height $H_1$ of the upper surface of the select gate electrode SG (i.e., $H_2 \leq H_1$), and the effects brought by thinning the insulating film 72 described above can be enjoyed to the maximum. Also, the effect of thinning the thickness of the photoresist pattern used upon forming the gate electrode of the peripheral circuit forming region becomes maximum when the height $H_2$ of the top portion 77 of the contact portion MG1a becomes lower than or equal to the height $H_1$ of the upper surface of the select gate electrode SG (i.e., $H_2 \leq H_1$), and the effect of miniaturizing the gate electrode in the peripheral circuit forming region can be enjoyed to the maximum.

In addition, since the contact portion MG1a formed by isotropic etching in the step S10 is necessary to be electrically connected to the memory gate electrode MG1 in a sidewall shape adjacent to the contact portion MG1a in the X direction, the contact portion MG1a and the memory gate electrode MG1 (i.e., the memory gate electrode MG1 other than the contact portion MG1a) are necessary to be integrally formed. Meanwhile, the contact portion MG1b before the step of isotropic etching in the step S10 is integrally formed with the memory gate electrode MG1 in a sidewall shape (i.e., the memory gate electrode MG1 other than the memory gate electrode MG1) and the silicon spacer SP1.

Further, the contact portion MG1a is preferable to have a portion adjacent to the select gate electrode SG via the insulating film 65. That is, in the step S10, the isotropic etching is preferably ended (stopped) before the contact portion MG1b loses the portion adjacent to the select gate electrode SG via the insulating film 65 (i.e., before the state of a contact portion MG1d in FIG. 94 described later is obtained). When the contact portion MG1a does not have a portion adjacent to the select gate electrode SG via the insulating film 65, a disconnecting between the contact portion MG1a and the memory gate electrode MG1 adjacent to the contact portion MG1a is feared to occur. On the contrary, when the contact portion MG1a has a portion adjacent to the select gate electrode SG via the insulating film 65, the disconnecting between the contact portion MG1a and the memory gate electrode MG1 adjacent to the contact portion MG1a can be more surely prevented.

Moreover, the photoresist pattern RP3 is required to be formed to satisfy the following conditions.

First, the memory gate electrode MG1 (i.e., the memory gate electrode MG1 other than the contact portion MG1b) in a sidewall shape is covered by the photoresist pattern RP3. This is to prevent a disconnecting occurring when the memory gate electrode MG1 in a sidewall shape is etched by the isotropic etching in the step S10.

Next, while it is preferable not to cover the spacer SP1 by the photoresist pattern RP3, since the etching in the step S10 is isotropic etching, side-etching of the silicon spacer SP1 is possible, and thus a part of the silicon spacer SP1 is allowable to be covered by the photoresist pattern RP3. Note that, when a part of the silicon spacer SP1 is covered by the photoresist pattern RP3, not only a part of the silicon spacer SP1 not covered by the photoresist pattern RP3 but also the part of the silicon spacer SP1 covered by the photoresist pattern RP3 is necessary to be removed by the isotropic etching in the step S10. In view of surely preventing occurrence of a remaining portion of the silicon spacer SP1, it is preferable that the silicon spacer SP1 is not covered by the photoresist pattern RP3.

Next, the contact portion MG1b has a portion covered by a part of the photoresist pattern RP3 and another portion not covered by the photoresist pattern RP3. This is to form the contact portion MG1a by side-etching not only the portion not covered by the photoresist pattern RP3 but also the part covered by the photoresist pattern RP3 of the contact portion MG1b.

To satisfy such conditions, as illustrated in FIGS. 64 to 68, it is preferable to position the edge portion of the photoresist pattern RP3 above the select gate electrode SG. Also, although there is a possibility of a slight misalignment from a designed value of the photoresist pattern RP3 to occur due to a misalignment of the photomask, when the edge portion of the photoresist pattern RP3 is designed to be near the center (center in the Y direction) of the select gate electrode SG as illustrated in FIGS. 64 to 68, the photoresist pattern RP3 can satisfy the above conditions even when the position of the photoresist pattern RP3 is slightly misaligned from the designed value.

Figure 90:
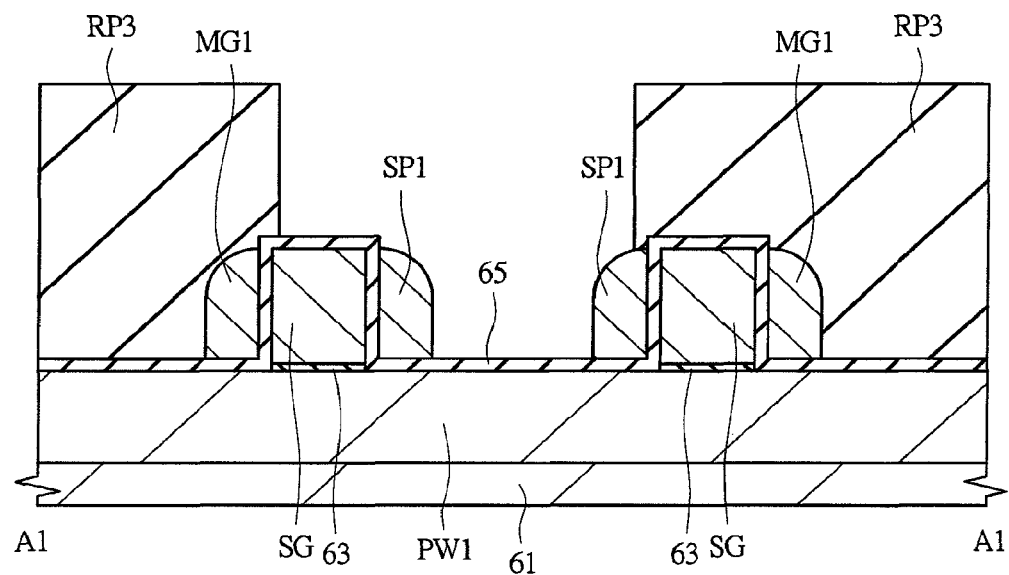
FIG. 90 is an explanatory diagram illustrating a photoresist pattern which is shifted due to a misalignment of a photomask etc. (cross-sectional view taken along the line A1-A1)

FIGS. 90 to 94 are explanatory diagrams illustrating a misalignment of the position of the photoresist pattern RP3 due to a misalignment of a photomask etc. FIG. 90 (cross-sectional view taken along the line A1-A1) corresponds to FIG. 65 described above, FIG. 91 (cross-sectional view taken along the line C1-C1) corresponds to FIG. 66 described above, FIG. 92 (cross-sectional view taken along the line A1-A1) corresponds to FIG. 69 described above, and FIG. 93 (cross-sectional view taken along the line C1-C1) and FIG. 94 (cross-sectional view taken along the line C1-C1) correspond to FIG. 70 described above.

Figure 91:
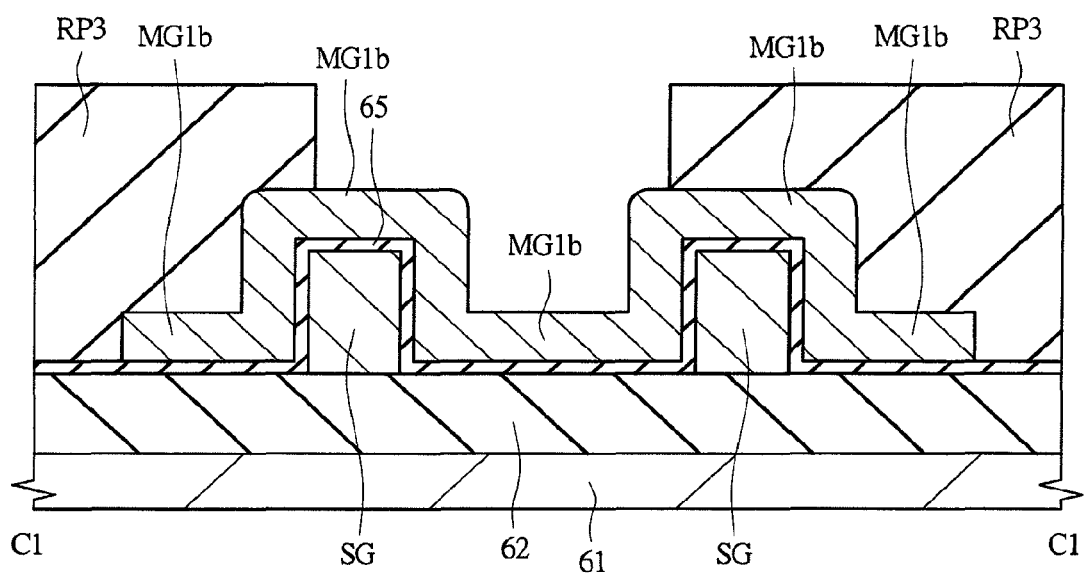
FIG. 91 is an explanatory diagram illustrating the photoresist pattern which is shifted due to a misalignment of a photomask etc. (cross-sectional view taken along the line C1-C1)
Figure 92:
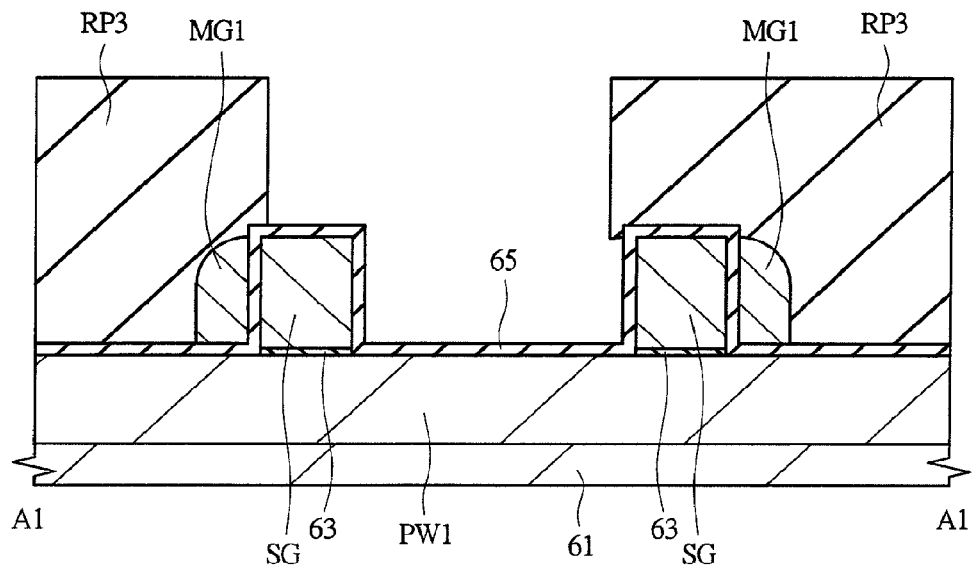
FIG. 92 is an explanatory diagram illustrating the photoresist pattern which is shifted due to a misalignment of a photomask etc. (cross-sectional view taken along the line A1-A1)
Figure 93:
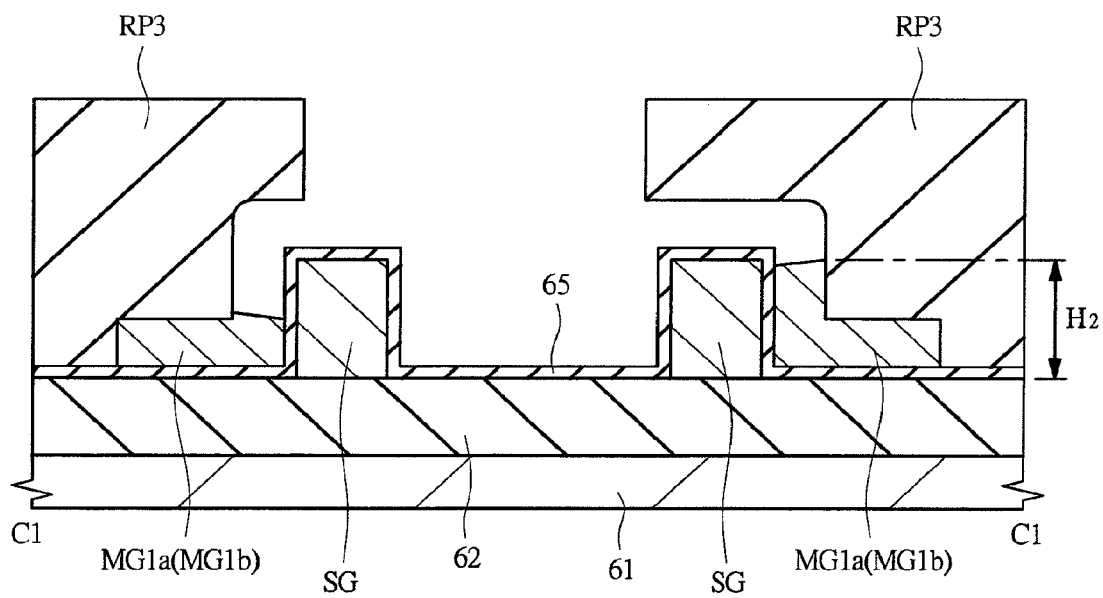
FIG. 93 is an explanatory diagram illustrating the photoresist pattern which is shifted due to a misalignment of a photomask etc. (cross-sectional view taken along the line C1-C1)

In FIGS. 90 and 91, due to a misalignment of a photomask etc., the position of the photoresist pattern RP3 is shifted to the left as compared to that in FIGS. 65 and 66 described above. Also in FIGS. 90 and 91, the photoresist pattern RP3 satisfies the above requirements. Performing an isotropic etching in the step S10 in this state is illustrated in FIGS. 92 and 93. As illustrated in FIG. 92, by the isotropic etching of the step S10, the silicon spacer SP1 is removed, and the memory gate electrode MG1 in a sidewall shape (i.e., memory gate electrode MG1 other than the contact portion MG1b) remains. Also, as illustrated in FIG. 93, the contact portion MG1b becomes the contact portion MG1a as a part of the contact portion MG1b is removed by the isotropic etching of the step S10. Etching conditions (etching time etc.) of the isotropic etching in the step S10 are preferably set as follows.

Figure 94:
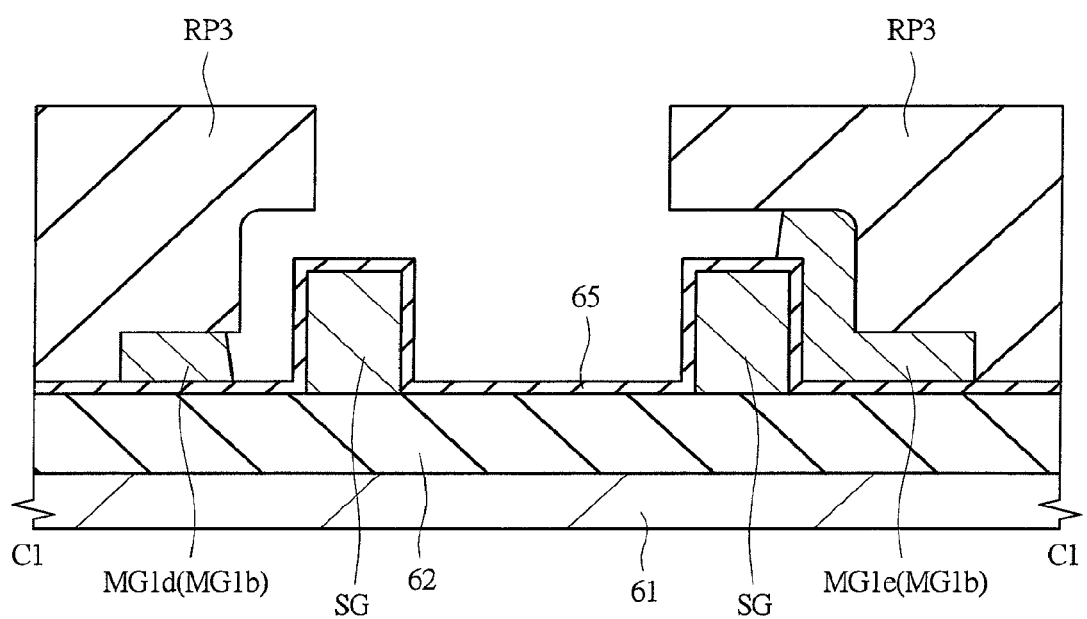
FIG. 94 is an explanatory diagram illustrating the photoresist pattern which is shifted due to a misalignment of a photomask etc. (cross-sectional view taken along the line C1-C1)

While the contact portion MG1d in FIG. 94 corresponds to the contact portion MG1a in FIG. 93, the contact portion MG1d is formed as the contact portion MG1b is excessively etched by the isotropic etching, and thus the contact portion MG1d does not have a portion adjacent to the select gate electrode SG via the insulating film 65. In the situation of the contact portion MG1d in FIG. 94, a disconnecting between the contact portion MG1d and the memory gate electrode MG1 in a sidewall shape adjacent to the contact portion MG1d possibly occurs. Therefore, the etching conditions (etching time etc.) of the isotropic etching in the step S10 are set so that the state of the contact portion MG1d in FIG. 94 is not caused even when the position of the photoresist pattern RP3 is misaligned, and the contact portion MG1a has a portion adjacent to the select gate electrode SG via the insulating film 65 as illustrated in FIG. 93.

Also, while the contact portion MG1e in FIG. 94 corresponds to the contact portion MG1a in FIG. 93, the contact portion MG1e is formed as the contact portion MG1b is insufficiently etched by the isotropic etching, and thus a part of the contact portion MG1e runs over the select gate electrode SG. In the situation of the contact portion MG1e in FIG. 94, the problems described in relation to the semiconductor device of the comparative example illustrated in FIGS. 88 and 89 occur. Therefore, the conditions (etching time etc.) of the isotropic etching in the step S10 are set so that the state of the contact portion MG1e in FIG. 94 is not caused and the contact portion MG1a does not run over the select gate electrode SG as illustrated in FIG. 93 even when the position of the photoresist pattern RP3 is misaligned, and more preferably, so that the height $H_2$ of the top portion 77 of the contact portion MG1a is lower than or equal to the height $H_1$ of the select gate electrode SG (i.e., $H_2 \leq H_1$).

In this manner, by setting the etching conditions of the isotropic etching in the step S10, the effects of the present embodiment can be surely obtained even when the position of the photoresist pattern RP3 is misaligned due to a misalignment of a photomask etc.

Fourth Embodiment

Figure 95:
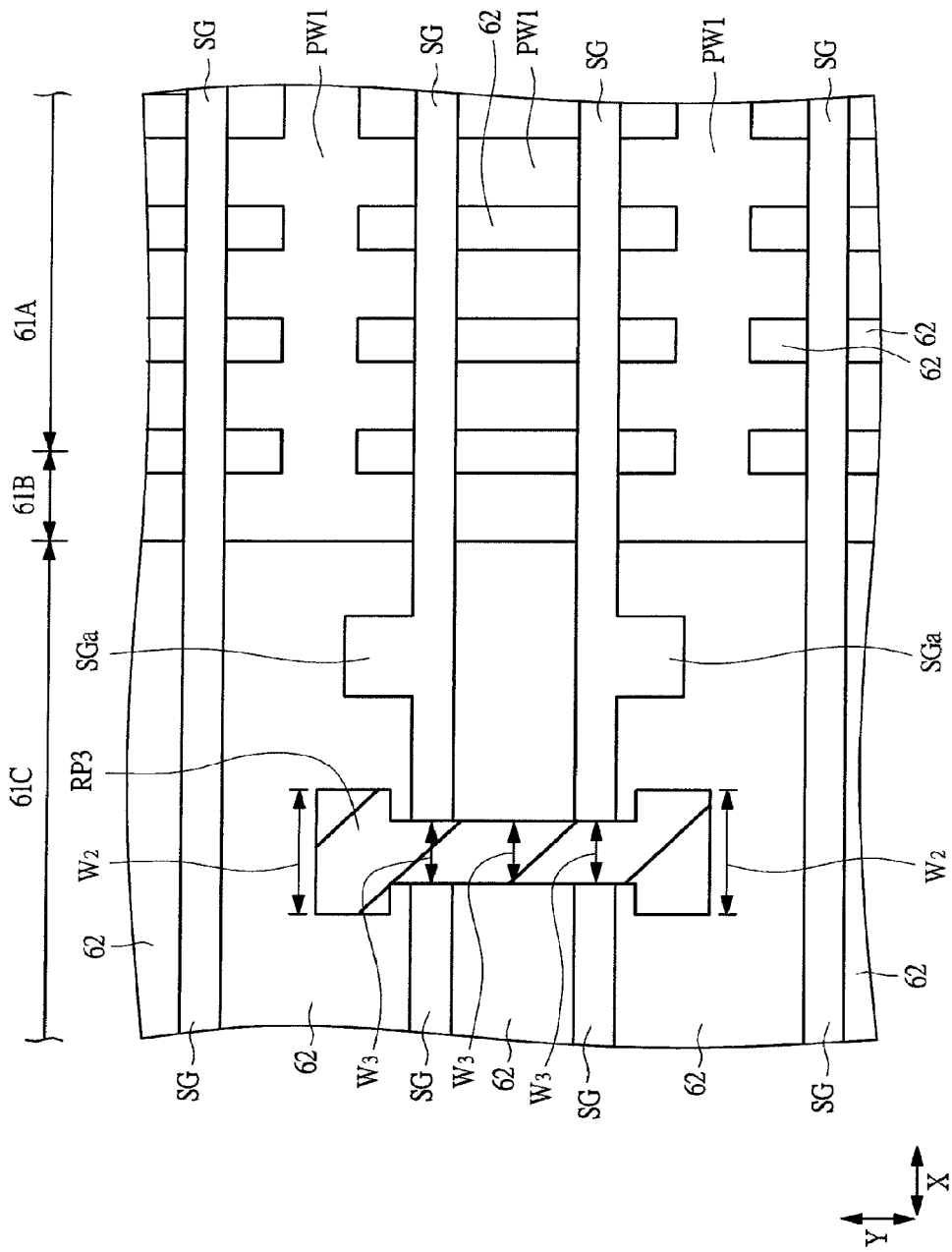
FIG. 95 is a plan view of a main part of a semiconductor device during a manufacturing process according to a fourth embodiment of the present invention.
Figure 96:
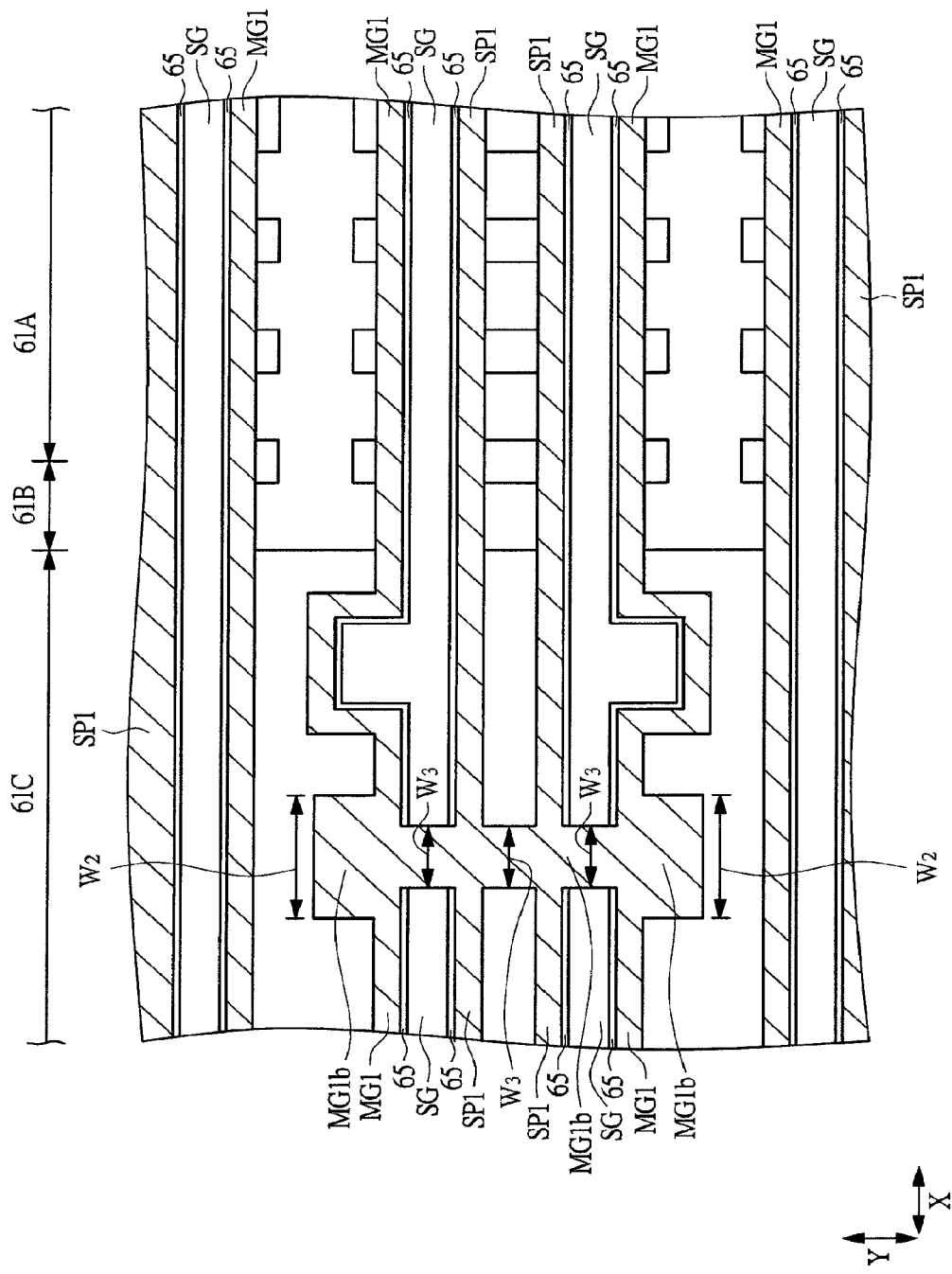
FIG. 96 is a plan view of a main part of the semiconductor device during the manufacturing process continued from FIG. 95.
Figure 97:
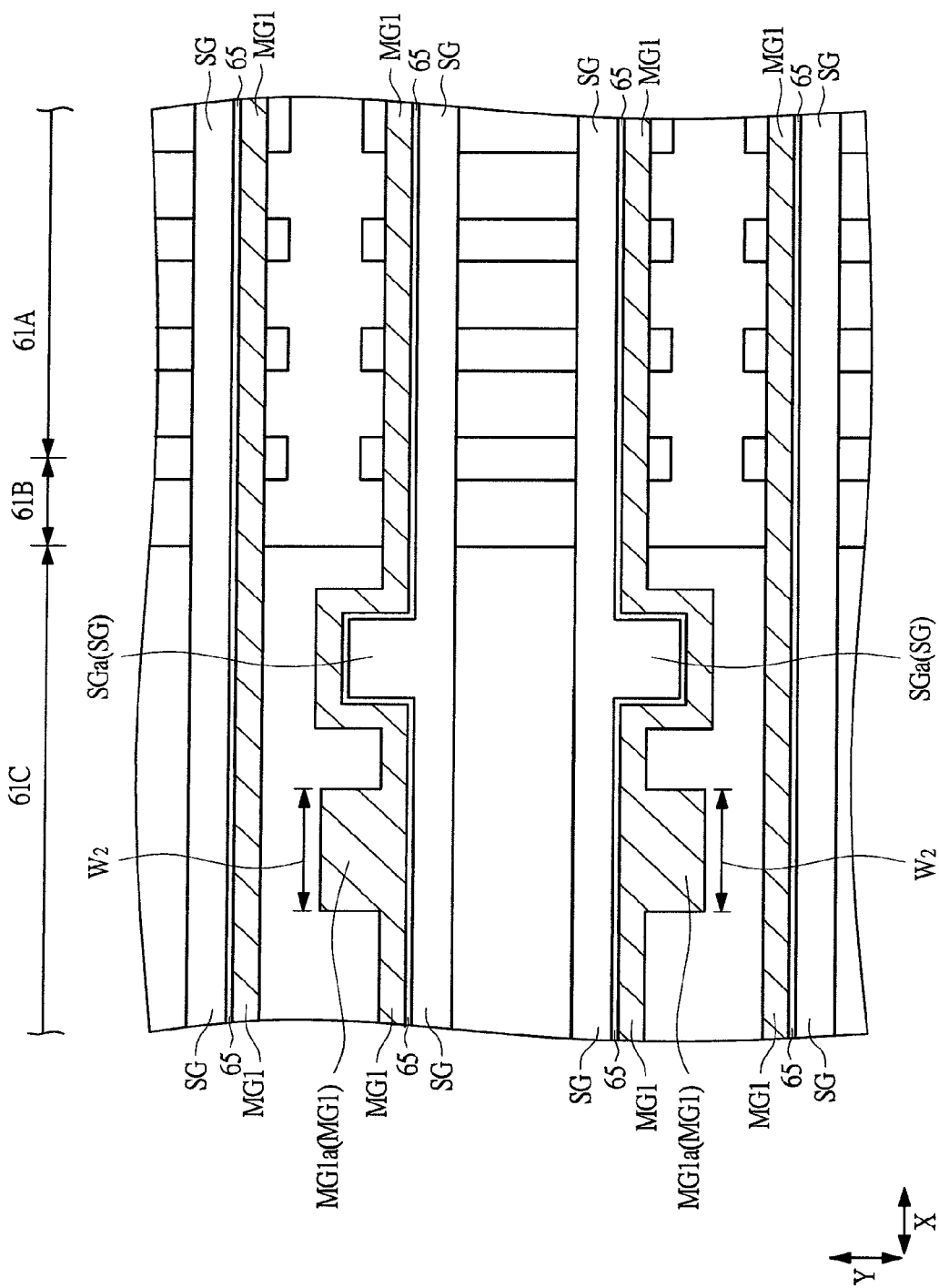
FIG. 97 is a plan view of a main part of the semiconductor device during the manufacturing process continued from FIG. 96.

FIGS. 95 to 97 are plan views of a main part during a manufacturing process of a semiconductor device according to a fourth embodiment. FIG. 95 corresponds to FIG. 58 of the third embodiment described above, FIG. 96 corresponds to FIG. 61 of the third embodiment described above, and FIG. 97 corresponds to FIG. 73 of the third embodiment described above.

The present embodiment is different from the third embodiment described above in the planar shape (pattern shape) of the contact portion MG1b. As described above, the contact portion MG1b is formed by leaving the silicon film 66 under the photoresist pattern RP2 in the etching back (anisotropic etching) step in the step S9 by the whole thickness of the silicon film 66. Thus, as understood from a comparison between FIGS. 58 and 61 and a comparison between FIGS. 95 and 96, the planar shape (pattern shape) of the contact portion MG1b is the same as the planar shape (pattern shape) of the photoresist pattern RP2 used in the etching back (anisotropic etching) step in the step S9. Therefore, the present embodiment is different from the third embodiment also in the planar shape (pattern shape) of the photoresist pattern RP2.

In the third embodiment and the present embodiment, the contact portion MG1b is formed to cross the select gate electrode SG, and extended in a direction (preferably, orthogonal direction; the Y direction here) crossing the extending direction (here, the X direction) of the select gate electrode SG. However, in the third embodiment described above, as illustrated in FIG. 61, the contact portion MG1b is extended in the direction crossing the extending direction of the select gate electrode SG having a same (constant) width $W_1$. Thus, as illustrated in FIG. 73, in the third embodiment, a width of the contact portion MG1a remaining after the step S10 is the same as the width $W_1$.

On the contrary, in the present embodiment, as illustrated in FIG. 96, as compared with a width $W_2$ (i.e., a width $W_2$ of the contact portion MG1a) of a portion of the contact portion MG1b to remain as the contact portion MG1a after the step S10, a width $W_3$ of a portion not covered by the photoresist pattern RP3 and a portion covered by the above-described photoresist pattern RP3 and positioned above the select gate electrode SG is smaller (narrower) (i.e., $W_2 > W_3$). The portion of the contact portion MG1b not covered by the photoresist pattern RP3 (the width $W_3$ of this portion is smaller than the width $W_2$ of the contact portion MG1a) is removed in the step S10, and the portion of the contact portion MG1b covered by the photoresist pattern RP3 and positioned above the select gate electrode SG (the width $W_3$ of this portion is smaller than the width $W_2$ of the contact portion MG1a) is removed by side etching by the isotropic etching in the step S10. Therefore, in the present embodiment, a width of the contact portion MG1a remaining after the step S10 is the same as the width $W_2$. Herein, the widths $W_1$, $W_2$, and $W_3$ correspond to a size (width) of the select gate electrode SG in a direction parallel to the extending direction of the gate electrode SG (here, the X direction).

As described in the third embodiment, when the contact portion MG1b (eventually, the photoresist pattern RP2 for forming the contact portion MG1b) has a constant width $W_1$ and is extended in a direction (here, the Y direction) crossing the extending direction (here, the X direction) of the select gate electrode SG, an allowable amount (margin) to a misalignment of the photoresist pattern RP2 is improved, and processing accuracy of the contact portion MG1b can be improved.

Meanwhile, in the present embodiment, the width $W_2$ of the portion of the contact portion MG1b to remain as the contact portion MG1a after the step S10 is increased so that it becomes easier to form the contact hole CT4 on the contact portion MG1a having the width $W_2$. And, since each width $W_3$ of the portion of the contact portion MG1b not covered by the photoresist pattern RP3 describe above and the portion of the contact portion MG1b covered by the photoresist pattern RP3 and positioned above the select gate electrode SG is smaller (narrower) than the width $W_2$, occurrence of a disconnecting between the contact portion MG1a and the memory gate electrode MG1 in a sidewall shape adjacent to the contact portion MG1a can be more adequately prevented. Reasons of that will be described with reference to FIGS. 98 and 99.

Figure 98:
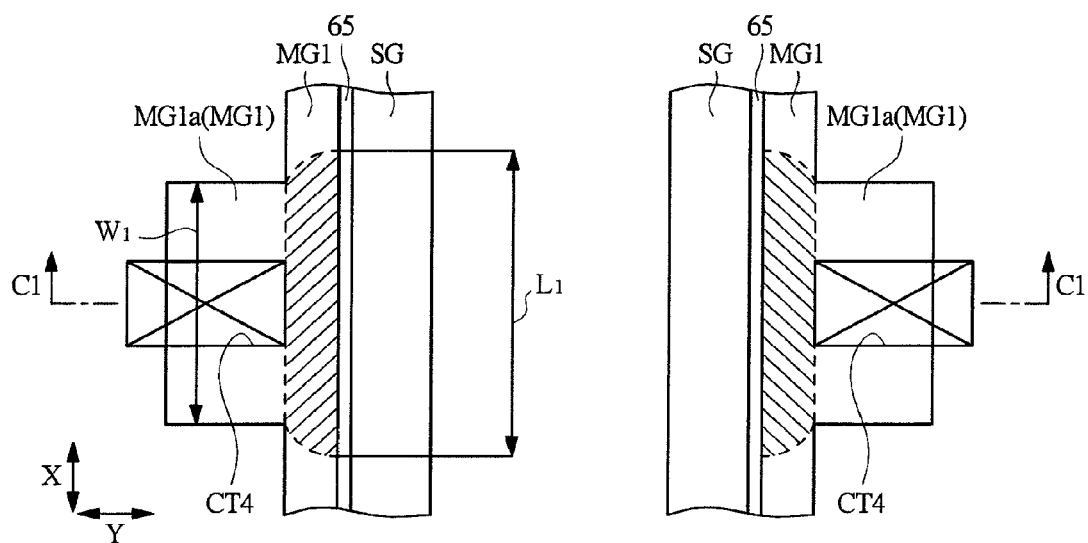
FIG. 98 is an explanatory diagram of a region to be subjected to a side etching by an isotropic etching of a step S10.
Figure 99:
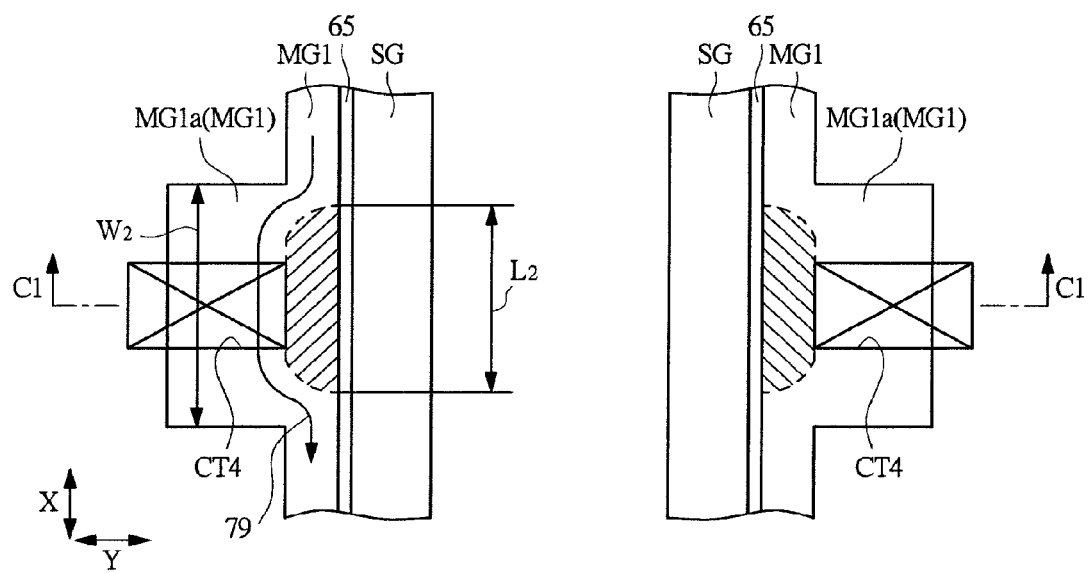
FIG. 99 is an explanatory diagram of the region to be subjected to a side etching by the isotropic etching of the step S10.

FIGS. 98 and 99 are explanatory diagrams of a region to be side-etched by the isotropic etching in the step S10. FIG. 98 corresponds to a situation in which the planar shape (pattern shape) of the contact portion MG1b is the planar shape (pattern shape) of the contact portion MG1b illustrated in FIG. 61 of the third embodiment. FIG. 99 corresponds to a situation in which the planar shape (pattern shape) of the contact portion MG1b is the planar shape (pattern shape) of the contact portion MG1b illustrated in FIG. 96 of the present embodiment. In FIGS. 98 and 99, a vicinity region of the contact portion MG1a is illustrated, in which the select gate electrode SG, memory gate electrode MG1 (including the contact portion MG1a), the insulating film 65 between the select gate electrode SG and the memory gate electrode MG1, and the contact hole CT4 are illustrated, and descriptions of other components are omitted. Also, while FIGS. 98 and 99 are plan views, hatching is added to regions in the memory gate electrodes MG1 (including the contact portion MG1a) in which the side-etching in the step S10 is advanced. Note that both the cross-sectional view taken along the line C1-C1 in FIG. 98 and the cross-sectional view taken along the line C1-C1 in FIG. 99 are substantially the same as FIG. 41.

In the present embodiment, in the contact portion MG1b, as compared with a width $W_2$ (i.e., a width $W_2$ of the contact portion MG1a) of a portion to remain as the contact portion MG1a after the step S10, a width $W_3$ of a portion positioned above the select gate electrode SG is smaller (narrower) (i.e., $W_2 > W_3$). The smaller the width $W_3$ of the portion of the contact portion MG1b positioned above the select gate electrode SG, the smaller sizes $L_1$ and $L_2$ in the X direction (extending direction of the memory gate electrode MG1) of the regions (the regions to which hatching is added in FIGS. 98 and 99) where the side-etching by the isotropic etching in the step S10 advanced in the memory gate electrodes MG1 (including the contact portion MG1a). Therefore, in the present embodiment, the size $L_2$ in the X direction (extending direction of the memory gate electrode MG1) of the regions (the regions to which hatching is added in FIG. 99), where side-etching of the isotropic etching in the step S10 advanced, can be smaller than the width $W_2$ of the contact portion MG1a (i.e., $W_2 > L_2$). Therefore, even if the cross-sectional view taken along the line C1-C1 of the contact portion MG1a in FIG. 99 becomes like the contact portion MG1d in FIG. 94 (the contact portion MG1d does not have a portion adjacent to the select gate electrode SG via the insulating film 65), through a path illustrated by an arrow 79 in FIG. 99, the contact portion MG1a and the memory gate electrode MG1 in a sidewall shape adjacent to the contact portion MG1a are integrally connected, and thus they are electrically connected. Thus, in the present embodiment, a disconnecting occurring between the contact portion MG1a and the memory gate electrode MG1 in a sidewall shape adjacent to the contact portion MG1a when a misalignment of the photoresist pattern RP3 occurs can be more adequately prevented.

Meanwhile, in the third embodiment, etching conditions of the isotropic etching of the step S10 are set so that the cross section taken along the line C1-C1 of the contact portion MG1a in FIG. 99 is not like the contact portion MG1d in FIG. 94 described above, that is, so that the cross section of the contact portion MG1a of FIG. 99 is like the contact portion MG1a in FIG. 70 or FIG. 93 described above (the contact portion MG1a includes a portion adjacent to the select gate electrode SG via the insulating film 65). In this manner, occurrence of a disconnecting between the contact portion MG1a and the memory gate electrode MG1 in a sidewall shape adjacent to the contact portion MG1a can be more adequately prevented.

Fifth Embodiment

Figure 100:
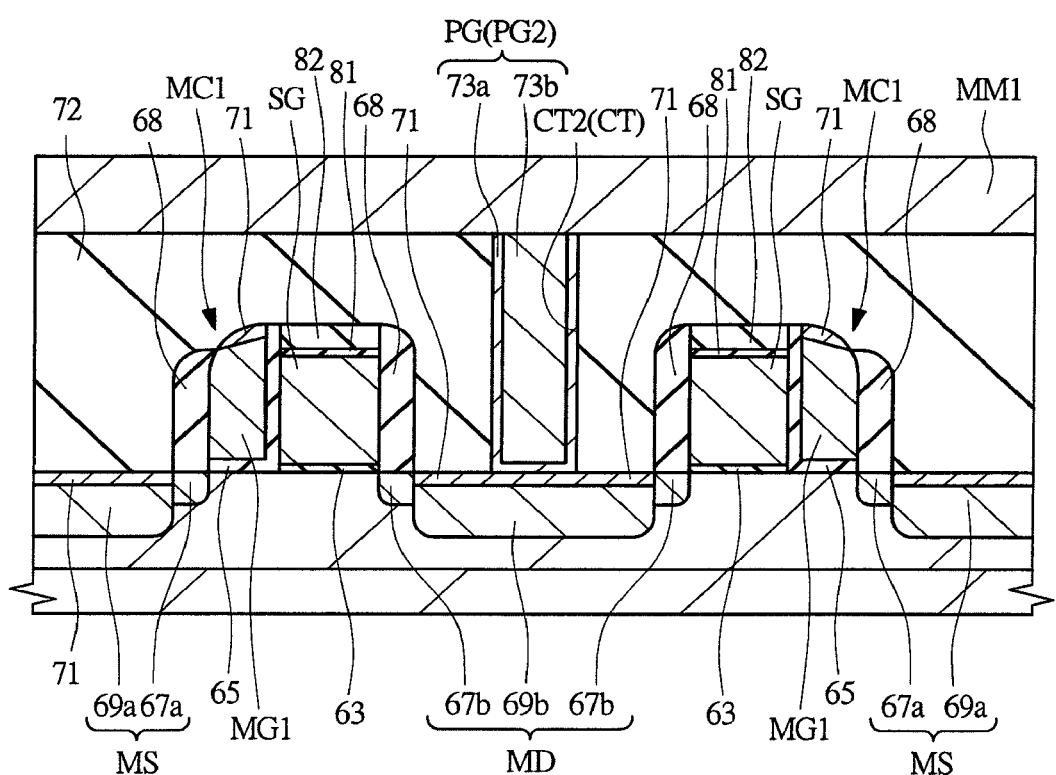
FIG. 100 is a cross-sectional view of a main part of a semiconductor device according to a fifth embodiment of the present invention.

FIG. 100 is a cross-sectional view of a main part of a semiconductor device according to a fifth embodiment, and corresponds to FIG. 39 of the third embodiment described above. In FIG. 100, in the same manner as FIG. 39 of the third embodiment described above, across section of the memory cell region 61A (cross section at the position corresponding to the line A1-A1 described above) is illustrated.

In the third embodiment, the metal silicide layer 71 has been formed to the upper portion of the select gate electrode SG and the upper portion of the memory gate electrode MG1. Meanwhile, in the present embodiment, while the metal silicide 71 is formed to the upper portion of the memory gate electrode MG1 as illustrated in FIG. 100, the metal silicide layer 71 is not formed to the upper portion of the select gate electrode SG other than the contact portion SGa.

More specifically, in the present embodiment, as illustrated in FIG. 100, an insulating film 81 and an insulating film 82 having a substantially the same planar shape (pattern shape) as that of the select gate electrode SG are formed on the select gate electrode SG. That is, the select gate electrode SG is formed as a stacked-film pattern of the select gate electrode SG, the insulating film 81, and the insulating film 82 on the select gate electrode SG, and extended on the semiconductor substrate 61. The insulating film 82 is formed of, for example, a silicon nitride film as an insulating film, and the insulating film 81 is formed of, for example, a silicon oxide film as an insulating film. The insulating film 82 is formed on the insulating film 81, and formed to be thicker than the insulating film 81. Therefore, the insulating film 81 and the insulating film 82 have a stacked structure (stacked-layer film, stacked-layer insulating film) of the insulating film 81 which is thin and at a bottom layer side and the insulating film 82 which is thicker than the insulating film 81 and at a top layer side. As the insulating films 81 and 82 are formed on the select gate electrode SG, the metal silicide layer 71 will not be formed on the select gate electrode SG in a salicide process (forming process of the metal silicide layer 71).

Also, in the third embodiment, the memory gate electrode MG1 has been formed on one sidewall of the select gate electrode SG via the insulating film 65 and the sidewall insulating film 68 has been formed on the other sidewall. Meanwhile, in the present embodiment, since the insulating film 81 and the insulating film 82 are formed on the select gate electrode SG, the memory gate electrode MG1 is formed on one sidewall of the stacked pattern (stacked-film pattern) formed of the select gate electrode SG, insulating film 81, and insulating film 82 via the insulating film 65, and the sidewall 68 is formed on the other sidewall. That is, while the select gate electrode SG and the memory gate electrode MG1 have been formed to be adjacent to each other via the insulating film 65 in the third embodiment, the stacked pattern (stacked-film pattern) formed of the select gate electrode SG, insulating film 81, and insulating film 82 and the memory gate electrode MG1 are formed to be adjacent to each other via the insulating film 65.

Since other configurations of the memory cell MC in the present embodiment are substantially the same as that of the third embodiment described above, descriptions thereof will be omitted.

In the present embodiment, as the insulating film 81 and the insulating film 82 are provided on the select gate electrode SG, the metal silicide layer 71 is formed to the upper portion of the memory gate electrode MG1 but not formed to the upper portion of the select gate electrode SG. Thus, the metal silicide layer 71 on the memory gate electrode MG1 will not be adjacent to the select gate electrode SG interposing the thin insulating film 65, occurrence of a short-circuiting failure between the select gate electrode SG and the memory gate electrode MG1 can be more adequately prevented. Meanwhile, in the third embodiment described above, as the metal silicide layer 71 has been formed to the upper portion of the memory gate electrode MG1 and the upper portion of the select gate SG, a resistance of the select gate electrode SG can be reduced, and thus an operation speed of the non-volatile memory can be further improved.

Figure 101:
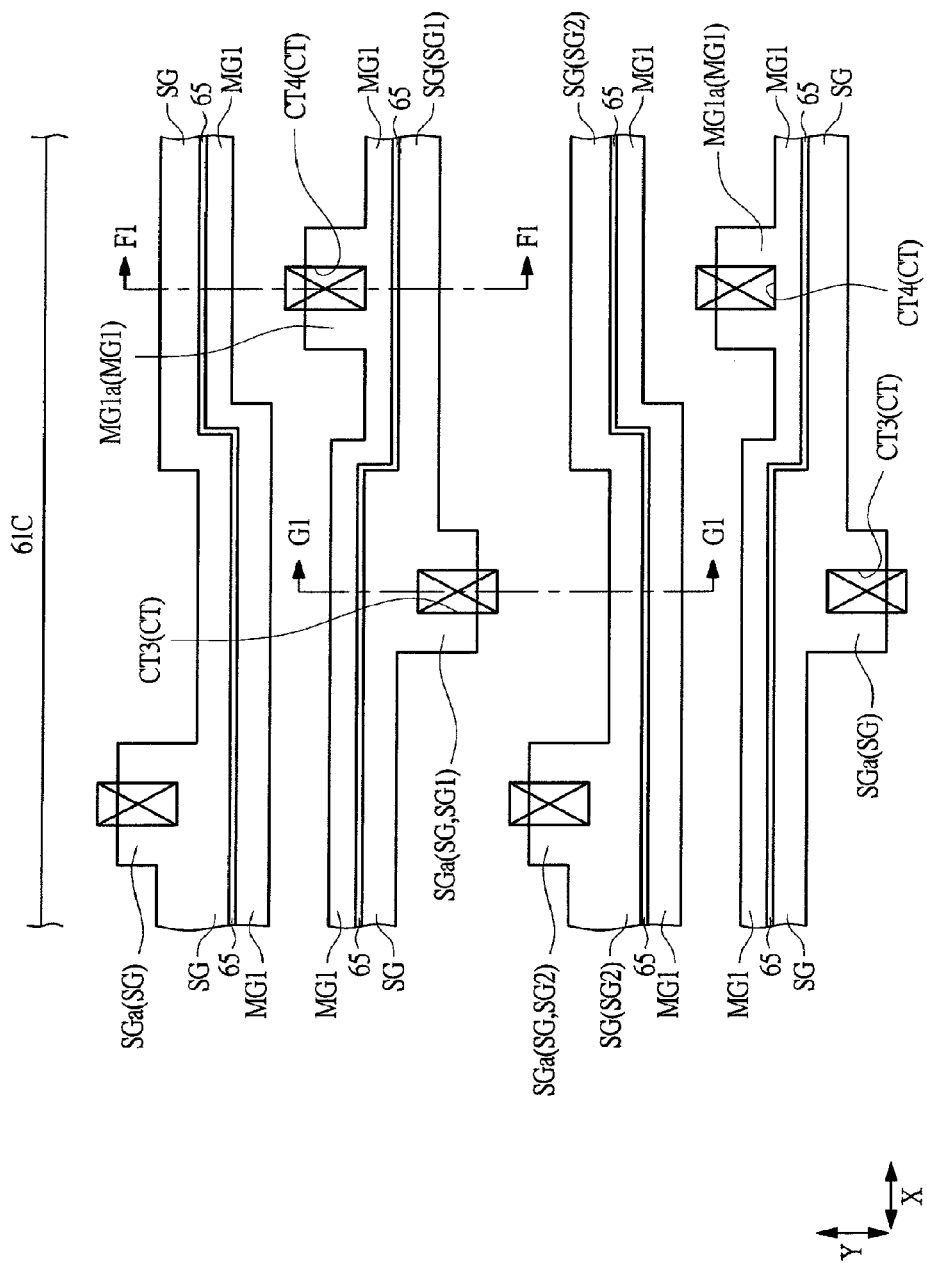
FIG. 101 is a plan view of a main part of the semiconductor device according to the fifth embodiment of the present invention.
Figure 102:
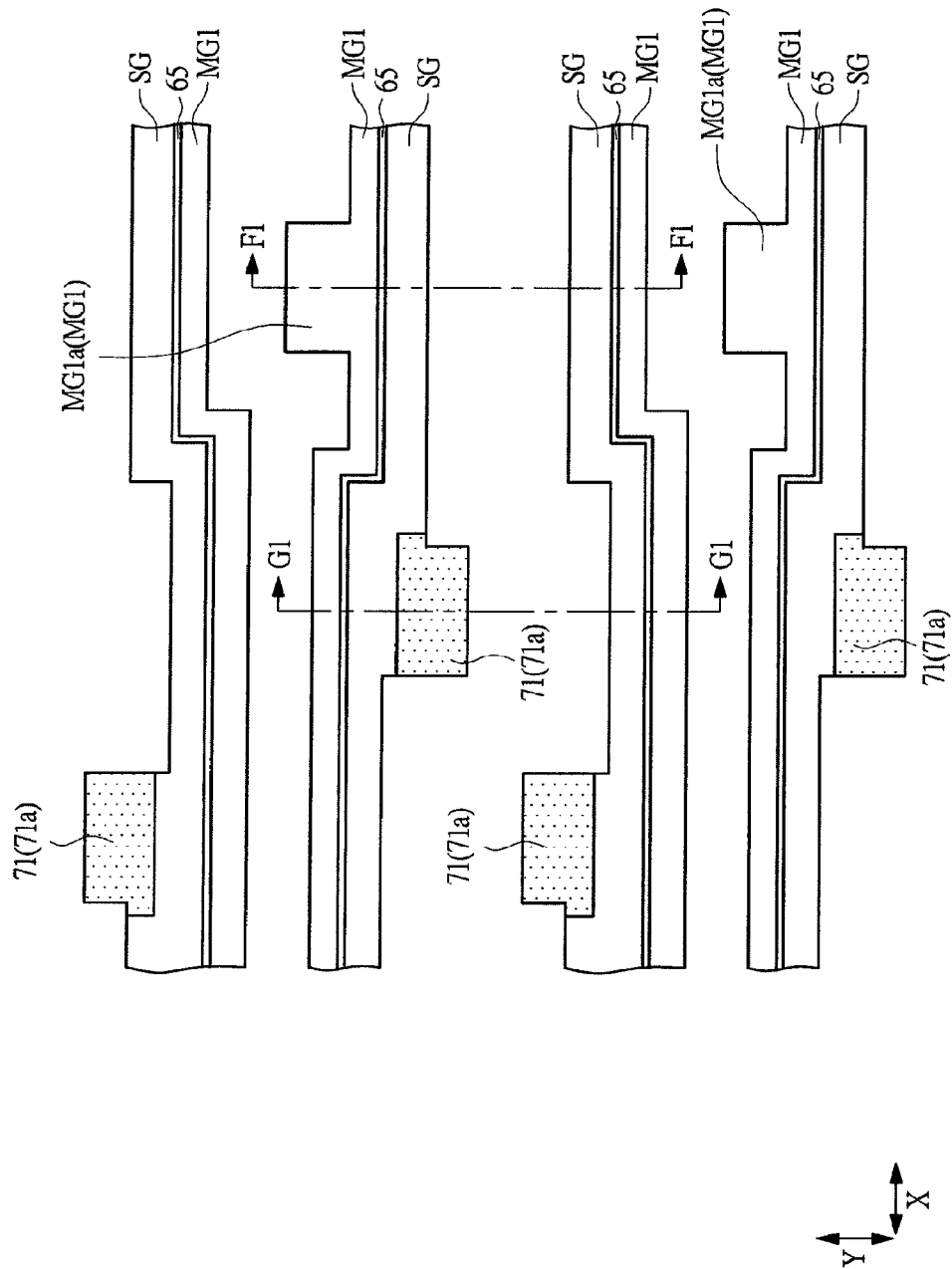
FIG. 102 is a plan view of a main part of the semiconductor device according to the fifth embodiment of the present invention.
Figure 103:
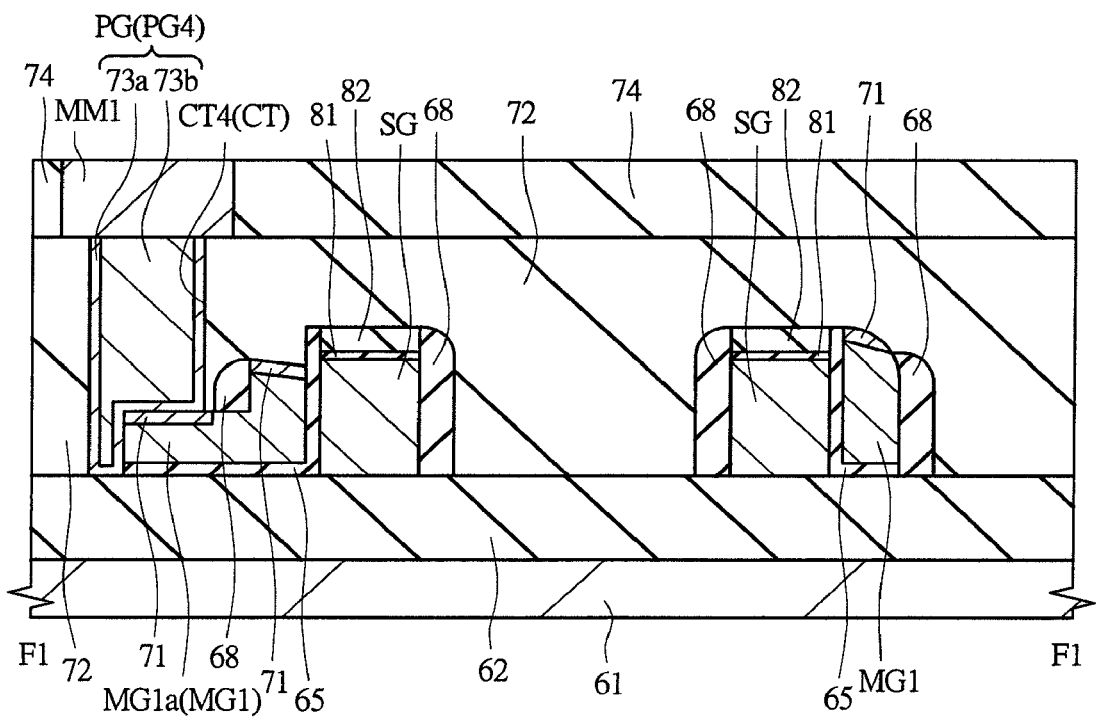
FIG. 103 is a cross-sectional view of a main part (cross-sectional view taken along the line F1-F1) of the semiconductor device according to the fifth embodiment of the present invention.
Figure 104:
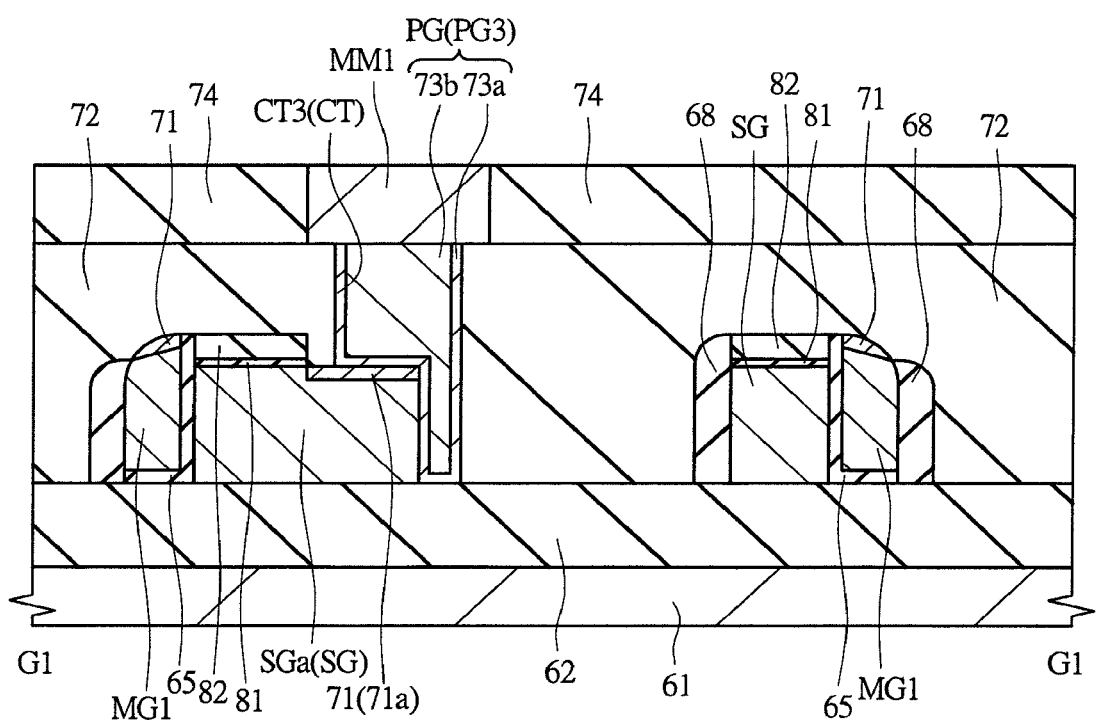
FIG. 104 is a cross-sectional view of a main part (cross-sectional view taken along the line G1-G1) of the semiconductor device according to the fifth embodiment of the present invention.

FIGS. 101 and 102 are plan views of a main part of the semiconductor device according to the present embodiment, and they illustrate the word shunt region 61C. In FIG. 102, the illustration of contact holes CT is eliminated from FIG. 101 and the regions where the metal silicide layers 71 are formed are emphasized by dots among the upper surfaces of the select gate electrode SG. Note that, while the metal silicide layers 71 are also formed on the memory gate electrodes MG1, in FIG. 102, the metal silicide layers 71 on the memory gate electrodes MG1 are not emphasized by dots. FIGS. 103 and 104 are cross-sectional views of a main part of the semiconductor device according to the present embodiment, where a cross-sectional view taken along the line F1-F1 in FIGS. 101 and 102 corresponds to FIG. 103, and a cross-sectional view taken along the line G1-G1 in FIGS. 101 and 102 corresponds to FIG. 104. Note that, FIG. 100 described above is a cross-sectional view of the memory cell region 61A, and the memory cell region 61A and the source-dummy region 61B are not illustrated in the plan views of FIGS. 101 and 102.

Also in the present embodiment, the layout of the word shunt region 61C can be designed to be the same as the third embodiment (FIG. 37 described above) described above. Meanwhile, in the present embodiment in which the insulating film 81 and the insulating film 82 are formed to the upper portion of the select gate electrode SG to prevent formation of the metal silicide layer 71, it is more preferable to make the layout of the word shunt region 61C like that in FIGS. 101 and 102. In the following, mainly, differences between the layout of the word shunt region 61C according to the present embodiment (i.e., the layout in FIG. 101) and the layout of the word shunt region 61C according to the third embodiment (i.e., the layout in FIG. 37) will be described.

In the word shunt region 61C, the contact portion SGa of the select gate electrode SG is extended in a direction (preferably, an orthogonal direction; the Y direction here) crossing the extending direction (here, the X direction) of the select gate electrode SG. As the contact portion SGa is extended in the direction crossing (preferably, orthogonal to) the extending direction of the select gate electrode SG, the width of the select gate electrode SG (width in the direction orthogonal to the extending direction of the select gate electrode SG) is wide in the region in which the contact portions SGa are arranged as compared with the region in which the contact portion SGa are not arranged. In this manner, the contact holes CT3 and the plugs PG3 filling the contact holes CT3 can be adequately formed on the contact portions SGa of the select gate electrodes SG. This point is common between the third embodiment and the present embodiment.

Meanwhile, as understood from a comparison between FIG. 37 and FIG. 101, regarding the select gate electrode SG, the extending directions of the contact portion SGa are opposite (reversed) in the third embodiment and the present embodiment.

More specifically, in the third embodiment, as illustrated in FIG. 37, the contact portion MG1a of the memory gate electrode MG1 has been extended in a direction to be away from the select gate electrode SG being adjacent via the insulating film 65, and the contact portion SGa of the select gate electrode SG has been extended toward the memory gate electrode MG1 being adjacent via the insulating film 65. Therefore, in the third embodiment, regarding the memory gate electrode MG and the select gate electrode SG adjacent to each other via the insulating film 65, the direction in which the contact portion SGa has been extended from the select gate electrode SG is the same as the direction in which the contact portion MG1a has been extended from the memory gate electrode MG1. That is, when viewed in a plane (i.e., in a plane parallel to the main surface of the semiconductor substrate 61), in the third embodiment, as illustrated in FIG. 37, the direction in which the contact portion SGa protrudes (bulges) from the select gate electrode SG has been the same as the direction in which the contact portion MG1a protrudes (bulges) from the memory gate electrode MG1 in the memory gate electrode MG1 and the select gate electrode SG adjacent to each other via the insulating film 65.

On the contrary, in the present embodiment, as illustrated in FIG. 101, the contact portion MG1a of the memory gate electrode MG1 is extended in the direction to be away from the select gate electrode SG being adjacent via the insulating film 65, and meanwhile, the contact portion SGa of the select gate electrode SG is extended in the direction to be away from the memory gate electrode MG1 being adjacent via the insulating film 65. From another point of view, in the present embodiment, as illustrated in FIG. 101, the contact portion SGa of the select gate electrode SG (for example, one of the select gate electrodes SG1 and SG2 in FIG. 101) is extended in a direction to be close to another select gate electrode SG (for example, the other one of the select gate electrodes SG1 and SG2) being adjacent via a drain region (corresponding to the drain semiconductor region MD described above). Therefore, in the present embodiment, regarding the memory gate electrode MG1 and the select gate electrode SG adjacent to each other via the insulating film 65, the direction in which the contact portion SGa is extended from the select gate electrode SG is opposite (reversed) to the direction in which the contact portion MG1a is extended from the memory gate electrode MG1. More specifically, when viewed in a plane (i.e., a plane parallel to the main surface of the semiconductor substrate 61), in the present embodiment, as illustrated in FIG. 101, the direction in which the contact portion SGa protrudes (bulges) from the select gate electrode SG is opposite (reversed) to the direction in which the contact portion MG1a protrudes (bulges) from the memory gate electrode MG1 in the memory gate electrode MG1 and the select gate electrode SG adjacent to each other via the insulating film 65.

Also, while a plurality of the select gate electrodes SG extended in the X directions are arranged next to each other at the main surface of the semiconductor substrate 61, in the select gate electrodes SG (the select gate electrode SG1 and the select gate electrode SG2 when FIG. 101 is applied) being adjacent to each other via the drain region (corresponding to the drain semiconductor region MD described above), the contact portions SGa are arranged to be shifted in the extending direction of the select gate electrodes SG (here, the X direction). More specifically, as illustrated in FIG. 101, the arranged position of the contact portion SGa of the select gate electrode SG1 and the arranged position of the contact portion SGa of the other select gate electrode SG2 being adjacent to the select gate electrode SG1 via the drain region (corresponding to the drain semiconductor region MD described above) are arranged to be misaligned in the extending direction (here, the X direction) of the select gate electrodes SG1 and SG2. In other words, a plurality of the select gate electrode SG and a plurality of the memory gate electrode MG1 are extended on the semiconductor substrate 61, and the select gate electrodes SG (when FIG. 101 is applied, the select gate electrode SG1 and the select gate electrode SG2) being adjacent to each other in the direction (here, the Y direction) crossing the extending direction of the select gate electrode SG (here, the X direction) without interposing the memory gate electrode MG1 have forming positions of the contact portions SGa misaligned in the extending direction of the select gate electrode SG (here, the X direction). Note that, when a plurality of the select gate electrodes SG and a plurality of the memory gate electrodes MG1 are extended on the semiconductor substrate 61, the select gate electrodes SG adjacent to each other via the drain region (corresponding to the drain semiconductor region MD described above) are the same as the select gate electrodes SG adjacent to each other in the direction (here, the Y direction) crossing the extending direction of the select gate electrode SG (here, the X direction) without interposing the memory gate electrode MG1.

The contact portion SGa of the select gate electrode SG1 is extended in a direction from the select gate electrode SG1 to be closer to the select gate electrode SG2, and the contact portion MG1a of the select gate electrode SG2 is extended from the select gate electrode SG2 in a direction to be closer to the select gate electrode SG1. Thus, as illustrated in FIG. 101, as the arranged position of the contact portion SGa of the select gate electrode SG1 and the arranged position of the contact portion SGa of the select gate electrode SG2 are misaligned in the extending direction of the select gate electrodes SG1 and SG2 (here, the X direction), a short-circuiting between the contact portion SGa of the select gate electrode SG1 and the contact portion SGa of the select gate electrode SG2 occurring when the contact portions SGa are adjacent can be adequately prevented.

In addition, in the present embodiment, as illustrated in FIGS. 102 to 104, the insulating films 81 and 82 are formed on the select gate electrode SG also in the word shunt region 61C (i.e., also on the device isolation region 62), and thus the metal silicide layer 71 is not formed to the upper portion of the select gate electrode SG. Meanwhile, this is about the select gate electrode SG other than the contact portion SGa, and thus the metal silicide layer 71 is partially formed to the upper portion of the contact portion SGa. Hereinafter, the metal silicide layer 71 formed to the upper portion of the contact portion SGa of the metal silicide layers 71 will be called a metal silicide layer 71a.

In the present embodiment, the other region than the contact portion contact portion SGa of the select gate electrode SG is covered by the insulating films 81 and 82, so that the metal silicide layer 71 is not formed on the select gate electrode SG. Meanwhile, the contact portion SGa in the select gate electrode SG has at least a portion not covered by the insulating films 81 and 82, and the metal silicide film 71a is formed in a region at an upper surface of the contact portion SGa not covered by the insulating films 81 and 82. That is, at least a part of the upper surface of the contact portion SGa is not covered by the insulating films 81 and 82 and the metal silicide layer 71a is formed to the part, and the metal silicide layer 71 is not formed to a part of the upper surface of the select gate electrode SG covered by the insulating films 81 and 82.

And, the contact hole CT3 is formed to the insulating film (interlayer insulating film) 72 on the contact portion SGa of the select gate electrode SG, and the plug (conductor portion) PG3 buried in the contact hole CT3 and the contact portion SGa of the select gate electrode SG are electrically connected. Thus, the metal silicide layer 71a formed to the upper portion of the contact portion SGa of the select gate electrode SG is exposed from the contact hole CT3, and contacted with the plug PG3. In the present embodiment, as the metal silicide layer 71 is not formed to the select gate electrode SG other than the contact portion SGa, occurrence of a short-circuiting failure between the select gate electrode SG and the memory gate electrode MG1 can be adequately prevented, and also, as the metal silicide layer 71 (i.e., the metal silicide layer 71a) is locally formed to the upper portion of the contact portion SGa, a contact resistance of the plug PG3 and the select gate electrode SG can be reduced.

Further, as illustrated in FIGS. 102 and 104, the metal silicide layer 71a formed to the upper portion of the contact portion SGa of the select gate electrode SG is not adjacent (not adjacent via the insulating film 65) to the memory gate electrode MG1, and is separated from the memory gate electrode MG1 by a distance longer than the thickness of the insulating film 65. That is, in the region in which the contact portion SGa is arranged, the upper surface of the select gate electrode SG is covered by the insulating films 81 and 82 in a vicinity of an edge portion of the select gate electrode SG on the side adjacent to the memory gate electrode MG1 via the insulating film 65 (i.e., the metal silicide layer 71 is not formed). Therefore, when viewed in a plane, as illustrated in FIG. 102, the region in which the metal silicide layer 71a is formed at the upper surface of the contact portion SGa of the select gate electrode SG is separated from the memory gate electrode MG1 interposing the region covered by the insulating films 81 and 82 at the upper surface of the select gate electrode SG (the region in which the metal silicide layer 71 is not formed). Therefore, in the upper surface of the select gate electrode SG, the region in the vicinity of the edge portion on the side adjacent to the memory gate electrode MG1 via the insulating film 65 is covered by the insulating films 81 and 82, regardless of whether the contact portion SGa is arranged in the region or not. And, in the upper surface of the select gate electrode SG, between the region in which the metal silicide layer 71 (here, the metal silicide layer 71a) is formed and the edge portion on the side adjacent to the memory gate electrode MG1, the region covered by the insulating films 81 and 82 is interposed. In this manner, the metal silicide layer 71a formed to the upper portion of the contact portion SGa of the select gate electrode SG will not be adjacent to the memory gate electrode MG1 (the metal silicide layer 71 above) interposing the thin insulating film 65, and thus occurrence of a short-circuiting failure between the select gate electrode SG and the memory gate electrode MG1 can be further adequately prevented.

Other configurations of the semiconductor device according to the present embodiment are substantially the same as the third embodiment, and thus descriptions thereof will be omitted.

Next, a manufacturing process of the semiconductor device according to the present embodiment will be described. FIGS. 105 to 126 are cross-sectional views of a main part or plan views of a main part during the manufacturing process of the semiconductor device according to the present embodiment. Among FIGS. 105 to 126, FIGS. 105, 107 to 109, 112, 113, 115, 116, 118 to 121, and 123 to 126 are cross-sectional views of a main part, and FIGS. 106, 110, 111, 114, 117, and 122 are plan views of a main part.

As the manufacturing method of the semiconductor device according to the present embodiment is basically the same as that of the third embodiment described above, differences from the above-described third embodiment will be mainly described. Some parts of the process not particularly mentioned can be performed in the same manner as those of the manufacturing method of the third embodiment.

Figure 105:
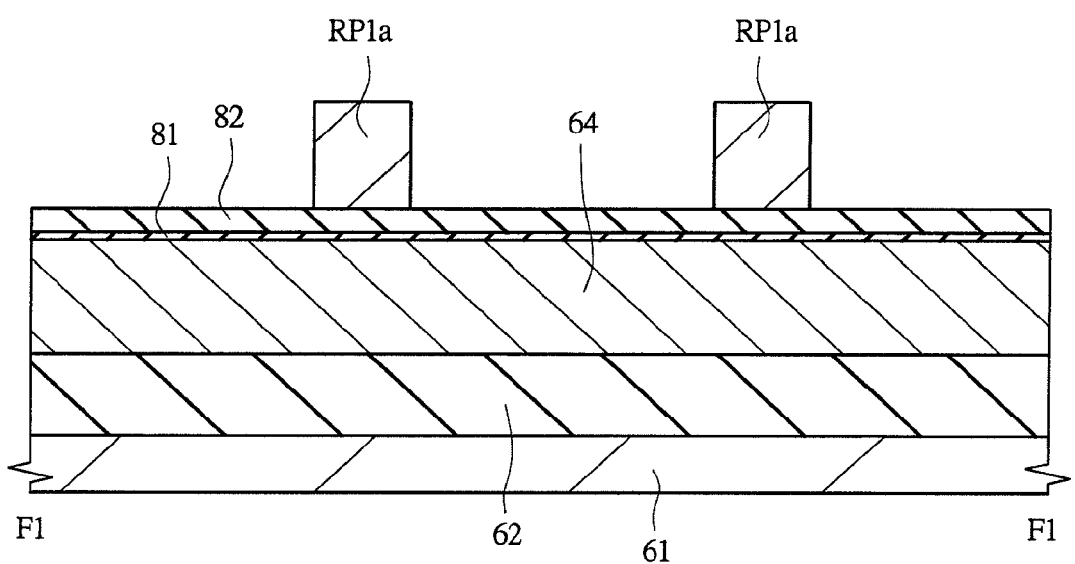
FIG. 105 is a cross-sectional view of a main part (cross-sectional view taken along the line F1-F1) of the semiconductor device during a manufacturing process according to the fifth embodiment of the present invention.

In the present embodiment, after performing the step of forming the silicon film 64 in the step S5 described above in the same manner as the third embodiment, and before performing the patterning step of the step S6 described above, the insulating films 81 and 82 are sequentially formed on the silicon film 64 as illustrated in FIG. 105 (cross-sectional view taken along the line F1-F1). The insulating film 81 is formed of, for example, a silicon oxide film, and the insulating film 82 is formed of, for example, a silicon nitride film, and each of the insulating films 81 and 82 can be formed to the entire of the upper surface of the silicon film 64. At this moment, the insulating film 81 is formed on the silicon film 64, and the insulating film 82 is formed on the insulating film 81. The insulating films 81 and 82 can be formed by, for example, a CVD method. The insulating film 82 is formed to be thicker than the insulating film 81.

Next, on the insulating film 82, a photoresist pattern (resist pattern) RP1a is formed using photolithography technology. The photoresist pattern RP1a corresponds to the photoresist pattern RP1 in the third embodiment described above, and has a pattern corresponding to the select gate electrodes SG to be formed.

Figure 106:
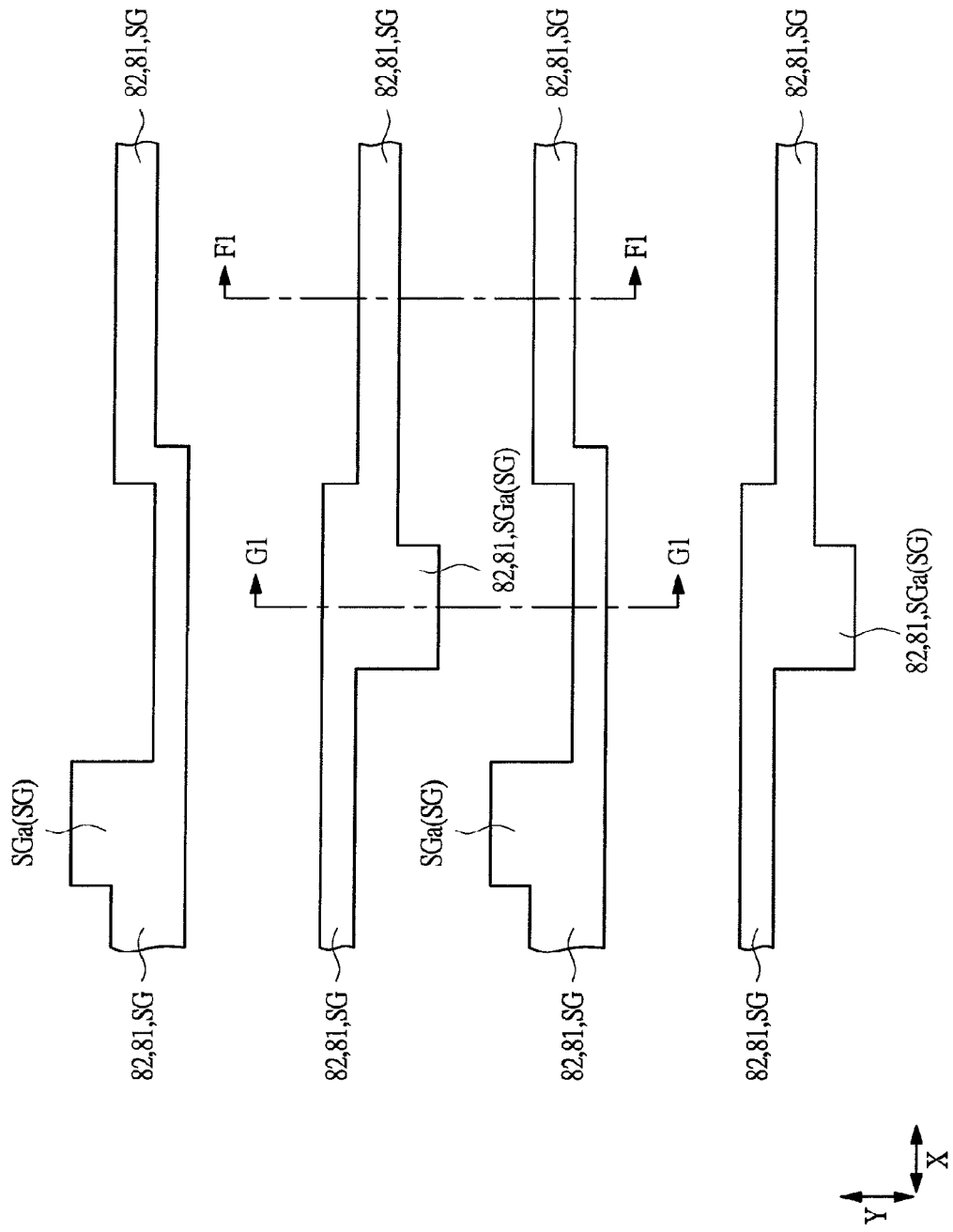
FIG. 106 is a plan view of a main part of the semiconductor device during the manufacturing process continued from FIG. 105.
Figure 107:
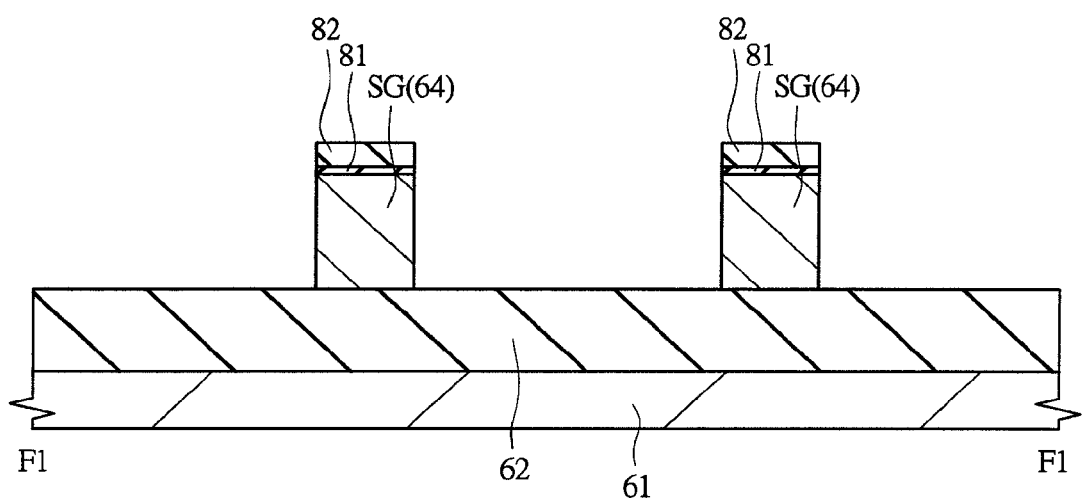
FIG. 107 is a cross-sectional view of a main part (cross-sectional view taken along the line F1-F1) of the semiconductor device during the manufacturing process same as that of FIG. 106.
Figure 108:
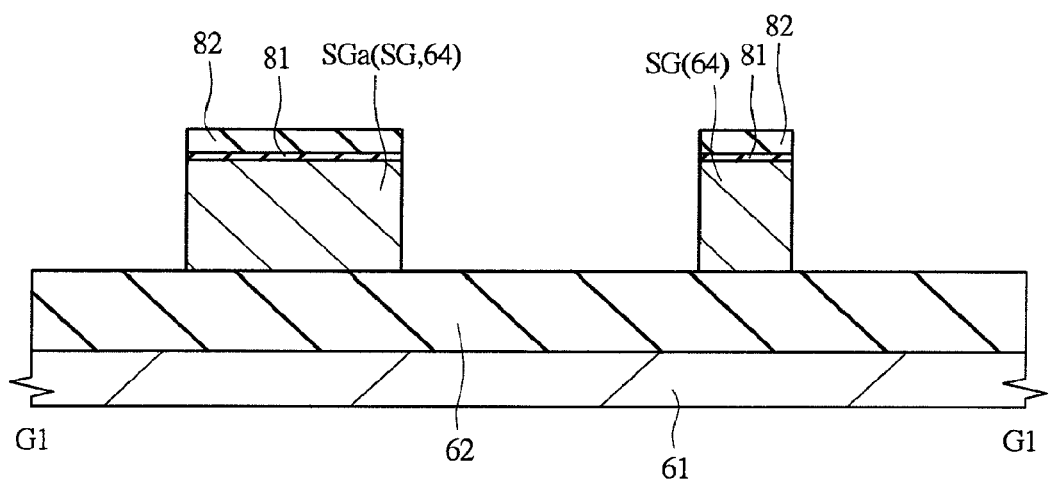
FIG. 108 is a cross-sectional view of a main part (cross-sectional view taken along the line G1-G1) of the semiconductor device during the manufacturing process same as that of FIGS. 106 and 107.

Next, using the photoresist pattern RP1a as an etching mask, as illustrated in FIG. 106 (plan view of a main part), FIG. 107 (cross-sectional view taken along the line F1-F1), and FIG. 108 (cross-sectional view taken along the line G1-G1), the insulating film 82, the insulating film 81, and the silicon film 64 are pattered by etching (dry etching). The patterning step of the step S6 has patterned the silicon film 64 in the third embodiment. Meanwhile, in the present embodiment, a stacked film of the silicon film 64, insulating film 81, and insulating film 82 is patterned, and this point is different from the third embodiment. While the select gate electrode SG is formed of the pattered silicon film 64, in the present embodiment, at this stage, the insulating film 81 and the insulating film 82 in the same planar shape (pattern shape) as the select gate electrode SG are formed. Thus, the select gate electrode SG is formed as a stacked film pattern of the select gate electrode SG and the insulating films 81 and 82 on the select gate electrode SG and is extended on the semiconductor substrate 61. Thereafter, the photoresist pattern RP1a is removed. FIGS. 107 and 108 correspond to the stage in which the photoresist pattern RP1a has been removed. While FIG. 106 is a plan view of the same region as the FIG. 101, to facilitate understanding, only the stacked pattern of the select gate electrode SG and the insulating films 81 and 82 is illustrated.

Also, as another aspect, after patterning the insulating film 82 by etching (dry-etching) using the photoresist pattern RP1a as an etching mask and then removing the photoresist pattern RP1a, the insulating film 81 and the silicon film 64 may be patterned by etching (dry etching) using the insulating film 82 as an etching mask (hard mask).

The select gate electrode SG integrally includes the contact portion SGa arranged in the word shunt region 61C. In addition, while it is not illustrated because FIG. 107 illustrates the word shunt region 61C, the insulating film 63 remains under the select gate electrode SG in the memory cell region 61A and becomes a gate insulating film of the select transistor as observed from FIG. 100 described above.

Next, in the present embodiment, before performing the step of forming the insulating film 65 of the step S7 described above, a step of forming the photoresist pattern RP4 and a step of etching the insulating film 82 and insulating film 81 using the photoresist pattern RP4 as an etching mask are performed. This process will be specifically described.

Figure 109:
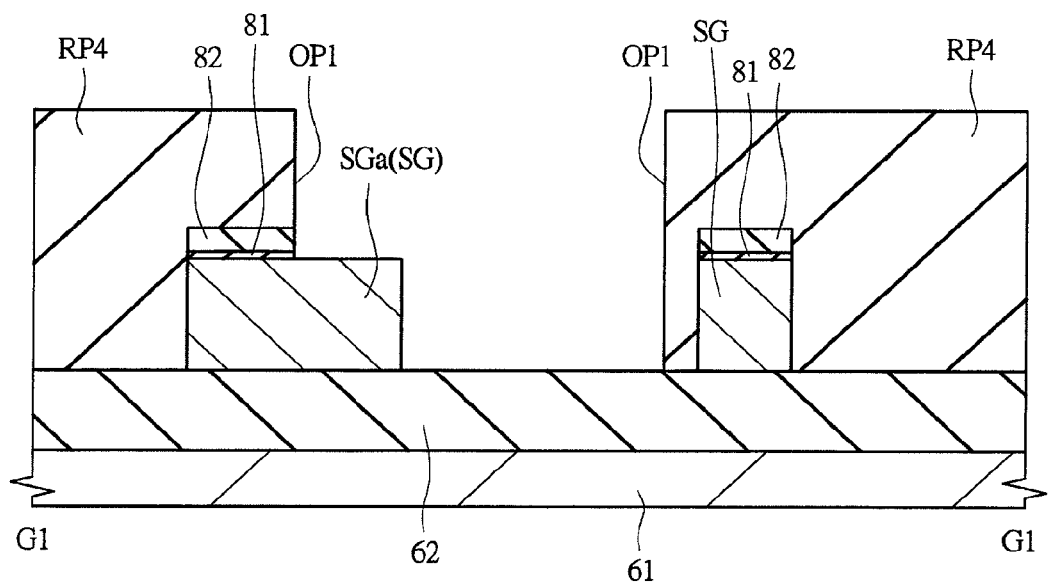
FIG. 109 is a cross-sectional view of a main part (cross-sectional view taken along the line G1-G1) of the semiconductor device during the manufacturing process continued from FIGS. 106 to 108.

First, as illustrated in FIG. 109 (cross-sectional view taken along the line G1-G1), the photoresist pattern (resist pattern) RP4 is formed on the main surface of the semiconductor substrate 61 using photolithography technology. The photoresist pattern RP4 is formed to cover the whole of the memory cell region 61A and the whole of the source dummy region 61B, and, in the word shunt region 61C, the select gate electrode SG other than the contact portion SGa is covered, and at least a part of the contact portion SGa is not covered (is exposed). That is, the photoresist pattern RP4 has an opening portion OP1 in the word shunt region 61C, and at least a part of the contact portion SGa is overlapped with the opening portion OP1 in a plane, and the select gate electrode SG other than the contact portion SGa is not overlapped with the opening portion OP1 in a plane.

Figure 110:
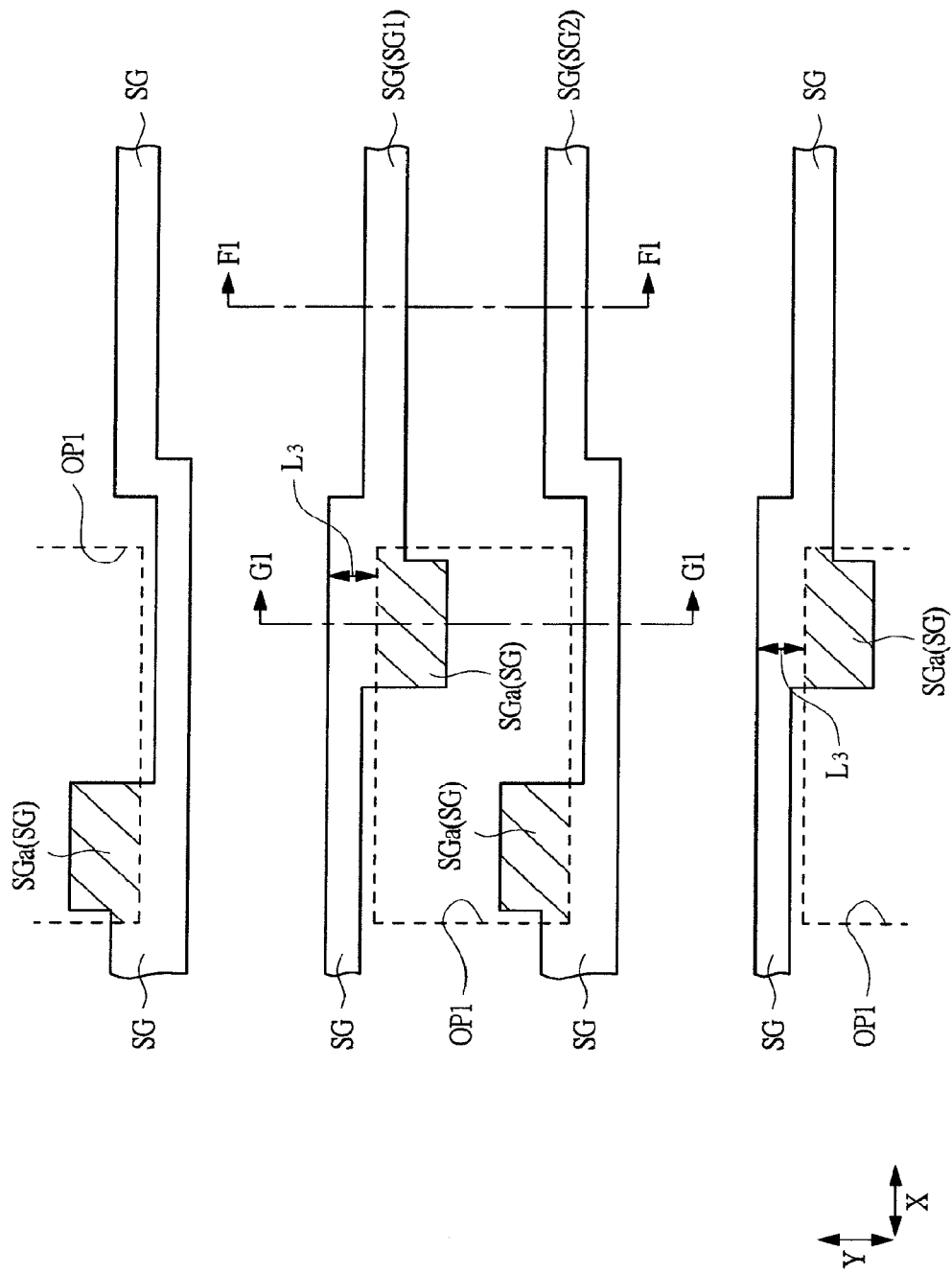
FIG. 110 is a plan view of a main part of the semiconductor device during the manufacturing process same as that of FIG. 109.

Next, using the photoresist pattern RP4 as an etching mask, the insulating film 82 exposed from the opening portion OP1 of the photoresist pattern RP4 is removed by etching (dry etching). At this moment, the insulating film 81 works as an etching stopper upon etching the insulating film 82. Thereafter, the insulating film is further removed by etching (dry etching). Then, the photoresist pattern RP4 is removed. In this manner, as illustrated in FIGS. 109 and 110, the select gate electrode SG other than the contact portion SGa is covered by the insulating films 81 and 82, and at least a part of the contact portion SGa not being covered by the insulating films 81 and 82 is exposed. Note that, while FIG. 110 is a plan view of the same region as FIG. 101 etc, the pattern of the select gate electrodes SG is illustrated by solid lines and positions of the opening portions OP1 are illustrated by dotted lines, and the regions in which the upper surfaces of the select gate electrodes SG are exposed as the insulating films 82 and 81 are removed are illustrated with hatching.

In the present embodiment, as described above, the contact portion SGa of the select gate electrode SG (for example, one of the select gate electrodes SG1 and SG2) is extended in a direction to be closer to another select gate electrode SG (for example, the other one of the select gate electrodes SG1 and SG2 in FIG. 110) being adjacent via a drain region (corresponding to the drain semiconductor region MD described above). Therefore, the select gate electrodes SG (for example, the select gate electrodes SG1 and SG2 in FIG. 110) being adjacent to each other via a drain region (corresponding to the drain semiconductor region MD described above) have the contact portions SGa extended in a direction to be closer to one another, and they protrude to be closer to one another when viewed in a plane.

Therefore, by arranging the opening portion OP1 of the photoresist pattern RP4 between the adjacent select gate electrodes SG (for example, between the select gate electrodes SG1 and SG2 in FIG. 110) via a drain region (corresponding to the drain semiconductor region MD), it becomes easy and adequate to achieve the configuration that at least a part of the contact portion SGa is overlapped with the opening portion OP1 in a plane and the select gate electrode SG other than the contact portion SGa is not overlapped with the opening portion OP1 in a plane. In this manner, without removing the insulating films 81 and 82 on the select gate electrode SG other than the contact portion SGa, the insulating films 81 and 82 on at least the part of the contact portion SGa can be adequately removed.

In the upper surface of the select gate electrode SG, the metal silicide layer 71 is formed in the region where the upper surface of the select gate electrode SG is exposed as the insulating films 81 and 82 are removed (i.e., the region with hatching in FIG. 110), and the other region in the upper surface of the select gate electrode SG (i.e., the region without hatching in the select gate electrode SG in FIG. 110) is still covered by the insulating films 81 and 82 and thus the metal silicide layer 71 is not formed thereafter. Therefore, in the upper surface of the select gate electrode SG, the region where the insulating films 81 and 82 are removed is coincident with the region where the metal silicide layer 71 is formed thereafter.

Also, as understood from FIG. 110, in the upper surface of the contact portion SGa, while the insulating films 81 and 82 are removed from a region separated from an edge portion on the side being adjacent to the memory gate electrode MG1 by a predetermined distance $L_3$ or more, and the metal silicide layer 71 is formed in the region thereafter, it is preferable that, in the contact portion SGa, the insulating films 81 and 82 are left in a region within the predetermined distance $L_3$ from the edge portion on the side being adjacent to the memory gate electrode MG1 and the metal silicide layer 71 is not formed in the region thereafter. That is, it is preferable to leave not only the insulating films 81 and 82 on the upper surface of the select gate electrode SG other than the contact portion SGa, but also leave the insulating films 81 and 82 in a vicinity of the edge portion on the side adjacent to the memory gate electrode MG1 thereafter. In this manner, as illustrated in FIGS. 102 and 104, the region in which the metal silicide layer 71 is formed at the upper surface of the contact portion SGa of the select gate electrode SG is separated from the memory gate electrode MG1 interposing the region covered by the insulating films 81 and 82 (region in which the metal silicide layer 71 is not formed) at the upper surface of the select gate electrode SG therebetween.

Moreover, when forming the photoresist pattern RP4, the peripheral circuit forming region described above is exposed without being covered by the photoresist pattern RP4. Thus, the insulating film 82 and the insulating film 81 on the silicon film 64 in the peripheral circuit forming region can be removed in the same step as the etching step of removing the insulating films 82 and 81 on the contact portion SGa in the word shunt region 61C. In this manner, using the silicon film 64 remaining in the peripheral circuit forming region, it becomes easy to later form gate electrodes of MISFETs forming the peripheral circuit.

Figure 111:
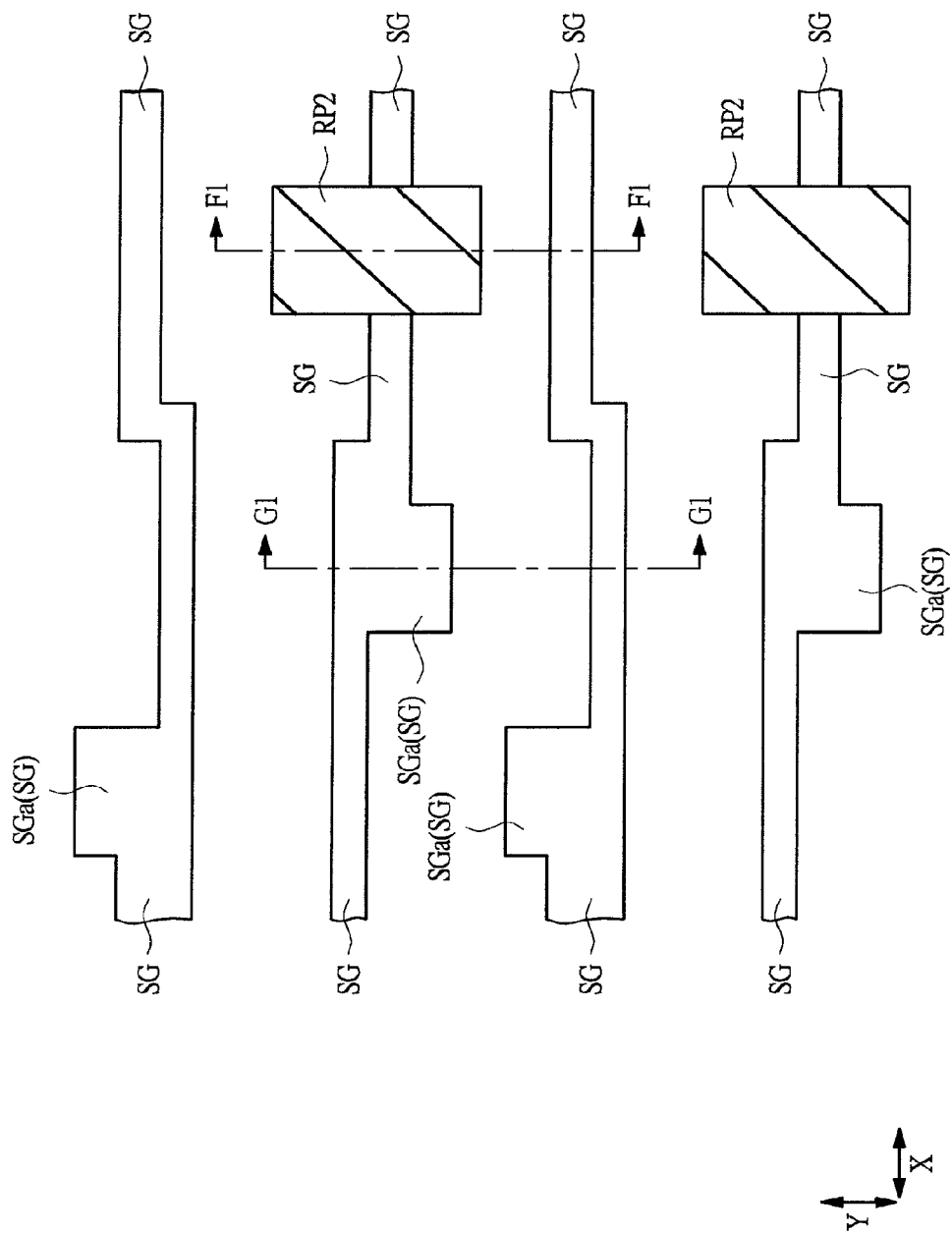
FIG. 111 is a plan view of a main part of the semiconductor device during the manufacturing process same as that of FIGS. 109 and 110.
Figure 112:
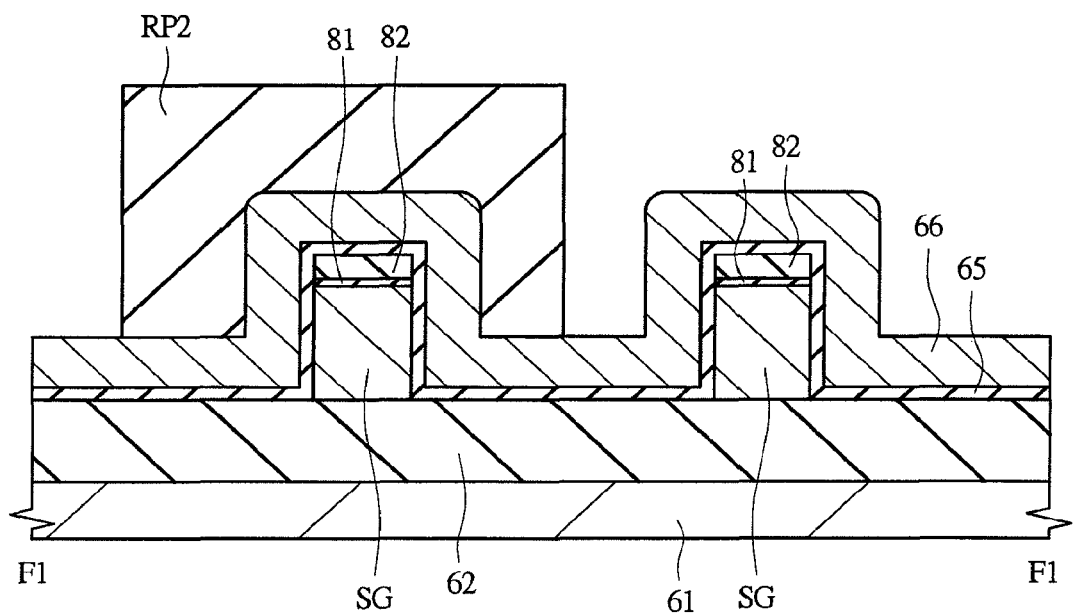
FIG. 112 is a cross-sectional view of a main part (cross-sectional view taken along the line F1-F1) of the semiconductor device during the manufacturing process same as that of FIG. 111.
Figure 113:
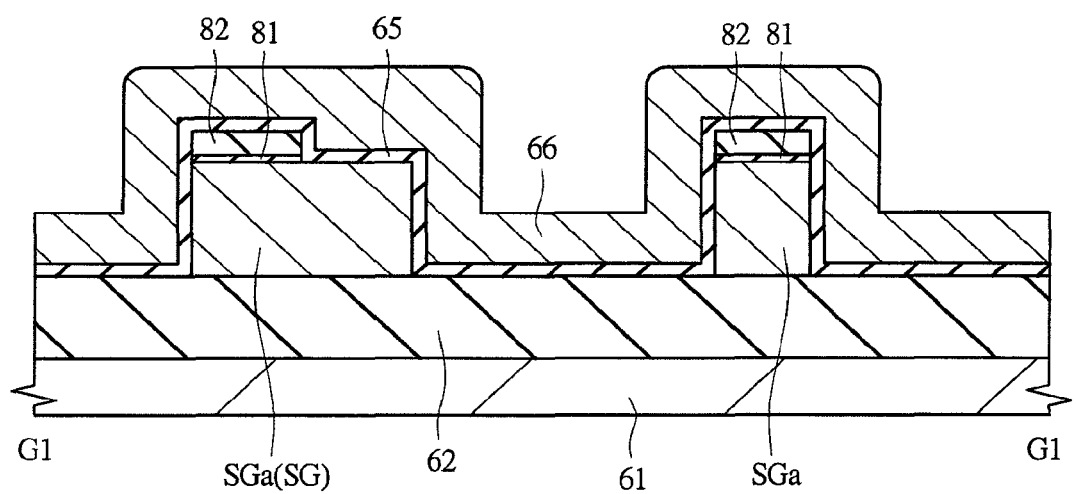
FIG. 113 is a cross-sectional view of a main part (cross-sectional view taken along the line G1-G1) of the semiconductor device during the manufacturing process same as that of FIGS. 111 and 112.

Next, in the same manner as the third embodiment, as illustrated in FIGS. 111, 112 (cross-sectional view taken along the line F1-F1), and 113 (cross-sectional view taken along the line G1-G1), the insulating film 65 is formed in the step S7 described above, and the silicon film 66 is formed in the step S8 described above. Then, after forming the photoresist pattern RP2 on the silicon film 66 in the step S9 described above, the silicon film 66 exposed from the photoresist pattern RP2 is etched back by an anisotropic etching. Note that, while FIG. 111 is a plan view of the same region as FIG. 101 etc., the pattern of the select gate electrodes SG and the pattern of the photoresist pattern RP2 are illustrated, hatching is added to the photoresist pattern RP2, and the silicon film 66 and the insulating films 65, 81, and 82 are transparent.

Figure 114:
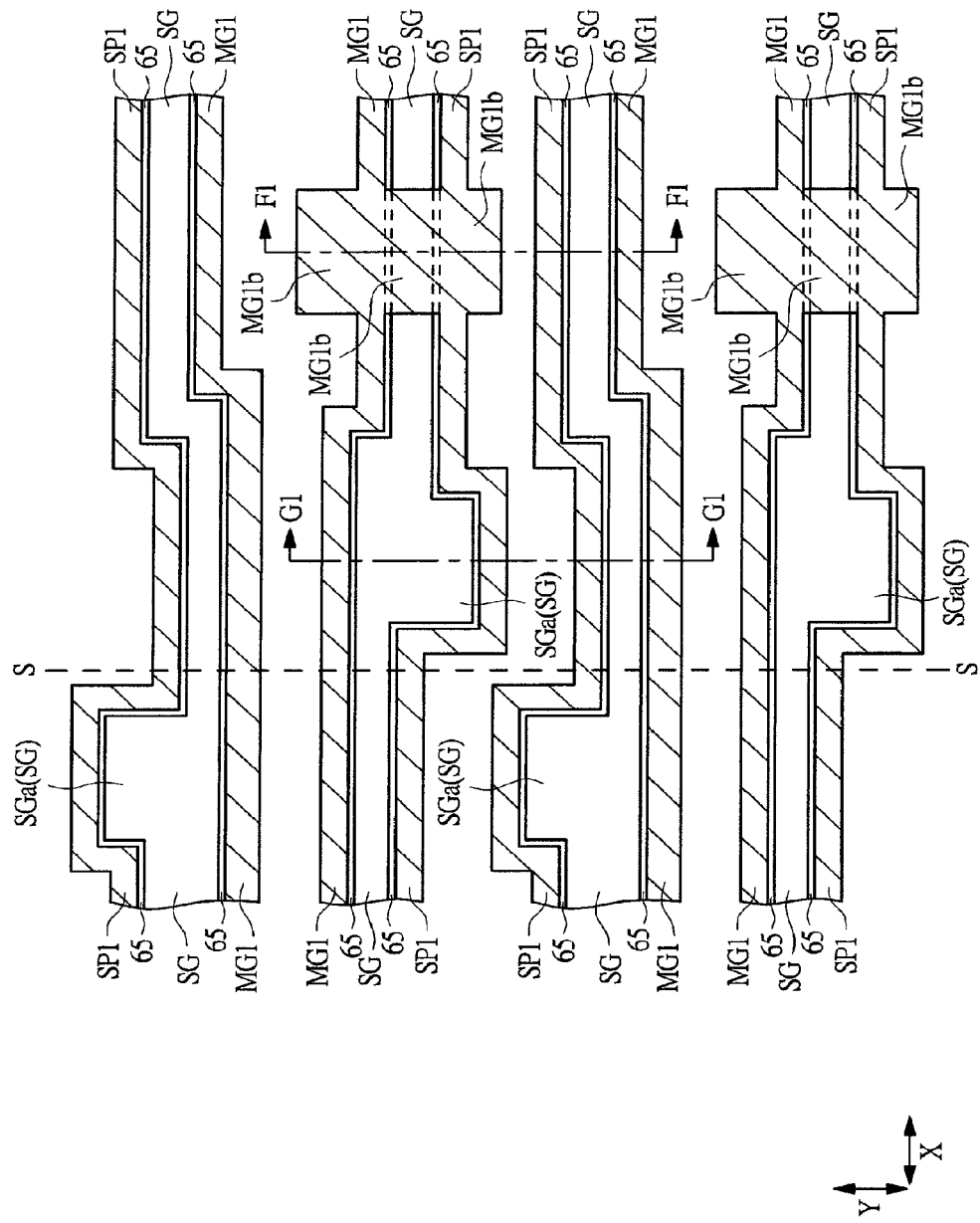
FIG. 114 is a plan view of a main part of the semiconductor device during the manufacturing process continued from FIGS. 111 to 113.
Figure 115:
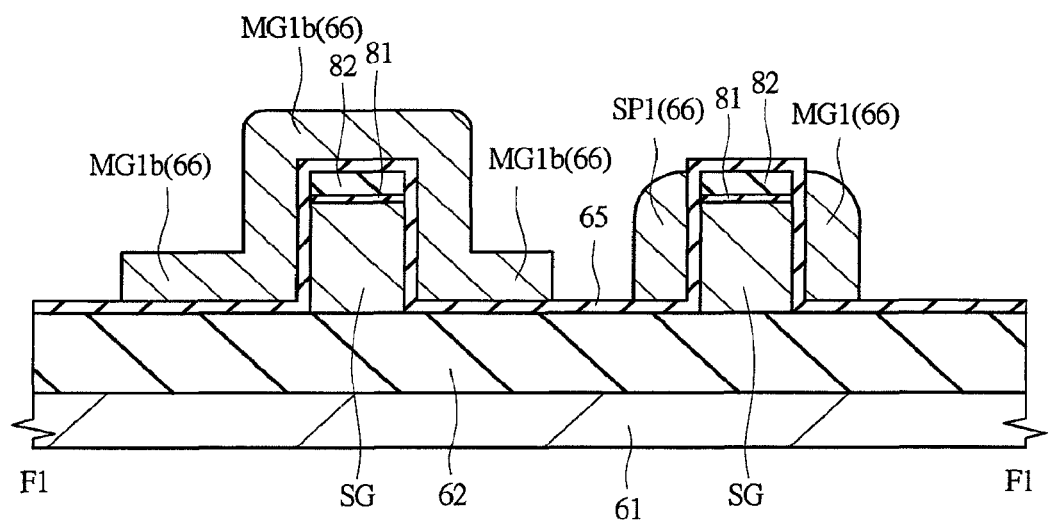
FIG. 115 is a cross-sectional view of a main part (cross-sectional view taken along the line F1-F1) of the semiconductor device during the manufacturing process same as that of FIG. 114.
Figure 116:
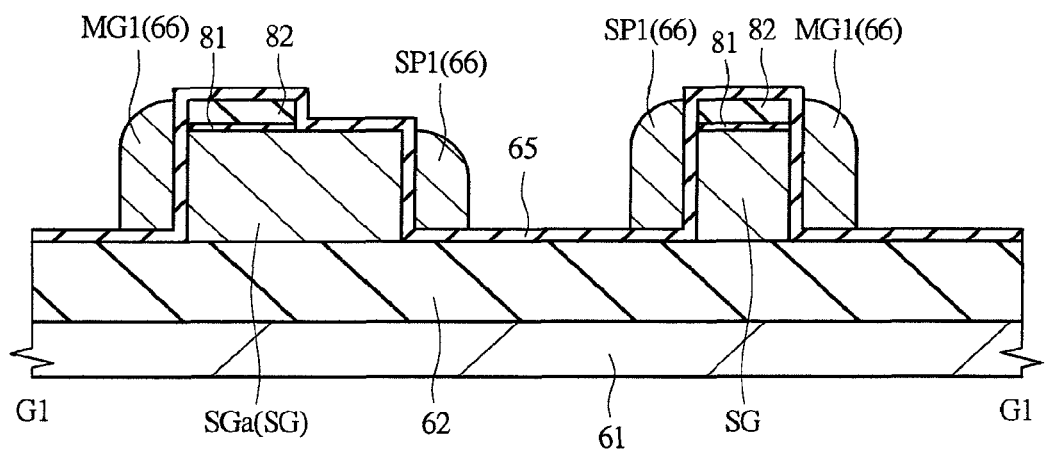
FIG. 116 is a cross-sectional view of a main part (cross-sectional view taken along the line G1-G1) of the semiconductor device during the manufacturing process same as that of FIGS. 114 and 115.

In this manner, as illustrated in FIGS. 114, 115 (cross-sectional view taken along the line F1-F1), and 116 (cross-sectional view taken along the line G1-G1), in the both sidewalls of the stacked pattern of the select gate electrode SG and the insulating films 81 and 82, the silicon film 66 remains in a sidewall shape on one of the sidewalls via the insulating film 65, thereby forming the memory gate electrode MG1, and, the silicon film 66 remains in a sidewall shape on the other sidewall via the insulating film 65, thereby forming the silicon spacer SP1. Also, as the silicon film 66 remains unetched under the photoresist pattern RP2 which works as an etching mask, the contact portion MG1b is formed. Then, the photoresist pattern RP2 is removed. FIGS. 114 to 116 correspond to the stage in which the photoresist pattern RP2 has been removed. Note that, while FIG. 114 is a plan view of the same region as FIG. 101 etc. described above, patterns of the select gate electrodes SG and the remaining silicon films 66 (i.e., the silicon spacer SP1, memory gate electrode MG1, and contact portion MG1b) are illustrated, where hatching is added to the remaining silicon films 66 (i.e., the silicon spacer SP1, memory gate electrode MG1, and contact portion MG1b), and the insulating films 65, 81, and 82 are transparent.

Since the etch-back step of the step S9 is anisotropic etching, the formed contact portion MG1b has the same pattern shape (planar shape) as the photoresist pattern RP2. In the word shunt region 61C, since the photoresist pattern RP2 is formed to cross (preferably, be orthogonal to) the select gate electrode SG, the contact portion MG1b is formed to cross (preferably, be orthogonal to) the select gate electrode SG.

Also in the present embodiment, the layout (planar shape) of the photoresist pattern RP2 may be made the same as the third embodiment (FIG. 58 described above), and thus the layout (planar shape) of the contact portion MG1b formed thereby may be the same as the third embodiment (FIG. 58 described above). That is, in the third embodiment, as illustrated in FIGS. 58 and 60, the photoresist pattern RP2 has been formed to cross two select gate electrodes SG (i.e., stride across the two select gate electrodes SG) being next to each other via a drain region (corresponding to the drain semiconductor region MD described above). Therefore, the contact portion MG1b has been formed to cross two select gate electrodes SG (i.e., stride across the two select gate electrodes SG) being next to each other via the drain region (corresponding to the drain semiconductor region MD described above). The layout (planar shape) of the photoresist pattern RP2 and the contact portion MG1b according to the third embodiment can be used in the present embodiment.

Meanwhile, the layout (planar shape) of the photoresist pattern RP2 and the contact portion MG1b can be made as illustrated in FIGS. 111 and 114. More specifically, as illustrated in FIGS. 111 and 112, the photoresist pattern RP2 is formed to cross one select gate electrode SG (i.e., stride across the one select gate electrode SG), and in this manner, as illustrated in FIGS. 114 and 115, the contact portion MG1b can be formed to cross one select gate electrode SG (i.e., stride across the one select gate electrode SG).

Regarding both the layout of FIGS. 58 and 60 and the layout of FIGS. 111 and 114, what is important is to form the photoresist pattern RP2 to cross (preferably, to be orthogonal to) each select gate electrode SG, and accordingly, to form the contact portion MG1b to cross (preferably, to be orthogonal to) each select gate electrode SG in the word shunt region 61C. While the number of the select gate electrodes SG strode (crossed) by each contact portion MG1b can be three or more, in consideration of the layout of the photoresist pattern RP2, two is preferable as illustrated in FIGS. 58 and 60 or one is preferable as illustrated in FIGS. 111 and 114. Note that, in FIG. 114, a layout symmetrical about the line S-S is also formed on the left side of the layout illustrated in FIG. 114, and thus the contact portion MG1b is formed on the left side of each contact portion SGa formed on the left side, and consequently, the numbers of the contact portions SGa and the contact portions MG1a eventually formed are the same in both layouts of FIGS. 58 and 60 and FIGS. 111 and 114.

Figure 117:
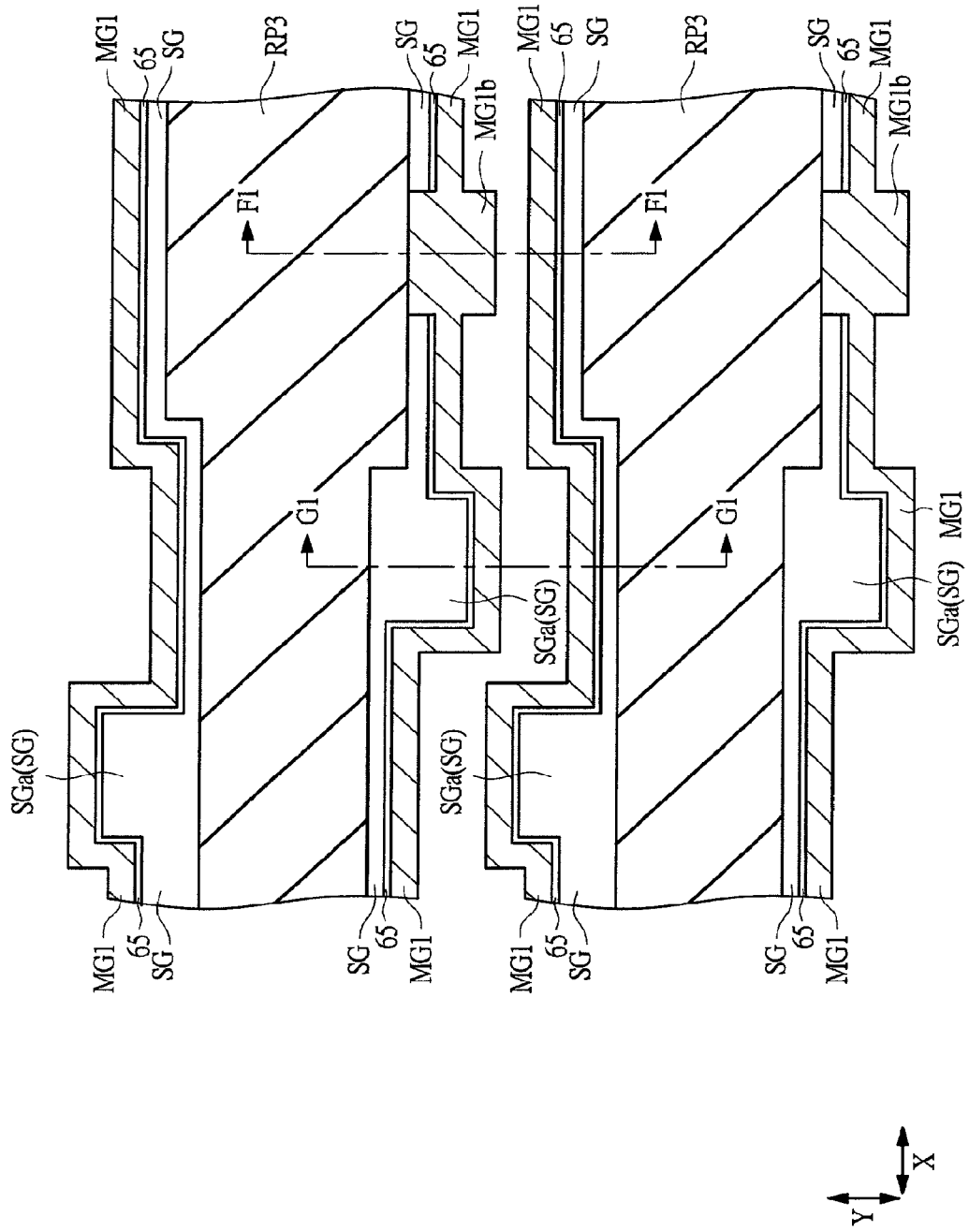
FIG. 117 is a plan view of a main part of the semiconductor device during the manufacturing process continued from FIGS. 114 to 116.
Figure 118:
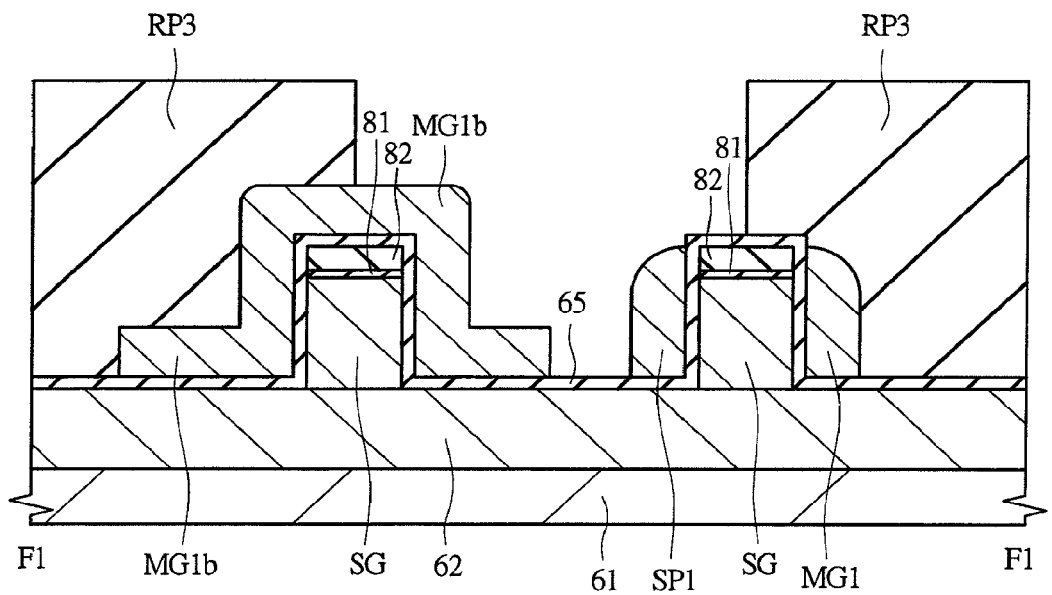
FIG. 118 is a cross-sectional view of a main part (cross-sectional view taken along the line F1-F1) of the semiconductor device during the manufacturing process same as that of FIG. 117.
Figure 119:
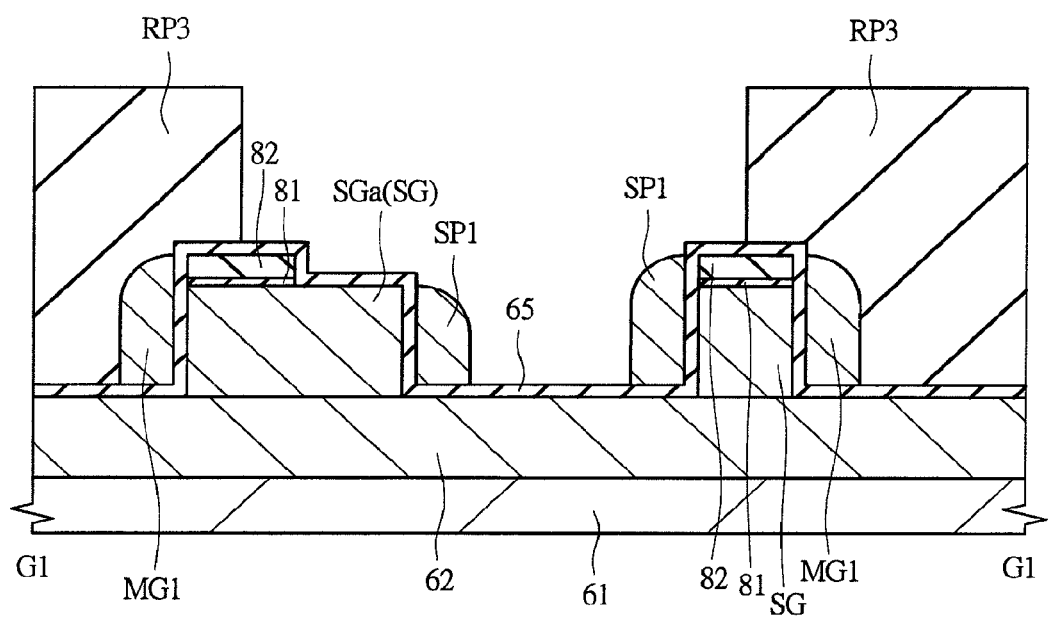
FIG. 119 is a cross-sectional view of a main part (cross-sectional view taken along the line G1-G1) of the semiconductor device during the manufacturing process same as that of FIGS. 117 and 118.
Figure 120:
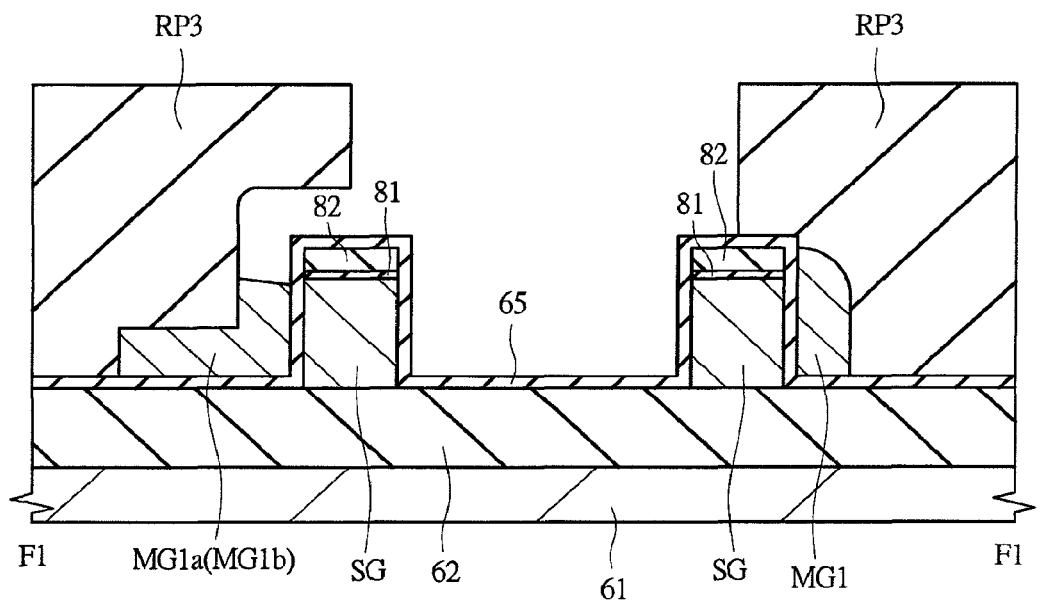
FIG. 120 is a cross-sectional view of a main part (cross-sectional view taken along the line F1-F1) of the semiconductor device during the manufacturing process continued from FIGS. 117 to 119.
Figure 121:
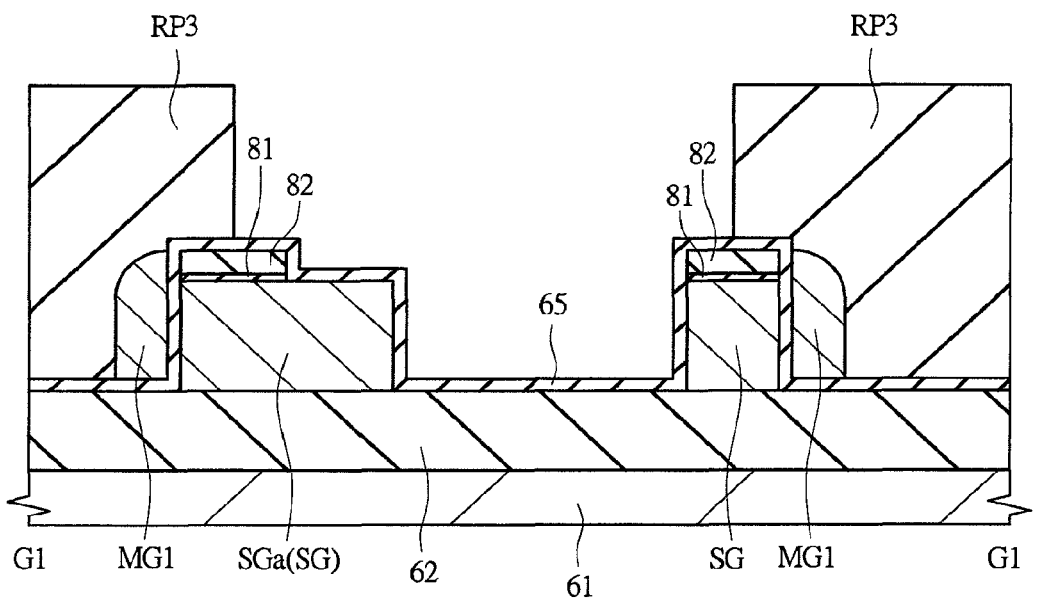
FIG. 121 is a cross-sectional view of a main part (cross-sectional view taken along the line G1-G1) of the semiconductor device during the manufacturing process same as that of FIG. 120.

Next, in the same manner as the third embodiment, the step S10 described above is performed. That is, in the same manner as the third embodiment, as illustrated in FIGS. 117, 118 (cross-sectional view taken along the line F1-F1), and 119 (cross-sectional view taken along the line G1-G1), the photoresist pattern RP3 covering the memory gate electrode MG1 and exposing the silicon spacer SP1 is formed on the semiconductor substrate 61. Thereafter, as illustrated in FIGS. 120 (cross-sectional view taken along the line F1-F1), 121 (cross-sectional view taken along the line G1-G1), and 122, the silicon spacer SP1 is removed by performing isotropic etching using the photoresist pattern RP3 as an etching mask. Then, the photoresist pattern RP3 is removed.

Figure 122:
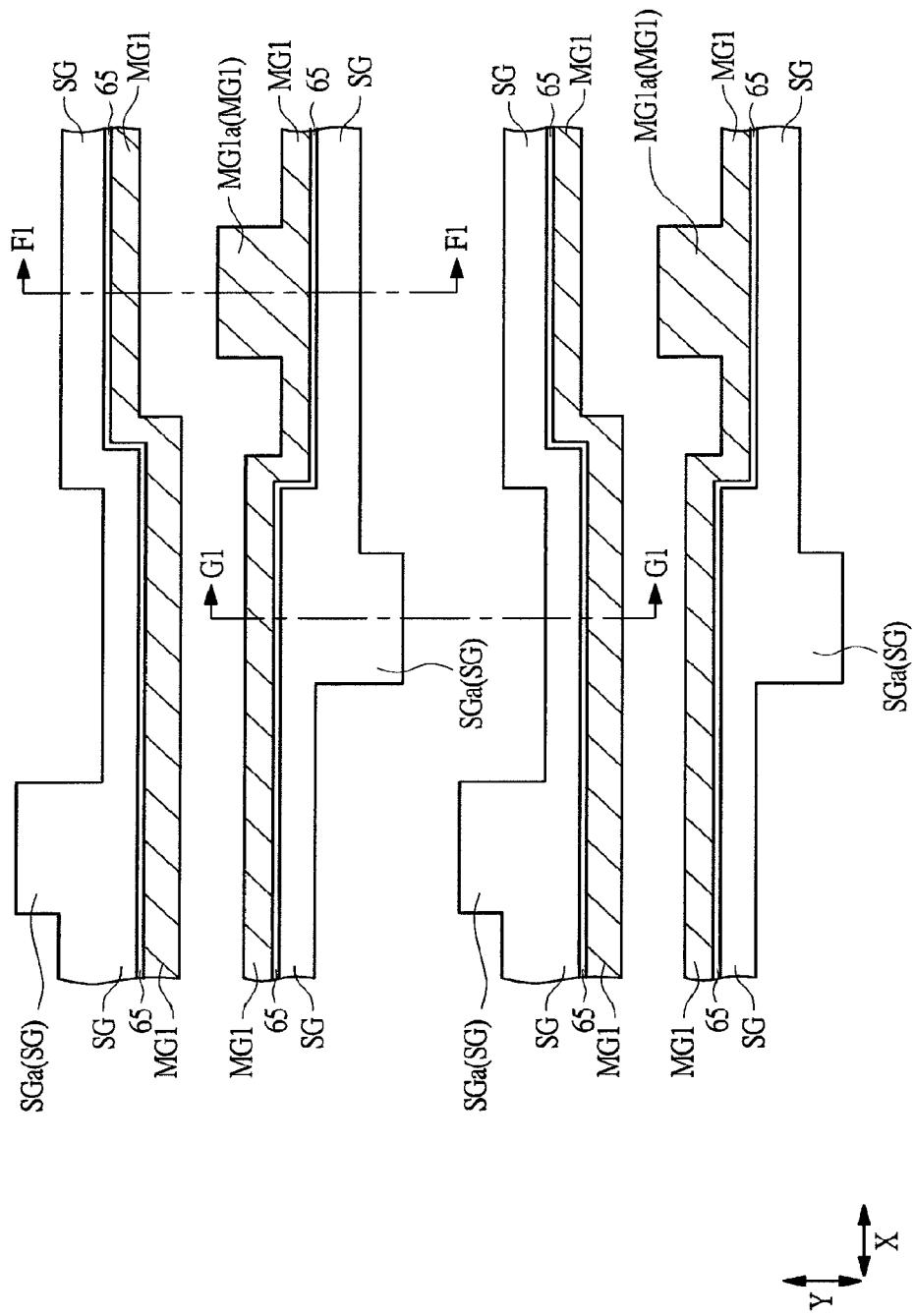
FIG. 122 is a plan view of a main part of the semiconductor device during the manufacturing process continued from FIGS. 120 and 121.
Figure 123:
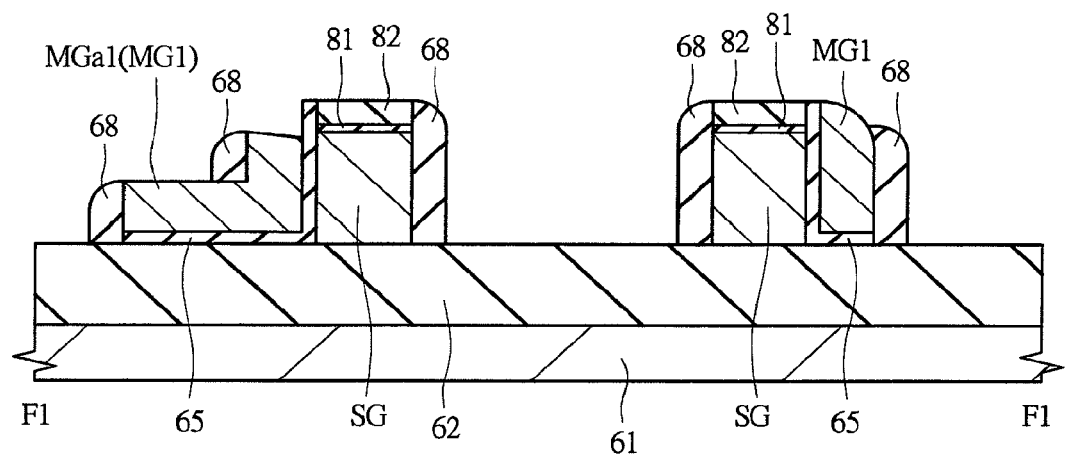
FIG. 123 is a cross-sectional view of a main part (cross-sectional view taken along the line F1-F1) of the semiconductor device during the manufacturing process continued from FIG. 122.
Figure 124:
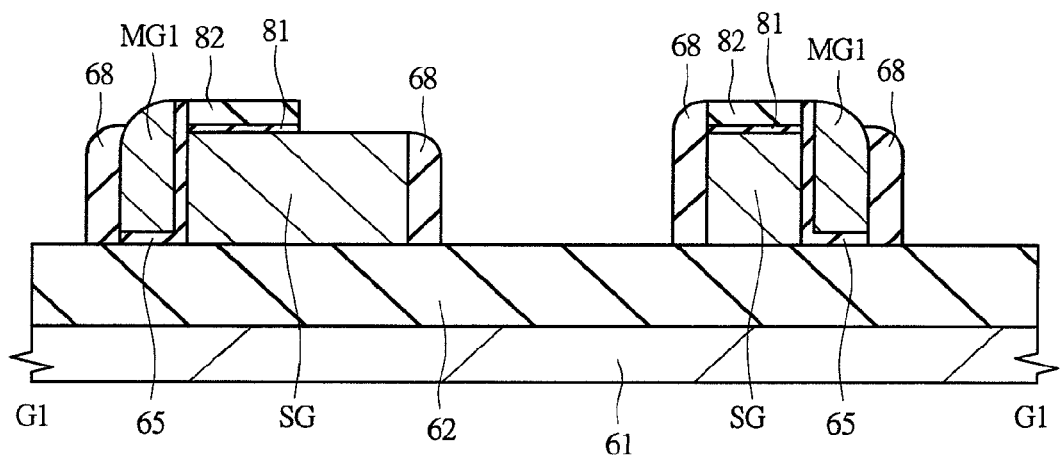
FIG. 124 is a cross-sectional view of a main part (cross-sectional view taken along the line G1-G1) of the semiconductor device during the manufacturing process same as that of FIG. 123.

Requirements of the layout of the photoresist pattern RP3 and conditions of the isotropic etching in the step S10 can be defined in the same manner as the third embodiment, and thus descriptions thereof will be omitted. Also, the silicon spacer SP1 is removed by the isotropic etching of the step S10 and the memory gate electrode MG1 in a sidewall shape remains, so that the contact portion MG1b becomes the contact portion MG1a, and this point is also the same as the third embodiment, and thus, descriptions thereof will be omitted. Note that, while FIG. 117 is a plan view of the same region as FIG. 101 etc. described above, the insulating films 65, 81, and 82 are transparent, and hatching is added to the photoresist pattern RP3, and the silicon spacer SP1 and the contact portion MG1b being exposed without being covered by the photoresist pattern RP3. In addition, while FIG. 122 is a plan view of the same region as FIG. 101 etc. described above, the stage where the photoresist pattern RP3 has been removed is illustrated, the insulating films 65, 81, and 82 are transparent, and hatching is added to the remaining silicon film 66 (i.e., the memory gate electrode MG1 and contact portion MG1a).

Next, in the same manner as the third embodiment, in the step S11 described above, as illustrated in FIGS. 123 (cross-sectional view taken along the line F1-F1) and 124 (cross-sectional view taken along the line G1-G1), exposed parts of the insulating film 65 not covered by the memory gate electrode MG1 (including the contact portion MG1a) are removed. Then, though not illustrated here, in the same manner as the third embodiment, the $n^-$-type semiconductor regions 67a and 67b are formed in the memory cell region 61A (region corresponding to FIG. 100 described above) in the step S12 described above. Next, in the same manner as the third embodiment, the sidewall insulating films 68 are formed in the step S13 described above. Then, though not illustrated here, in the same manner as the third embodiment, the $n^+$-type semiconductor regions 69a and 69b are formed in the memory cell region 61A (region corresponding to FIG. 100 described above) in the step S14 described above.

Next, if necessary, etching (wet etching using, for example, diluted hydrofluoric acid) is performed to clean (expose) the contact portion SGa (region not covered by the insulating films 81 and 82) of the select gate electrode SG, the memory gate electrode MG1, and the upper surface (surface) of the $n^+$-type semiconductor regions 69a and 69b. The etching here can be a light etching to the extent of removing natural silicon oxide film.

Figure 125:
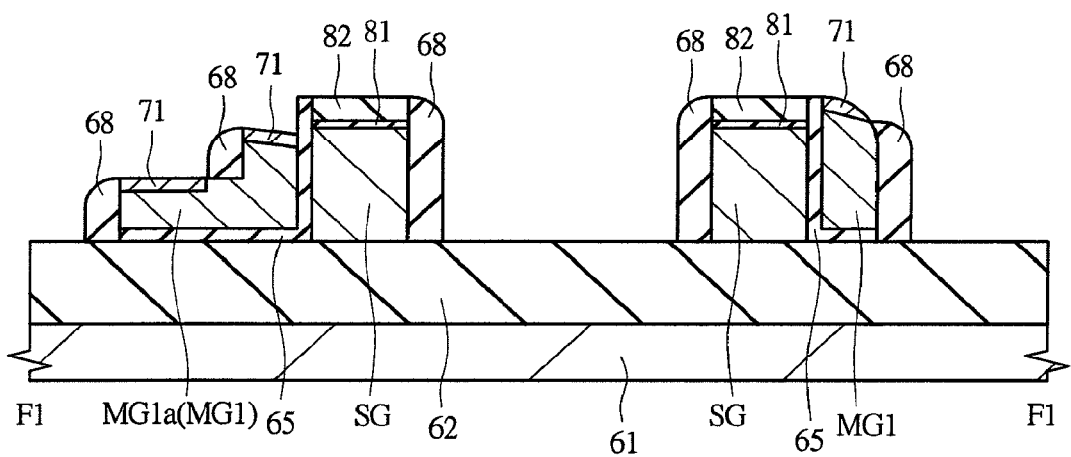
FIG. 125 is a cross-sectional view of a main part (cross-sectional view taken along the line F1-F1) of the semiconductor device during the manufacturing process continued from FIGS. 123 and 124.

Next, in the same manner as the third embodiment, using salicide technology, as illustrated in FIGS. 125 (cross-sectional view taken along the line F1-F1), 126 (cross-sectional view taken along the line G1-G1), and FIG. 100 described above, the metal silicide layers 71 are formed to the contact portion SGa (region not covered by the insulating films 81 and 82) of the select gate electrode SG, memory gate electrode MG1, and the upper portion (upper surface, surface, upper-layer portion) of the $n^+$-type semiconductor regions 69a and 69b, respectively. The step of forming the metal silicide layer 71 is basically same as that of the third embodiment except for that the metal silicide layer 71 is not formed to the part of the upper surface of the select gate electrode SG covered by the insulating films 81 and 82.

Figure 126:
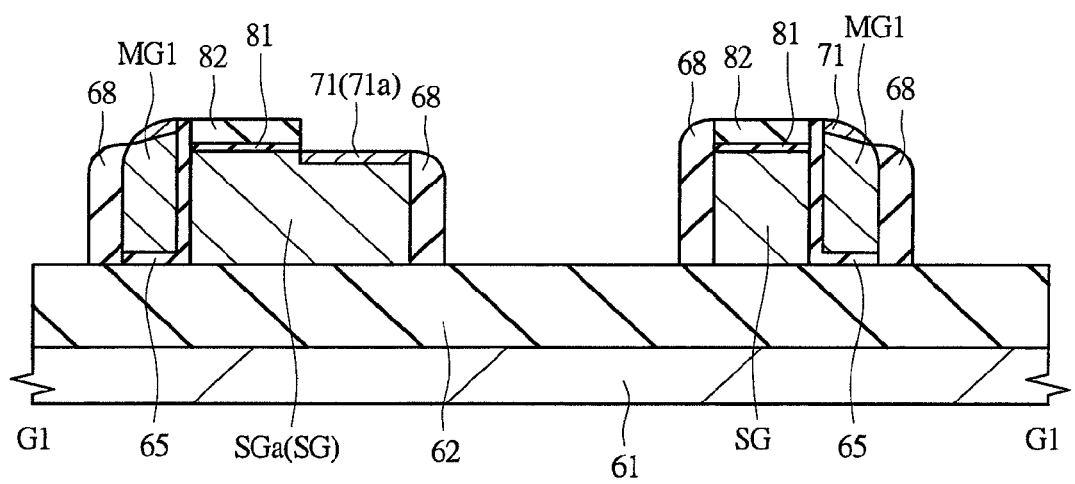
FIG. 126 is a cross-sectional view of a main part (cross-sectional view taken along the line G1-G1) of the semiconductor device during the manufacturing process same as that of FIG. 125.

More specifically, a metal film (not illustrated) is formed (deposited) on the contact portion SGa (region not covered by the insulating films 81 and 82) of the select gate electrode SG, the memory gate electrode MG1, and the whole of the main surface of the semiconductor substrate 61 including portions on the upper surfaces (surfaces) of the $n^+$-type semiconductor regions 69a and 69b to cover the select gate electrode SG, memory gate electrode MG1, and sidewall insulating film 68. Then, by performing a thermal treatment to the semiconductor substrate 61, the contact portion SGa (region not covered by the insulating films 81 and 82) of the select gate electrode SG, the memory gate electrode MG1, and the upper layer portions of the $n^+$-type semiconductor regions 69a and 69b are reacted with the metal film, thereby forming the metal silicide layers 71. Thereafter, unreacted part of the metal film is removed. FIGS. 125 and 126 illustrate cross-sectional views of this stage.

In this manner, the metal silicide layer 71 is formed by performing a so-called salicide process. Meanwhile, in the third embodiment described above, the metal film is formed in a state in which the upper surface of the whole of the select gate electrode SG is exposed and the reaction with the metal film is made, so that the metal silicide film 71 is formed to the upper surface of the whole of the select gate electrode SG. Meanwhile, in the present embodiment, since the metal film is formed while the select gate electrode SG other than the contact portion SGa is covered by the insulating films 81 and 82, the metal silicide 71 is not formed to the upper portion of the select gate electrode SG other than the contact portion SGa. And, since the metal film is formed while at least a part of the contact portion SGa of the select gate electrode SG is not covered by the insulating films 81 and 82, as illustrated in FIG. 126, the metal silicide layer 71 is formed to the upper portion of at least the part of the contact portion SGa of the select gate electrode SG. Moreover, in the same manner as the third embodiment, also in the present embodiment, as illustrated in FIG. 125, the metal silicide layers 71 are formed to the portions not covered by the sidewall insulating films 68 in the upper layer of the contact portion MG1a of the memory gate electrode MG1.

The following steps are the same as those of the third embodiment. That is, as illustrated in FIGS. 100, 103, and 104, in the same manner as the third embodiment, the insulating film (interlayer insulating film) 72 is formed, the contact holes CT are formed in the insulating film 72, the plugs PG are formed in the contact holes CT, the insulating film (interlayer insulating film) 74 is formed on the insulating film 72 in which the plugs PG are buried, and the wiring MM1 is formed to the insulating film 74.

Also in the present embodiment, the same effects as those described in the third embodiment can be obtained except for the effects uniquely obtained by the present embodiment described above. In addition, the technique of the fourth embodiment can be also applied to the present embodiment.

In the foregoing, the invention made by the inventors of the present invention has been concretely described based on the embodiments. However, it is needless to say that the present invention is not limited to the foregoing embodiments and various modifications and alterations can be made within the scope of the present invention.

The present invention is effectively applied to a semiconductor device and manufacturing technology of the same.

What is claimed is:

1. A semiconductor device comprising:
    a semiconductor substrate;
    a first gate electrode formed to an upper portion of the semiconductor substrate;
    a second gate electrode formed on one of sidewalls of the first gate electrode and extended on the semiconductor substrate with the first gate electrode;
    an insulating film formed between the second gate electrode and the semiconductor substrate, and between the first gate electrode and the second gate electrode, the insulating film including a charge storage portion inside; and
    an interlayer insulating film formed on the semiconductor substrate to cover the first gate electrode and the second gate electrode,
    wherein the second gate electrode includes a first contact portion extended in a direction to be away from the first gate electrode from a position adjacent to the one of the sidewalls of the first gate electrode,
    wherein a first contact hole is formed to the interlayer insulating film above the first contact portion of the second gate electrode, and a first conductor portion buried in the first contact hole and the first contact portion of the second gate electrode are electrically connected, and
    wherein the first contact portion does not run over the first gate electrode,
    wherein the second gate electrode does not have a portion positioned above the first gate electrode.

2. The semiconductor device according to claim 1, comprising
    a first wiring formed on the interlayer insulating film and electrically connected to the first contact portion via the first conductor portion.

3. The semiconductor device according to claim 2, comprising
    a device isolation region formed to the semiconductor substrate,
    wherein the first contact portion is formed above the device isolation region.

4. The semiconductor device according to claim 3,
    wherein the second gate electrode except for the first contact portion is formed in a sidewall spacer shape on the one of the sidewalls of the first gate electrode.

5. The semiconductor device according to claim 4,
    wherein the first contact portion is extended in a direction perpendicular to a direction in which the second gate electrode is extended.

6. The semiconductor device according to claim 5,
    wherein a height of the first contact portion is lower than or equal to a height of the second gate electrode.

7. The semiconductor device according to claim 6,
    wherein a metal silicide layer is formed to an upper portion of each of the first gate electrode and the second gate electrode.

* * * * *